US009978948B2

(12) United States Patent
Funahashi et al.

(10) Patent No.: US 9,978,948 B2
(45) Date of Patent: May 22, 2018

(54) INK COMPOSITION, ORGANIC ELECTROLUMINESCENCE ELEMENT, AND ELECTRONIC APPARATUS

(71) Applicant: JOLED Inc., Tokyo (JP)

(72) Inventors: Masakazu Funahashi, Kanagawa (JP); Tadahiko Yoshinaga, Kanagawa (JP); Emiko Kambe, Kanagawa (JP)

(73) Assignee: JOLED Inc., Tokyo (JP)

( * ) Notice: Subject to any disclaimer, the term of this patent is extended or adjusted under 35 U.S.C. 154(b) by 0 days. days.

(21) Appl. No.: 15/119,843

(22) PCT Filed: Mar. 10, 2015

(86) PCT No.: PCT/JP2015/056895
§ 371 (c)(1),
(2) Date: Aug. 18, 2016

(87) PCT Pub. No.: WO2015/137291
PCT Pub. Date: Sep. 17, 2015

(65) Prior Publication Data

US 2017/0148993 A1 May 25, 2017

(30) Foreign Application Priority Data

Mar. 14, 2014 (JP) ................................ 2014-051342

(51) Int. Cl.
*H01L 51/00* (2006.01)
*C09K 11/06* (2006.01)
(Continued)

(52) U.S. Cl.
CPC ........ *H01L 51/0058* (2013.01); *C09D 11/033* (2013.01); *C09D 11/037* (2013.01);
(Continued)

(58) Field of Classification Search
CPC ... C09D 11/033; C09D 11/037; C09D 11/328; C09D 11/36; C09D 11/38; C09D 11/50;
(Continued)

(56) References Cited

U.S. PATENT DOCUMENTS

2008/0001123 A1* 1/2008 Inoue et al. ........... C09D 11/32 252/301.16
2010/0314615 A1* 12/2010 Mizuki et al. ....... C07D 307/91 257/40
(Continued)

FOREIGN PATENT DOCUMENTS

JP 2003-308969 A 10/2003
JP 2004-224766 A 8/2004
(Continued)

*Primary Examiner* — Tom Thomas
*Assistant Examiner* — Benjamin Tzu-Hung Liu
(74) *Attorney, Agent, or Firm* — Michael Best & Friedrich LLP

(57) ABSTRACT

Provided is an ink composition including the following components (A), (B), and (C).
The component (A) is an anthracene derivative represented by the following formula (A1).
The component (B) is an aromatic amine derivative represented by the following formula (B1) (in the formula (B1), one or more of Ar1 to Ar4 are a heterocyclic group represented by the following formula (B1')).
The component (C) is a solvent represented by the following formula (C1) and having a boiling point of 110° C. or higher and a solubility of 1 wt % or less in water.

(A1)

(Continued)

-continued

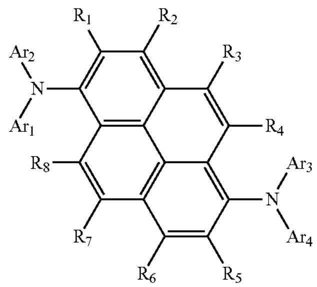

(B1)

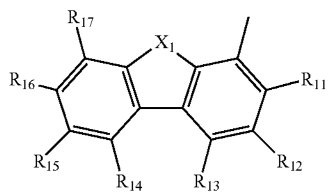

(B1′)

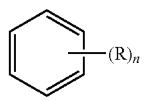

(C1)

21 Claims, 1 Drawing Sheet

(51) Int. Cl.

| | |
|---|---|
| ***C09D 11/50*** | (2014.01) |
| ***C09D 11/52*** | (2014.01) |
| ***C09D 11/36*** | (2014.01) |
| ***C09D 11/328*** | (2014.01) |
| ***C09D 11/38*** | (2014.01) |
| ***C09D 11/033*** | (2014.01) |
| ***C09D 11/037*** | (2014.01) |
| ***C09K 11/02*** | (2006.01) |
| *H01L 51/50* | (2006.01) |

(52) U.S. Cl.
CPC ............ *C09D 11/328* (2013.01); *C09D 11/36* (2013.01); *C09D 11/38* (2013.01); *C09D 11/50* (2013.01); *C09D 11/52* (2013.01); *C09K 11/025* (2013.01); *C09K 11/06* (2013.01); *H01L 51/006* (2013.01); *H01L 51/0061* (2013.01); *H01L 51/0094* (2013.01); *C09K 2211/1007* (2013.01); *C09K 2211/1011* (2013.01); *C09K 2211/1014* (2013.01); *C09K 2211/1022* (2013.01); *C09K 2211/1088* (2013.01); *H01L 51/0054* (2013.01); *H01L 51/0073* (2013.01); *H01L 51/5012* (2013.01)

(58) Field of Classification Search
CPC ....... C09D 11/52; C09K 11/025; C09K 11/06; C09K 2211/1007; C09K 2211/1011; C09K 2211/1014; C09K 2211/1022; C09K 2211/1088; H01L 51/0054; H01L 51/00; H01L 51/0058; H01L 51/006; H01L 51/0061; H01L 51/0073; H01L 51/0094; H01L 51/5012
See application file for complete search history.

(56) References Cited

U.S. PATENT DOCUMENTS

2012/0112169 A1* 5/2012 Mizuki et al. ....... C07D 307/91 257/40
2014/0326985 A1* 11/2014 Mizuki et al. ......... C09K 11/06 257/40

FOREIGN PATENT DOCUMENTS

| | | | |
|---|---|---|---|
| JP | 2004-356033 | A | 12/2004 |
| JP | 2011-231108 | A | 11/2011 |
| WO | 2006/070712 | A1 | 7/2006 |
| WO | 2009/084512 | A1 | 7/2009 |
| WO | 2010/122810 | A1 | 10/2010 |
| WO | 2013/077405 | A1 | 5/2013 |
| WO | 2013/077406 | A1 | 5/2013 |

* cited by examiner

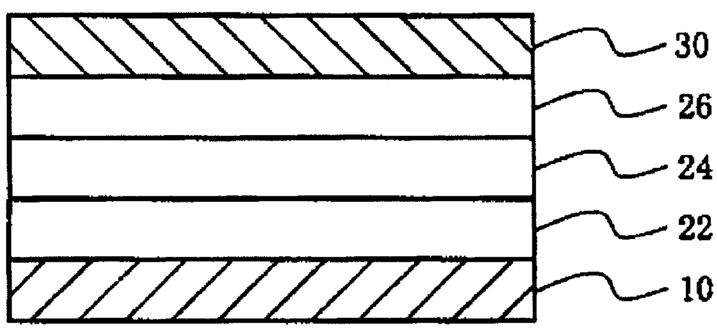
30
26
24
22
10

INK COMPOSITION, ORGANIC ELECTROLUMINESCENCE ELEMENT, AND ELECTRONIC APPARATUS

TECHNICAL FIELD

The present technology relates to an ink composition, an organic electroluminescence element including an organic thin film formed with use of the ink composition, and an electronic apparatus including the organic electroluminescence element.

BACKGROUND ART

Many luminescent low-molecular materials are slightly soluble, and film formation with use of the luminescent low-molecular materials is generally performed by vacuum evaporation. However, the vacuum evaporation method has many difficulties such as complicated process and need for a large evaporation apparatus. It is therefore desirable to easily form films of the luminescent materials by wet film formation.

Patent Literature 1 discloses an ink composition containing an organic material and a specific solvent that allows for coating as a technology of an ink composition that forms a light-emitting layer of an organic EL element. Patent Literature 2 discloses a luminescent ink composition for use of a wet process.

Moreover, for example, an anthracene derivative disclosed in Patent Literature 3 is known as a luminescent material used for a luminescent ink for coating film formation.

However, light emission efficiency of these ink compositions is not sufficient. An ink composition that makes it possible to achieve higher light emission efficiency is therefore desired.

CITATION LIST

Patent Literature

Patent Literature 1: Japanese Unexamined Patent Application Publication No. 2003-308969
Patent Literature 2: WO 2006/070712
Patent Literature 3: Japanese Unexamined Patent Application Publication No. 2004-224766

SUMMARY

It is therefore desirable to provide an ink composition that makes it possible to manufacture an organic EL element having superior light emission efficiency, an organic electroluminescence element, and an electronic apparatus each of which uses the ink composition.

According to an embodiment of the present technology, there are provided the followings such as an ink composition.

There is provided an ink composition including the following components (A), (B), and (C), the component (A) being an anthracene derivative represented by the following formula (A1):

[Chem. 1]

(A1)

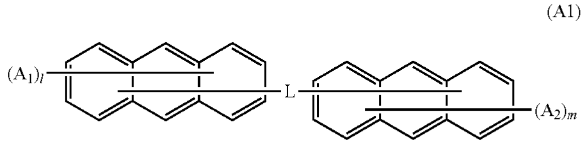

in the formula (A1), L is one of a single bond, a substituted or unsubstituted arylene group including 6 to 50 ring-forming carbon atoms, and a heteroarylene group including 5 to 50 ring-forming atoms, each of A1 and A2 is one of a substituted or unsubstituted aryl group including 6 to 50 ring-forming carbon atoms, and a heteroaryl group including 5 to 50 ring-forming atoms, each of l and m is an integer of 0 to 9, where when 1 is an integer of 2 or more, a plurality of A1's are the same as or different from one another, and when m is an integer of 2 or more, a plurality of A2's are the same as or different from one another.

The component (B) being an aromatic amine derivative represented by the following formula (B1):

[Chem. 2]

(B1)

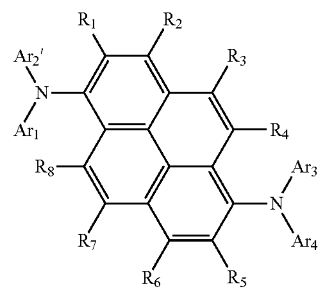

in the formula (B1), each of R1 to R8 is one of a hydrogen atom and a substituent group, and each of Ar1 to Ar4 is one of a substituted or unsubstituted aryl group including 6 to 30 ring-forming carbon atoms, and a substituted or unsubstituted heterocyclic group including 5 to 30 ring-forming atoms, where one or more of Ar1 to Ar4 are a heterocyclic group represented by the following formula (B1'),

[Chem. 3]

(B1')

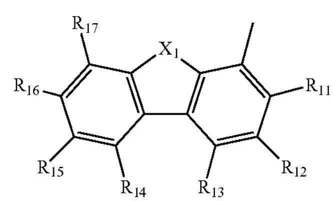

in the formula (B1'), each of R11 to R17 is one of a hydrogen atom and a substituent group, adjacent substituent groups in R11 to R17 optionally form a saturated or unsaturated ring, and X1 is one of an oxygen atom and a sulfur atom, and the component (C) being a solvent represented by the following formula (C1) and having a boiling point of 110° C. or higher and a solubility of 1 wt % or less in water:

[Chem. 4]

(C1)

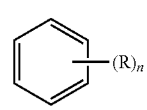

in the formula (C1), R is a substituent group, and n is an integer of 1 to 6 both inclusive, where when n is 2 or more, a plurality of R's are the same as or different from one another.

According to the present technology, it is possible to provide an ink composition that makes it possible to manufacture an organic EL element having superior light emission efficiency, and an organic electroluminescence element and an electronic apparatus each of which uses the ink composition.

BRIEF DESCRIPTION OF DRAWINGS

FIG. 1 is a cross-sectional view of an organic EL element according to an embodiment of the present technology.

MODE FOR CARRYING OUT THE INVENTION

An ink composition according to an embodiment of the present technology includes the following components (A), (B), and (C).

The component (A) is an anthracene derivative represented by a formula (A1).

The component (B) is an aromatic amine derivative represented by a formula (B1).

The component (C) is a solvent represented by a formula (C1) and having a boiling point of 110° C. or higher and a solubility of 1 wt % or less in water.

The ink composition including the foregoing components allows for thin film formation by a wet process, and an organic EL element including an organic thin film formed with use of the ink composition makes it possible to achieve high light emission efficiency.

As used herein, the term "number of ring-forming carbon atoms" refers to the number of carbon atoms in atoms forming a ring in a compound having a structure in which the atoms are bonded in the ring (for example, a monocyclic compound, a condensed cyclic compound, a cross-linked compound, a carbocyclic compound, or a heterocyclic compound). In a case in which the ring is substituted with a substituent group, the number of ring-forming carbon atoms does not include carbon contained in the substituent group. The term "number of ring-forming carbon atoms" to be described below is similar unless otherwise noted. For example, the number of ring-forming carbon atoms in a benzene ring is six. The number of ring-forming carbon atoms in a naphthalene ring is ten. The number of ring-forming carbon atoms in a pyridinyl group is five. The number of ring-forming carbon atoms in a furanyl group is four. Moreover, in a case in which a benzene ring or a naphthalene ring is substituted with, for example, an alkyl group as a substituent group, the number of ring-forming carbon atoms does not include the number of carbon atoms in the alkyl group. Further, in a case in which a fluorene ring is bonded with, for example, a fluorene ring as a substituent group (including a spirofluorene ring), the number of ring-forming carbon atoms does not include the number of carbon atoms in the fluorene ring as the substituent group.

As used herein, the term "number of ring-forming atoms" refers to the number of atoms forming a ring in a compound having a structure (for example, a single ring, a condensed ring, or a ring assembly) in which the atoms are bonded in the ring (for example, a monocyclic compound, a condensed cyclic compound, a cross-linked compound, a carbocyclic compound, or a heterocyclic compound). The number of ring-forming atoms does not include an atom not forming a ring (for example, a hydrogen atom that terminates a bond of atoms forming a ring) and an atom included in a substituent group in a case in which the ring is substituted with the substituent group. The term "number of ring-forming atoms" to be described below is similar unless otherwise noted. For example, the number of ring-forming atoms in a pyridine ring is six. The number of ring-forming atoms in a quinazoline ring is ten. The number of ring-forming atoms in a furan ring is five. The number of ring-forming atoms does not include a hydrogen atom that is bonded with each of carbon atoms of a pyridine ring or a quinazoline ring, and an atom forming a substituent group. Moreover, in a case in which a fluorene ring is bonded with, for example, a fluorene ring as a substituent group (including a spirofluorene ring), the number of ring-forming atoms does not include the number of atoms in the fluorene ring as the substituent group.

As used herein, the term "XX to YY carbon atoms" in a "substituted or unsubstituted ZZ group including XX to YY carbon atoms" refers to the number of carbon atoms in a case in which the ZZ group is unsubstituted, and does not include the number of carbon atoms in a substituent group in a case in which the ZZ group is substituted. Herein, "YY" is larger than "XX", and each of "XX" and "YY" means an integer of 1 or more.

As used herein, the term "XX to YY atoms" in a "substituted or unsubstituted ZZ group including XX to YY atoms" refers to the number of atoms in a case in which the ZZ group is unsubstituted, and does not include the number of atoms in a substituent group in a case in which the ZZ group is substituted. Herein, "YY" is larger than "XX, and each of "XX" and "YY" means an integer of 1 or more.

As used herein, the term "unsubstituted" in the term "substituted or unsubstituted" means being unsubstituted with the substituent group and being bonded with a hydrogen atom.

As used herein, the hydrogen atom may include isotopes having different neutron numbers, i.e., light hydrogen (protium), heavy hydrogen (deuterium), and tritiated hydrogen (tritium).

Hereinafter, description is given of the respective components.

[Component (A): Anthracene Derivative]

The component (A) is an anthracene derivative represented by the following formula (A1).

[Chem. 5]

(A1)

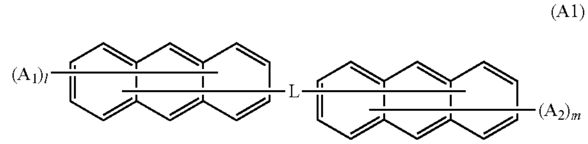

In the formula (A1), L is one of a single bond, a substituted or unsubstituted arylene group including 6 to 50 ring-forming carbon atoms, and a heteroarylene group including 5 to 50 ring-forming atoms, each of A1 and A2 is one of a substituted or unsubstituted aryl group including 6 to 50 ring-forming carbon atoms, and a heteroaryl group including 5 to 50 ring-forming atoms, each of l and m is an integer of 0 to 9, where when 1 is an integer of 2 or more, a plurality of A1's are the same as or different from one another, and when m is an integer of 2 or more, a plurality of A2's are the same as or different from one another.

In the formula (A1), L may be bonded at any bonding position in a three-membered ring of an anthracene skeleton. Moreover, each of A1 and A2 may be bonded at any bonding position in the three-membered ring of the anthracene skeleton.

In the foregoing formula (A1), each of l and m may be preferably an integer of 1 to 3, and more preferably 1.

The foregoing anthracene derivative may be preferably represented by the following formula (A2).

[Chem. 6]

(A2)

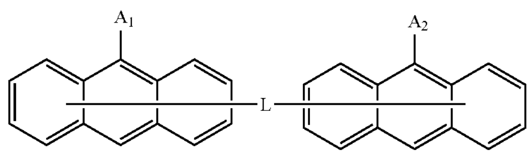

In the formula (A2), L, A1, and A2 are respectively the same as L, A1, and A2 in the foregoing formula (A1).

In the formula (A2), L may be bonded at any bonding position in the three-membered ring of the anthracene skeleton.

More preferably, the foregoing anthracene derivative may be represented by the following formula (A3).

[Chem. 7]

(A3)

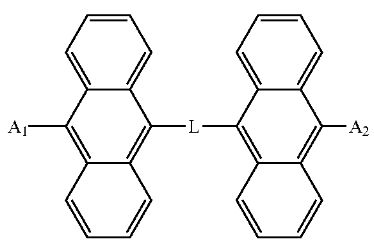

In the formula (A3), L, A1, and A2 are respectively the same as L, A1, and A2 in the foregoing formula (A1).

More preferably, the foregoing anthracene derivative may be represented by the following formula (A4).

[Chem. 8]

(A4)

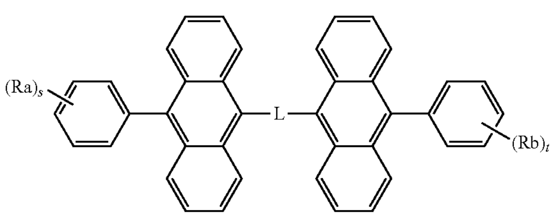

In the formula (A4), L is the same as L in the foregoing formula (A1), each of Ra and Rb is a substituent group, and each of s and t is an integer of 0 to 5. When s is an integer of 2 or more, a plurality of Ra's are the same as or different from one another, and when t is an integer of 2 or more, a plurality of Rb's are the same as or different from one another.

Each of s and t may be preferably an integer of 0 to 2.

The substituent group of each of Ra and Rb is one of a substituted or unsubstituted aryl group including 6 to 50 carbon atoms, a substituted or unsubstituted alkyl group including 1 to 50 carbon atoms, a substituted or unsubstituted alkoxy group including 1 to 50 carbon atoms, a substituted or unsubstituted aralkyl group including 7 to 50 carbon atoms, a substituted or unsubstituted aryloxy group including 5 to 50 ring-forming atoms, an halogen atom, and a cyano group.

Non-limiting examples of a substituent group in the "substituted or unsubstituted . . . " in the formulas (A1) to (A4) may include an alkyl group, an alkoxy group, an aralkyl group, an aryl group, an aryloxy group, a heteroaryl group, a halogen atom, and a cyano group.

These substituent groups may be further substituted with any of the foregoing substituent groups. Moreover, two or more of these substituent groups are optionally bonded to form a ring.

Specific examples of the respective groups in the foregoing formulas (A1) to (A4) may include the following groups.

Non-limiting examples of the aryl group including 6 to 50 ring-forming carbon atoms may include phenyl, 2-biphenylyl, 3-biphenylyl, 4-biphenylyl, terphenylyl, 3,5-diphenylphenyl, 3,5-di(1-naphthyl)phenyl, 3,5-di(2-naphthyl)phenyl, 3,4-diphenylphenyl, pentaphenylphenyl, 4-(2,2-diphenylvinyl)phenyl, 4-(1,2,2-triphenylvinyl)phenyl, fluorenyl, 1-naphthyl, 2-naphthyl, 4-(1-naphthyl)phenyl, 4-(2-naphthyl)phenyl, 3-(1-naphthyl)phenyl, 3-(2-naphthyl)phenyl, 9-anthryl, 2-anthryl, 9-phenanthryl, 1-pyrenyl, chrysenyl, naphthacenyl, and coronyl.

The arylene group including 6 to 50 ring-forming carbon atoms may be a bivalent group corresponding to the foregoing aryl group.

Non-limiting examples of the heteroaryl group including 5 to 50 ring-forming atoms may include a 1-pyrrolyl group, a 2-pyrrolyl group, a 3-pyrrolyl group, a pyrazinyl group, a pyrimidyl group, a pyridazyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, 1, 9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxazinyl group, a 2-phenoxazinyl group, a 3-phenoxazinyl group, a 4-phenoxazinyl group, a 10-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrole-1-yl group, a 2-methylpyrrole-3-yl group, a 2-methylpyrrole-4-yl group, a 2-methylpyrrole-5-yl group, a 3-methylpyrrole-1-yl group, a 3-methylpyrrole-2-yl group, a 3-methylpyrrole-4-yl group, a 3-methylpyrrole-5-yl group, a 2-t-butylpyrrole-4-yl group, a 3-(2-phenylpropyl) pyrrole-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, and a 4-t-butyl-3-indolyl group.

The heteroarylene group including 6 to 50 ring-forming atoms may be a bivalent group corresponding to the foregoing heteroaryl group.

Non-limiting examples of the substituted or unsubstituted alkyl group including 1 to 50 carbon atoms may include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a cyclopropyl group, a cyclobutyl group, a cyclopentyl group, a cyclohexyl group, a 4-methylcyclohexyl group, a 1-adamantyl group, a 2-adamantyl group, a 1-norbornyl group, and a 2-norbornyl group.

The substituted or unsubstituted alkoxy group including 1 to 50 carbon atoms is a group represented by —OY1. Non-limiting examples of Y1 may include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, and a 1,2,3-trinitropropyl group.

Non-limiting examples of the substituted or unsubstituted aralkyl group may include a benzyl group, a 1-phenylethyl group, a 2-phenylethyl group, a 1-phenylisopropyl group, a 2-phenylisopropyl group, a phenyl-t-butyl group, a α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, a 2-β-naphthylisopropyl group, a 1-pyrrolylmethyl group, a 2-(1-pyrrolyl)ethyl group, a p-methylbenzyl group, a m-methylbenzyl group, a o-methylbenzyl group, a p-chlorobenzyl group, a m-chlorobenzyl group, a o-chlorobenzyl group, a p-bromobenzyl group, a m-bromobenzyl group, a o-bromobenzyl group, a p-iodobenzyl group, a m-iodobenzyl group, a o-iodobenzyl group, a p-hydroxybenzyl group, an m-hydroxybenzyl group, an o-hydroxybenzyl group, a p-aminobenzyl group, an m-aminobenzyl group, an o-aminobenzyl group, a p-nitrobenzyl group, an m-nitrobenzyl group, an o-nitrobenzyl group, a p-cyanobenzyl group, an m-cyanobenzyl group, an o-cyanobenzyl group, a 1-hydroxy-2-phenylisopropyl group, and a 1-chloro-2-phenylisopropyl group.

The substituted or unsubstituted aryloxy group is represented by —OY'. Non-limiting examples of Y' may include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, a m-terphenyl-3-yl group, an m-terphenyl-2-yl group, a o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, a 4"-t-butyl-p-terphenyl-4-yl group, a 2-pyrrolyl group, a 3-pyrrolyl group, a pyrazinyl group, a 2-pyridinyl group, a 3-pyridinyl group, a 4-pyridinyl group, a 2-indolyl group, a 3-indolyl group, a 4-indolyl group, a 5-indolyl group, a 6-indolyl group, a 7-indolyl group, a 1-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a 2-quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 1-phenoxazinyl group, a 2-phenoxazinyl group, a 3-phenoxazinyl group, a 4-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrole-1-yl group, a 2-methylpyrrole-3-yl group, a 2-methylpyrrole-4-yl group, a 2-methylpyrrole-5-yl group, a 3-methylpyrrole-1-yl group, a 3-methylpyrrole-2-yl group, a 3-methylpyrrole-4-yl group, a 3-methylpyrrole-5-yl group, a 2-t-butylpyrrole-4-yl group, a 3-(2-phenylpropyl)pyrrole-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, and a 4-t-butyl-3-indolyl group.

Specific examples of the anthracene derivative are as follows.

[Chem. 9]

H-1

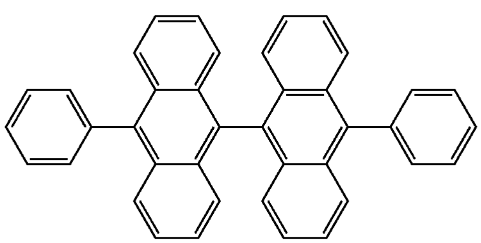

H-2

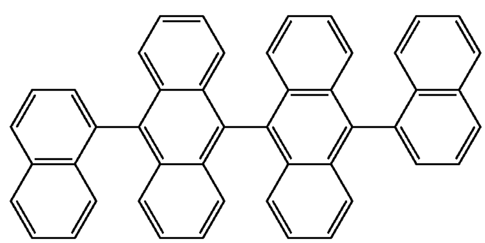

H-3

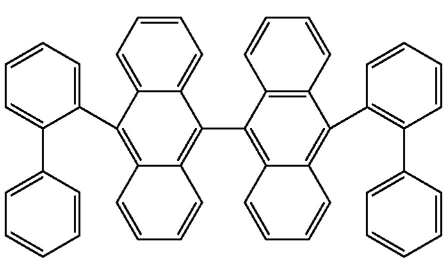

H-4

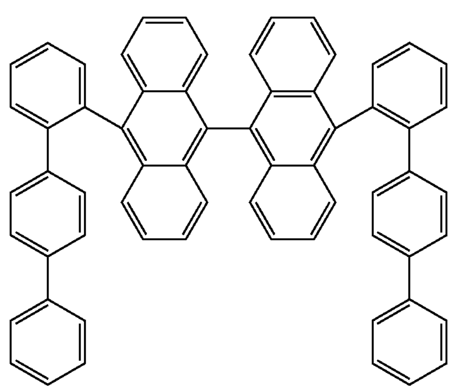

-continued
H-5
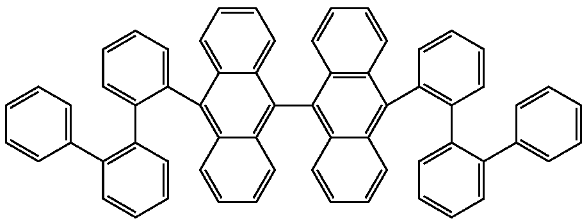
H-6
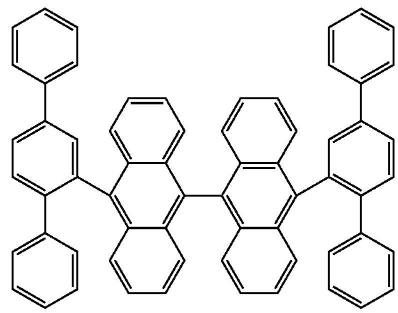
H-7
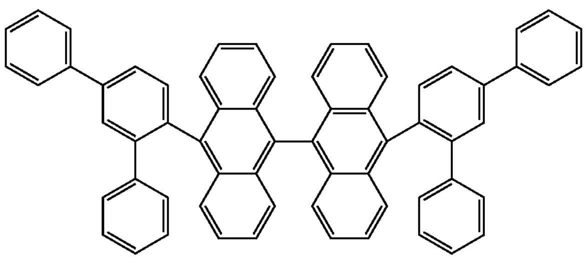
H-8
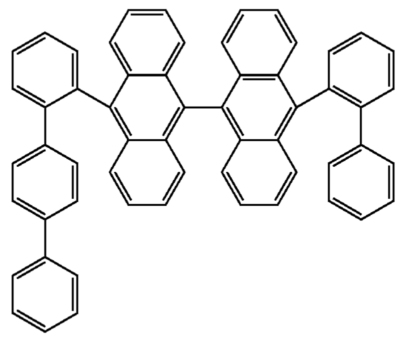
H-9
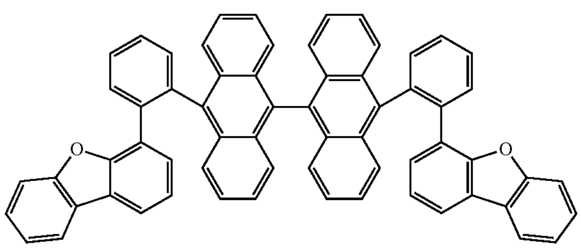
H-10
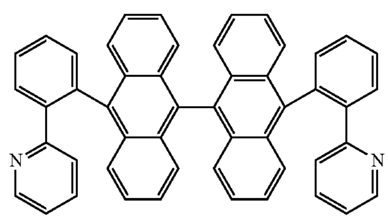
H-11
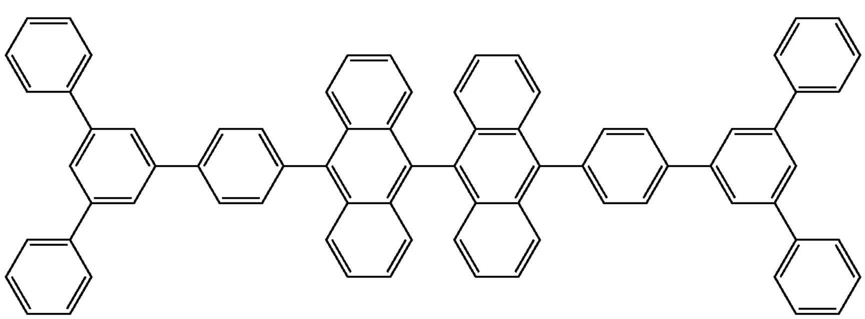
H-12
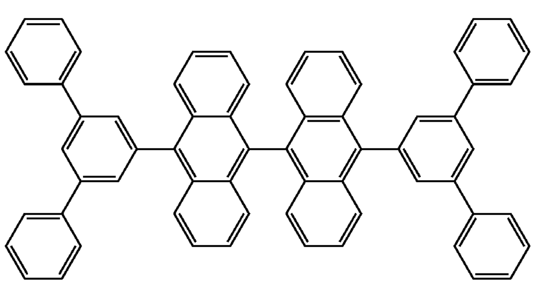
H-13
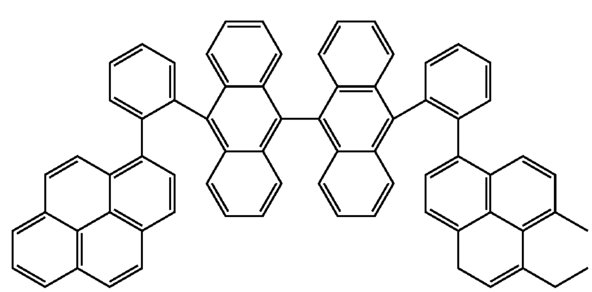

-continued
[Chem. 10]
H-14
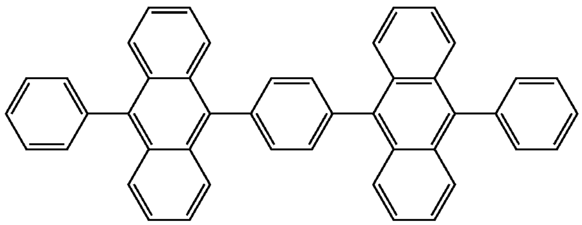
H-15
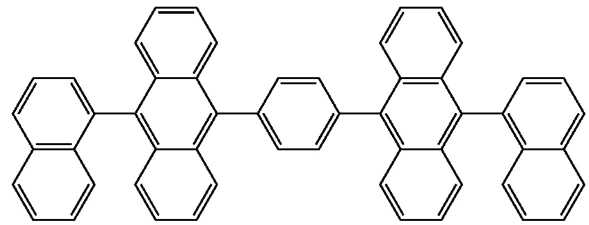
H-16
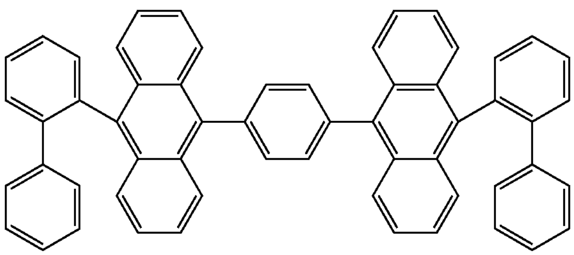
H-17
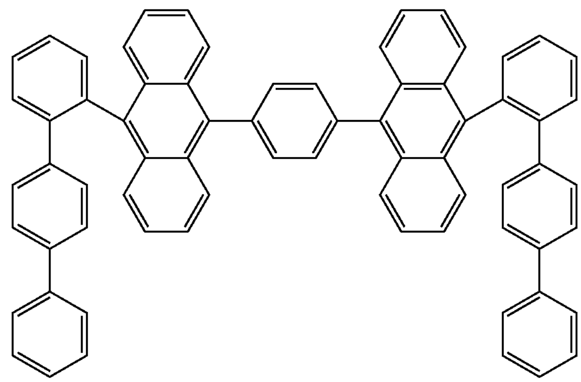
H-18
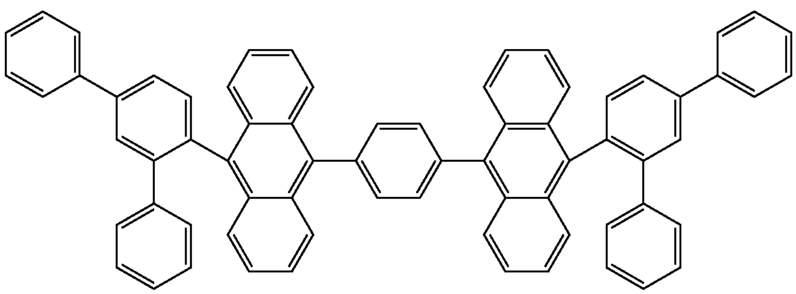
H-19
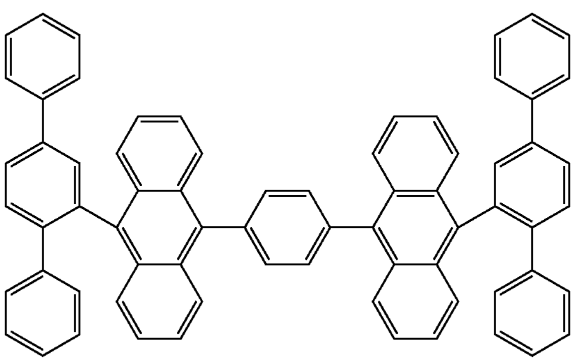
H-20
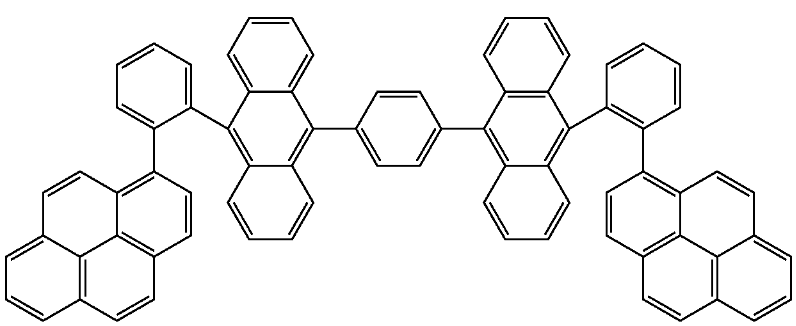

-continued
H-21
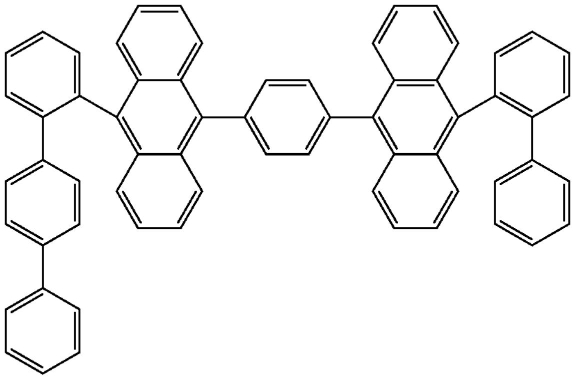
H-22
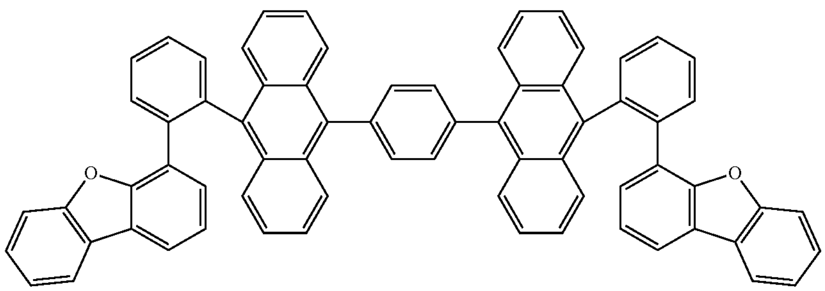
H-23
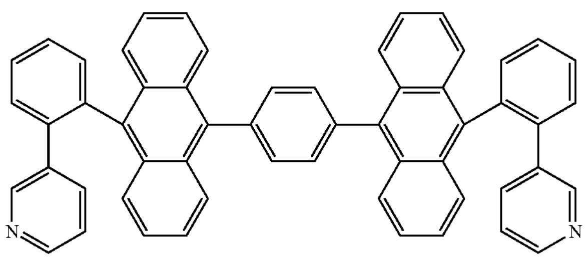
[Chem. 11]
H-24
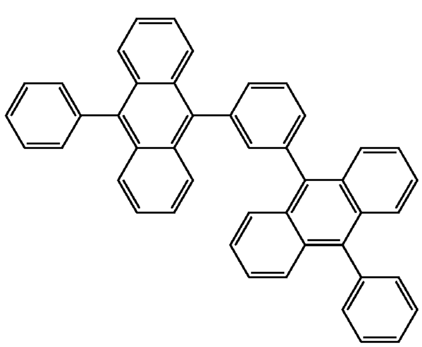
H-25
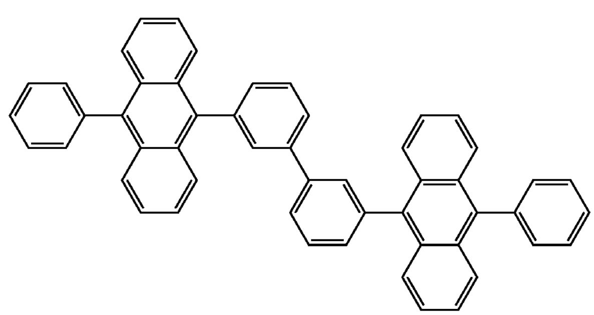

-continued
H-26
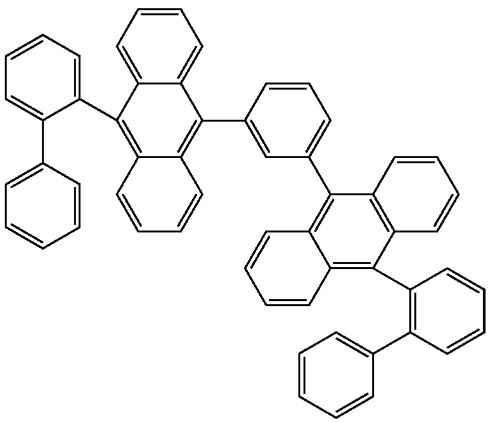
H-27
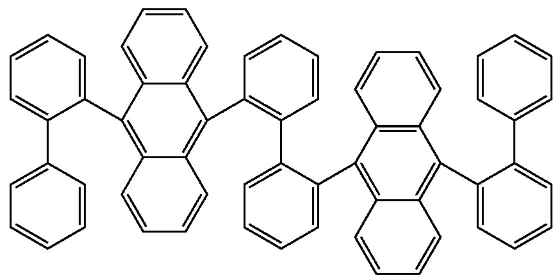
H-28
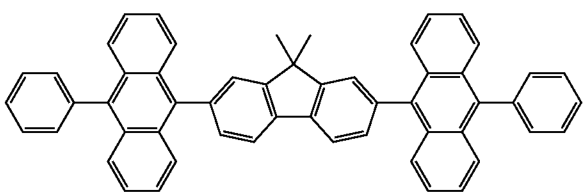
H-29
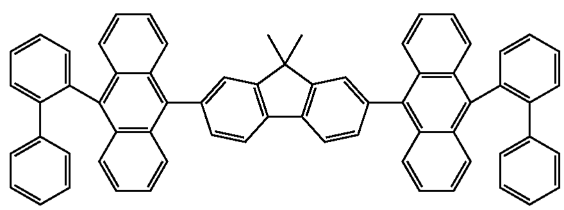
H-30
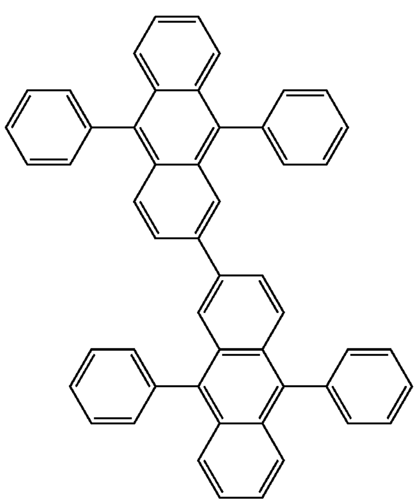
H-31
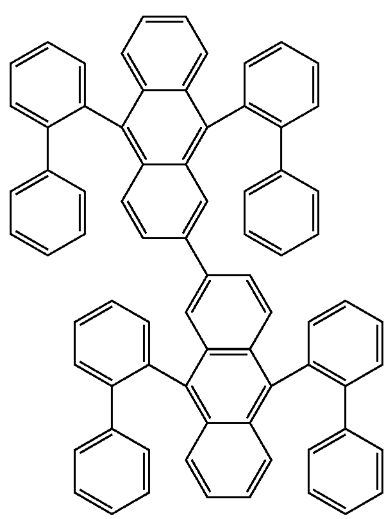

-continued

H-33

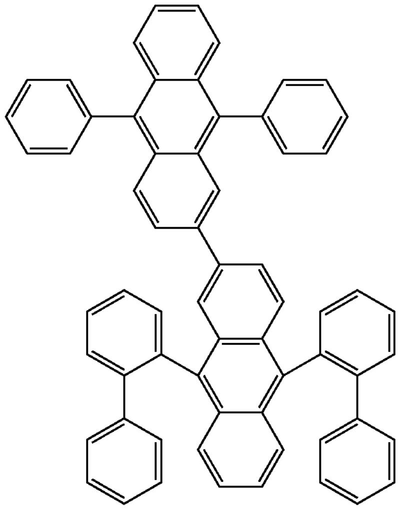

The anthracene derivative as the component (A) may preferably have a high glass transition temperature (Tg). The high glass transition temperature may be preferable in a case in which the anthracene derivative is used as a host material of an organic EL element.

The glass transition temperature may be preferably 135° C. or higher, and more preferably 140° C. or higher. The glass transition temperature is measured with use of a differential scanning calorimeter.

The glass transition temperatures of specific compounds are as follows.

H-3 (Tg=141° C.), H-4 (Tg=157° C.), H-26 (Tg=150° C.), H-27 (Tg=158° C.), BHa (Tg=130° C.)

[Component (B): Aromatic Amine Derivative]

The component (B) is an aromatic amine derivative represented by the following formula (B1).

[Chem. 12]

(B1)

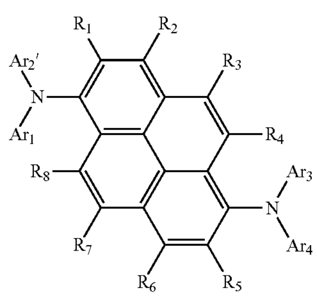

In the formula (B1), each of R1 to R8 is one of a hydrogen atom and a substituent group, and each of Ar1 to Ar4 is one of a substituted or unsubstituted aryl group including 6 to 30 ring-forming carbon atoms, and a substituted or unsubstituted heterocyclic group including 5 to 30 ring-forming atoms.

Further, one or more of Ar1 to Ar4 are a heterocyclic group represented by the following formula (B1').

[Chem. 13]

(B1')

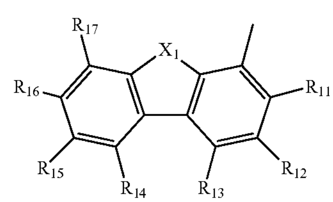

In the formula (B1'), each of R11 to R17 is one of a hydrogen atom and a substituent group, and adjacent substituent groups in R11 to R17 optionally form a saturated or unsaturated ring. X1 is one of an oxygen atom and a sulfur atom.

In the formula (B1), two of Ar1 to Ar4 may be preferably heterocyclic groups represented by the formula (B1'). Moreover, X1 may be preferably an oxygen atom.

The aromatic amine derivative may be preferably represented by the following formula (B2).

[Chem. 14]

(B2)

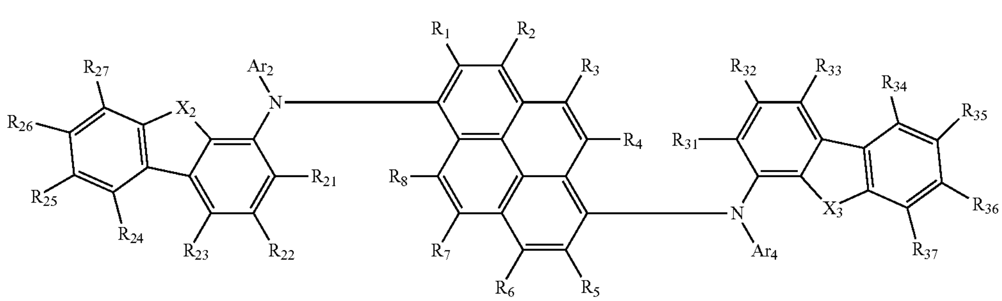

In the formula (B2), R1 to R8, Ar2, and Ar4 are respectively the same as R1 to R8, Ar2, and Ar4 in the formula (B1).

Each of R21 to R27 and R31 to R37 is one of a hydrogen atom and a substituent group, and adjacent substituent groups in R21 to R27, and R31 to R37 optionally form a saturated or unsaturated ring.

Each of X2 and X3 is one of an oxygen atom and a sulfur atom.

Non-limiting examples of the substituent groups of R1 to R8, R11 to R17, R21 to R27, and R31 to R37 may include a halogen atom, a substituted or unsubstituted alkyl group including 1 to 20 carbon atoms, a substituted or unsubstituted cycloalkyl group including 3 to 10 ring-forming carbon atoms, a substituted or unsubstituted silyl group, a cyano group, and a substituted or unsubstituted aryl group including 6 to 30 carbon atoms.

In the foregoing formula (B2), each of Ar2 and Ar4 may be preferably a substituted or unsubstituted aryl group including 6 to 30 ring-forming carbon atoms, and more preferably a substituted or unsubstituted phenyl group.

Each of R1 to R8 may be a hydrogen atom. R2 may be one of a halogen atom, a substituted or unsubstituted alkyl group including 1 to 20 carbon atoms, a substituted or unsubstituted cycloalkyl group including 3 to 10 ring-forming carbon atoms, a substituted or unsubstituted silyl group, and a substituted or unsubstituted aryl group including 6 to 30 ring-forming carbon atoms. Each of R1, and R3 to R8 may be a hydrogen atom, and each of R2 and R6 may be one of a halogen atom, a substituted or unsubstituted alkyl group including 1 to 20 carbon atoms, a substituted or unsubstituted cycloalkyl group including 3 to 10 ring-forming carbon atoms, a substituted or unsubstituted silyl group, and a substituted or unsubstituted aryl group including 6 to 30 ring-forming carbon atoms. Each of R1, R3, R4, R5, R7, and R8 may be a hydrogen atom.

Each of X2 and X3 may be preferably an oxygen atom.

Non-limiting examples of the substituent group in the "substituted or unsubstituted . . . " in the formulas (B1) and (B2) may include an alkyl group, a substituted or unsubstituted silyl group, an alkoxy group, an aryl group, an aryloxy group, an aralkyl group, a cycloalkyl group, a heterocyclic group, a halogen atom, a halogenated alkyl group, a hydroxy group, a nitro group, a cyano group, and a carboxylic group.

These substituent groups may be further substituted with any of the foregoing substituent groups. Moreover, two or more of these substituent groups are optionally bonded to form a ring.

Specific examples of the respective groups in the foregoing formulas (B1) and (B2) are as follows.

Non-limiting examples of the alkyl group may include a methyl group, an ethyl group, a propyl group, an isopropyl group, an n-butyl group, an s-butyl group, an isobutyl group, a t-butyl group, an n-pentyl group, an n-hexyl group, an n-heptyl group, and an n-octyl group. The alkyl group may be a substituent group in which an alkylene group, and an aryl group or any other group are combined (such as a phenylmethyl group and a 2-phenyl isopropyl group, for example).

The number of carbon atoms described above may be preferably 1 to 10, and more preferably 1 to 6. In particular, a methyl group, an ethyl group, a propyl group, an isopropyl group, an n-butyl group, an s-butyl group, an isobutyl group, a t-butyl group, a n-pentyl group, and an n-hexyl group may be preferable.

Non-limiting examples of the substituted silyl group may include an alkylsilyl group including 3 to 30 carbon atoms, and an arylsilyl group including 8 to 30 ring-forming carbon atoms, and may include a trimethylsilyl group, a triethylsilyl group, a t-butyldimethylsilyl group, a vinyldimethylsilyl group, a propyldimethylsilyl group, a triisopropylsilyl group, and a triphenylsilyl group.

The alkoxy group is represented by —OY, and examples of Y may include the foregoing examples of alkyl. Examples of the alkoxy group may include a methoxy group and an ethoxy group.

An alkenyl group and an alkynyl group as R11 to R17, R21 to R27, R31 to R37, and R41 to 48 may be preferably a vinyl group and an ethynyl group, respectively.

Non-limiting examples of the aryl group may include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a naphthacenyl group, a pyrenyl group, a chrysenyl group, a benzo[c]phenanthryl group, a benzo[g]chrysenyl group, a triphenylenyl group, a 1-fluorenyl group, a 2-fluorenyl group, a 3-fluorenyl group, a 4-fluorenyl group, a 9-fluorenyl group, a benzofluorenyl group, a dibenzofluorenyl group, a 2-biphenylyl group, a 3-biphenylyl group, a 4-biphenylyl group, a terphenyl group, and a fluoranthenyl group.

The aryl group described as R1 to R8 may preferably include 6 to 20 ring-forming carbon atoms, and more preferably 6 to 12 ring-forming carbon atoms. A phenyl group, a biphenyl group, a tolyl group, a xylyl group, and a 1-naphthyl group may be particularly preferable in the foregoing aryl groups.

The aryloxy group is represented by —OZ, and examples of Z may include the foregoing aryl groups, and examples of a monocyclic group and a condensed ring group that are to be described later. The aryloxy group may be a phenoxy group, for example.

The aralkyl group is represented by —Y—Z. Examples of Y may include examples of alkylene corresponding to the foregoing examples of alkyl, and examples of Z may include the foregoing examples of aryl. The aralkyl group may be preferably an aralkyl group including 7 to 50 carbon atoms (where an aryl moiety includes 6 to 49 carbon atoms (preferably 6 to 30 carbon atoms, more preferably 6 to 20 carbon atoms, and particularly preferably 6 to 12 carbon atoms) and an alkyl moiety includes 1 to 44 carbon atoms (preferably 1 to 30 carbon atoms, more preferably 1 to 20 carbon atoms, more preferably 1 to 10 carbon atoms, and particularly preferably 1 to 6 carbon atoms)). Examples of the aralkyl group may include a benzyl group, a phenylethyl group, and a 2-phenylpropane-2-yl group.

Non-limiting examples of the cycloalkyl group may include a cyclopropyl group, a cyclobutyl group, a cyclopentyl group, a cyclohexyl group, a 4-methylcyclohexyl group, an adamantyl group, and a norbornyl group. The cycloalkyl group may preferably include 3 to 10 ring-forming carbon atoms. The cycloalkyl group may more preferably include 5 to 8 ring-forming carbon atoms or may more preferably include 3 to 8 ring-forming carbon atoms. The cycloalkyl group may particularly preferably include 3 to 6 ring-forming carbon atoms.

Non-limiting examples of the heterocyclic group may include a pyrrolyl group, a pyrazinyl group, a pyridinyl group, an indolyl group, an isoindolyl group, an imidazolyl group, a furyl group, a benzofuranyl group, a isobenzofuranyl group, a 1-dibenzofuranyl group, a 2-dibenzofuranyl group, a 3-dibenzofuranyl group, a 4-dibenzofuranyl group, a 1-dibenzothiophenyl group, a 2-dibenzothiophenyl group, a 3-dibenzothiophenyl group, a 4-dibenzothiophenyl group, a quinolyl group, an isoquinolyl group, a quinoxalinyl group, a 1-carbazolyl group, a 2-carbazolyl group, a 3-carbazolyl group, a 4-carbazolyl group, a 9-carbazolyl group, a phenanthridinyl group, an acridinyl group, a phenanthrolinyl group, a phenazinyl group, a phenothiazinyl group, a phenoxazinyl group, an oxazolyl group, an oxadiazolyl group, a furazanyl group, a thienyl group, and a benzothiophenyl group.

The foregoing heterocyclic group may preferably include 5 to 20 ring-forming atoms, and more preferably 5 to 14 ring-forming atoms.

The heterocyclic group may be preferably one of a 1-dibenzofuranyl group, a 2-dibenzofuranyl group, a 3-dibenzofuranyl group, a 4-dibenzofuranyl group, a 1-dibenzothiophenyl group, a 2-dibenzothiophenyl group, a 3-dibenzothiophenyl group, a 4-dibenzothiophenyl group, a 1-carbazolyl group, a 2-carbazolyl group, a 3-carbazolyl group, a 4-carbazolyl group, and a 9-carbazolyl group.

Non-limiting examples of the halogen atom may include fluorine, chlorine, bromine, and iodine, and a preferable halogen atom may be a fluorine atom.

Non-limiting examples of the halogenated alkyl group may include a fluoromethyl group, a difluoromethyl group, a trifluoromethyl group, a fluoroethyl group, and a trifluoromethylmethyl group.

Specific examples of the aromatic amine derivative are as follows.

[Chem. 15]

D-1

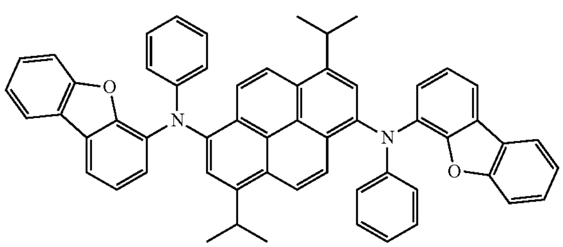

D-2

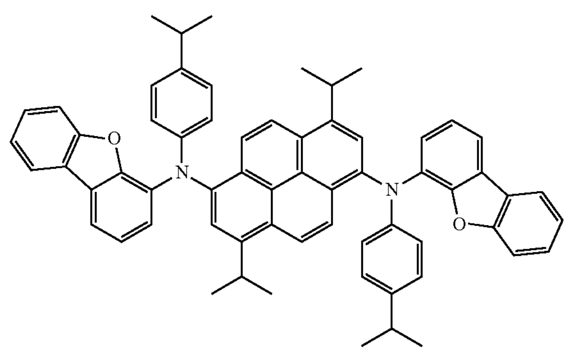

D-3

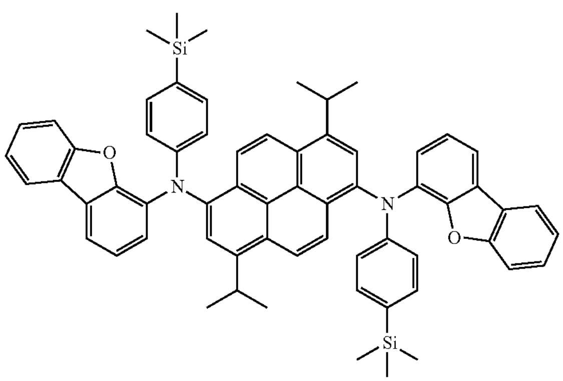

D-4

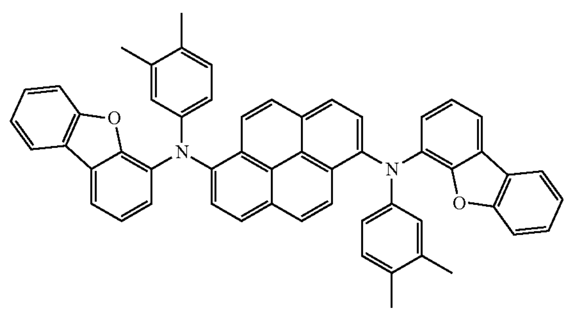

D-5

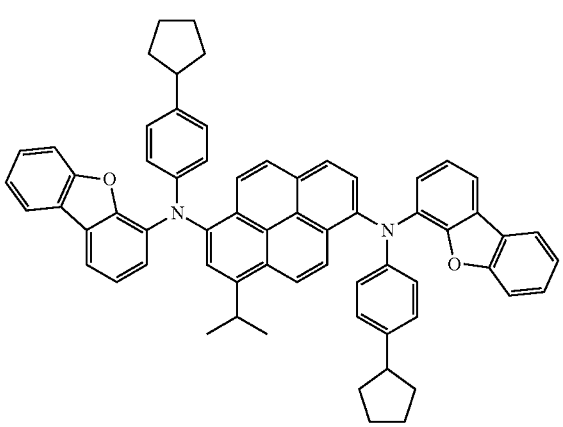

D-6

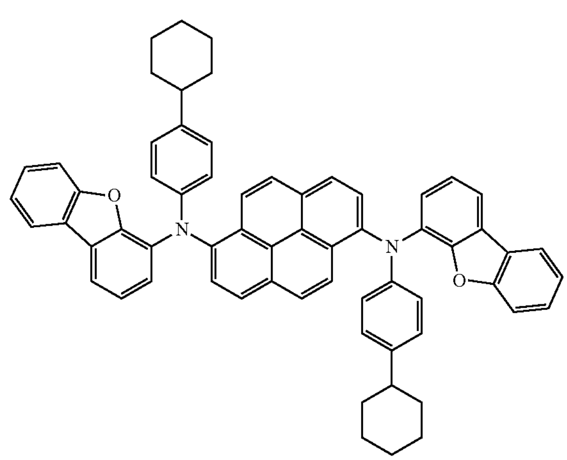

-continued
D-7
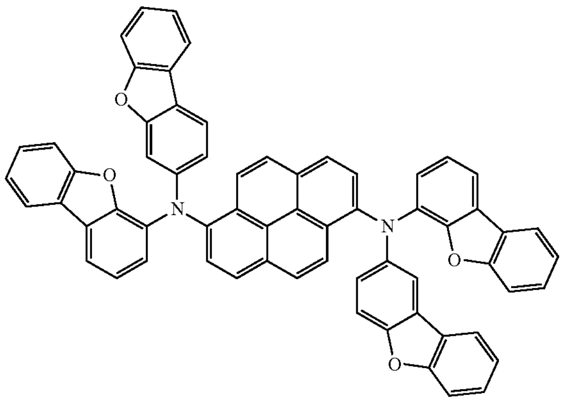
D-8
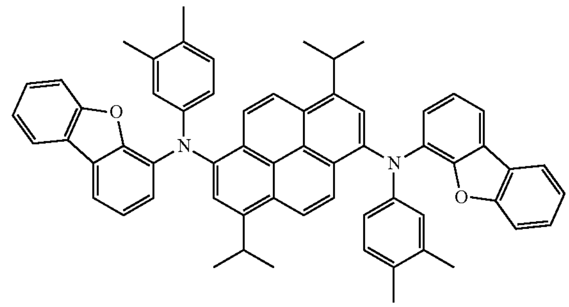
D-9
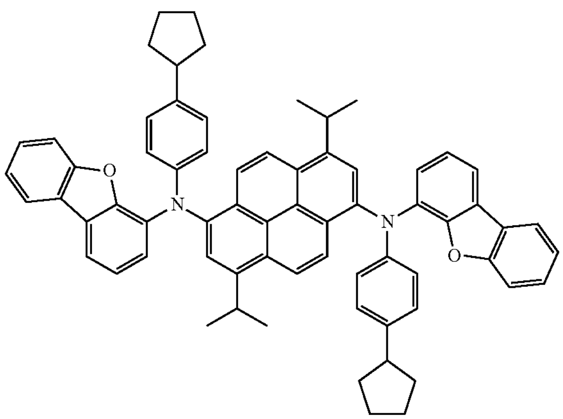
[Chem. 16]
D-10
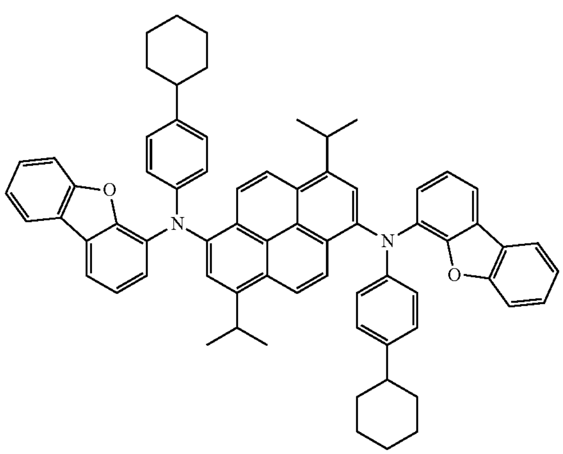
D-11
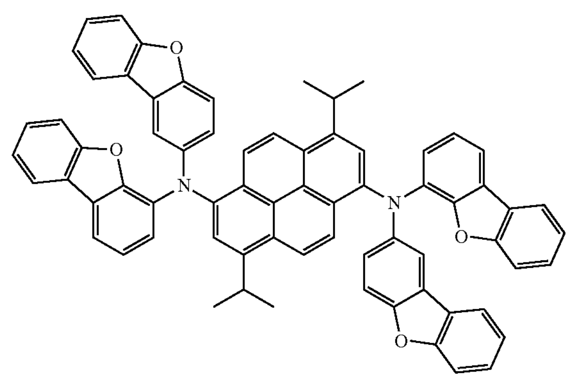
D-12
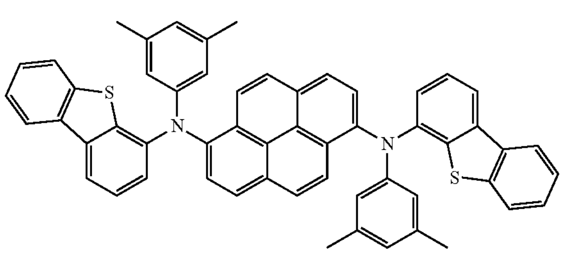
D-13
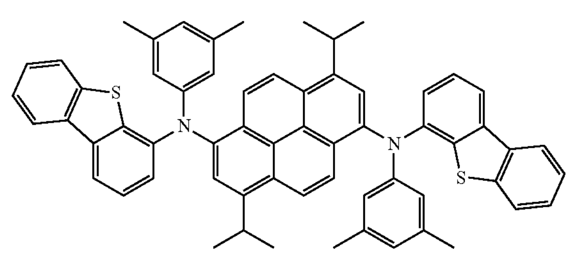

-continued
D-14
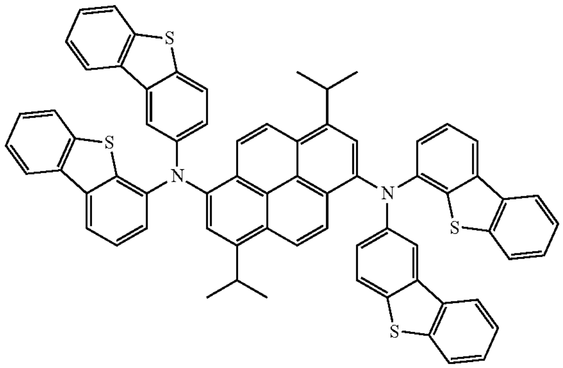
D-15
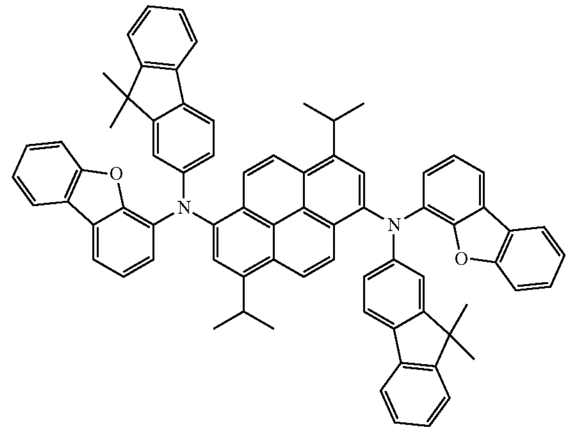
D-16
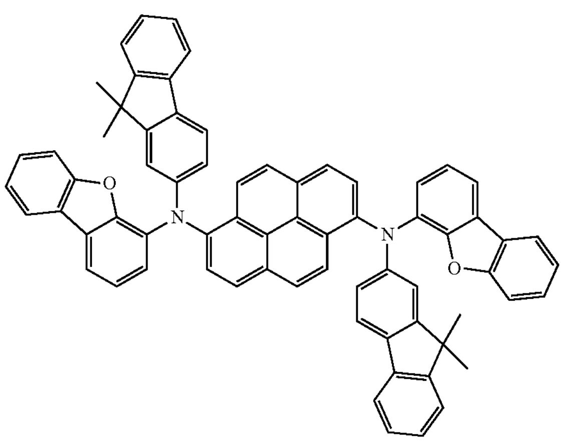
D-17
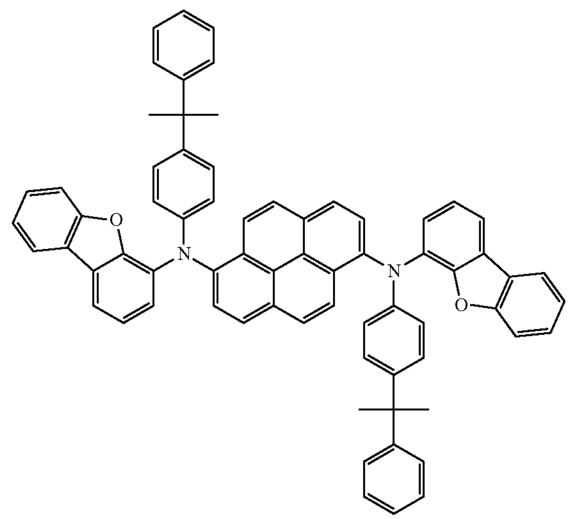
[Chem. 17]
D-18
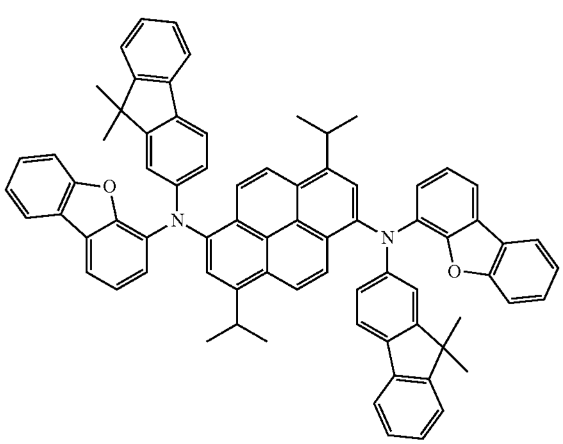
D-19
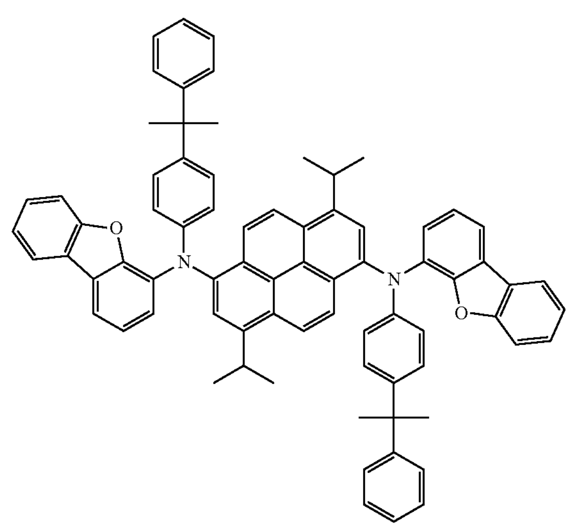

-continued
D-20
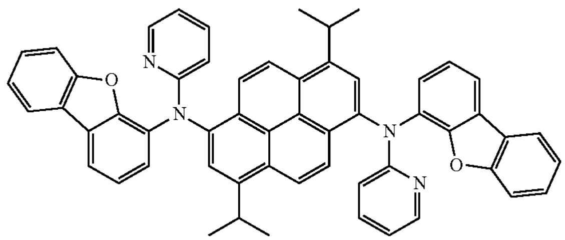
D-21
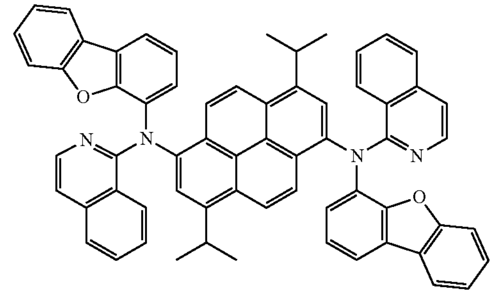
D-22
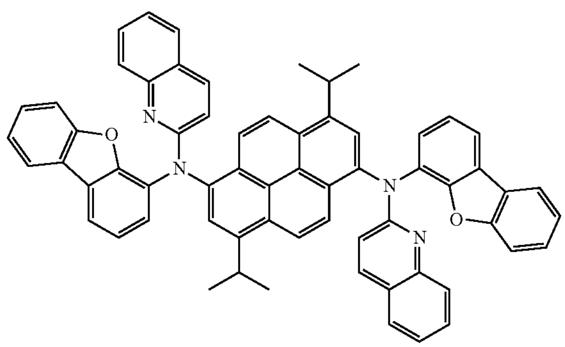
D-23
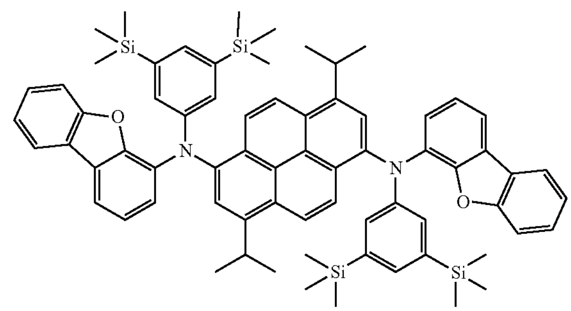
D-24
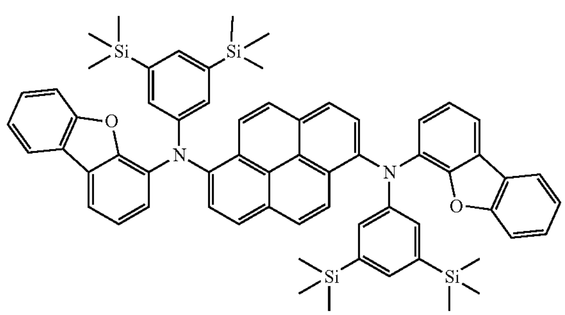
D-25
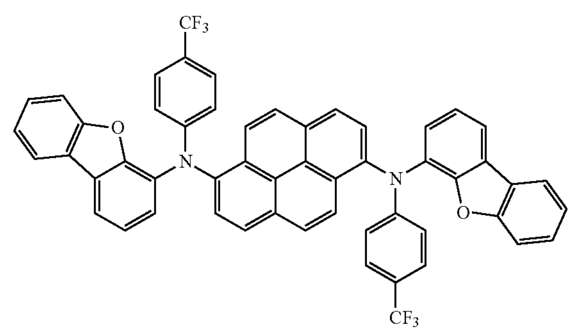
[Chem. 18]
D-26
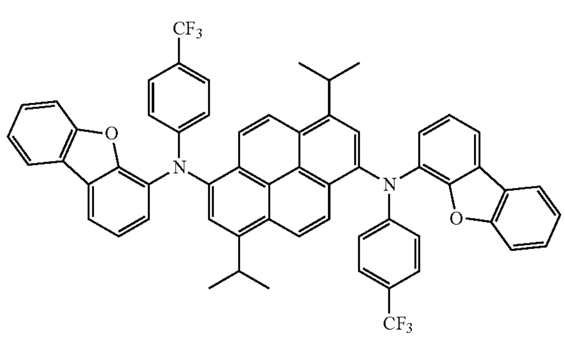
D-27
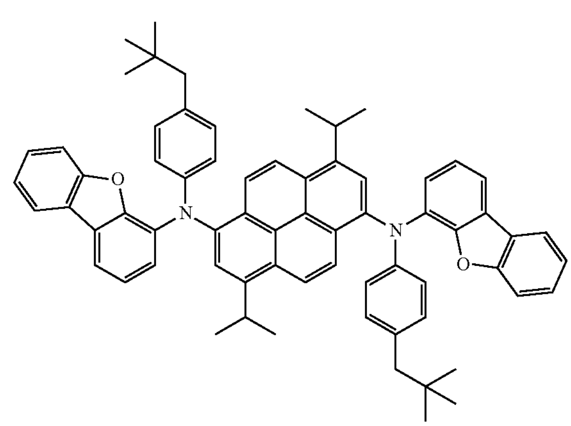

-continued
D-28
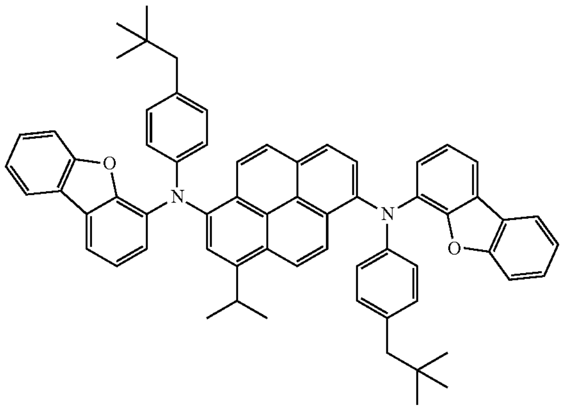
D-29
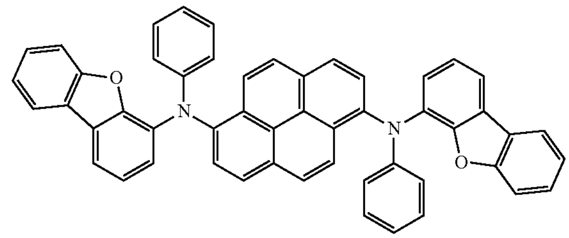
D-30
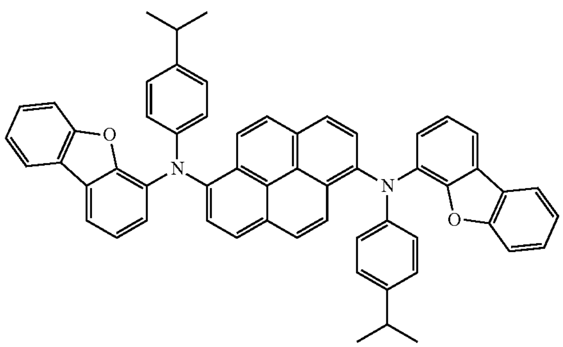
D-31
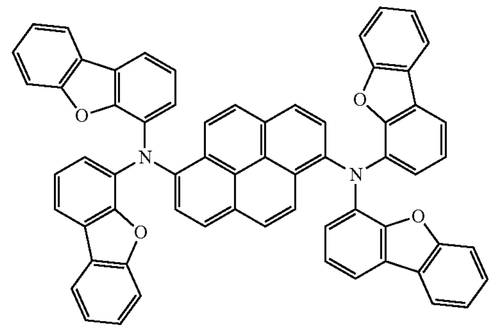
D-32
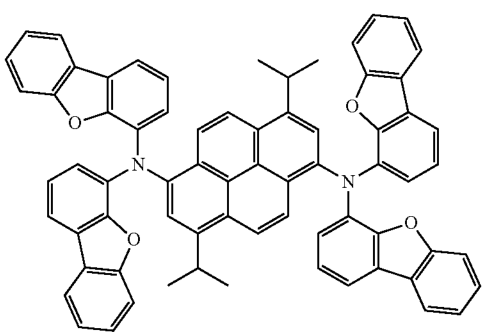
D-33
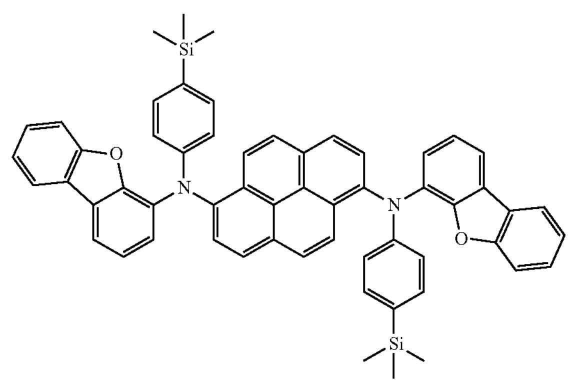
[Chem. 19]
D-34
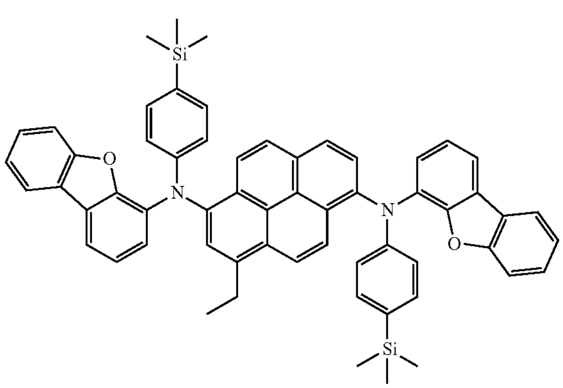
D-35
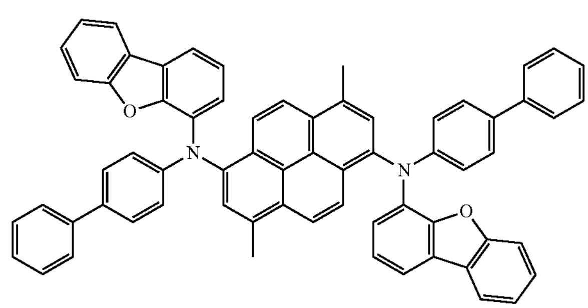

-continued
D-36
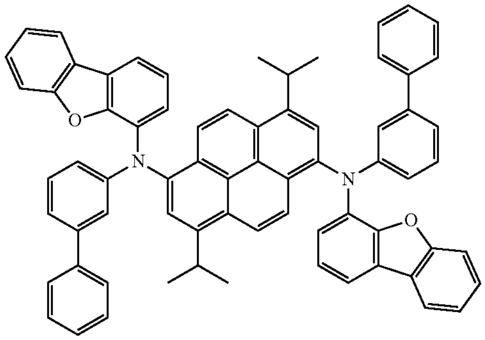
D-37
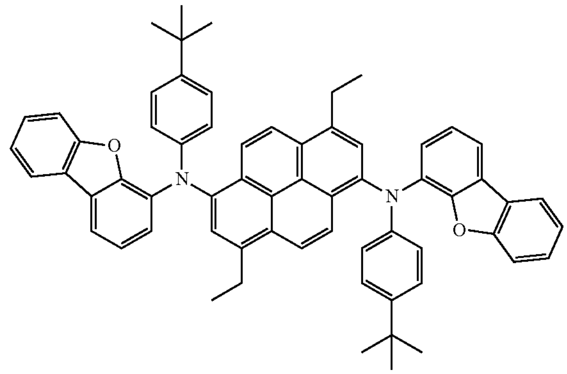
D-38
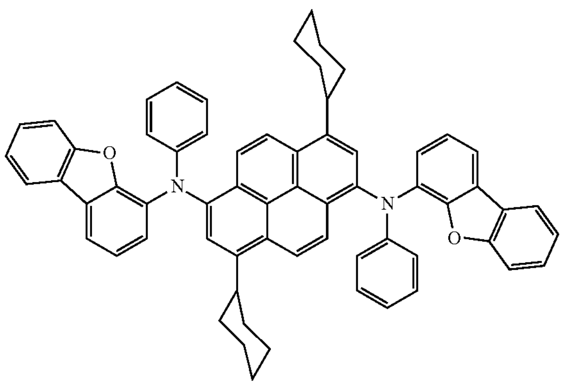
D-39
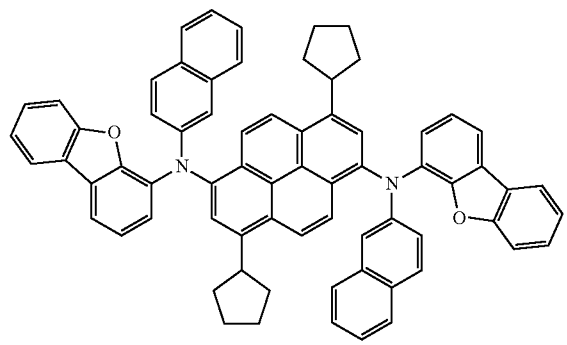
D-40
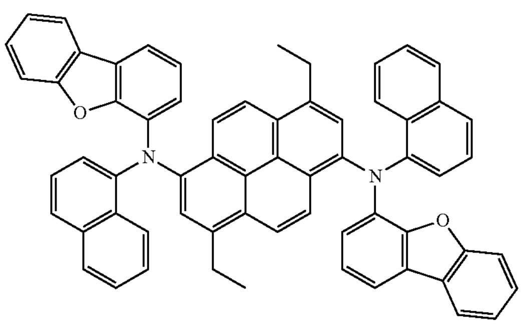
D-41
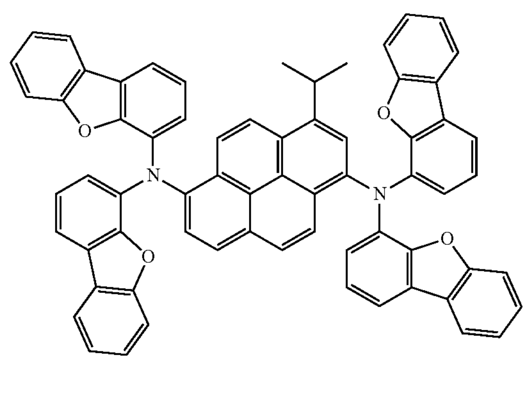
[Chem. 20]
D-42
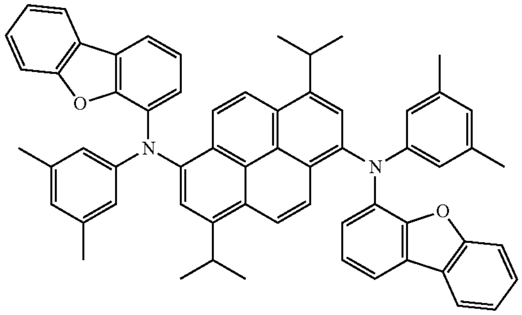
D-43
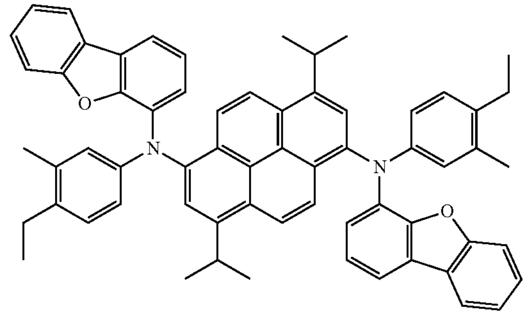

-continued
D-44
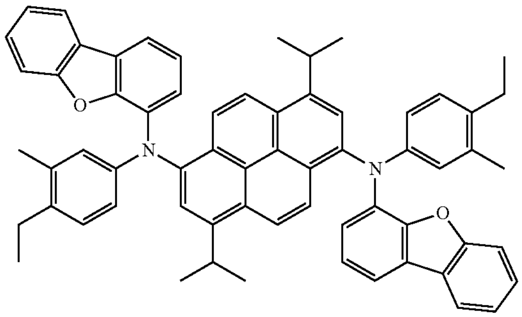
D-45
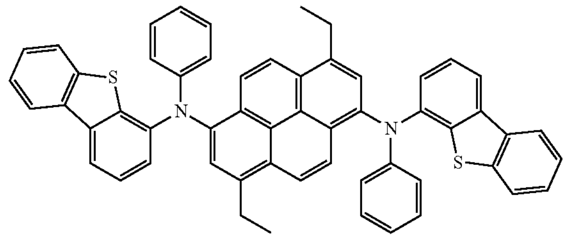
D-46
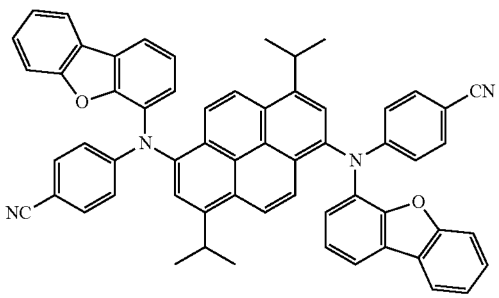
D-47
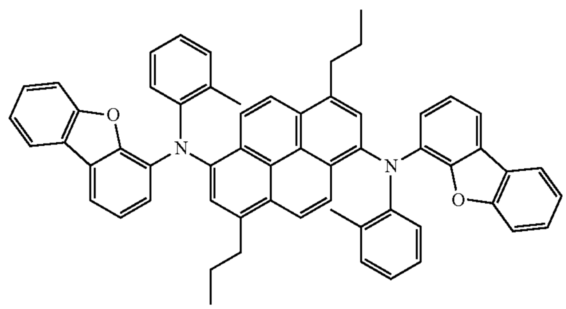
D-48
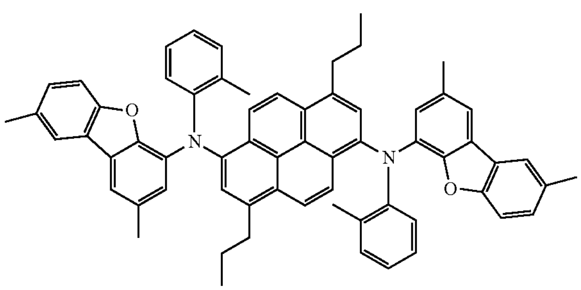
D-49
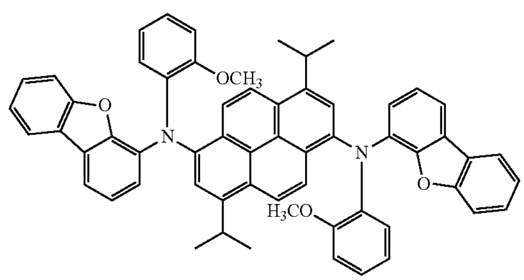
[Chem. 21]
D-50
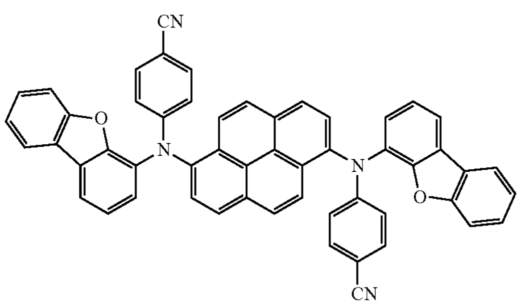
D-51
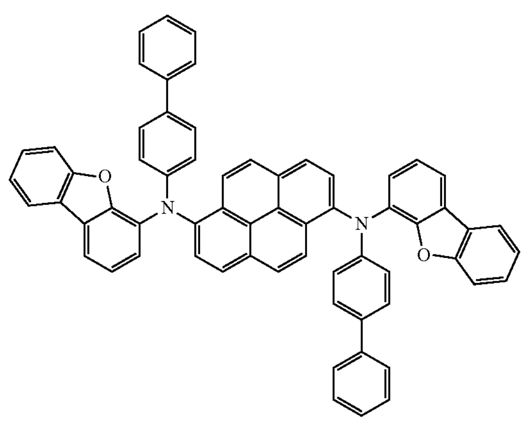

-continued
D-52
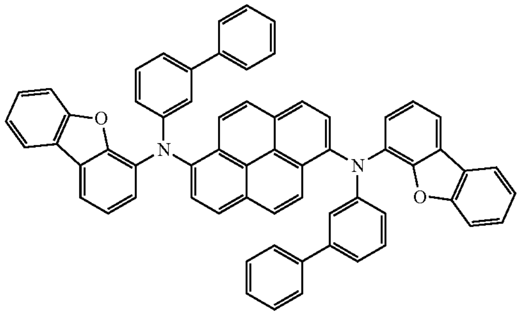
D-53
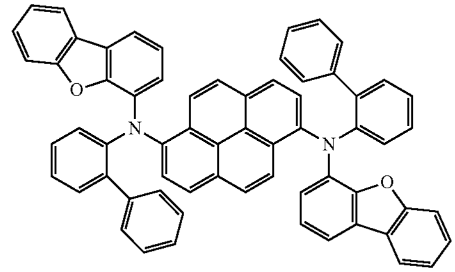
D-54
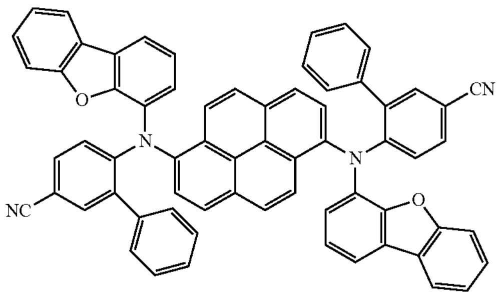
D-55
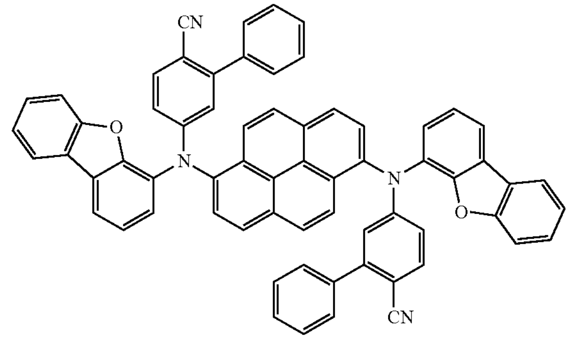
D-56
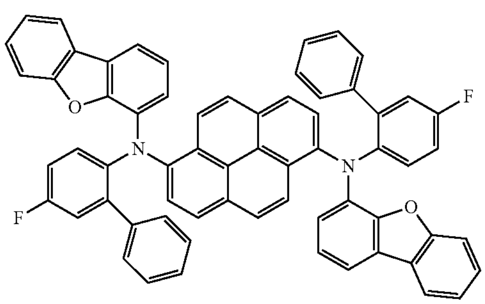
D-57
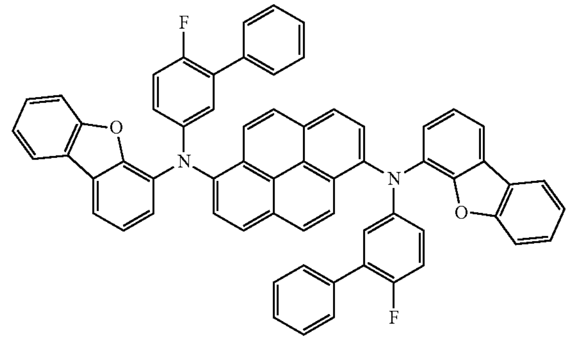
[Chem. 22]
D-58
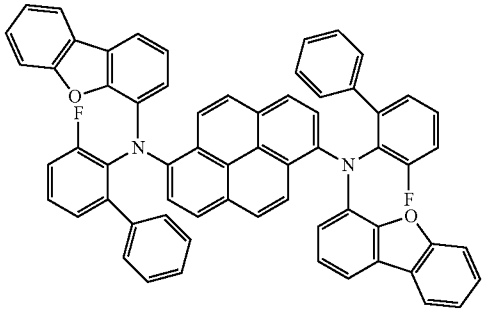
D-59
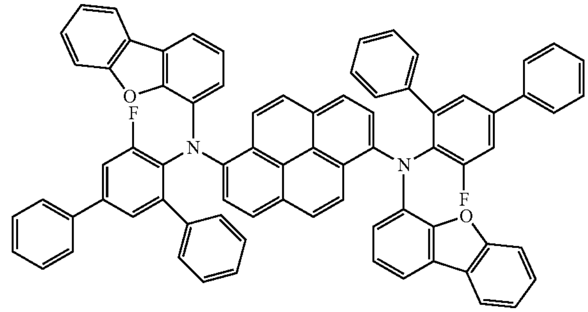

-continued
D-60
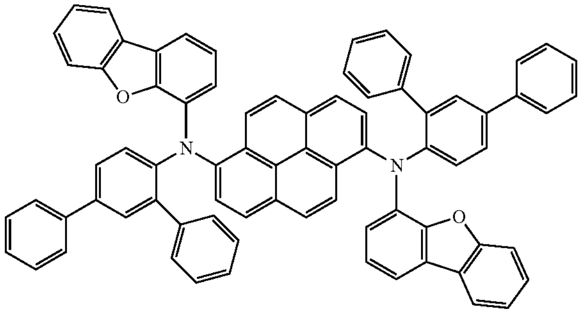
D-61
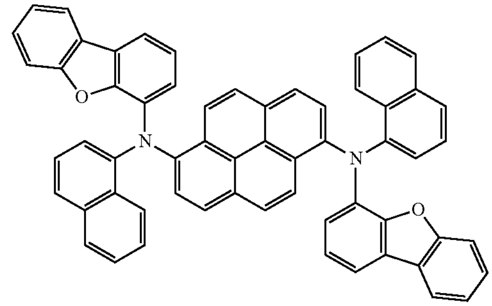
D-62
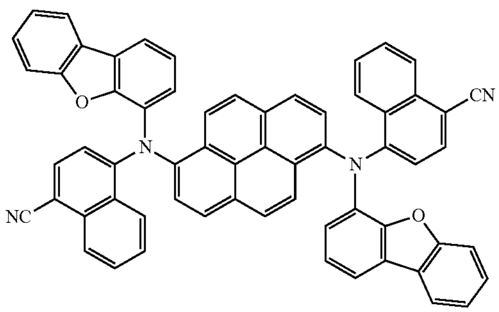
D-63
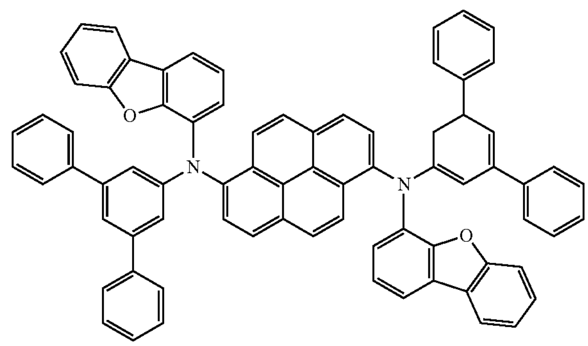
D-64
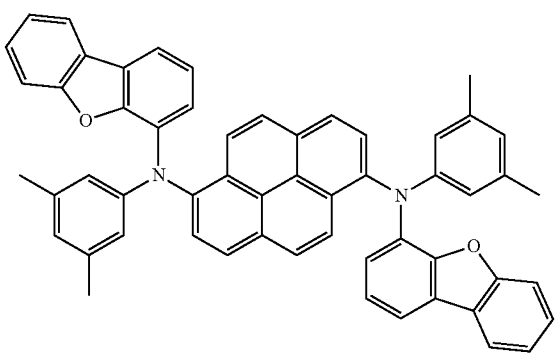
D-65
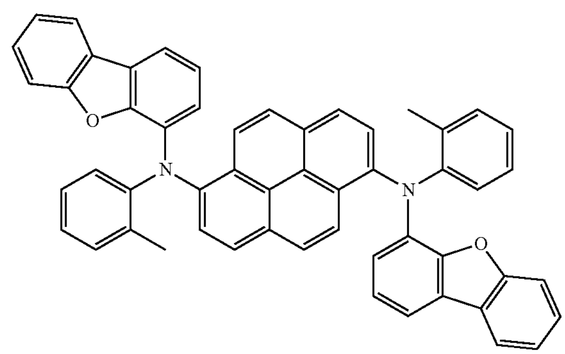
[Chem. 23]
D-66
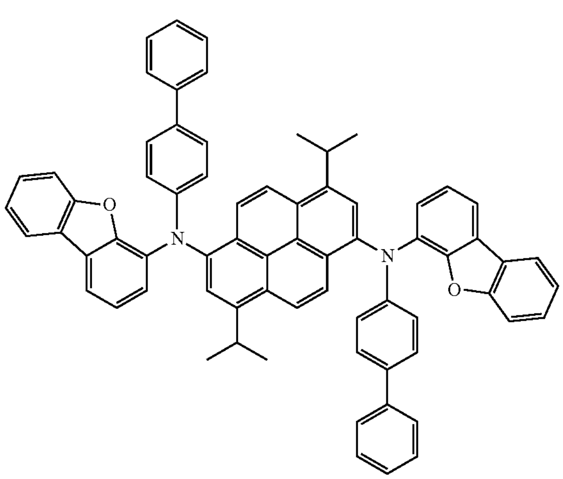
D-67
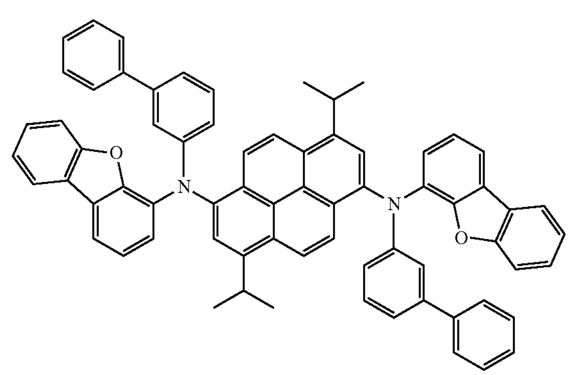

-continued
D-68
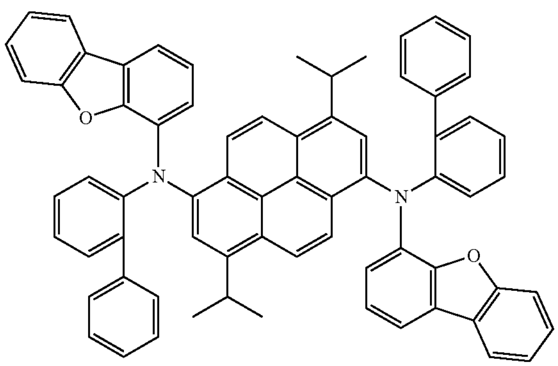
D-69
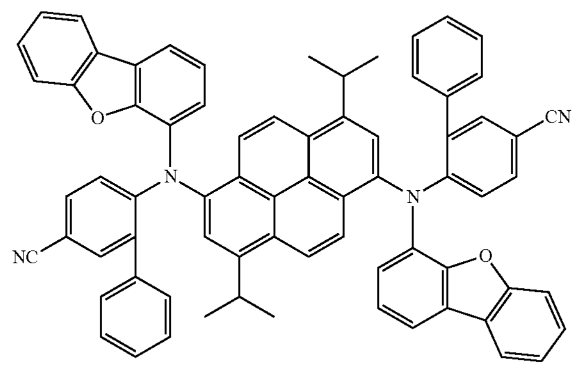
D-70
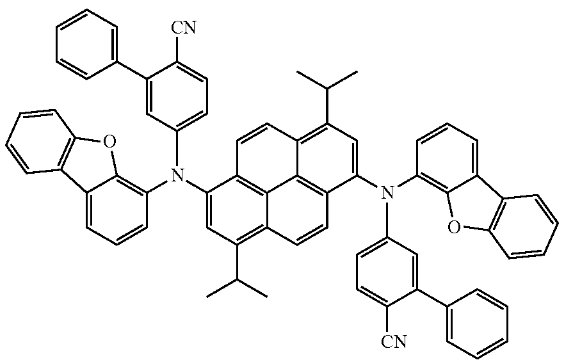
D-71
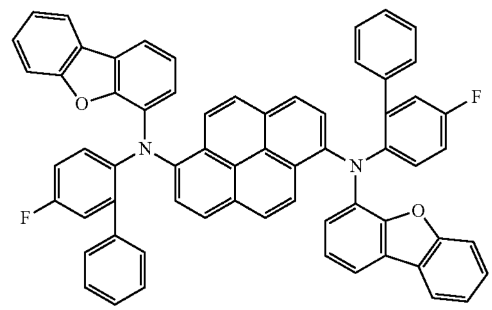
D-72
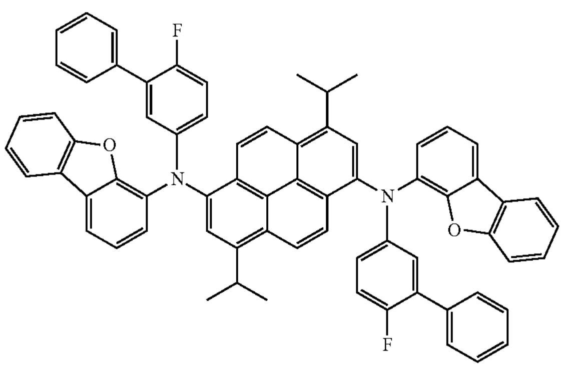
D-73
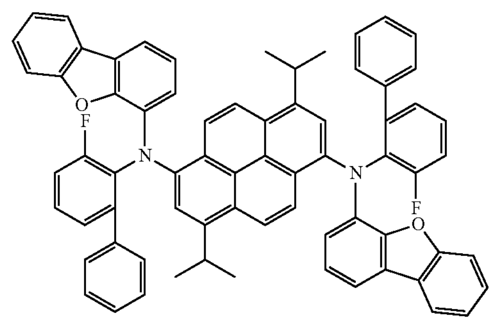
[Chem. 24]
D-74
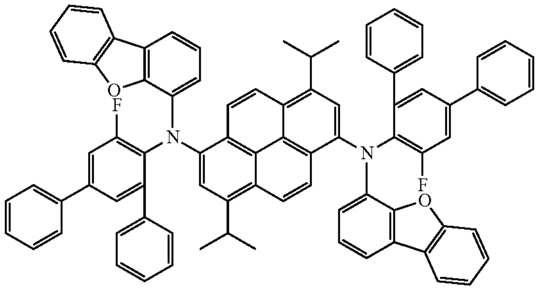
D-75
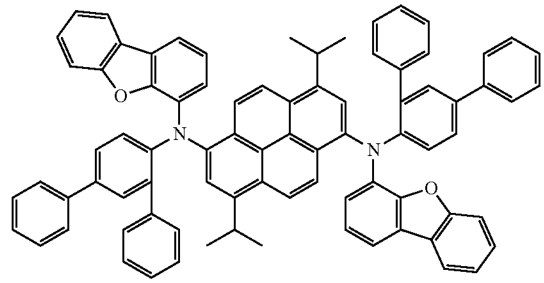

-continued
D-76
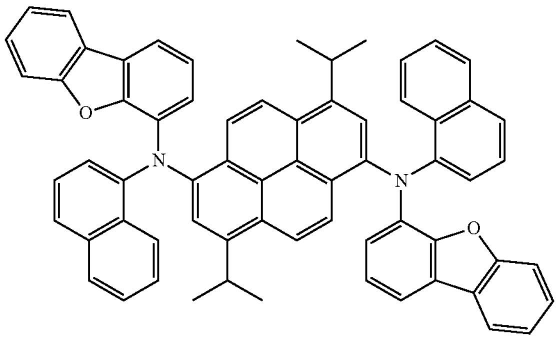
D-77
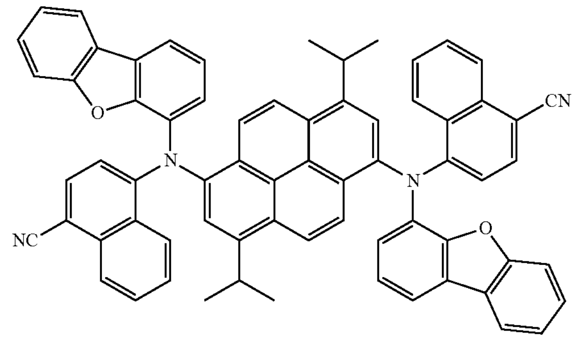
D-78
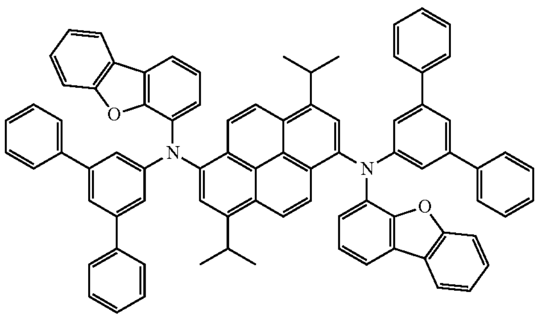
D-79
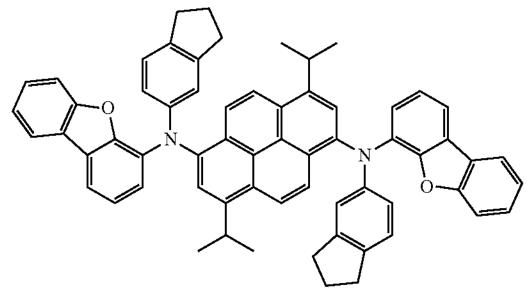
D-80
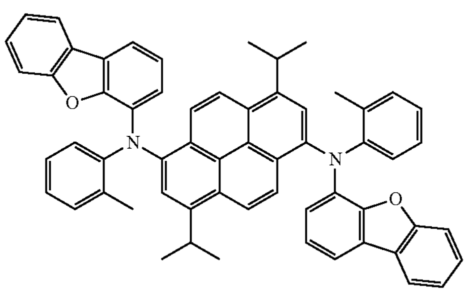
D-81
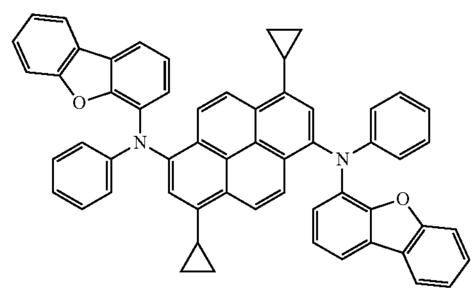
[Chem. 25]
D-82
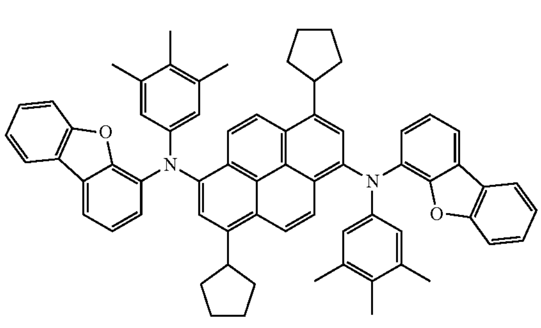
D-83
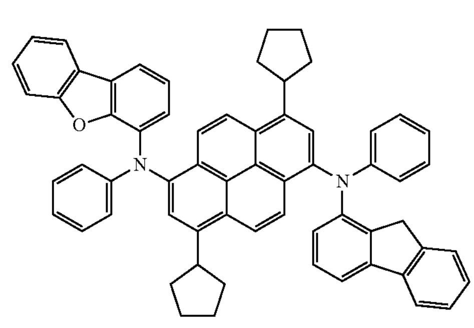

-continued
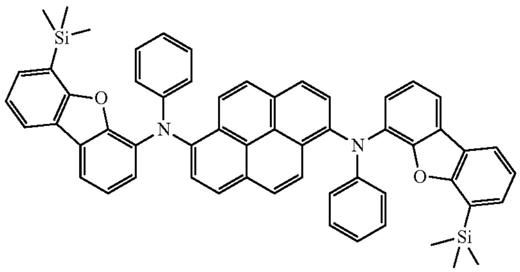
D-84
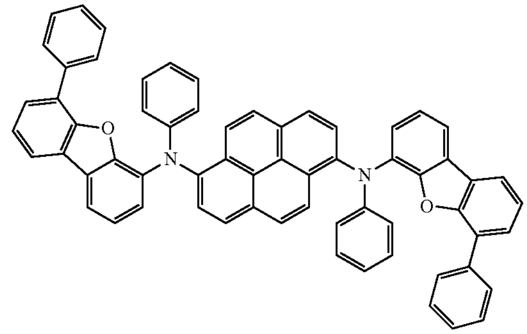
D-85
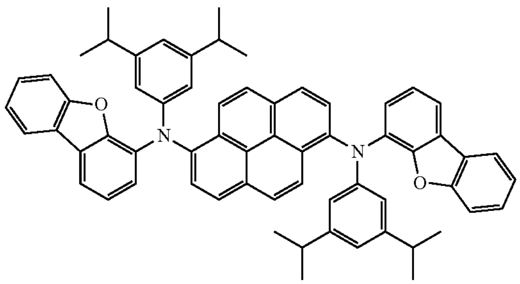
D-86
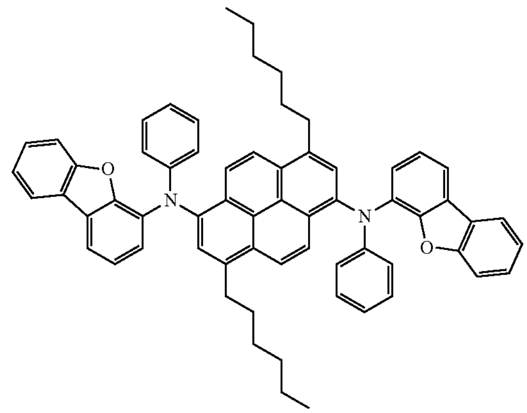
D-87
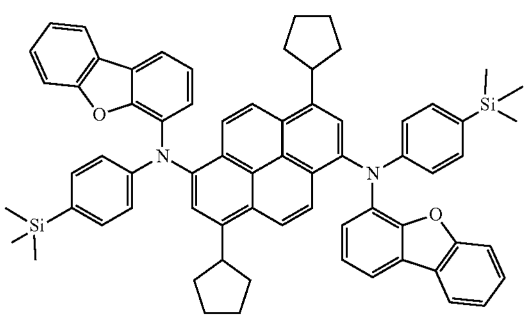
D-88
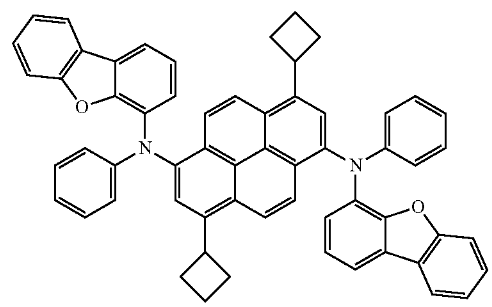
D-89
[Chem. 26]
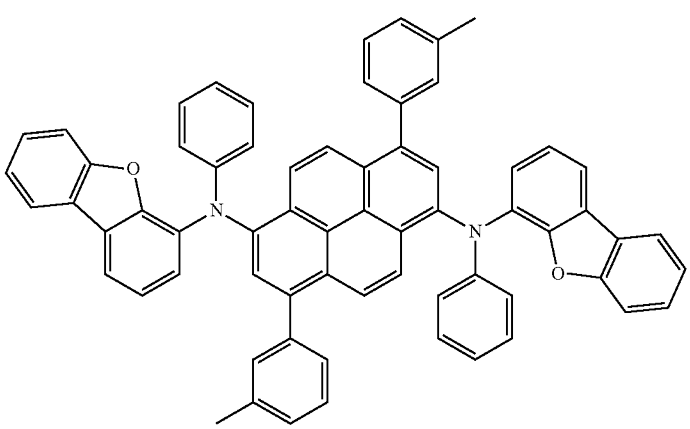
D-90

-continued
D-91
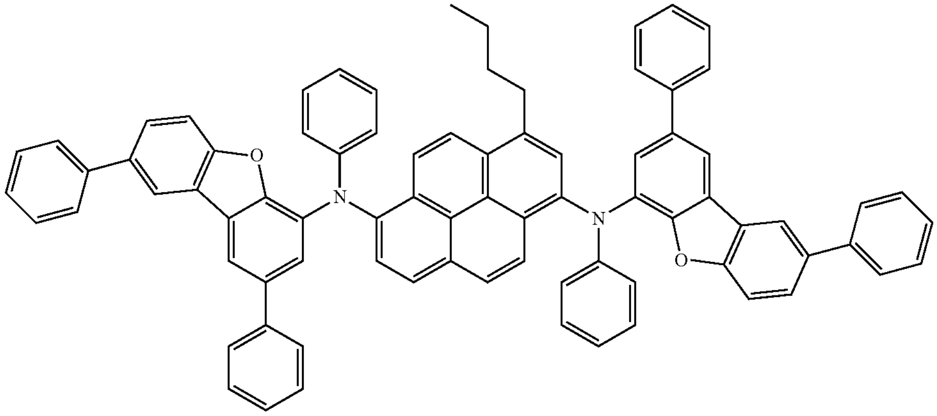
D-92
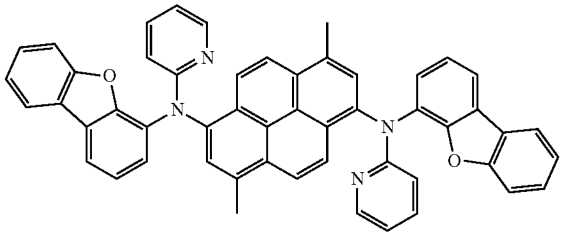
D-93
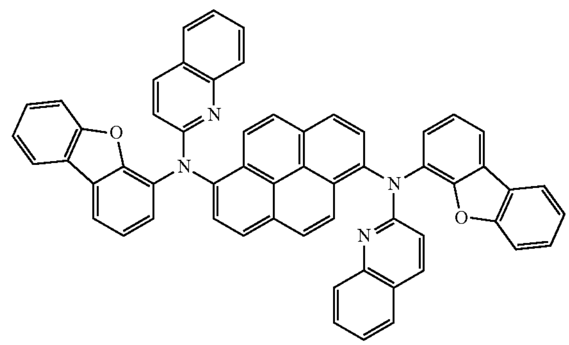
D-94
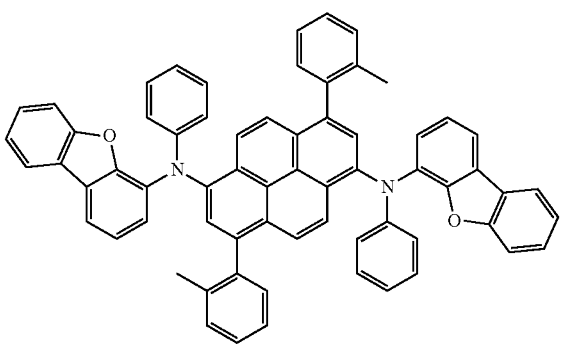
D-95
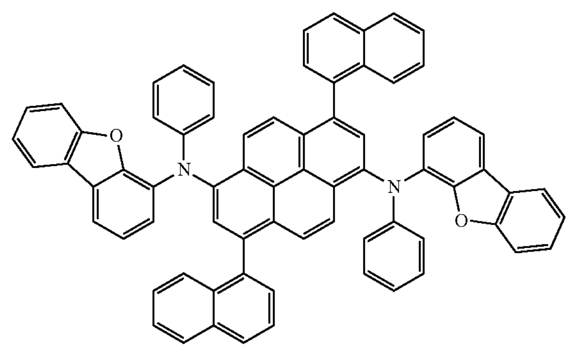
D-96
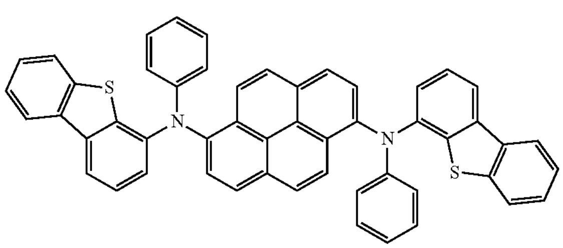
D-97
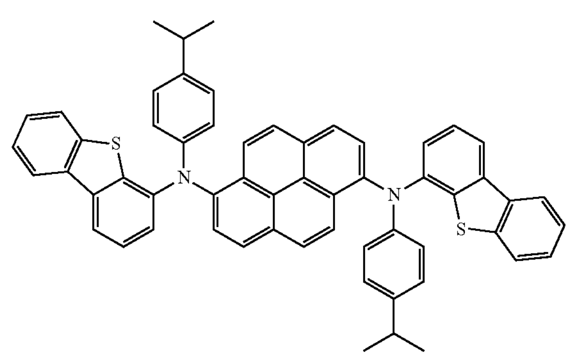

-continued
[Chem. 27]
D-98
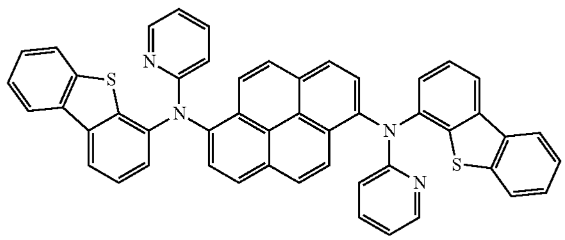
D-99
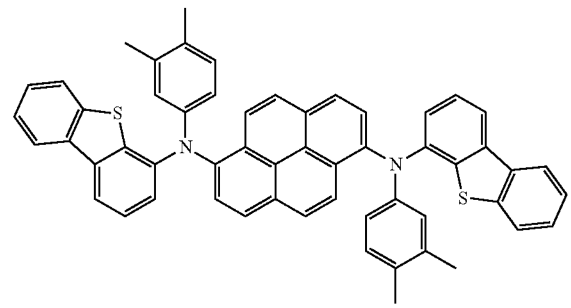
D-100
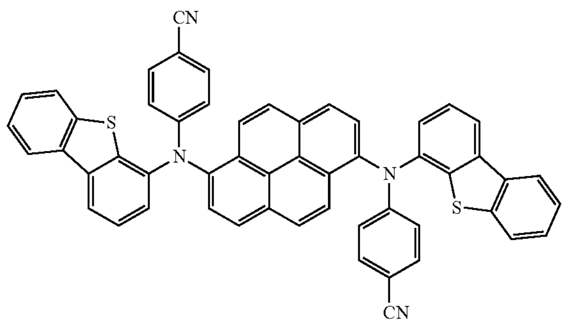
D-101
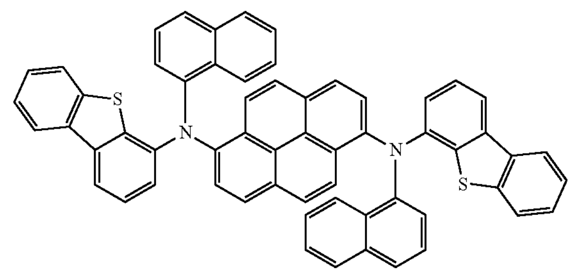
D-102
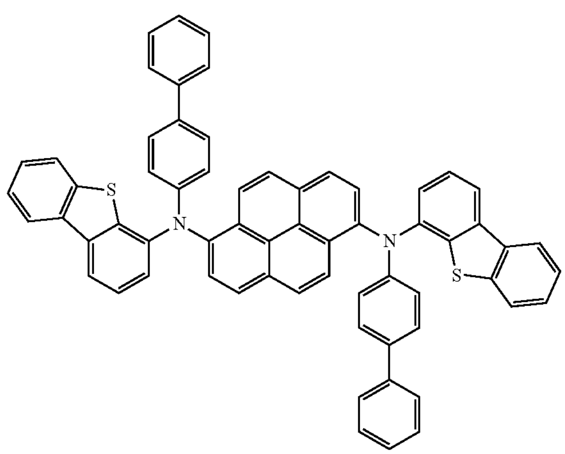
D-103
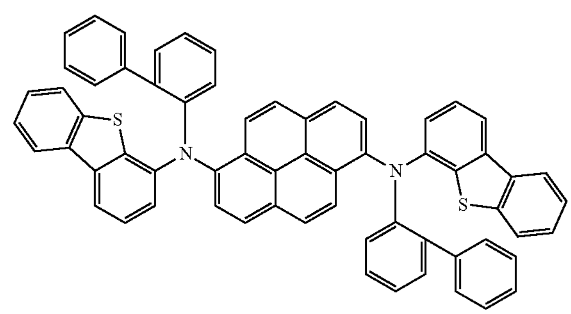
D-104
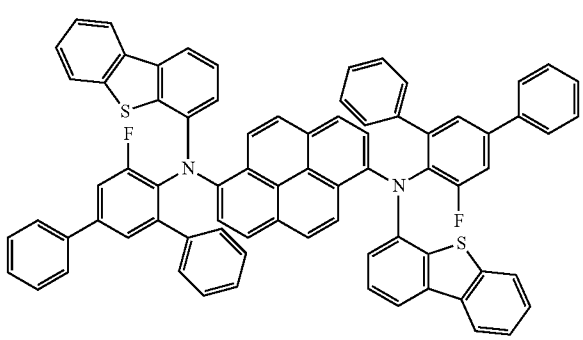
D-105
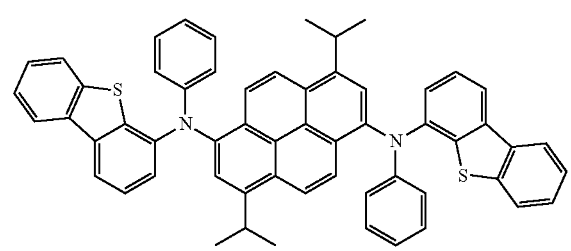

-continued
[Chem. 28]
D-106
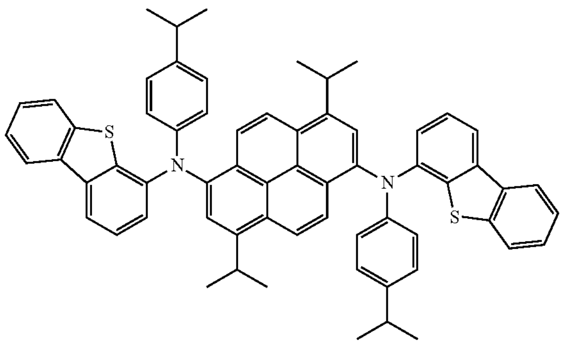
D-107
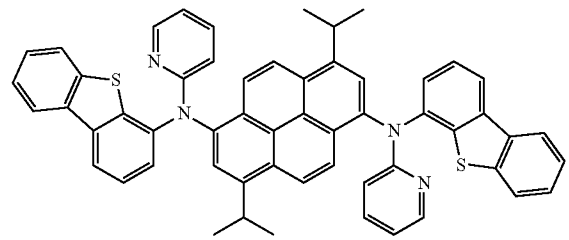
D-108
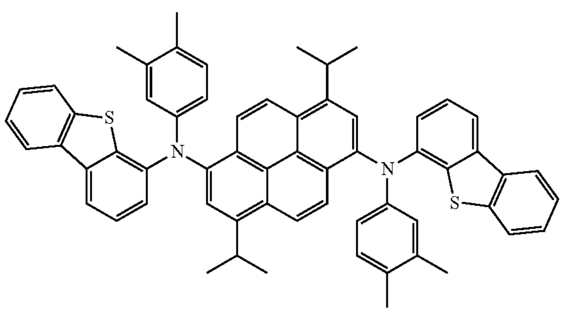
D-109
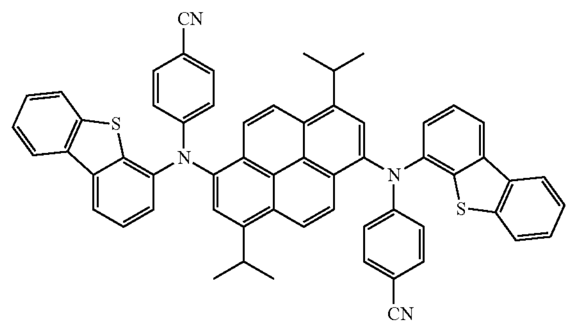
D-110
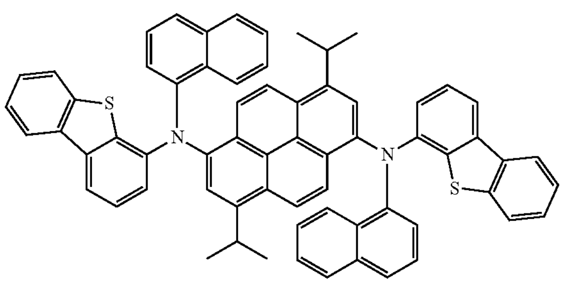
D-111
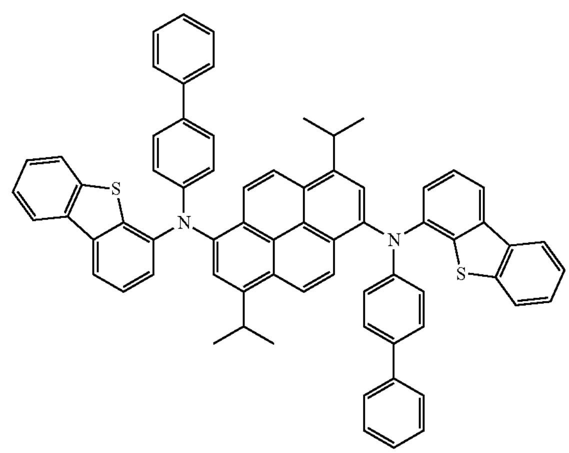
D-112
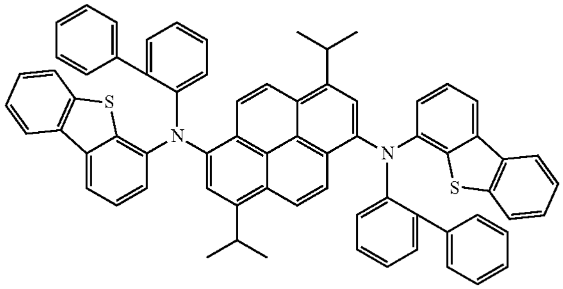
D-113
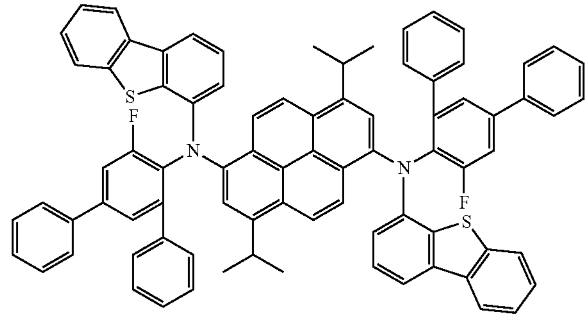

-continued
[Chem. 29]
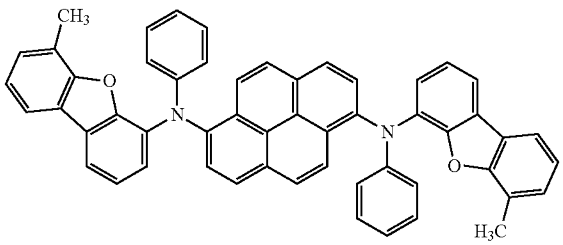
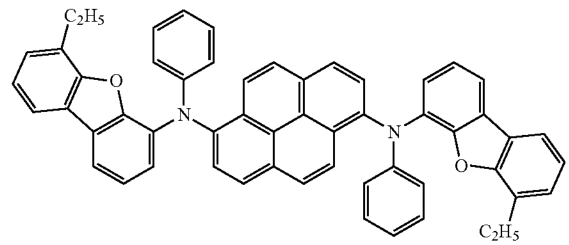
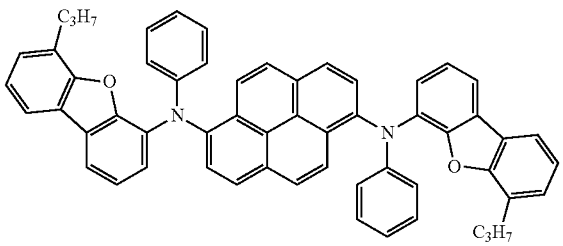
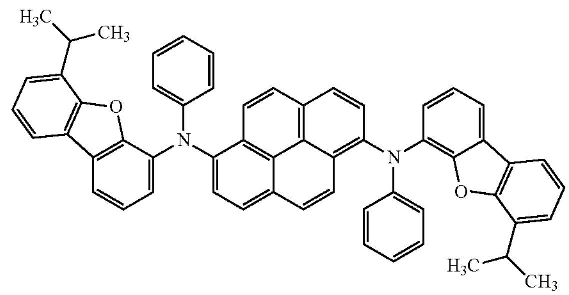
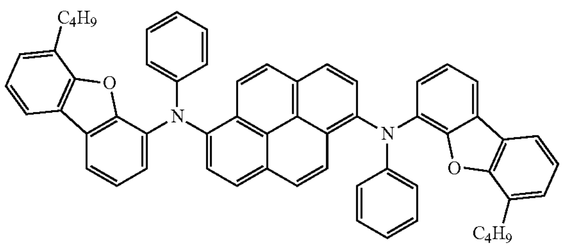
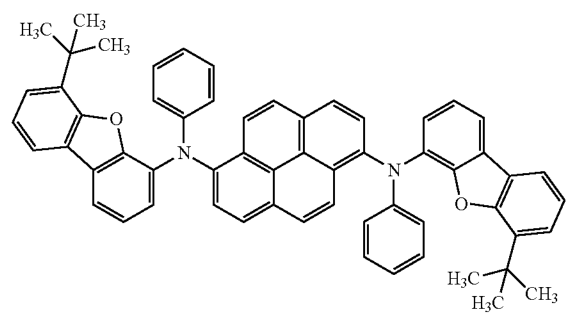
[Chem. 30]
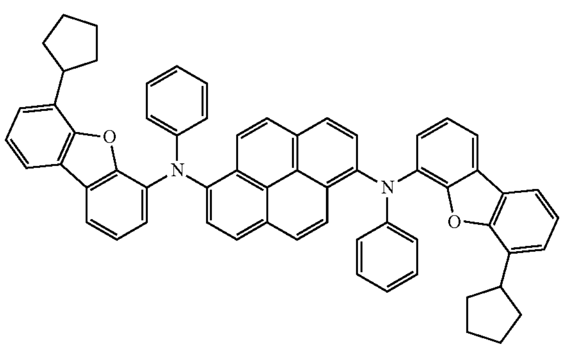
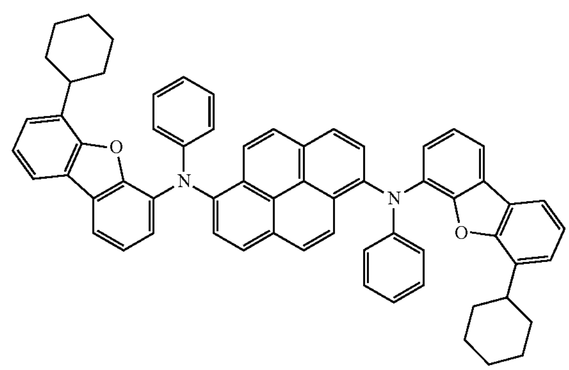
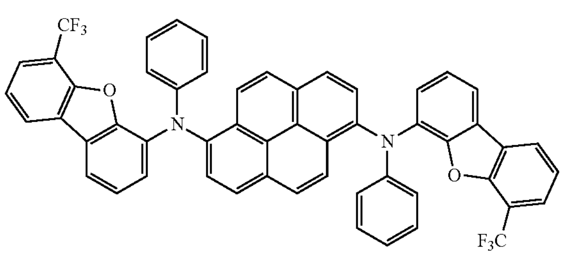
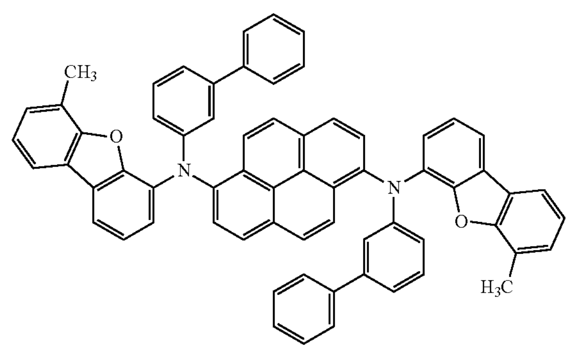

-continued
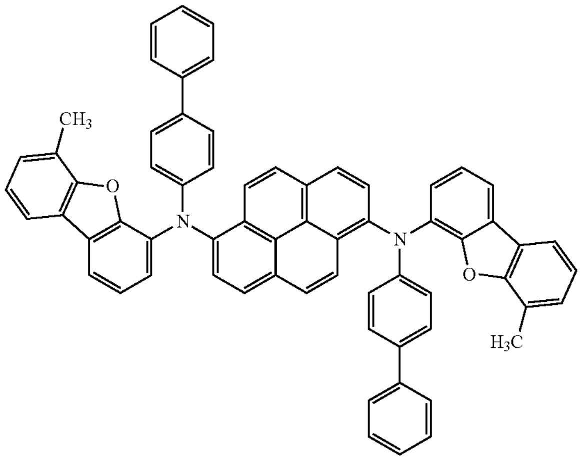
[Chem. 31]
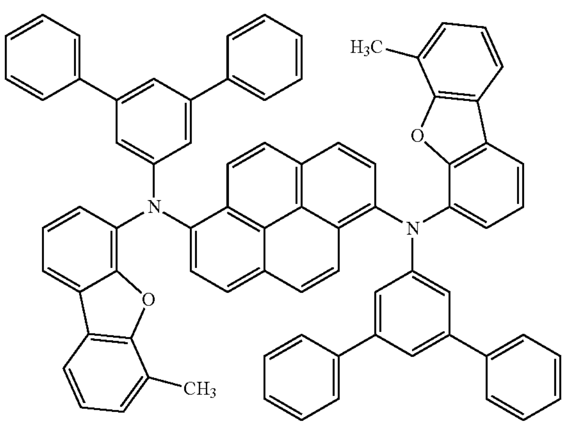
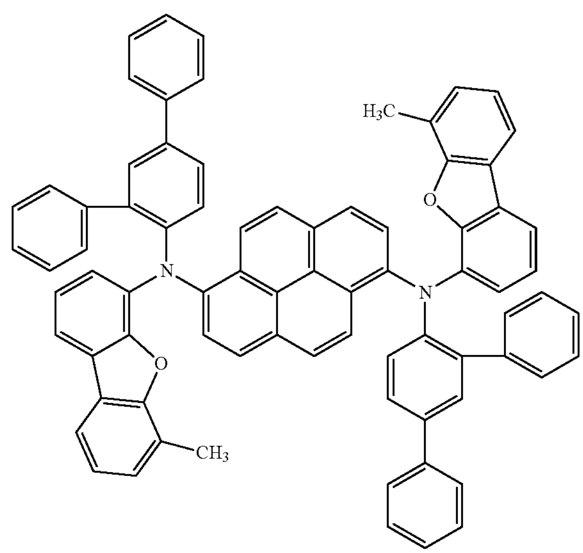
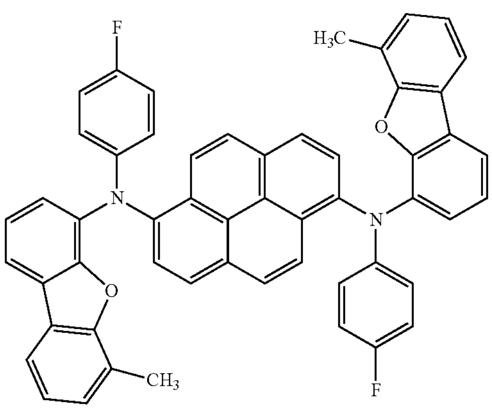
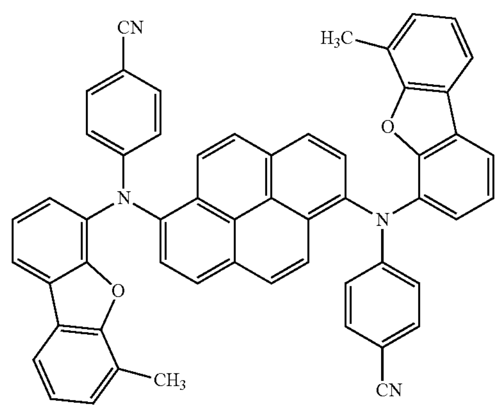

-continued
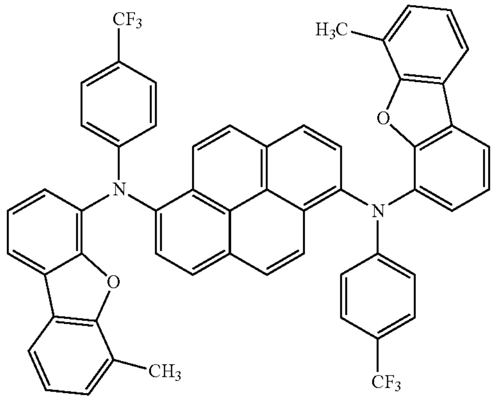
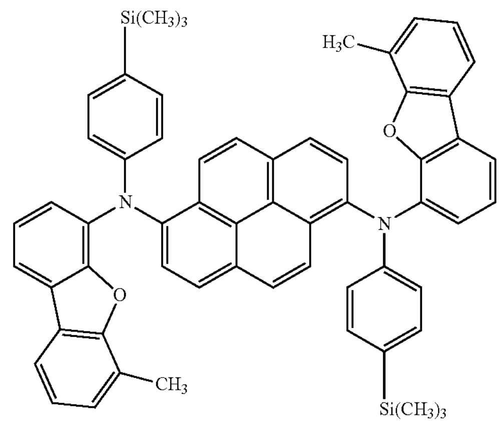
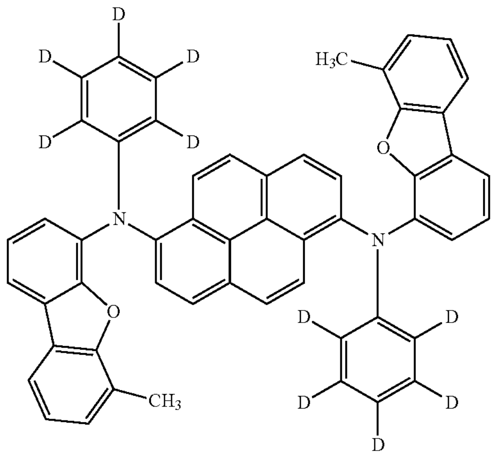
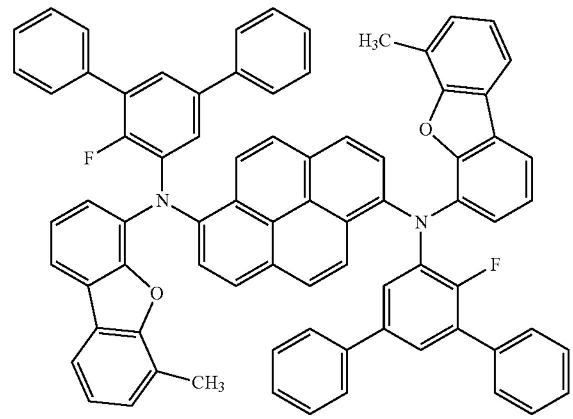
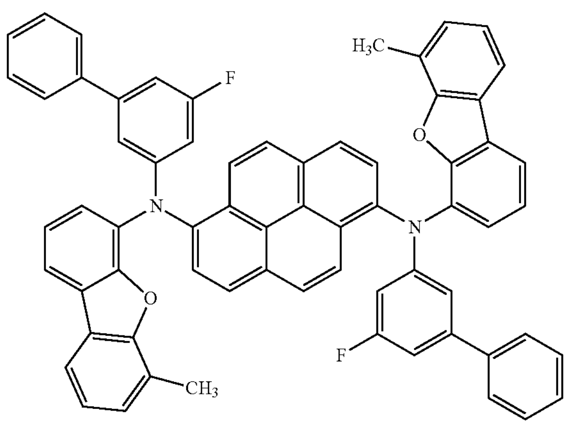
[Chem. 32]
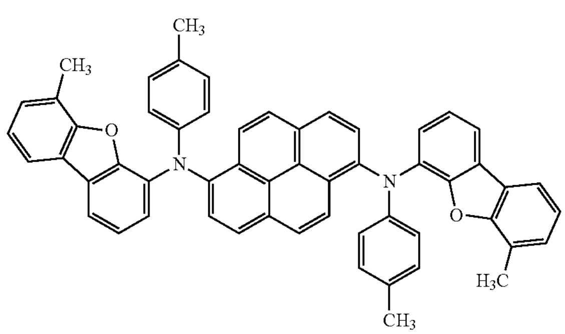
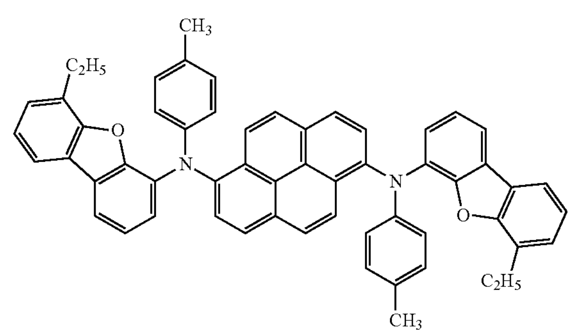

-continued
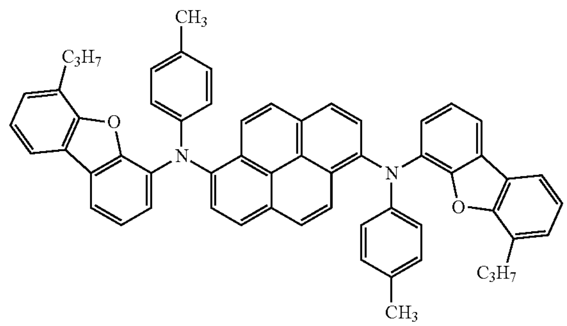
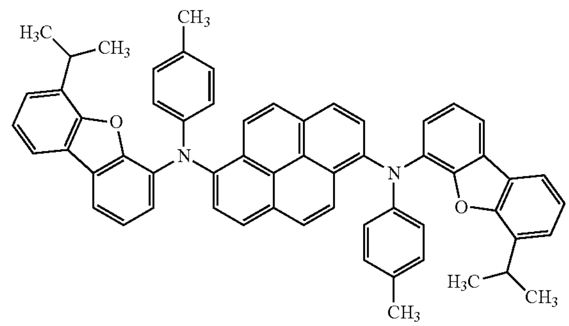
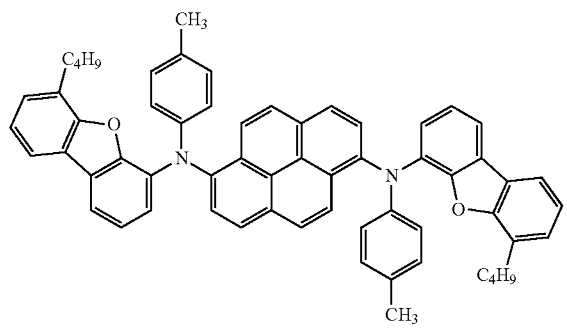
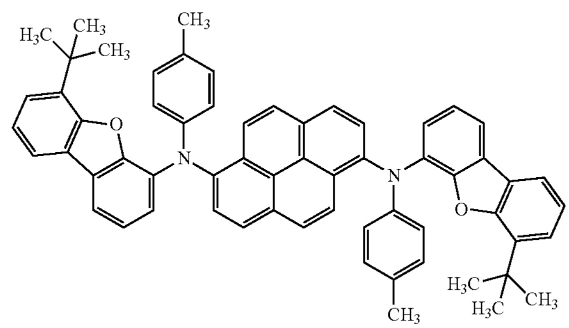
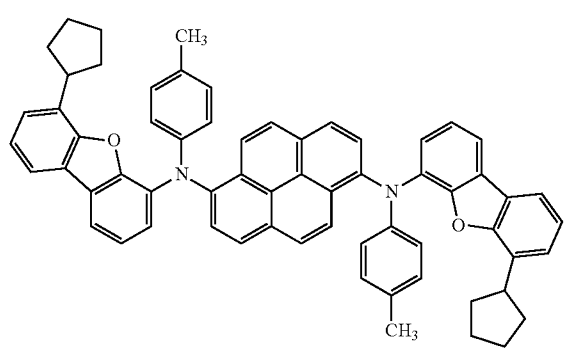
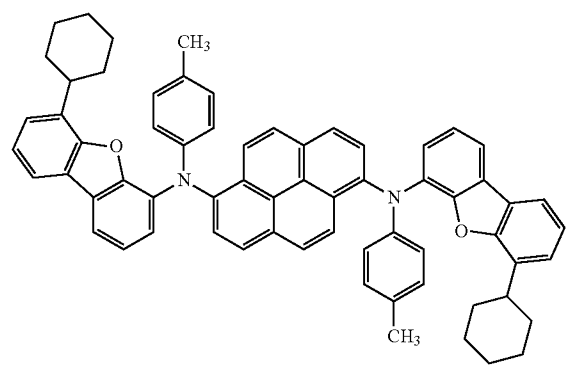
[Chem. 33]
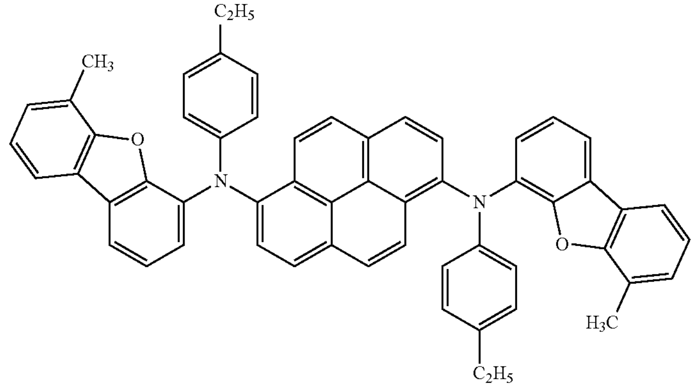

-continued
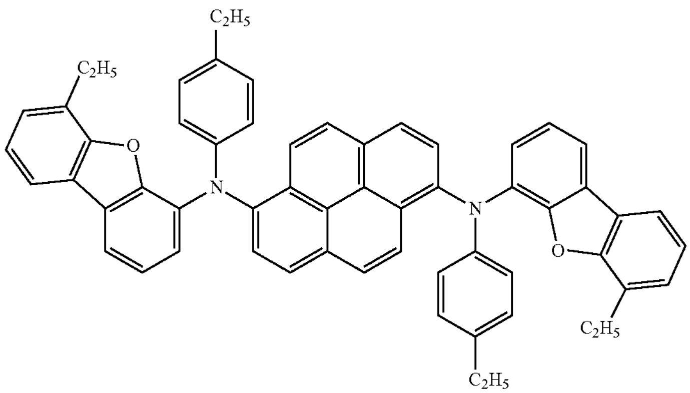
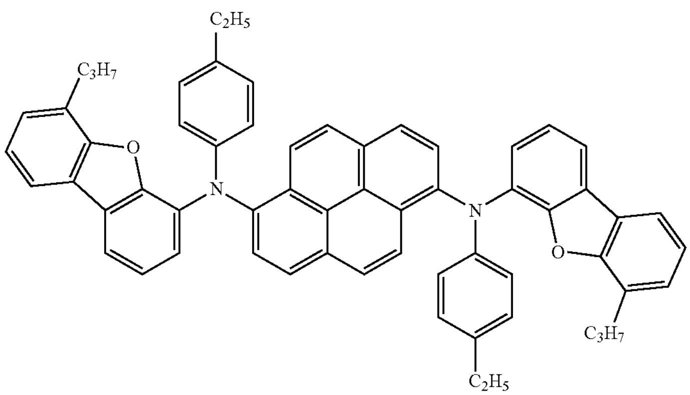
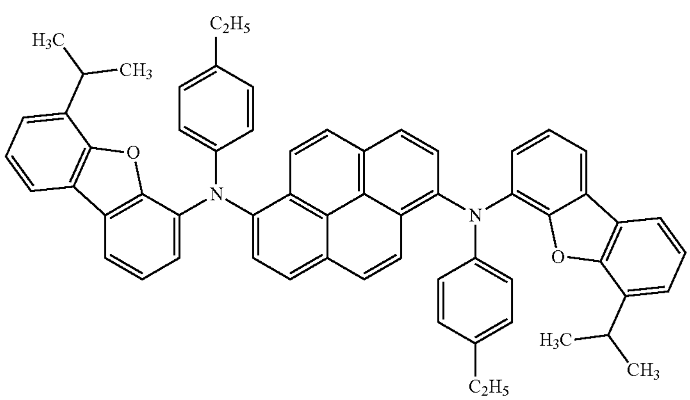
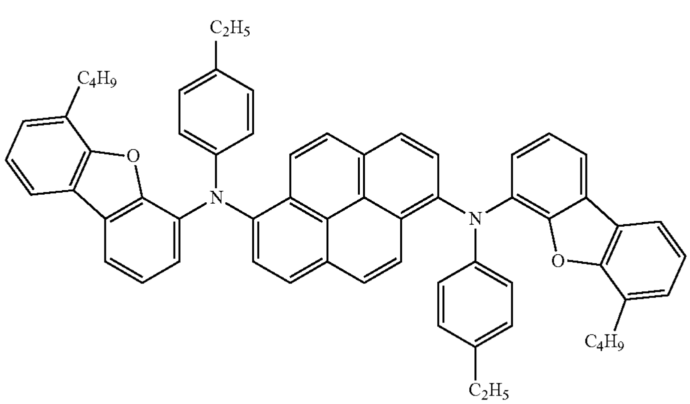

-continued
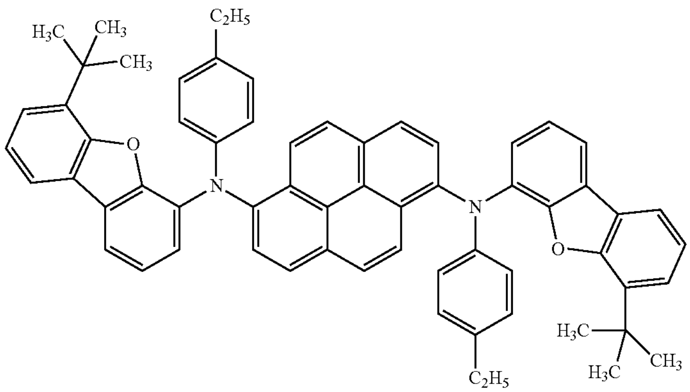
[Chem. 34]
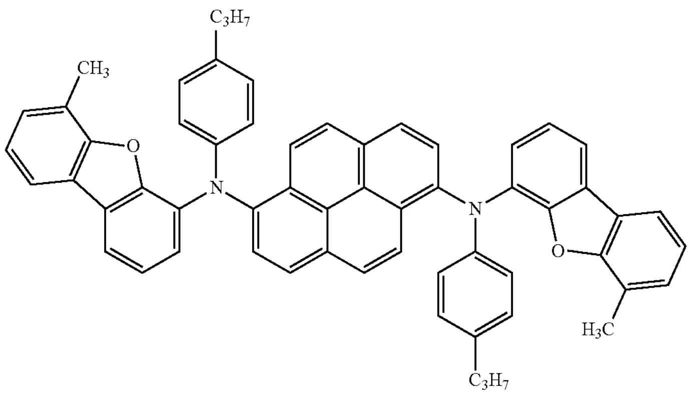
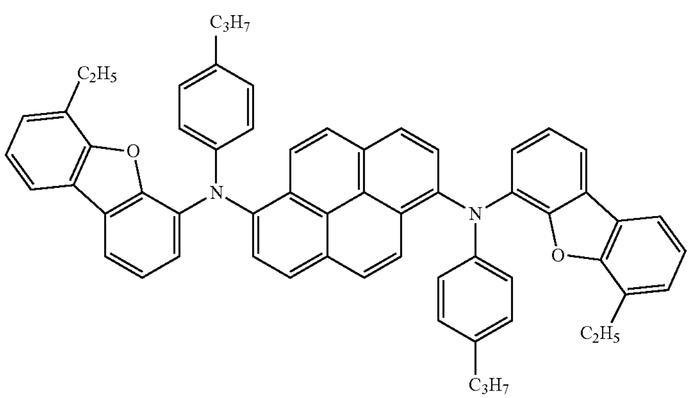
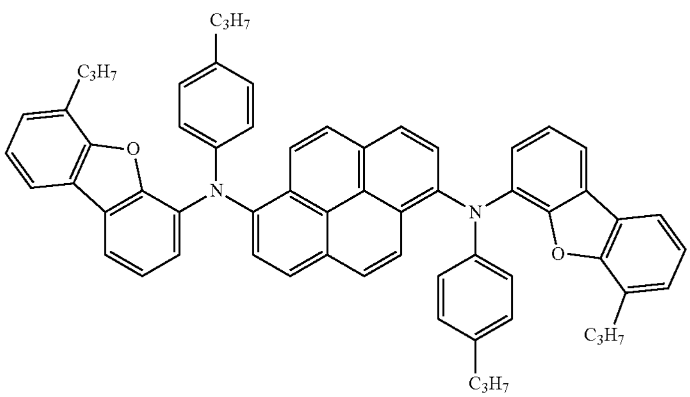

-continued
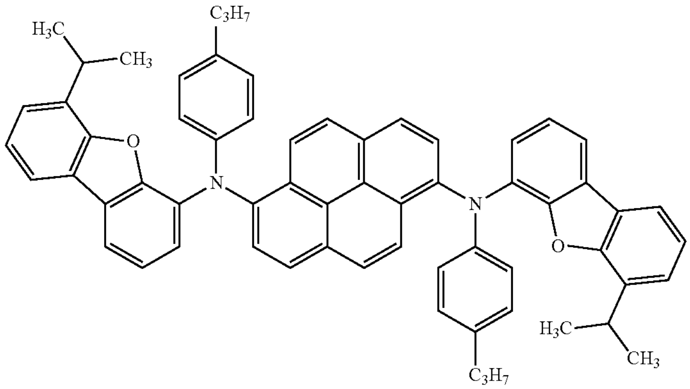
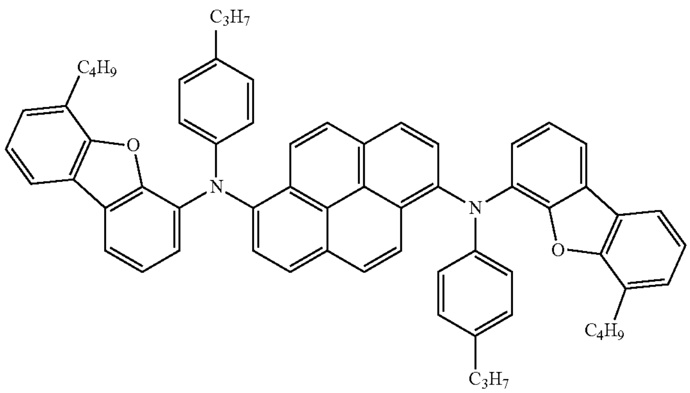
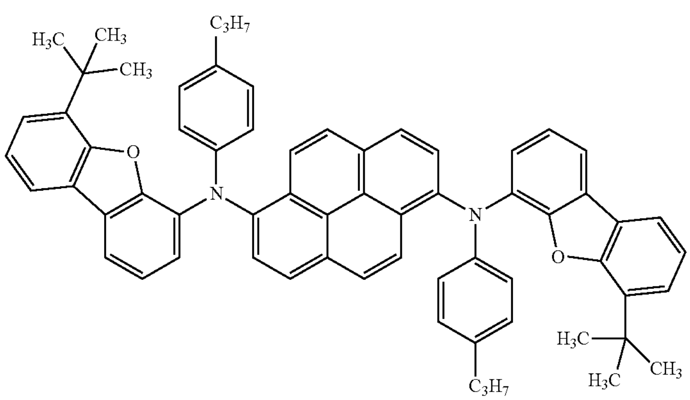
[Chem. 35]
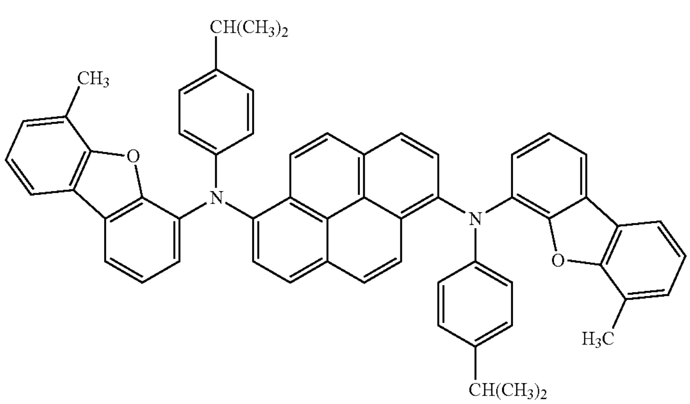

-continued
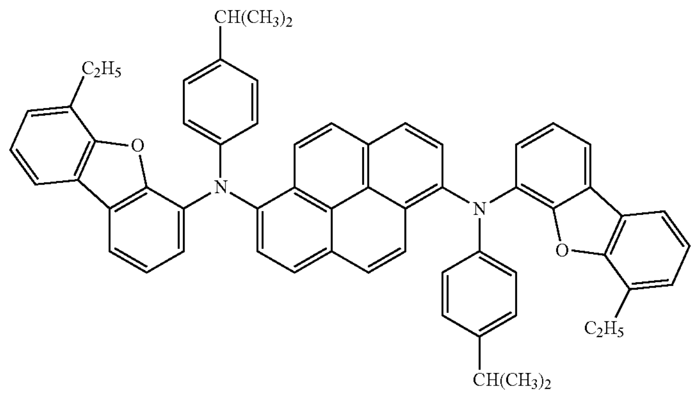
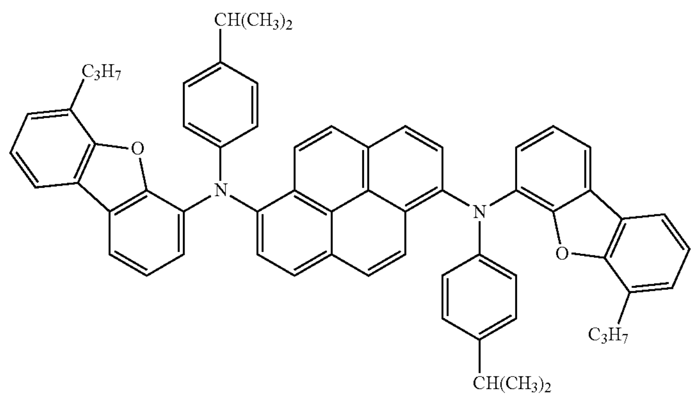
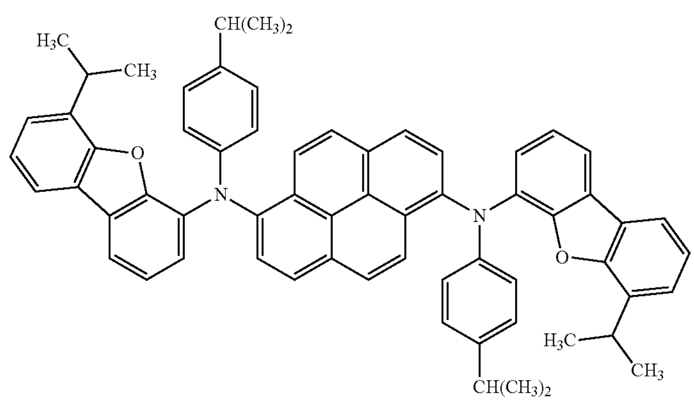
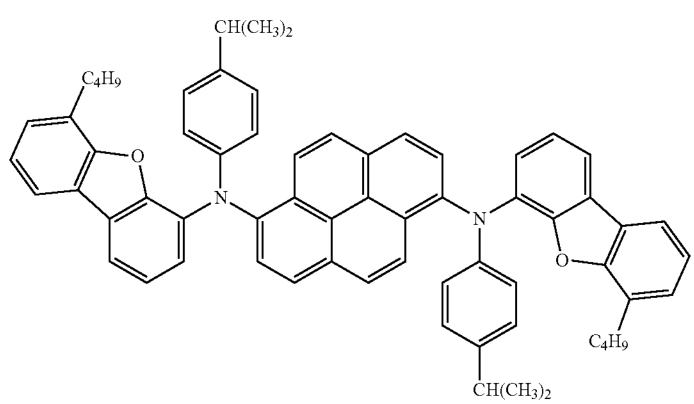

-continued
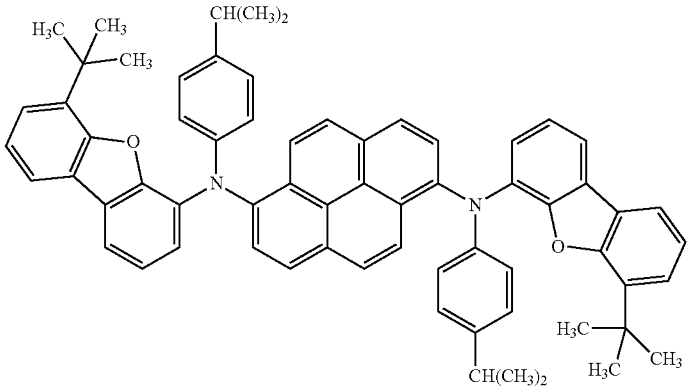
[Chem. 36]
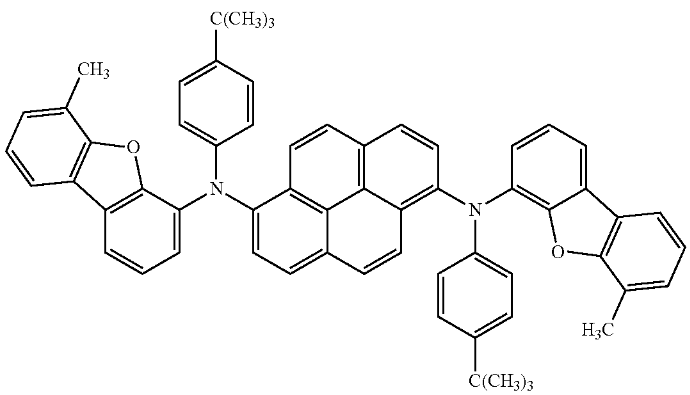
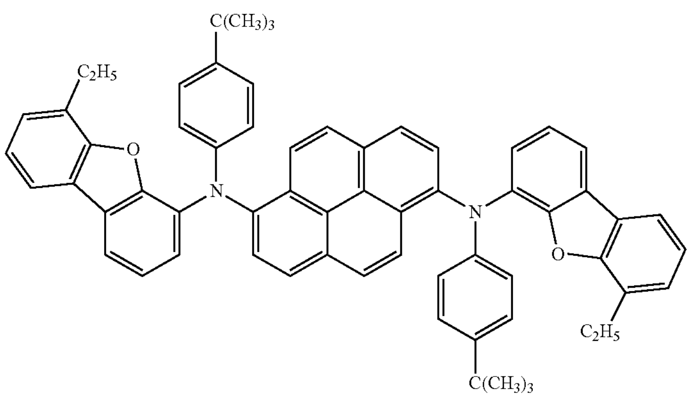
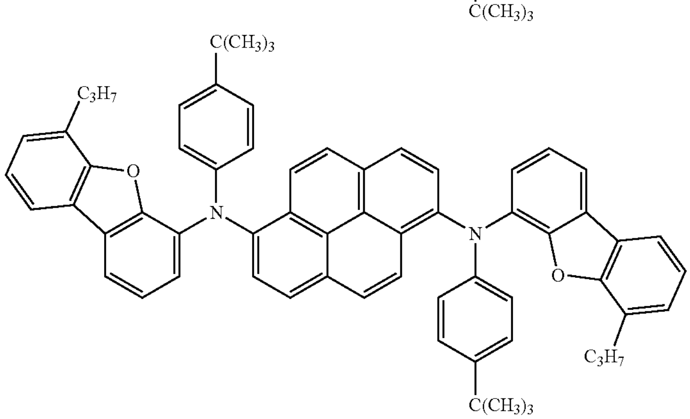

-continued
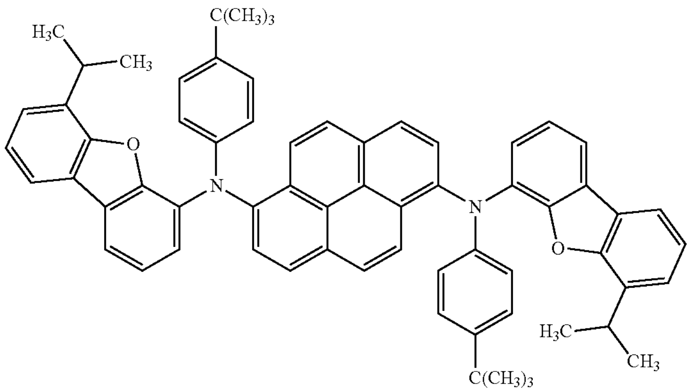
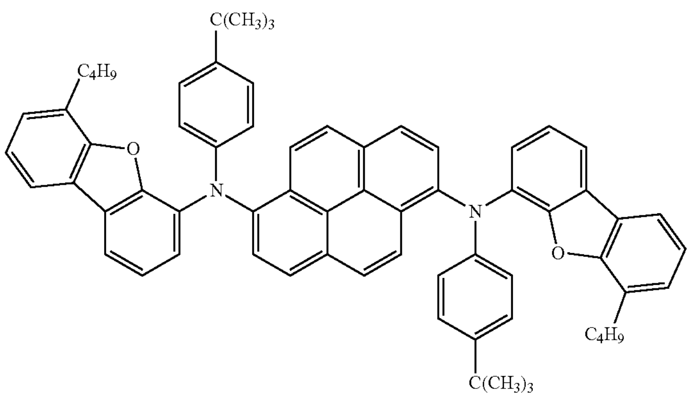
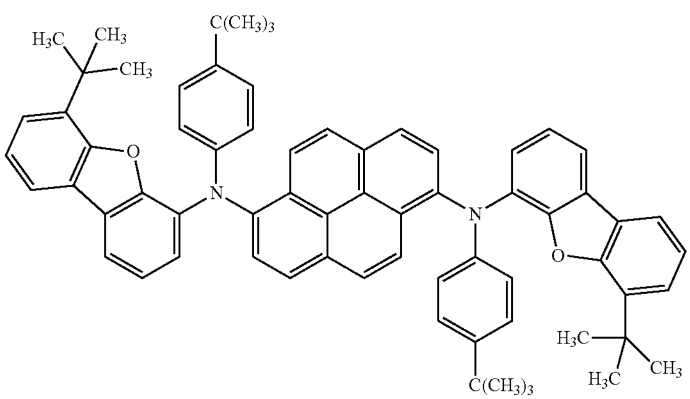
[Chem. 37]
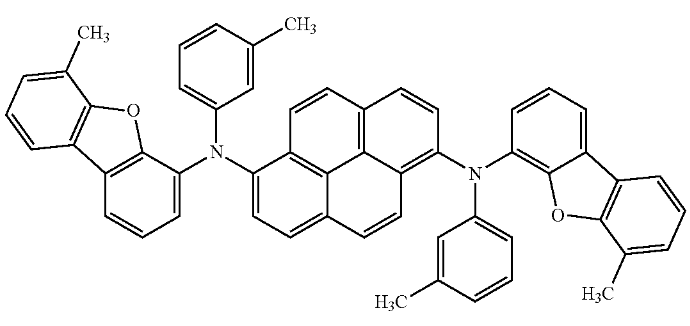

-continued
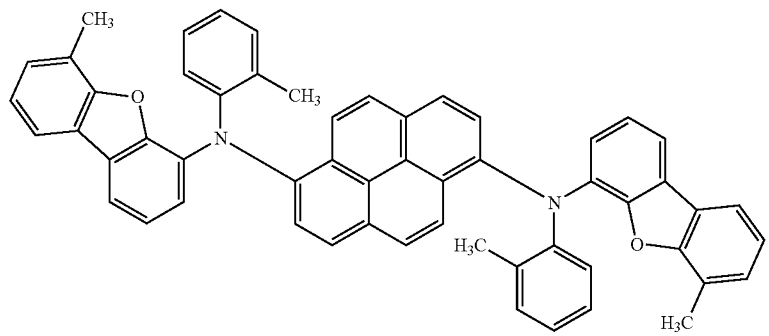
[Chem. 38]
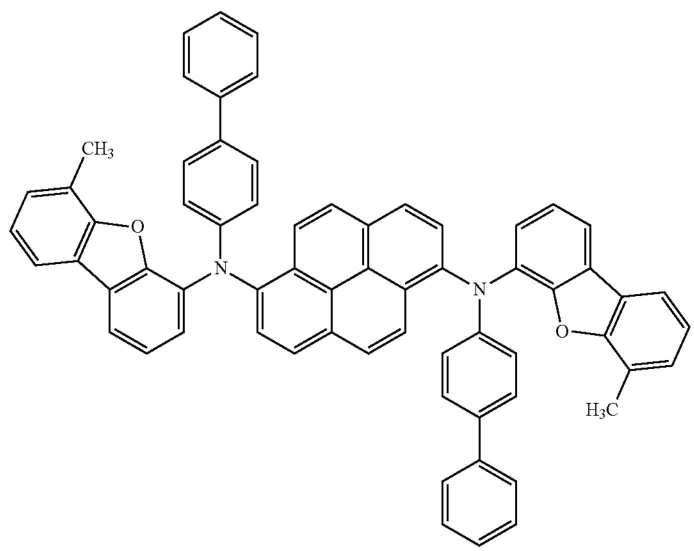
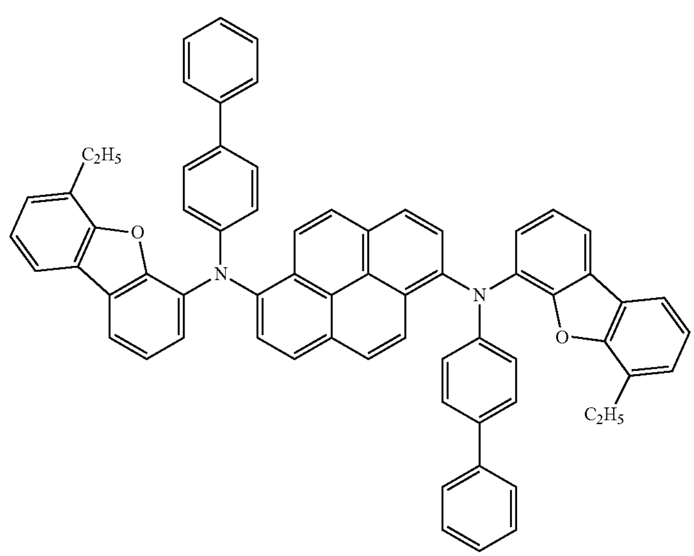

-continued
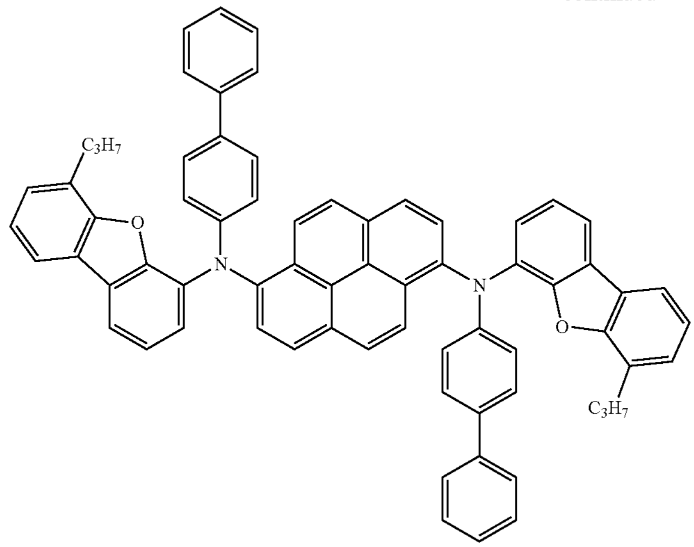
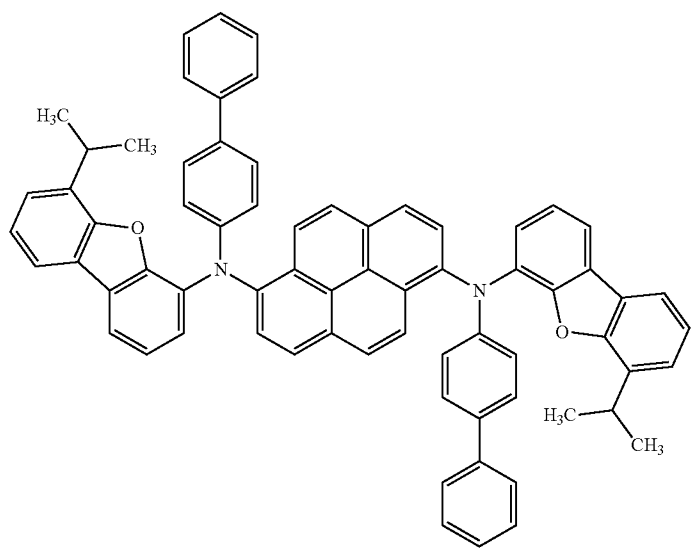
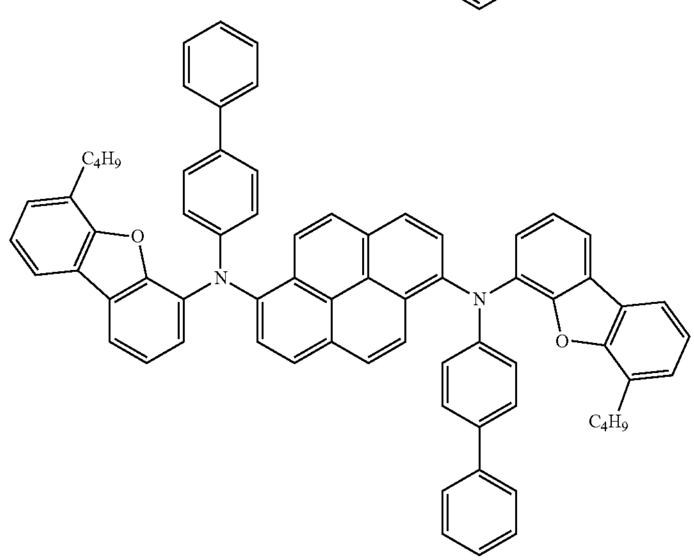

-continued
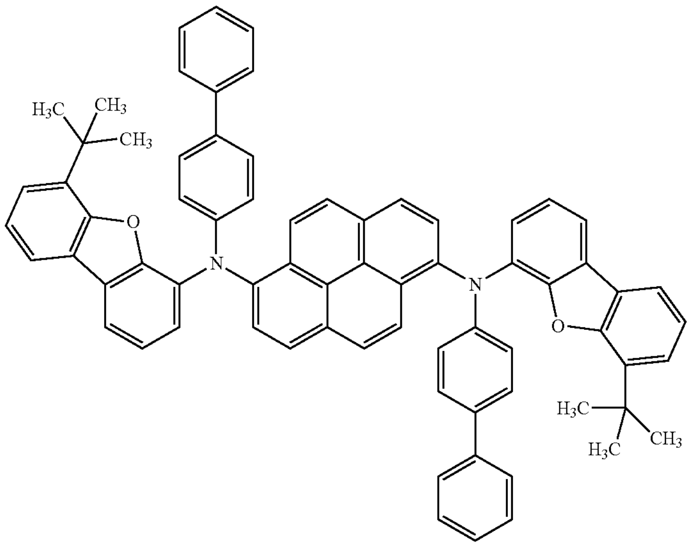
[Chem. 39]
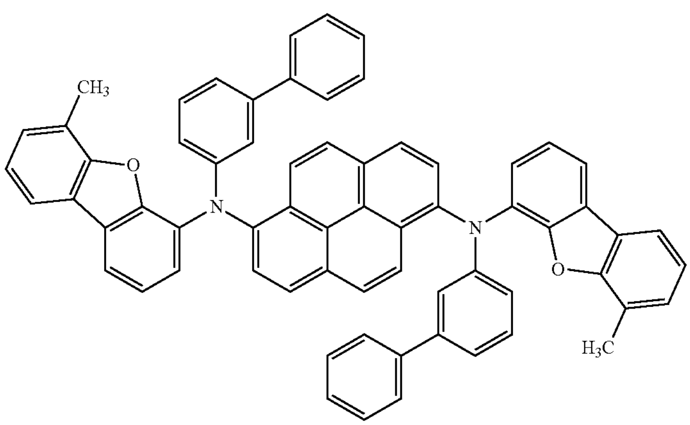
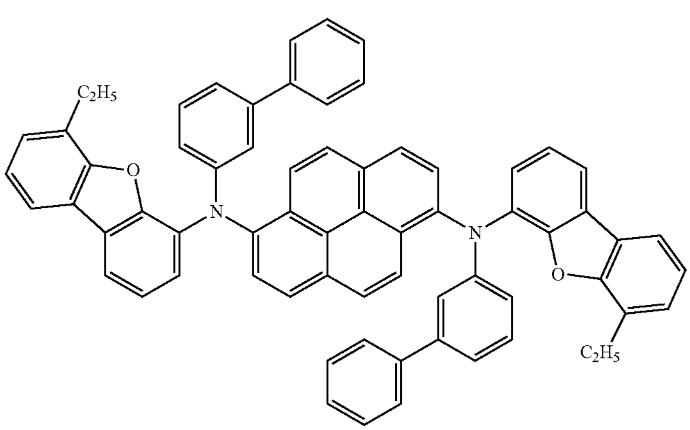

-continued
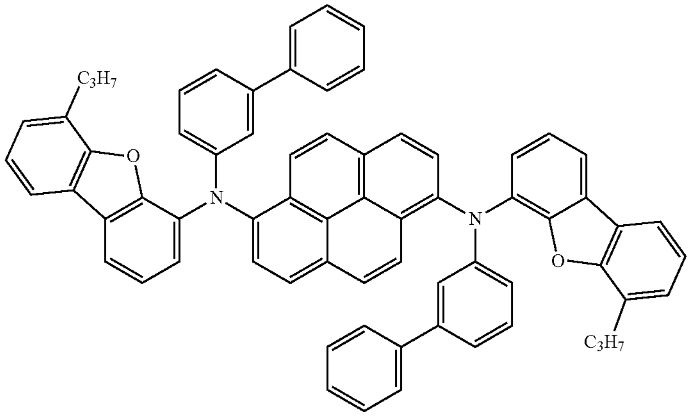
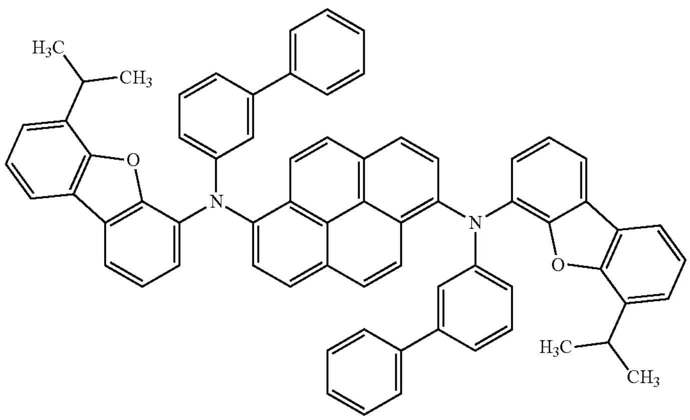
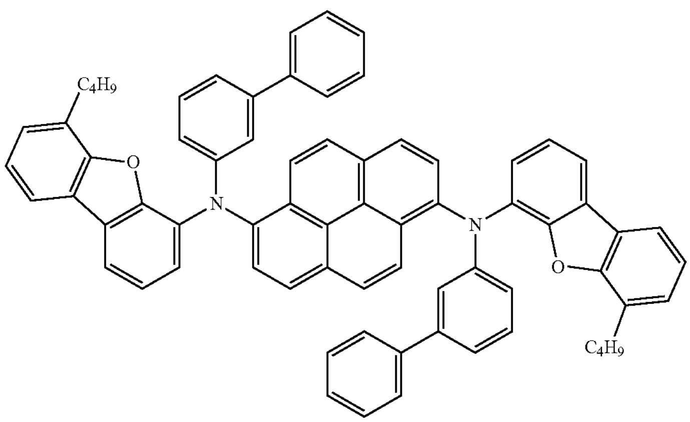
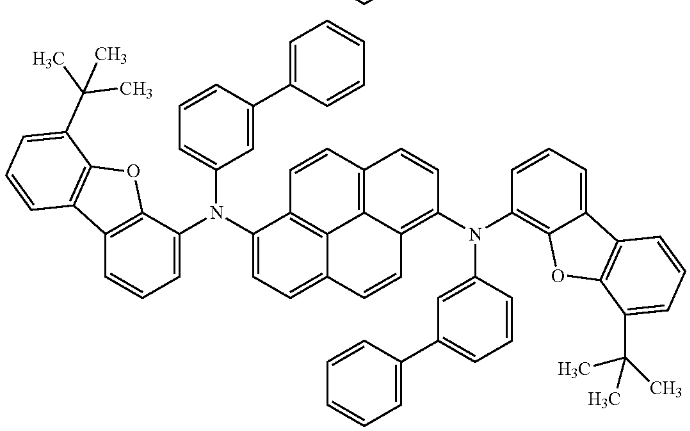

-continued
[Chem. 40]
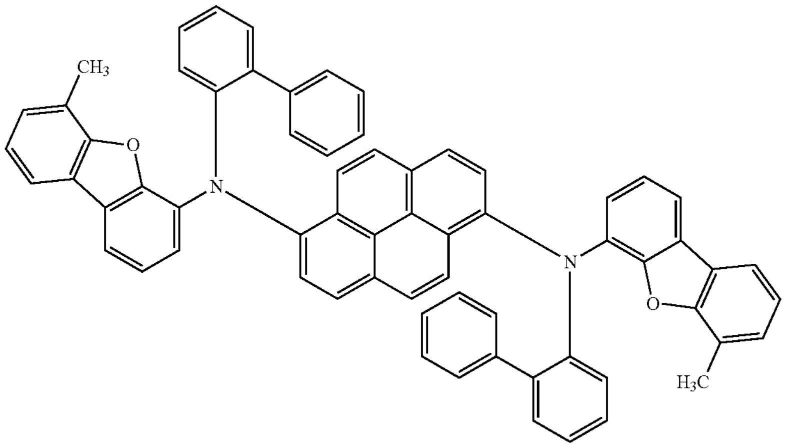
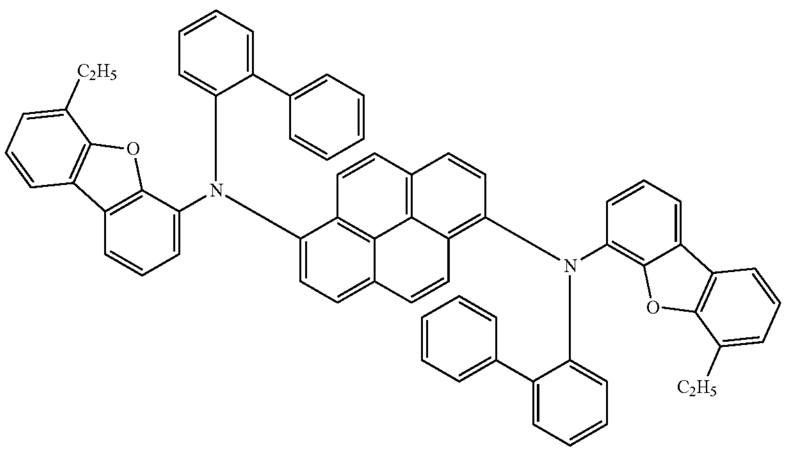
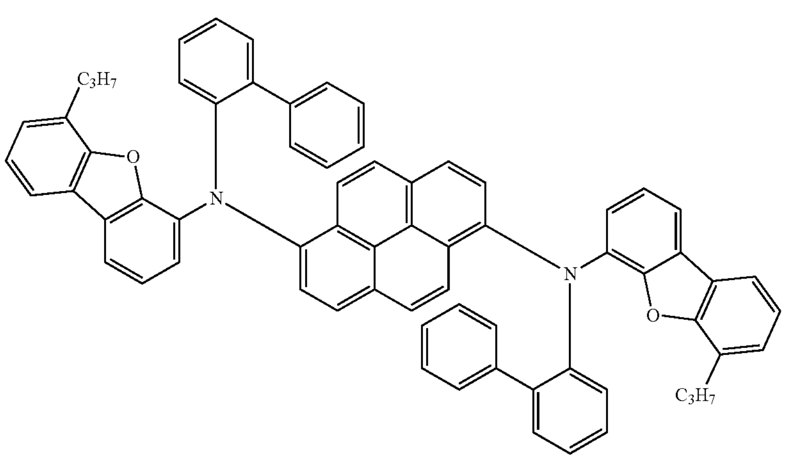

-continued
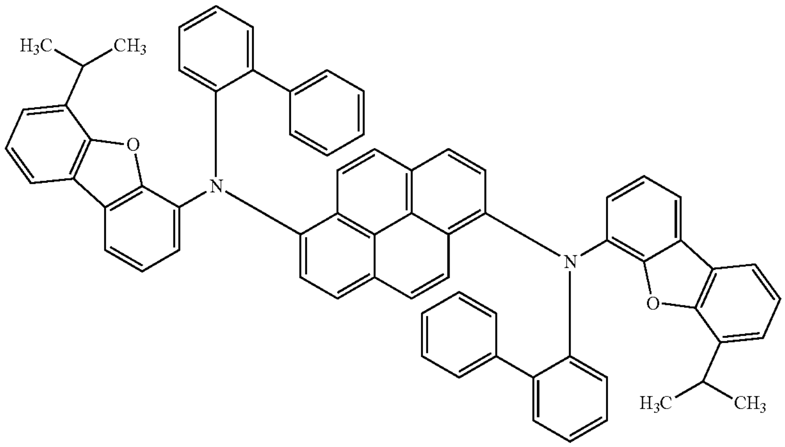
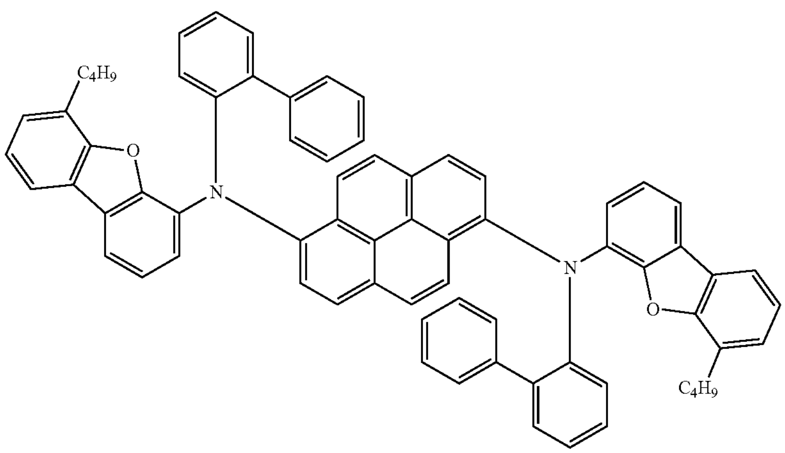
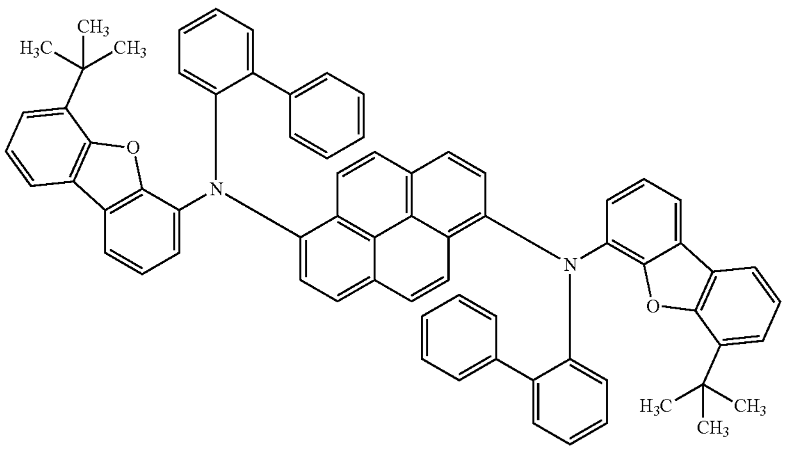

-continued
[Chem. 41]
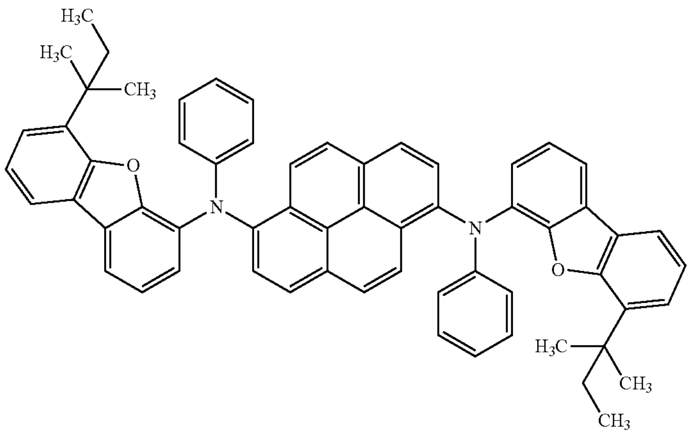
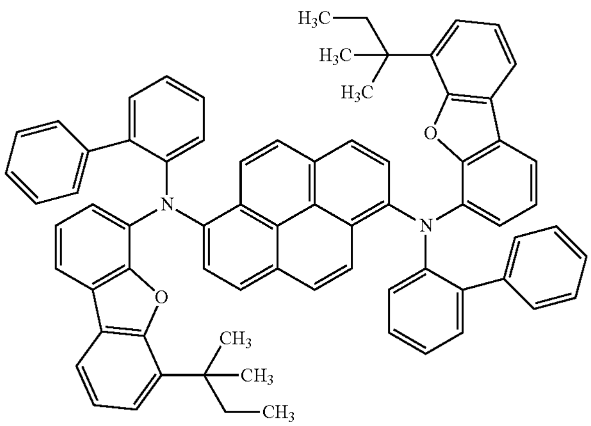
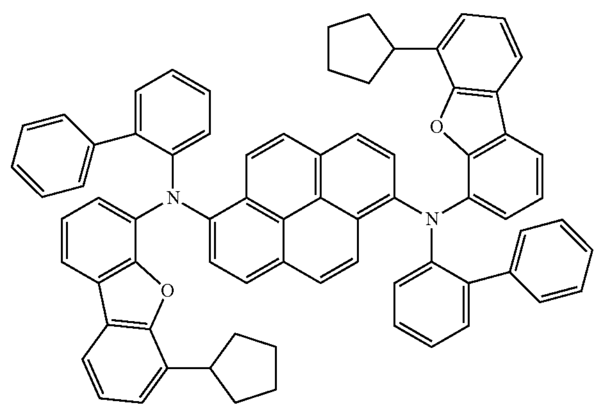
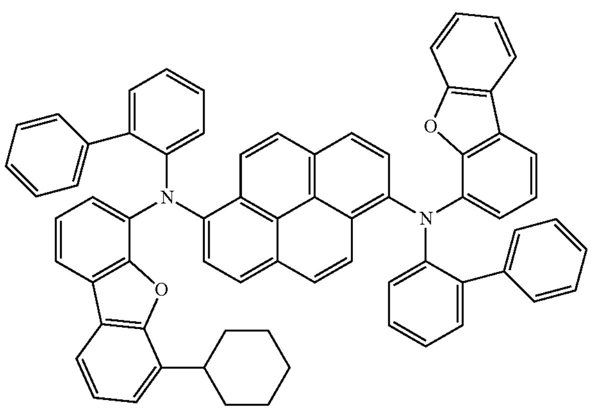
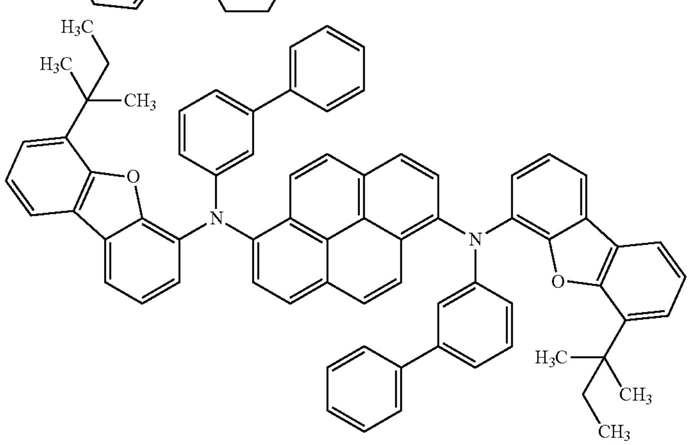

-continued
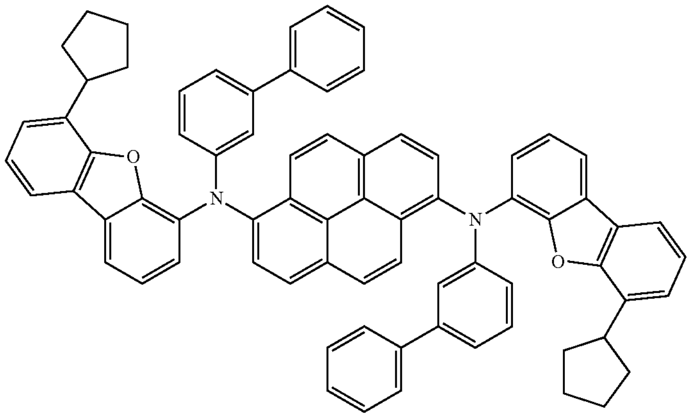
[Chem. 42]
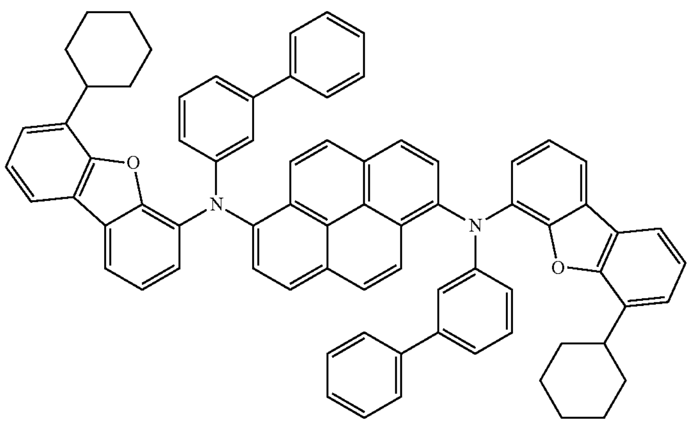
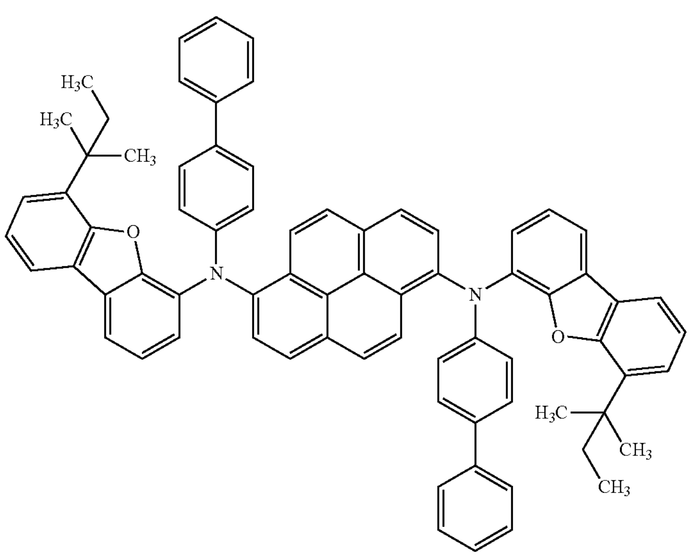

-continued
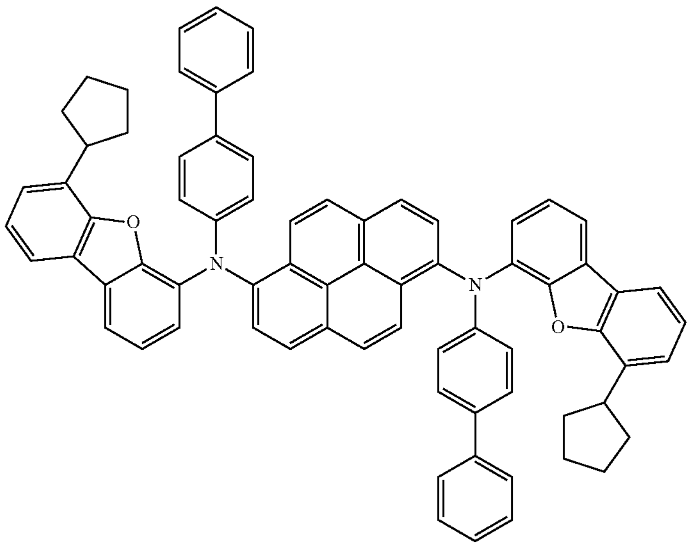
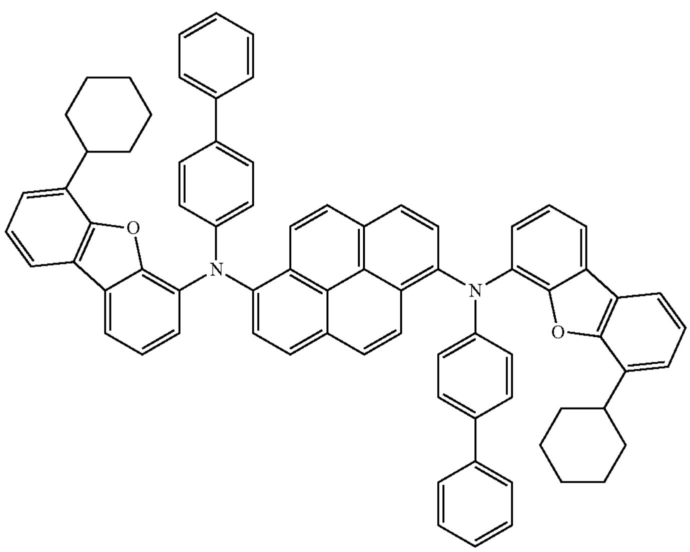
[Chem. 43]
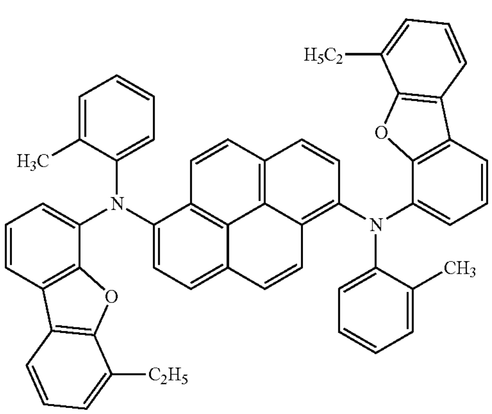
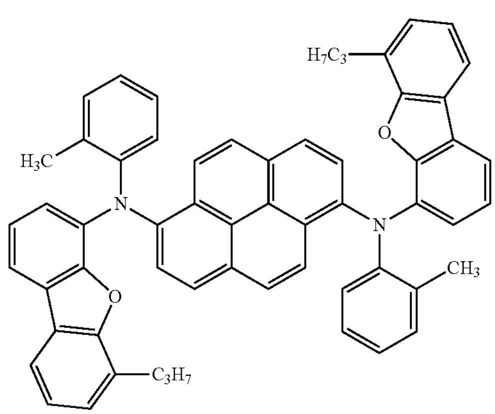

-continued
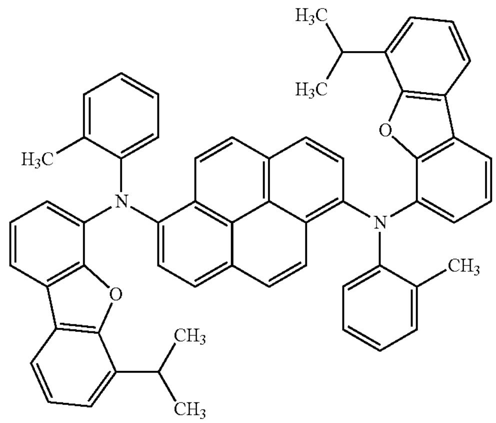
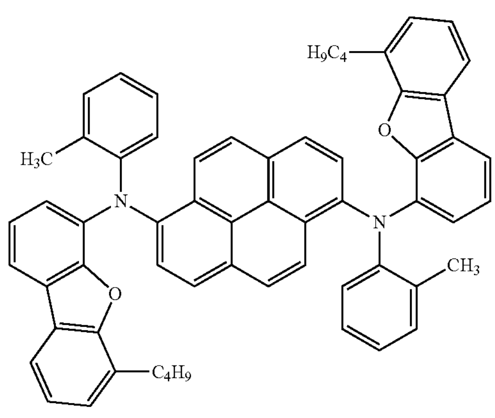
[Chem. 44]
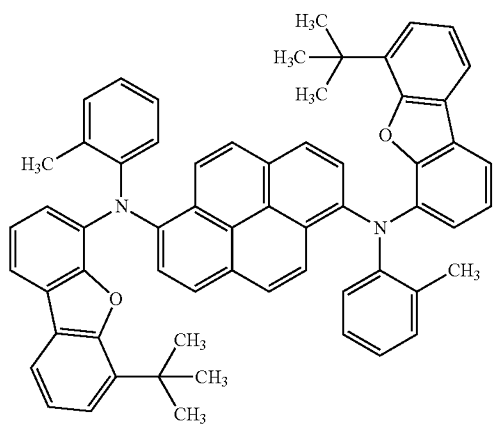
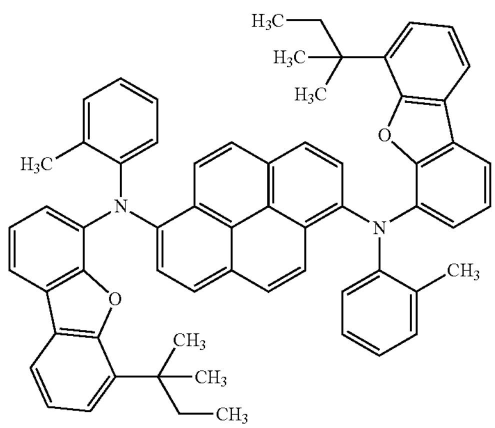
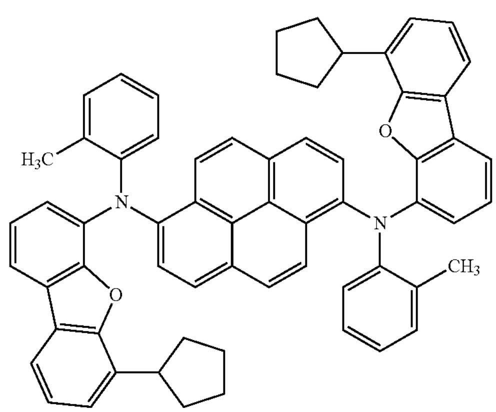
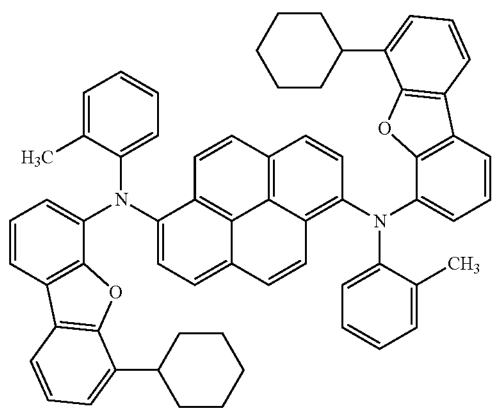
[Chem. 45]
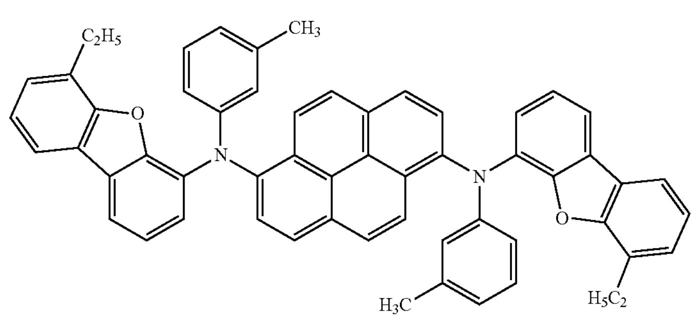

-continued
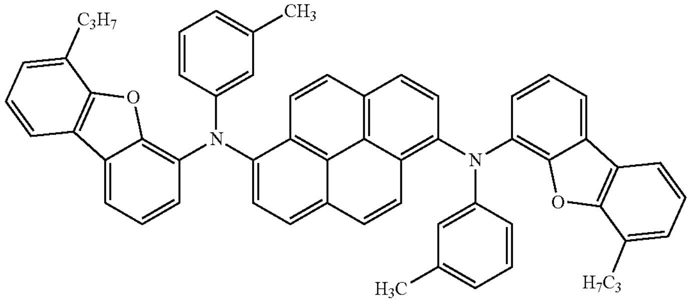
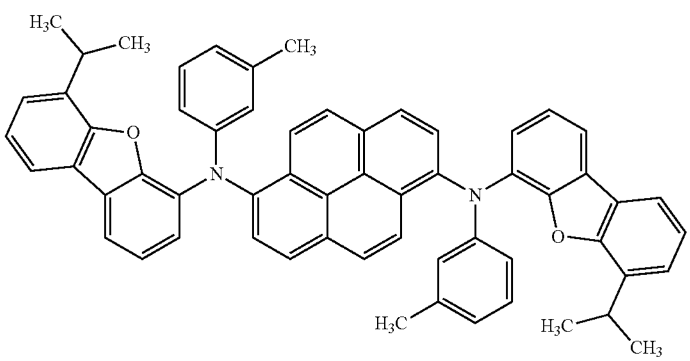
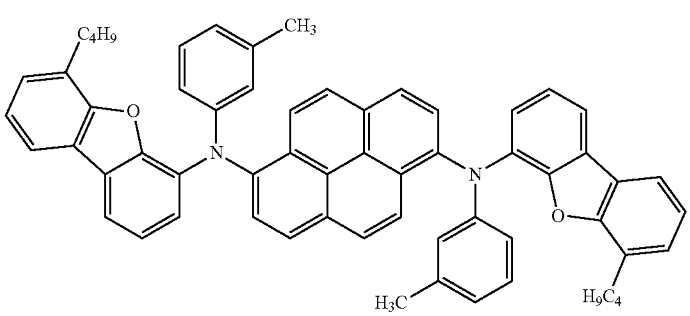
[Chem. 46]
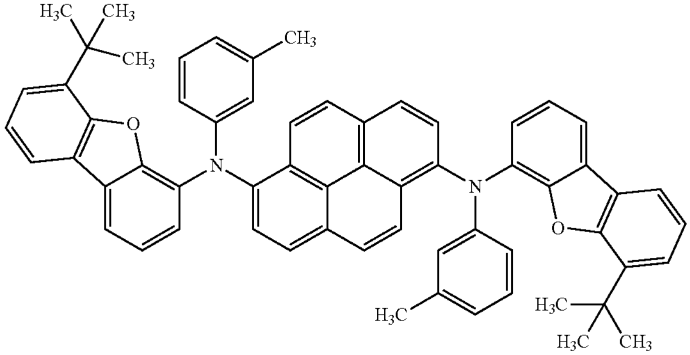

-continued
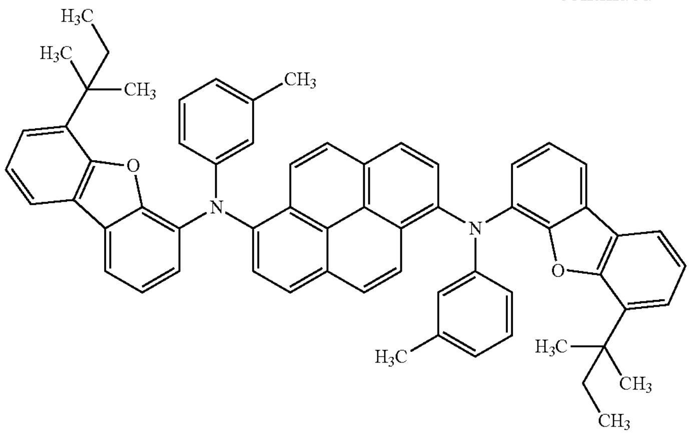
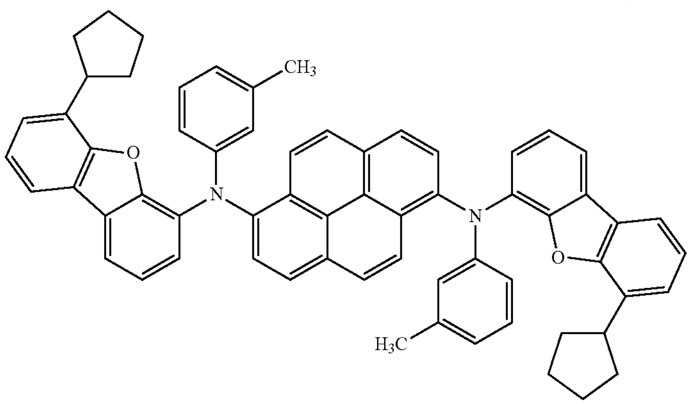
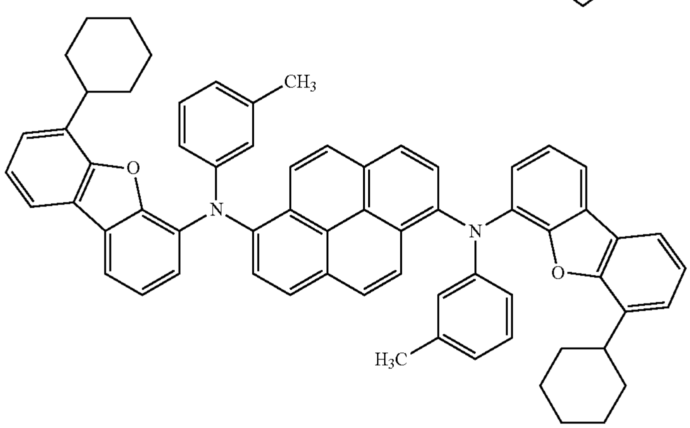
[Chem. 47]
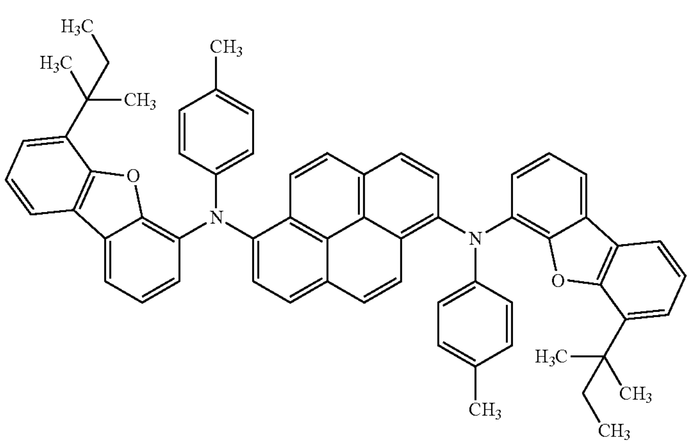

-continued
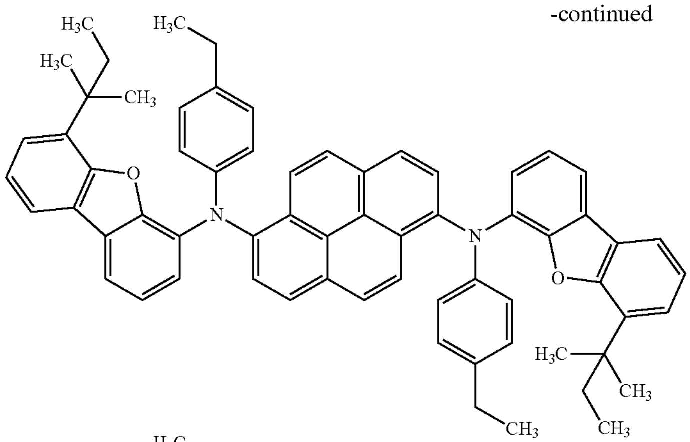
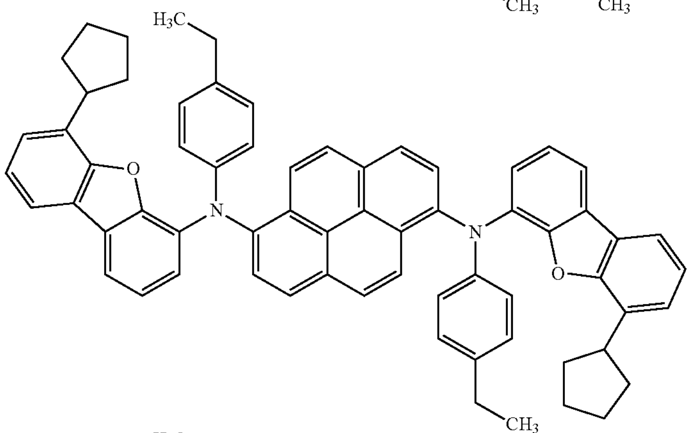
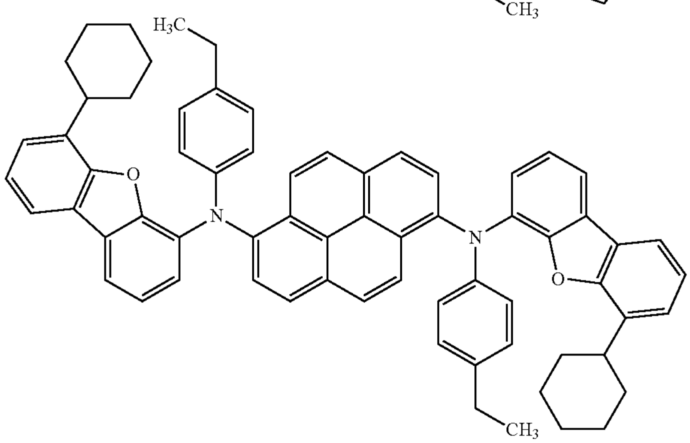
[Chem. 48]
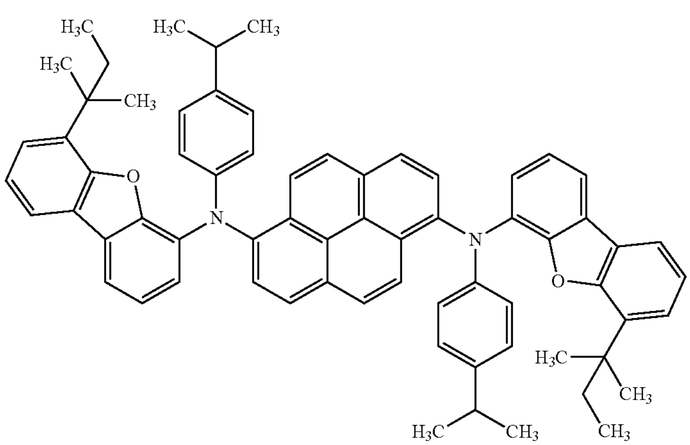

-continued
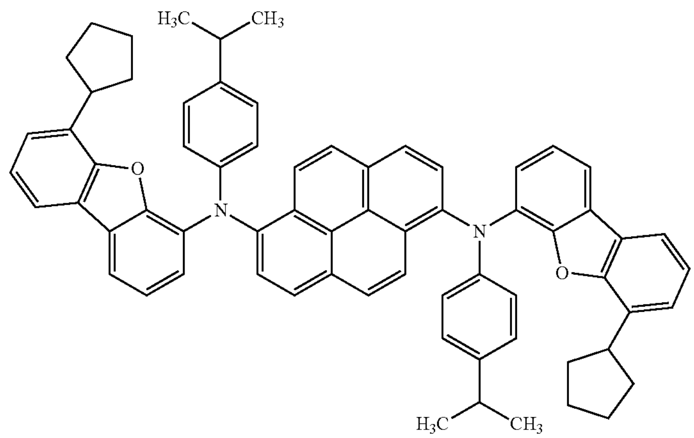
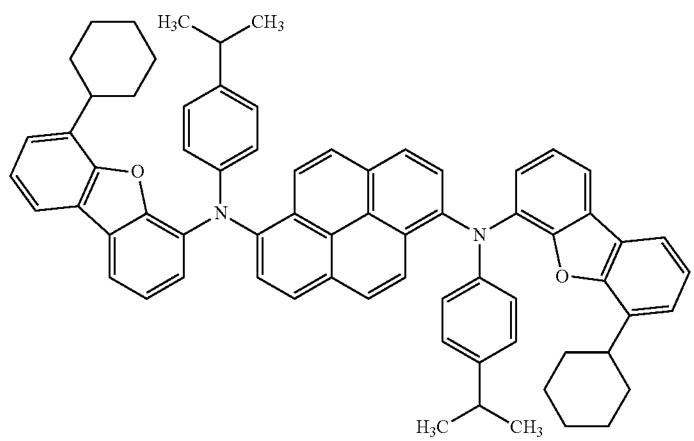
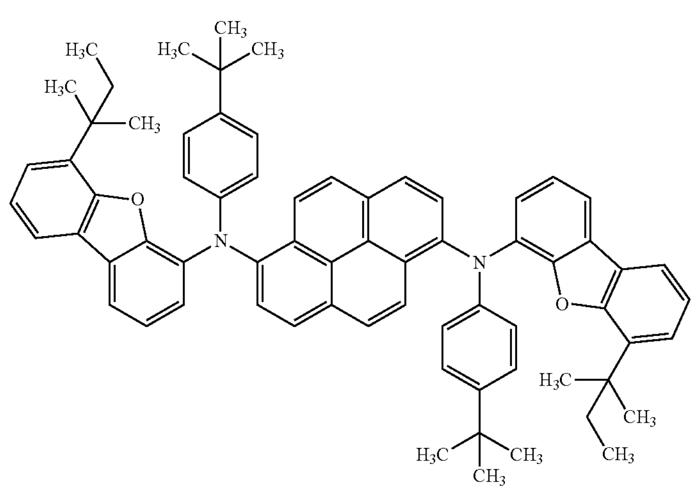

-continued
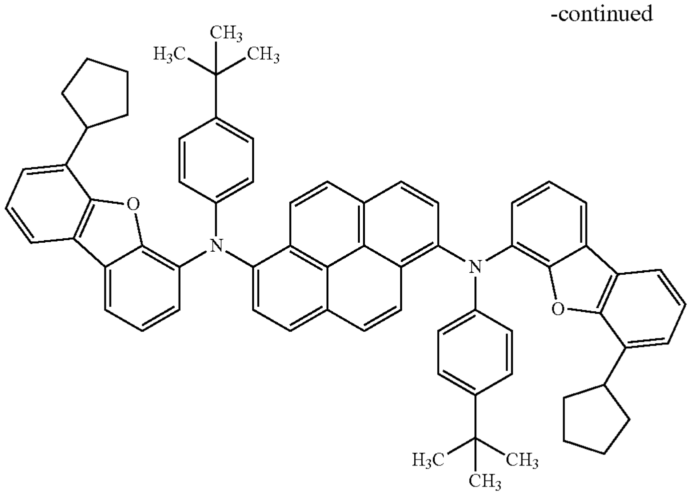
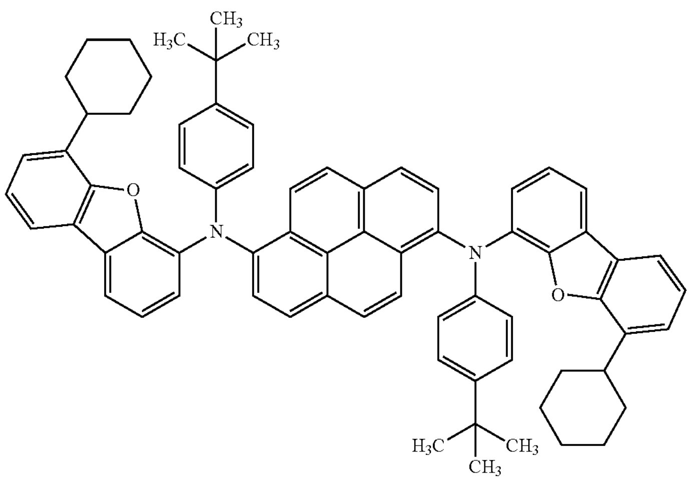
[Chem. 49]
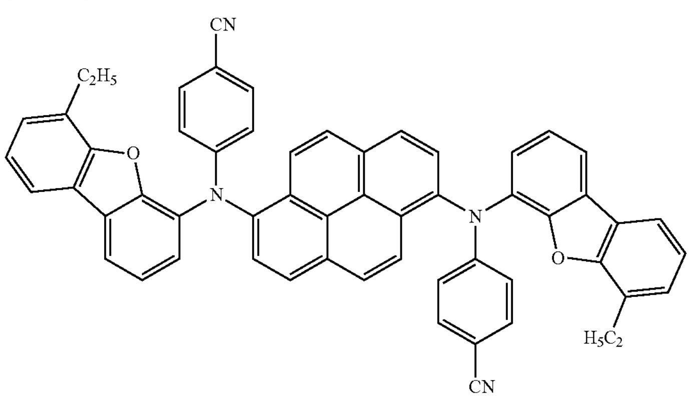

-continued
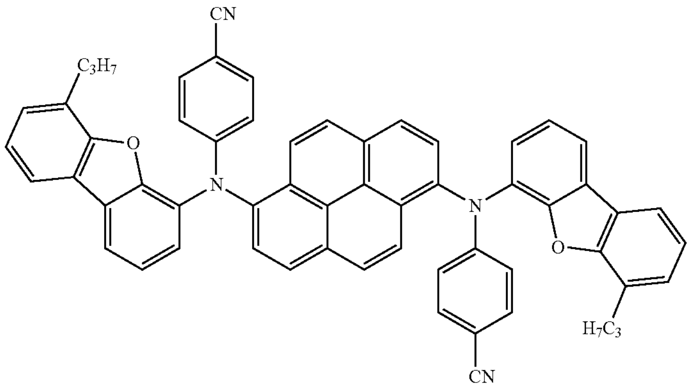
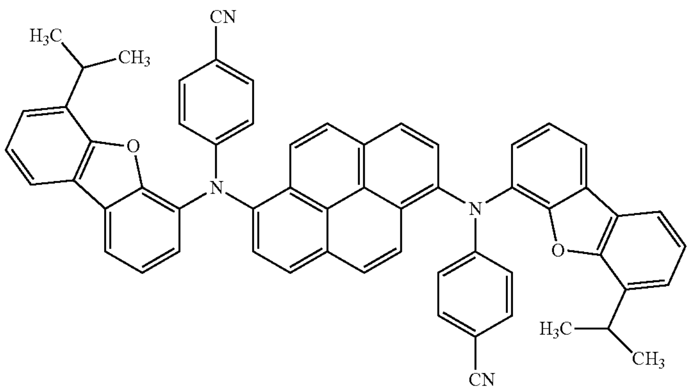
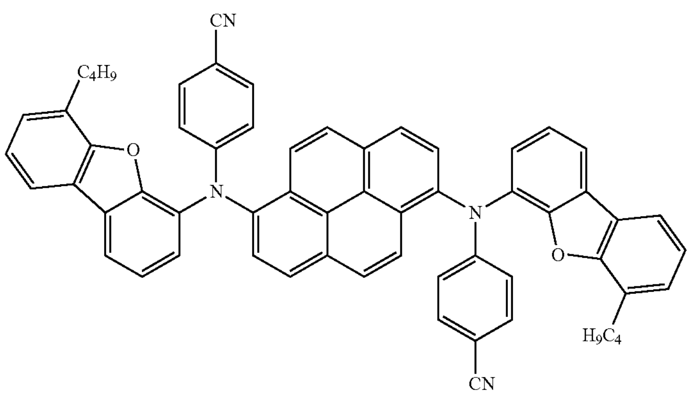
[Chem. 50]
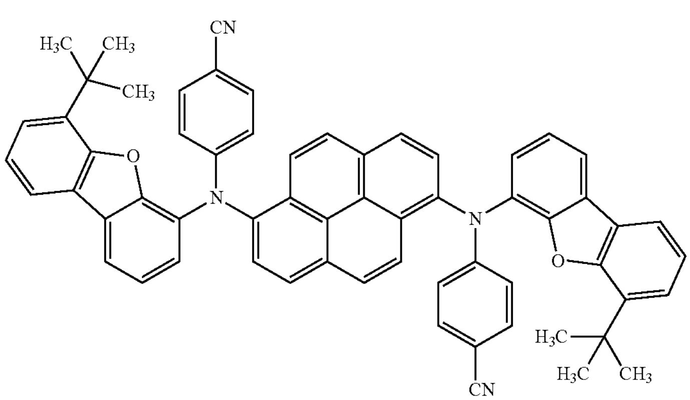

-continued
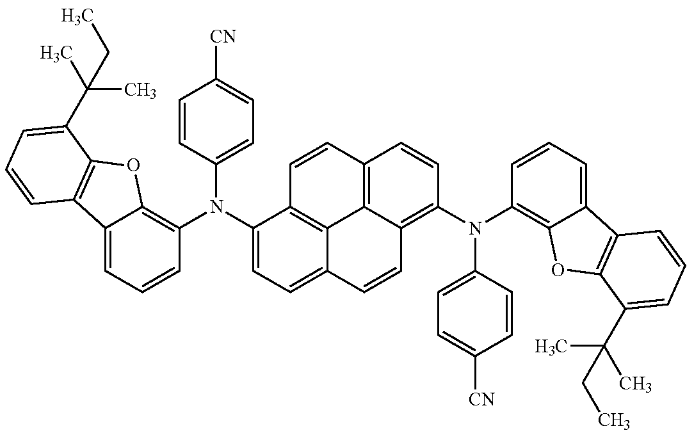
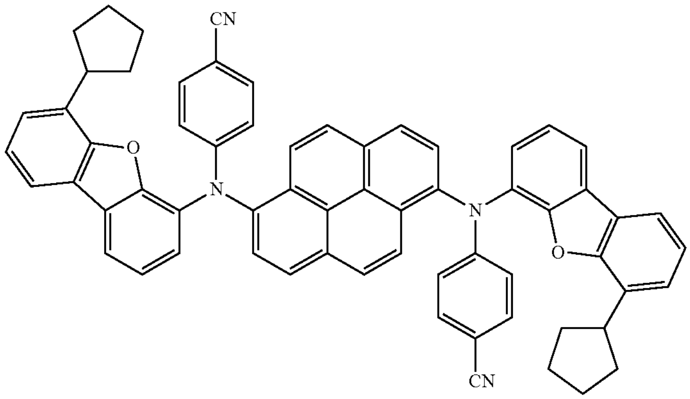
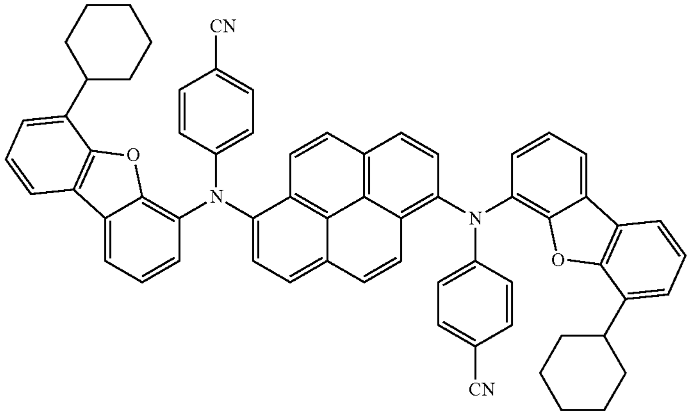
[Chem. 51]
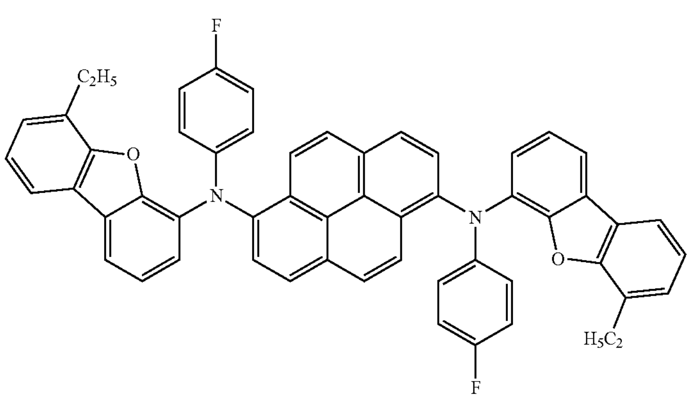

-continued
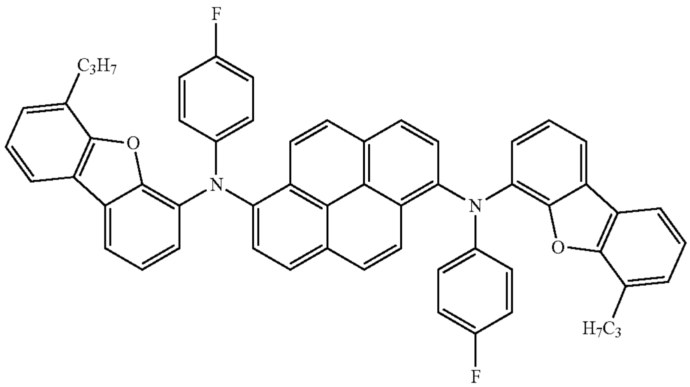
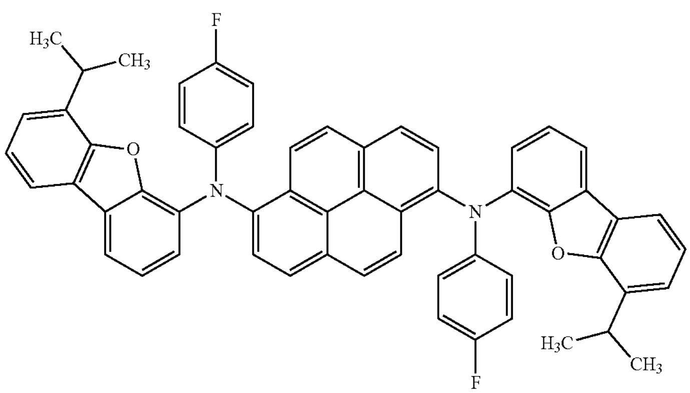
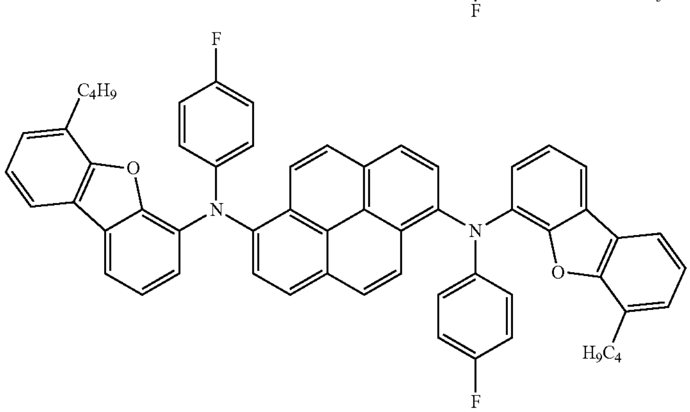
[Chem. 52]
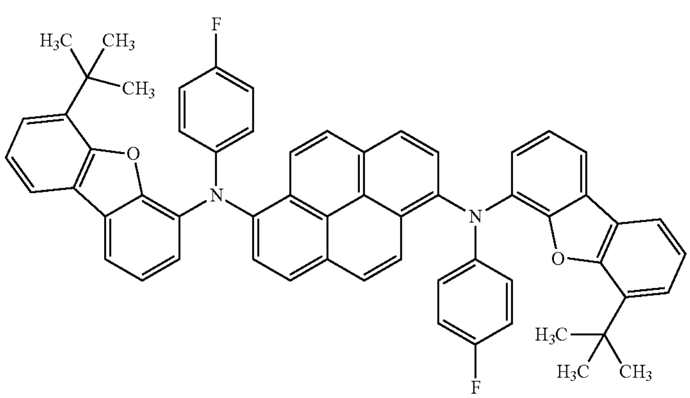

-continued
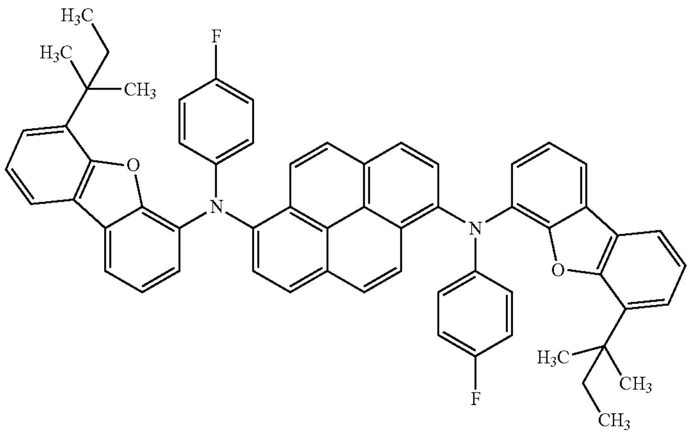
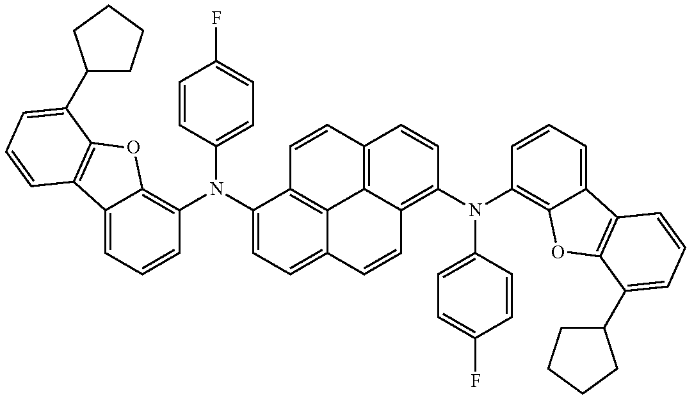
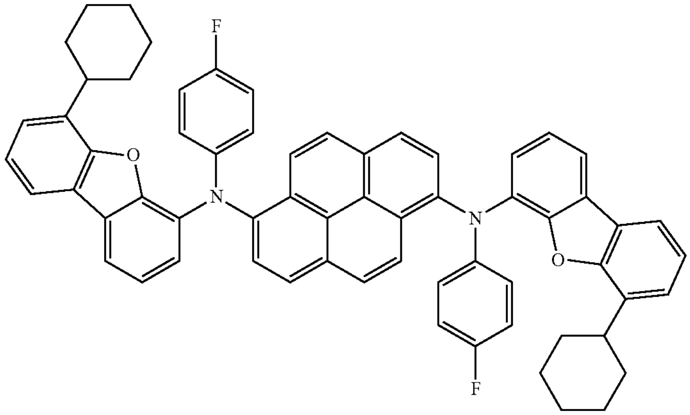
[Chem. 53]
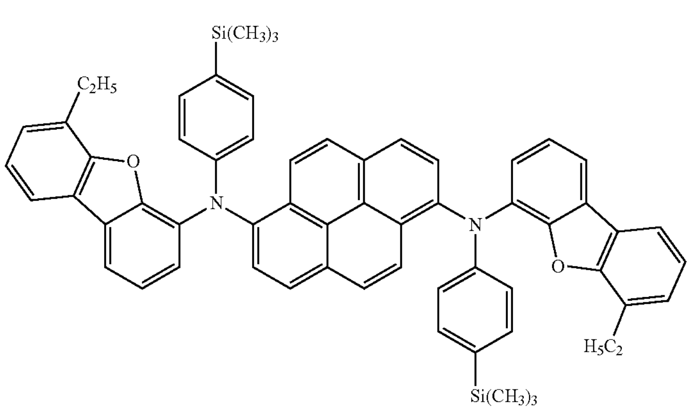

-continued
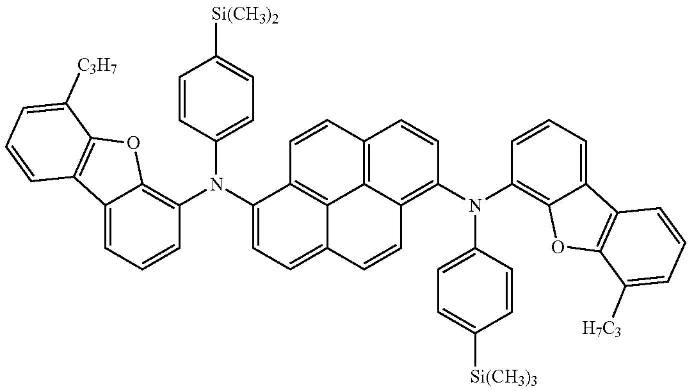
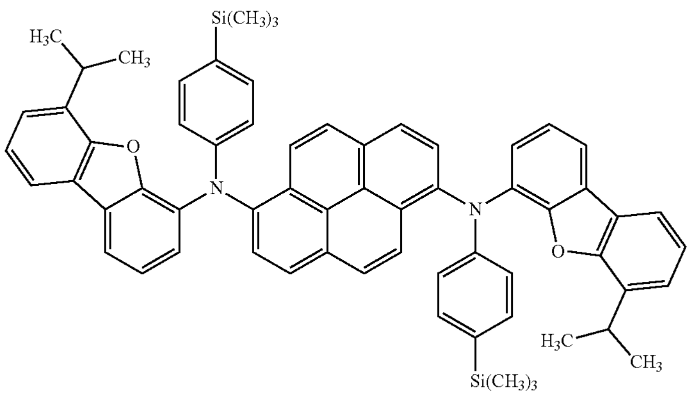
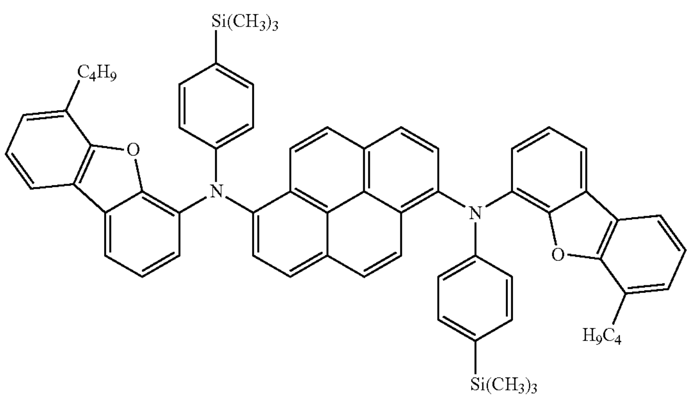
[Chem. 54]
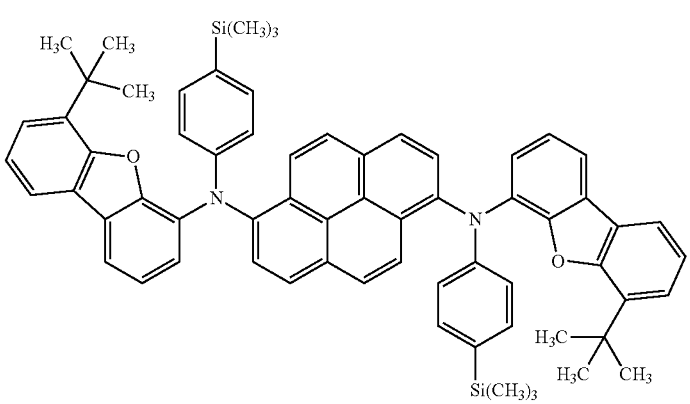

-continued
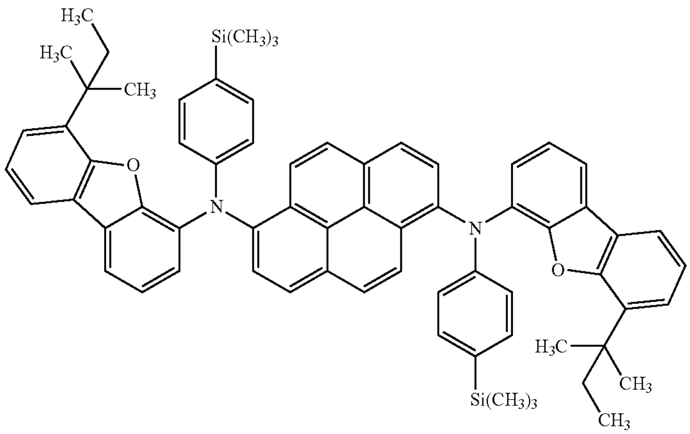
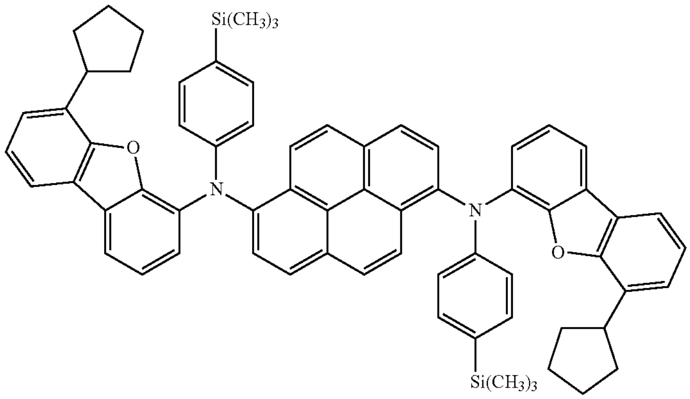
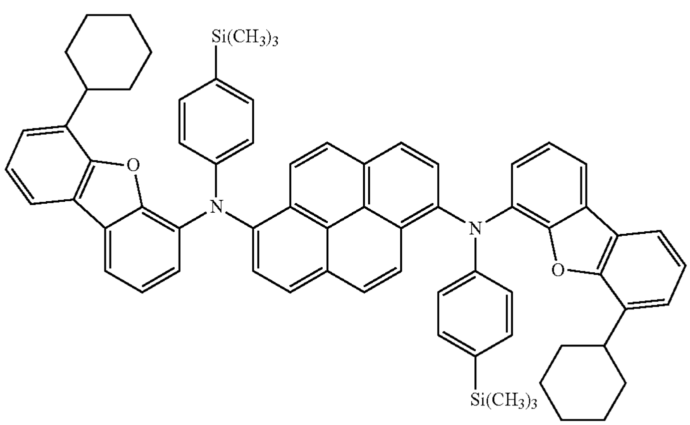
[Chem. 55]
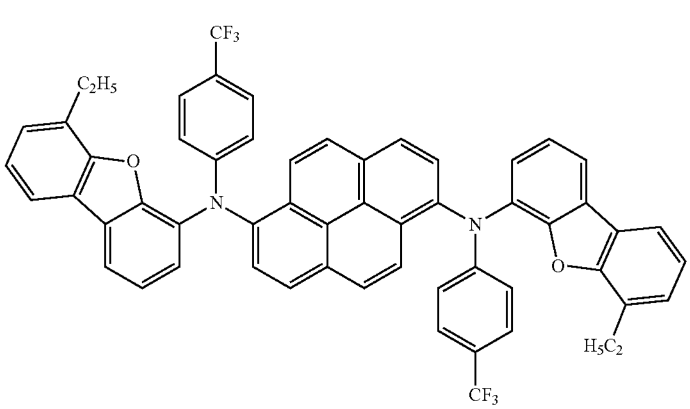

-continued
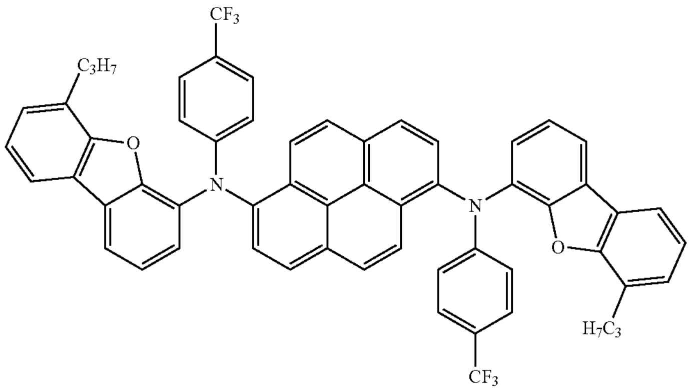
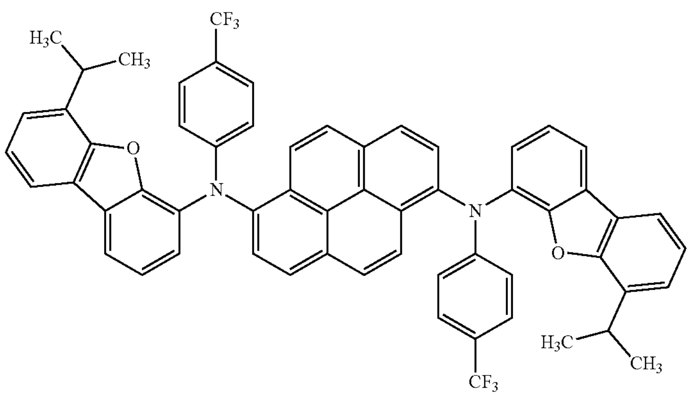
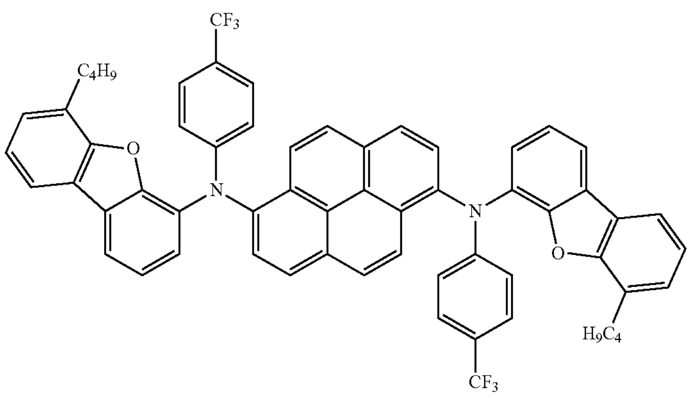
[Chem. 56]
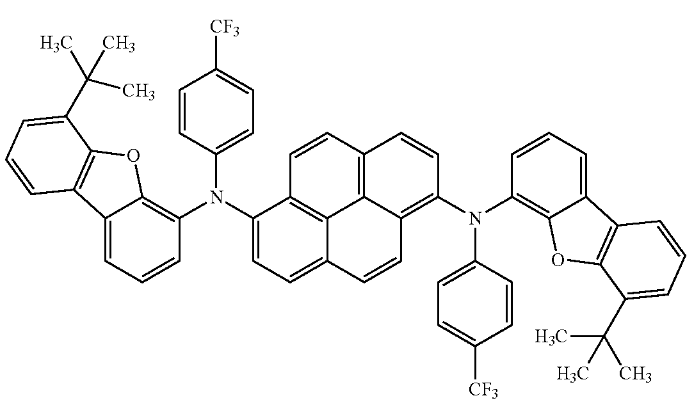

-continued
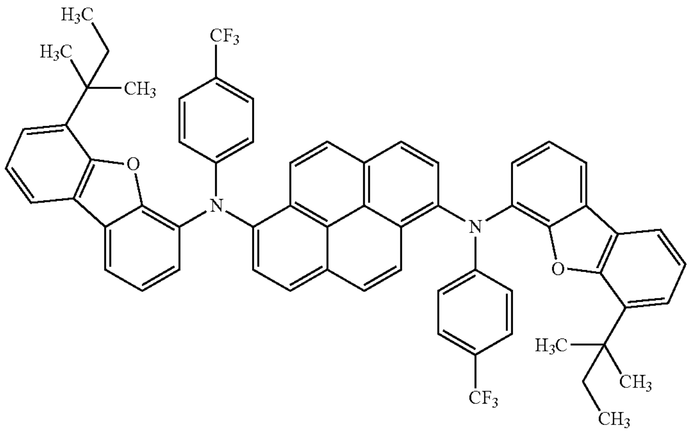
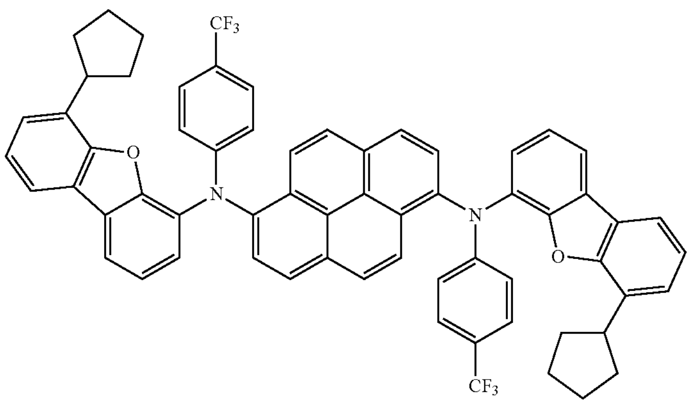
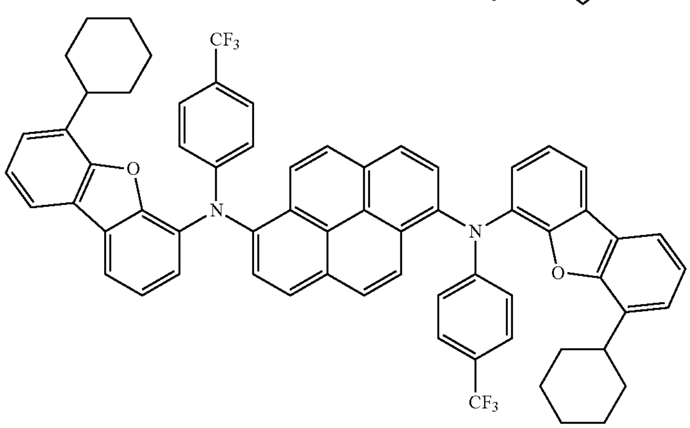
[Chem. 57]
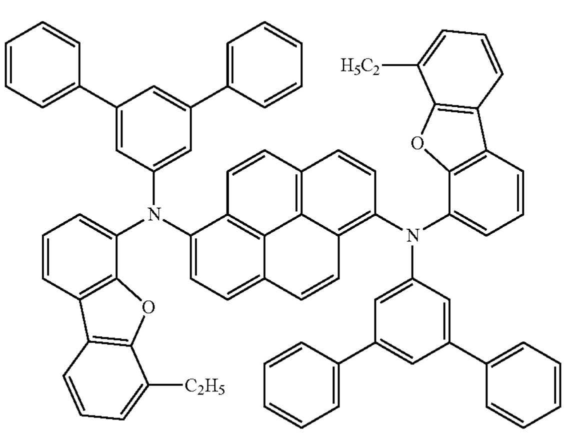
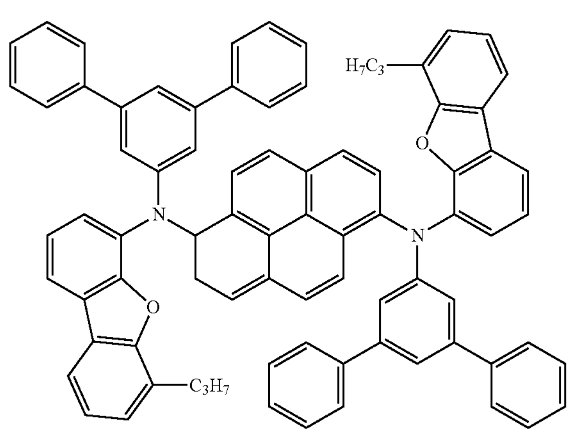

-continued
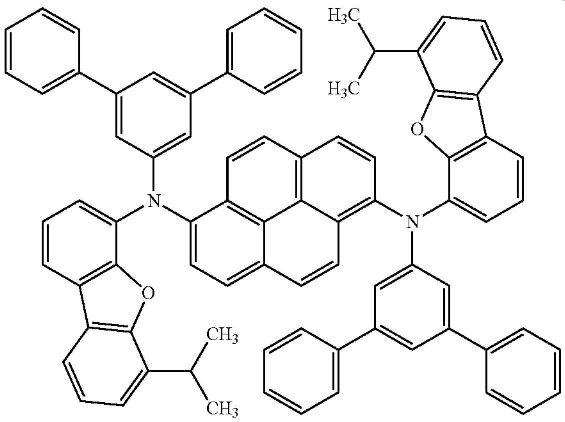
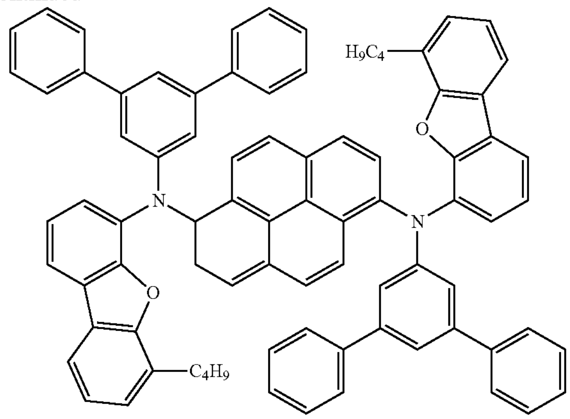
[Chem.58]
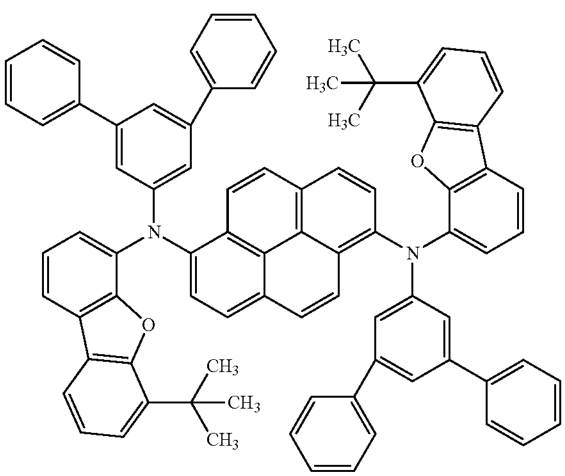
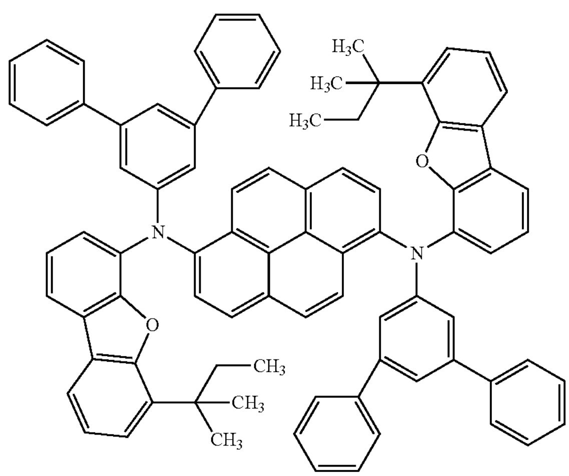
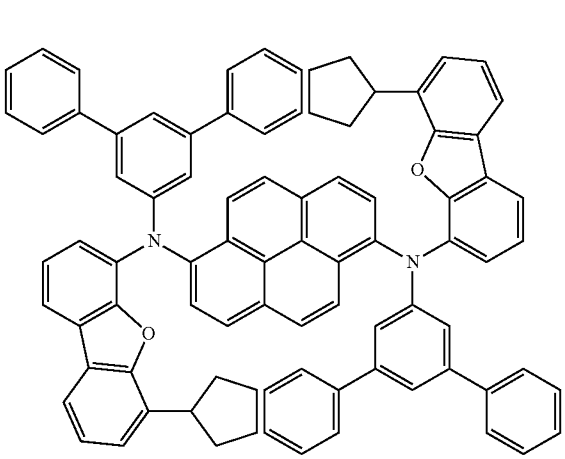
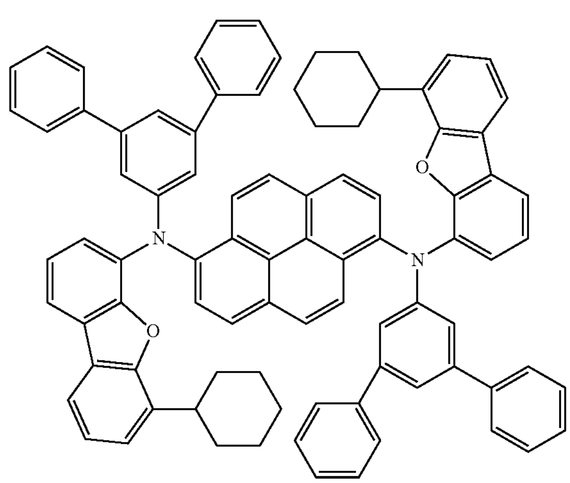

-continued
[Chem. 59]
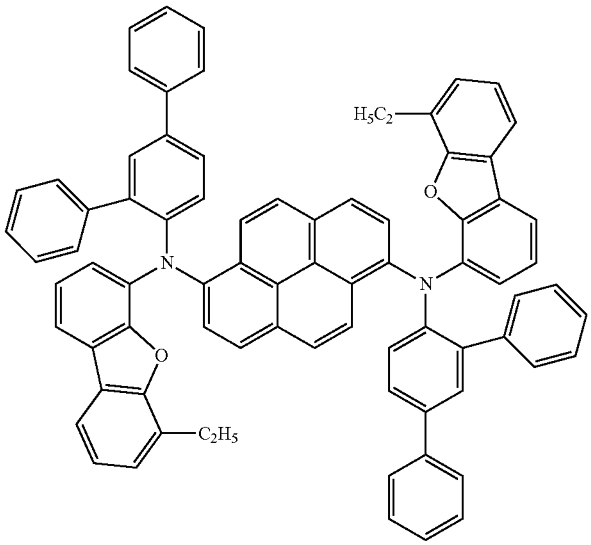
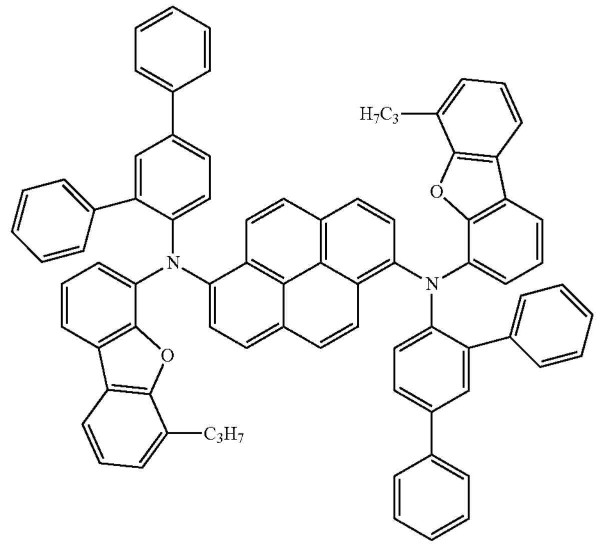
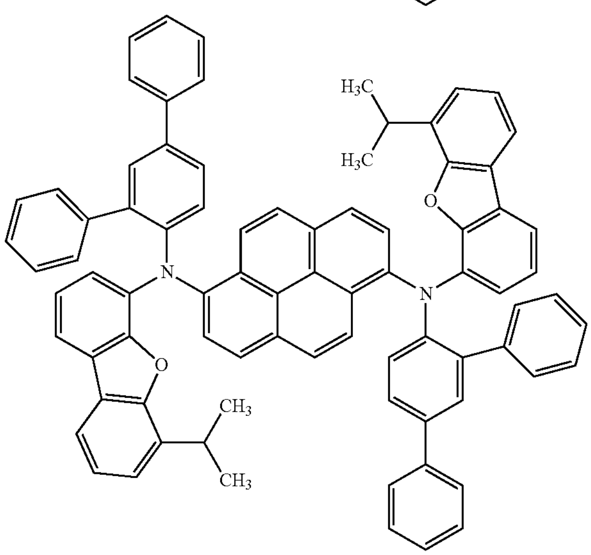
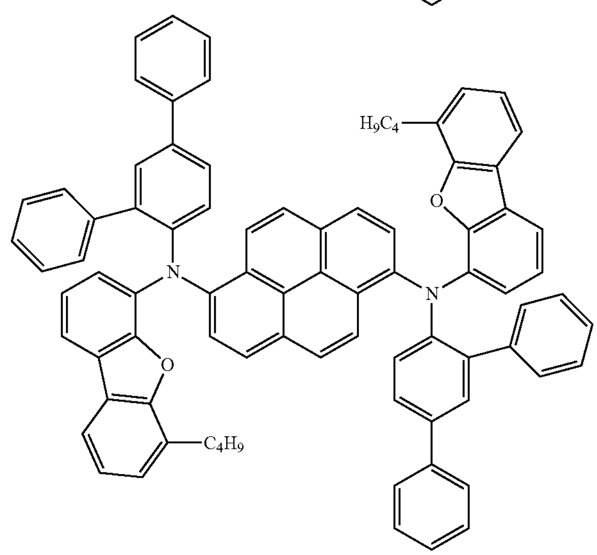
[Chem. 60]
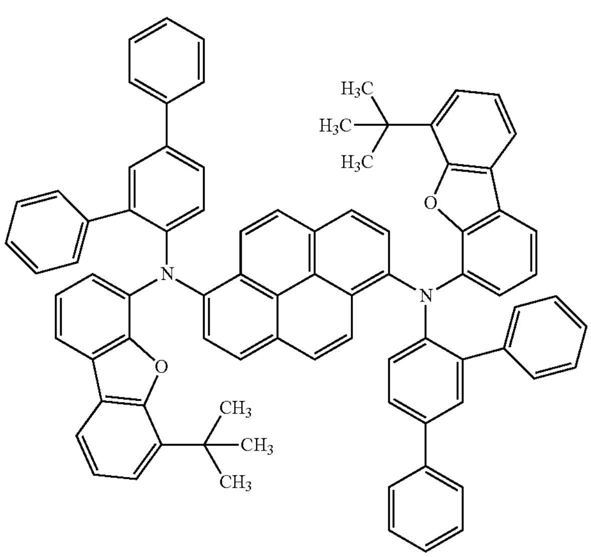
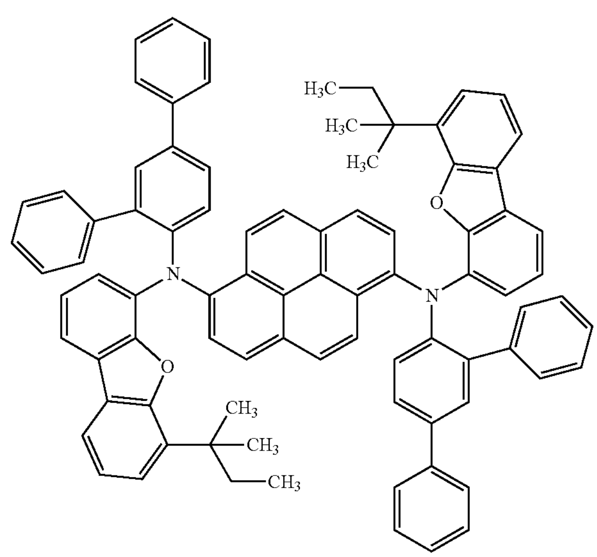

-continued
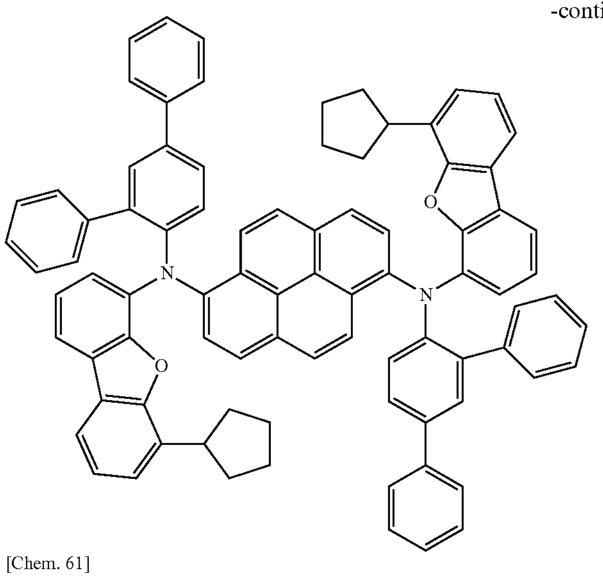
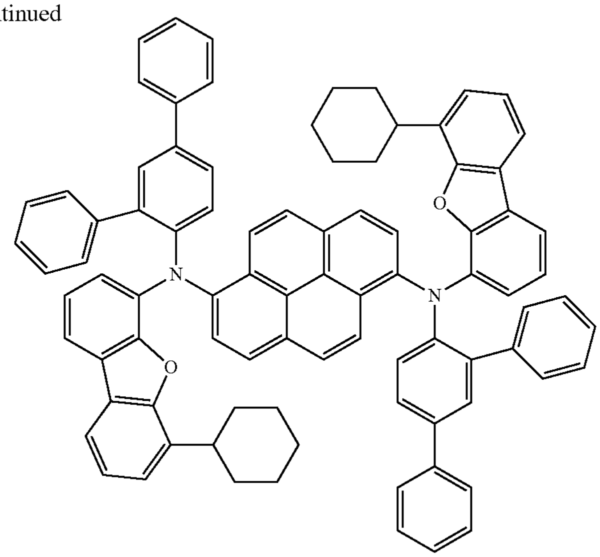
[Chem. 61]
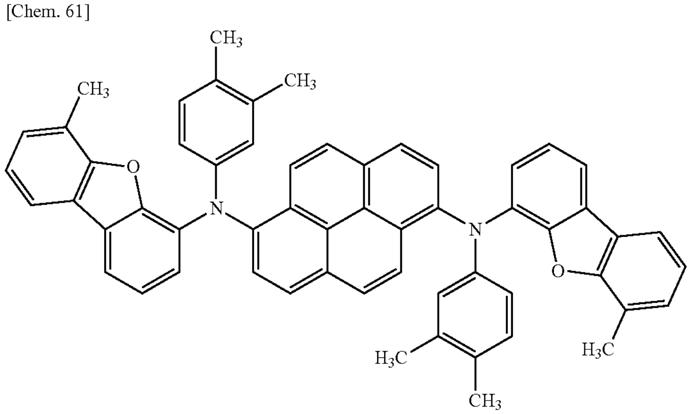
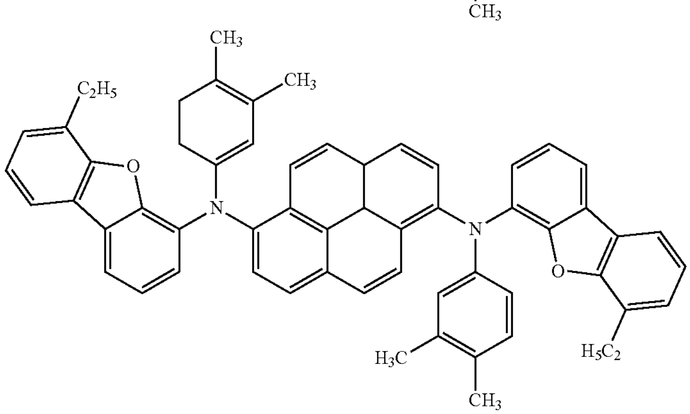
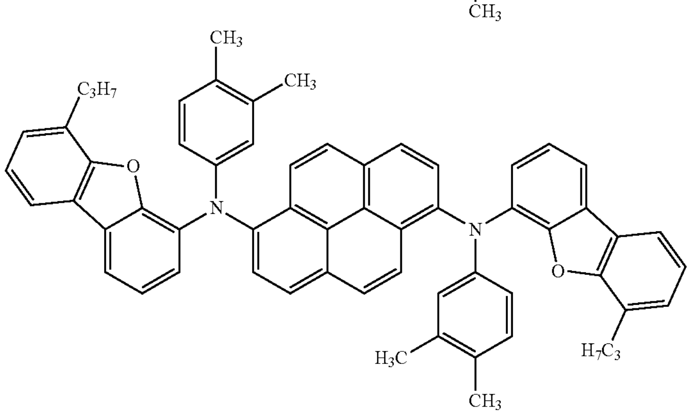

-continued
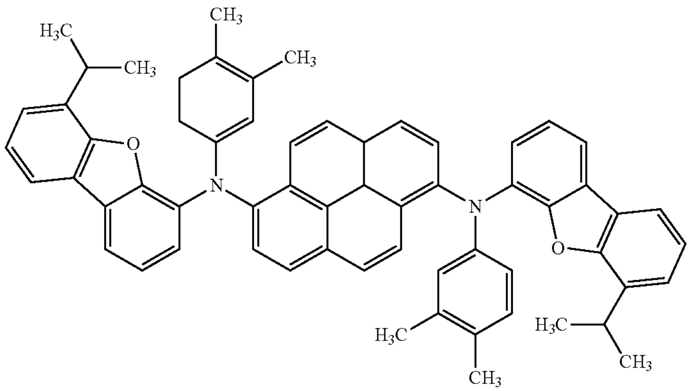
[Chem. 62]
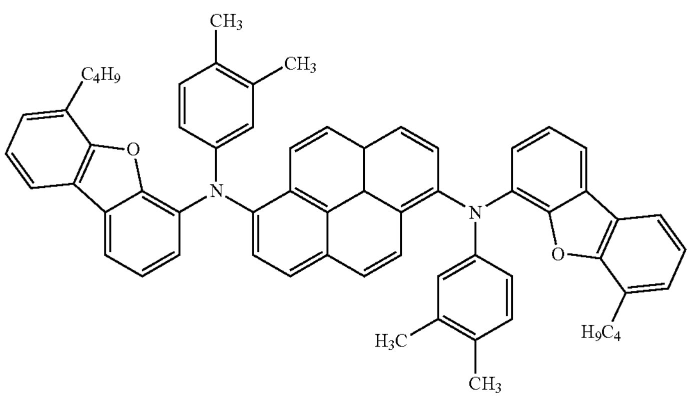
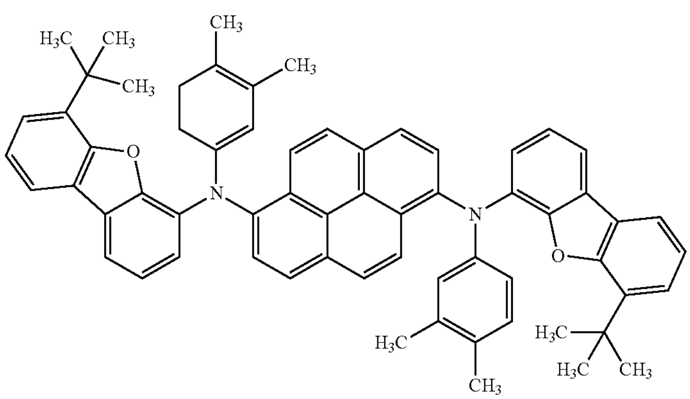
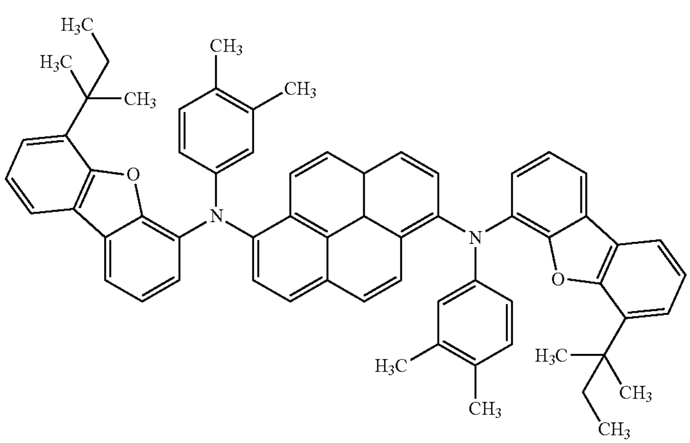

-continued
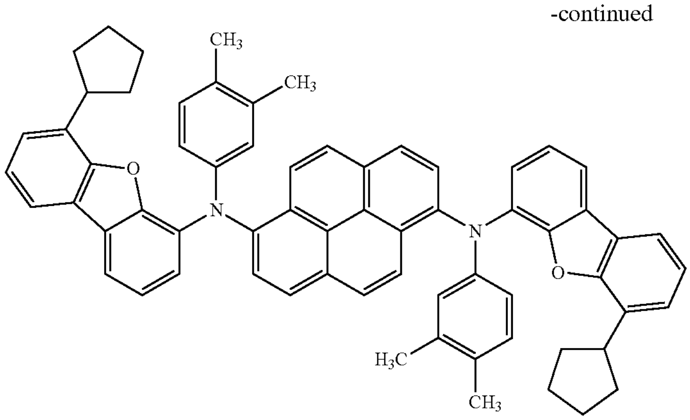
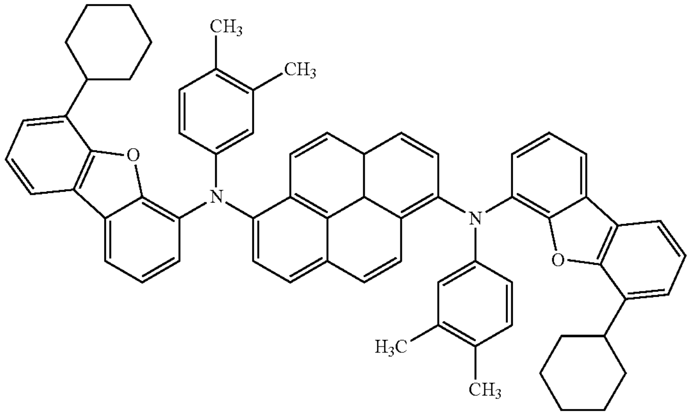
[Chem. 63]
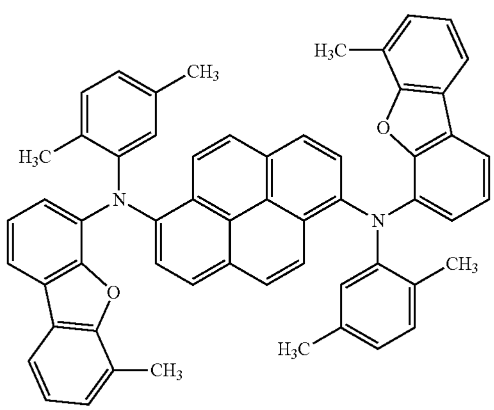
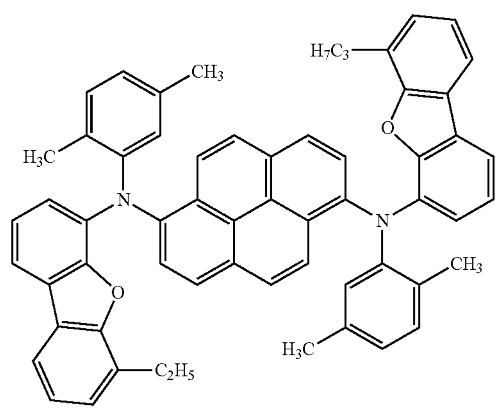
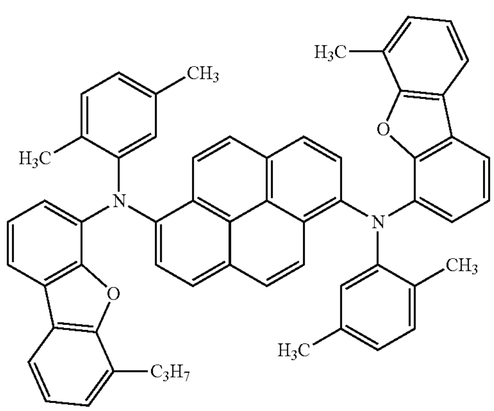
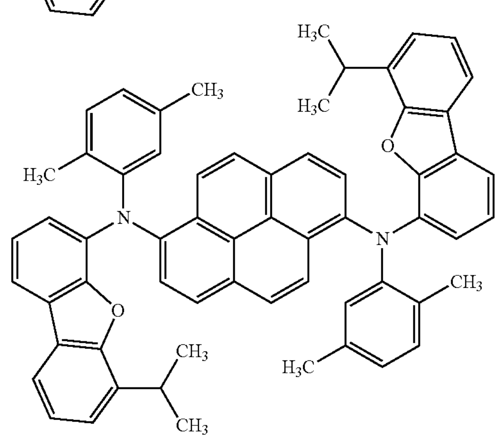

-continued
[Chem.64]
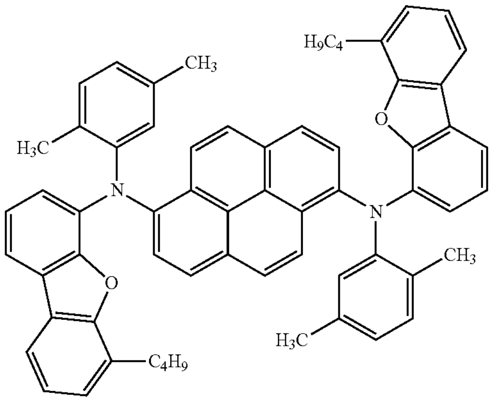
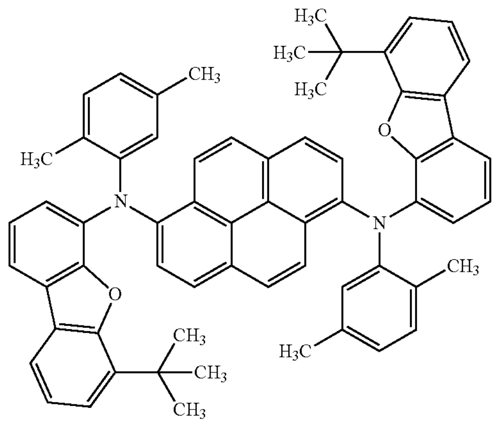
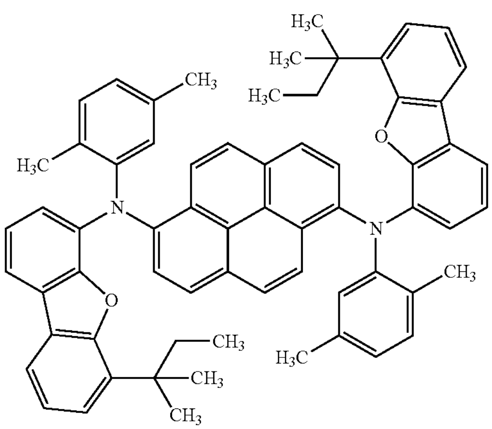
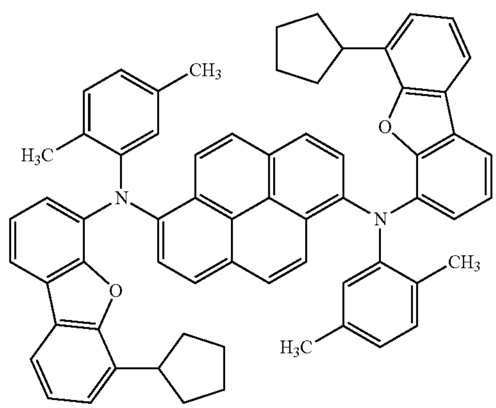
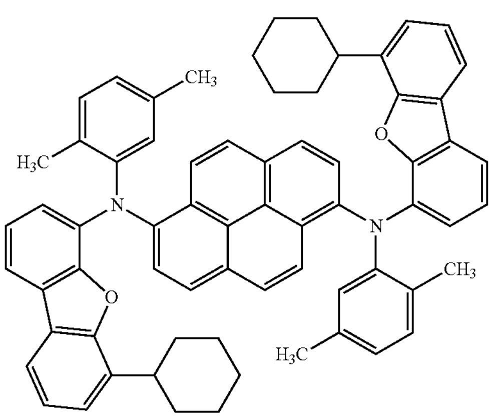

[Chem. 65]
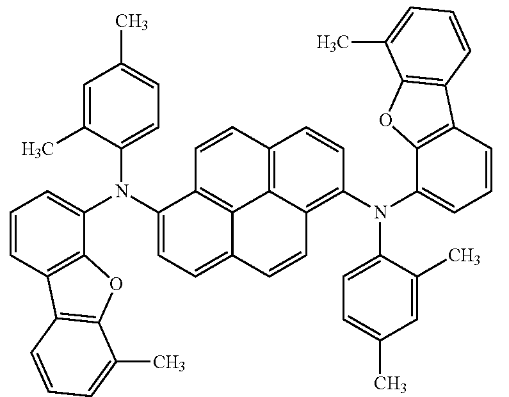
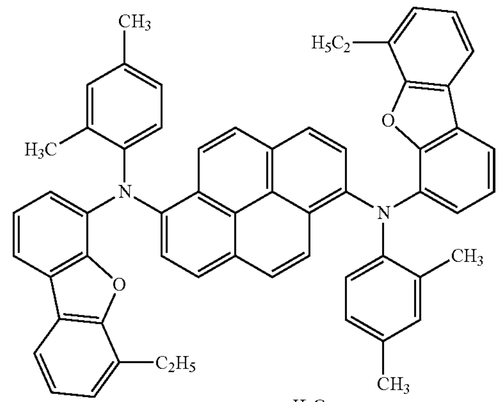
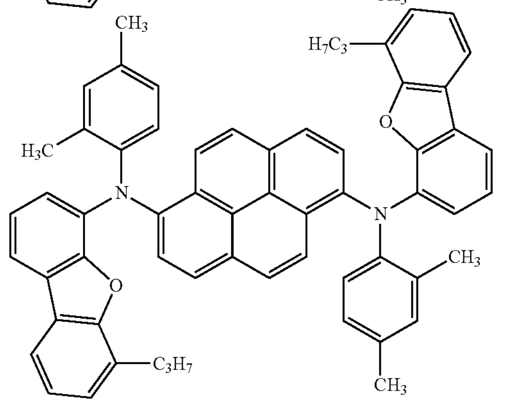
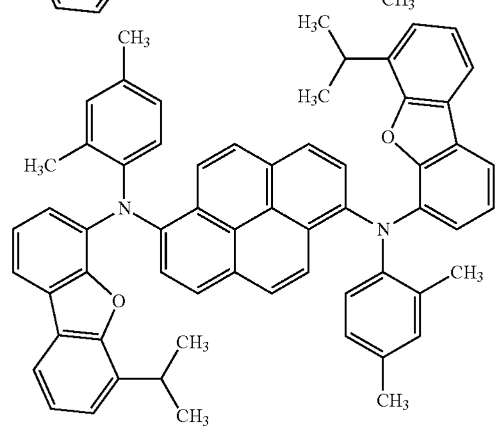
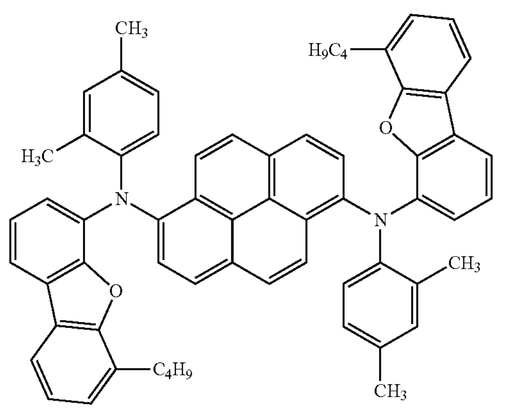
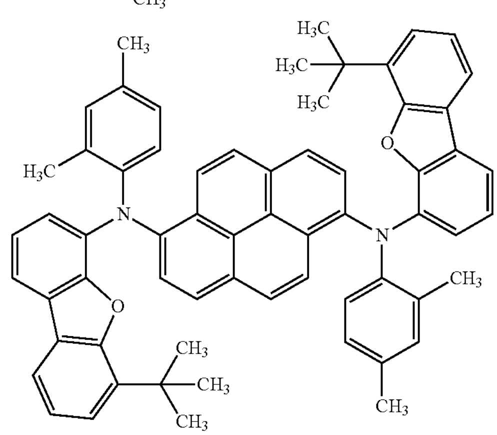
[Chem. 66]
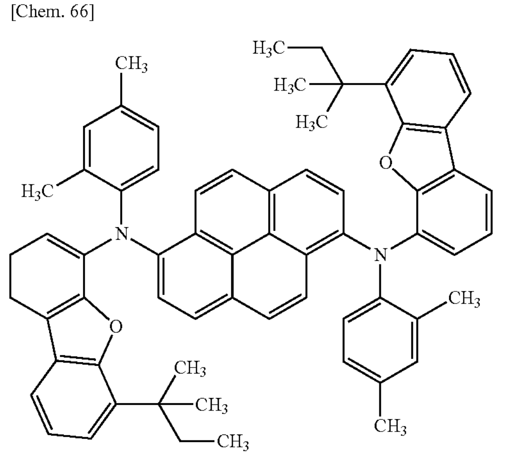
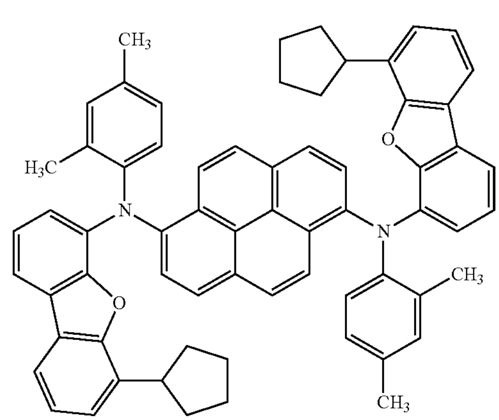

-continued
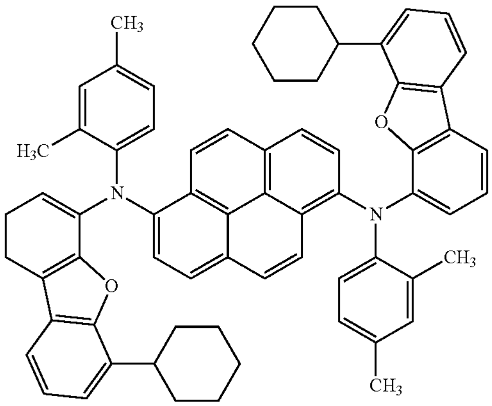
[Chem. 67]
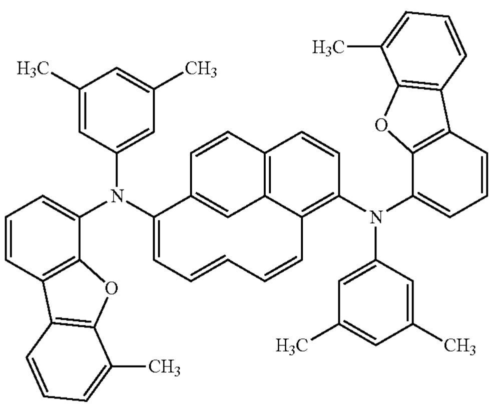
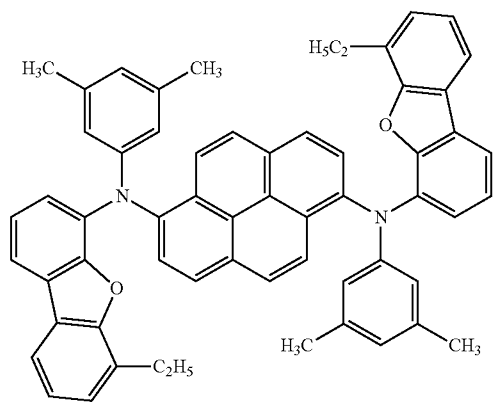
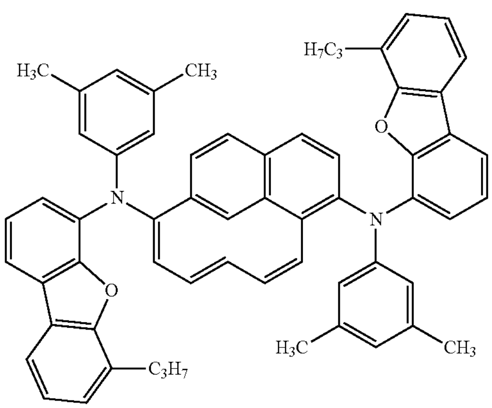
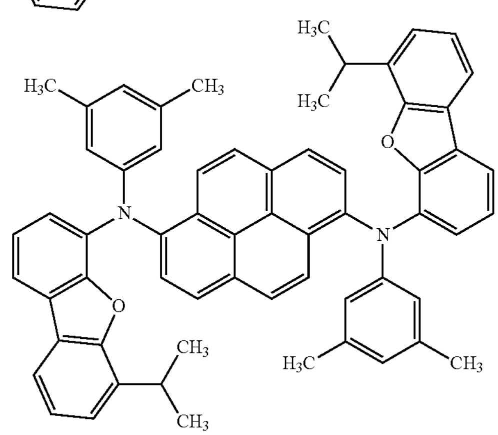
[Chem. 68]
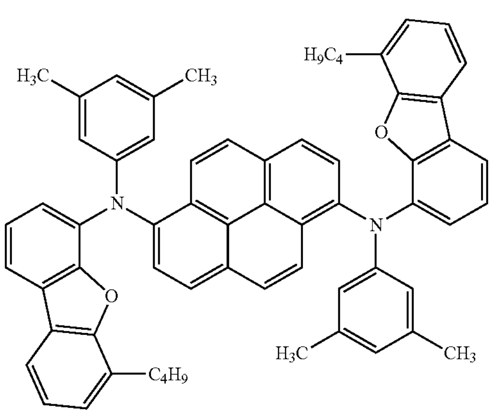
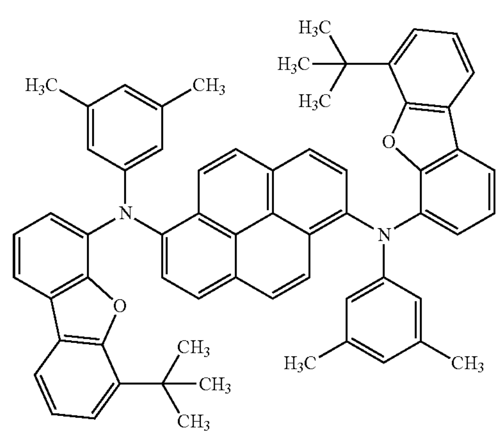

-continued
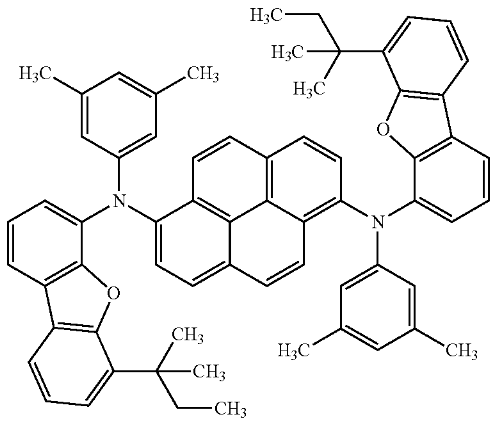
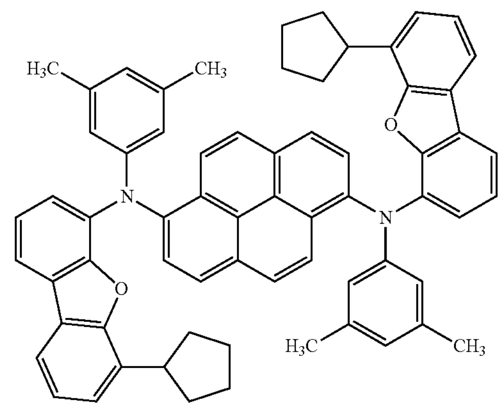
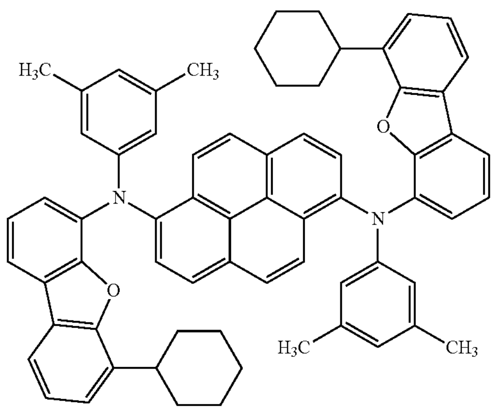
[Chem. 69]
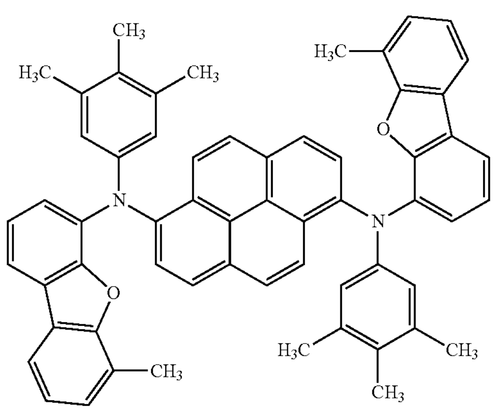
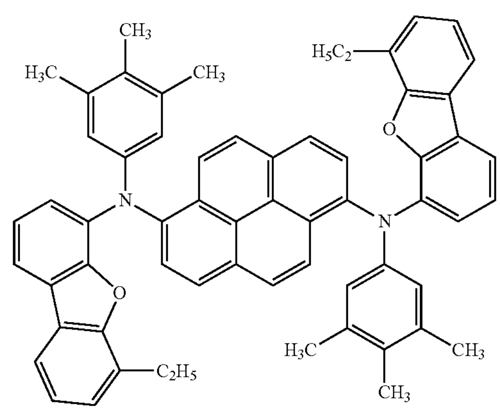
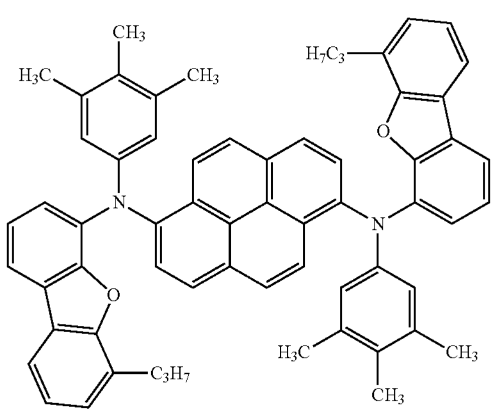
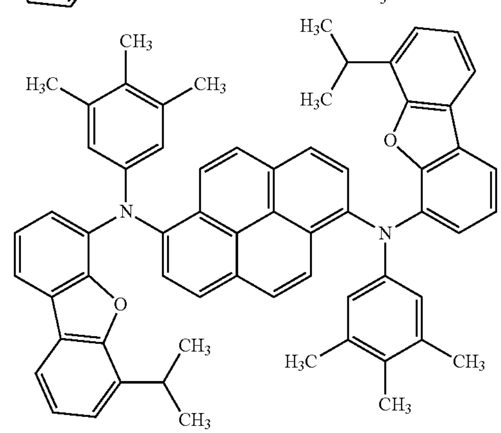

-continued
[Chem. 70]
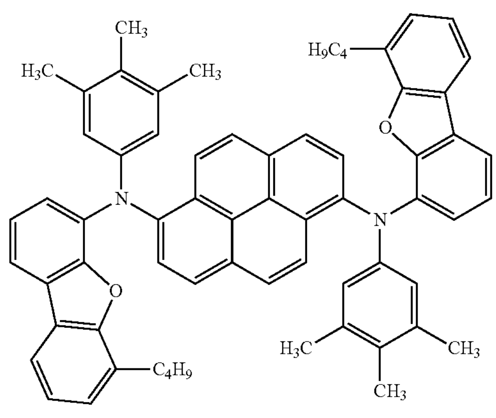
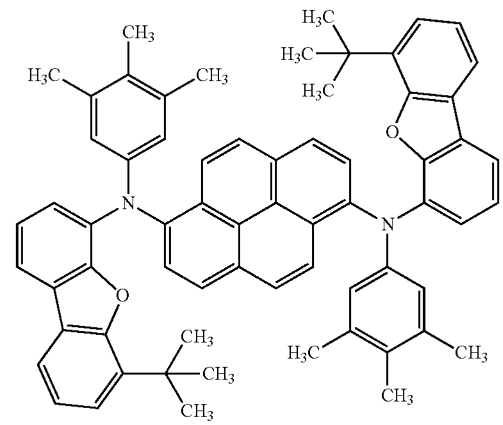
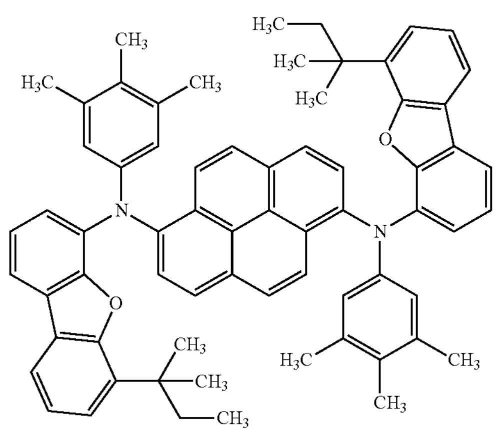
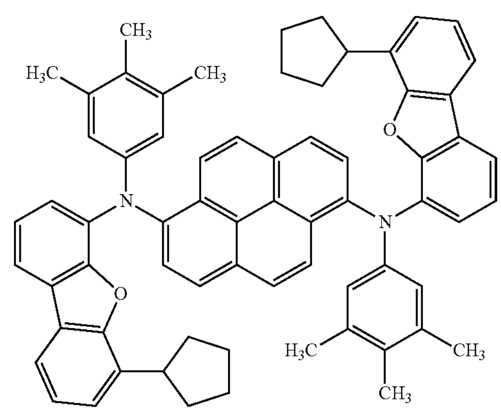
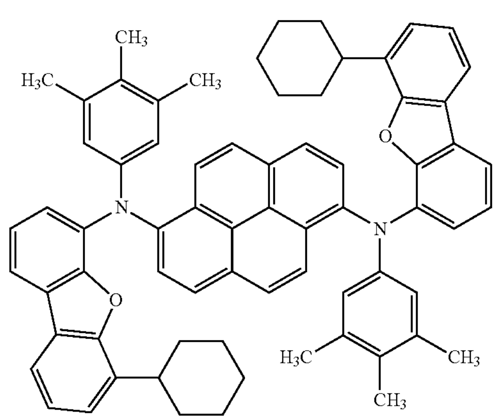

-continued
[Chem. 71]
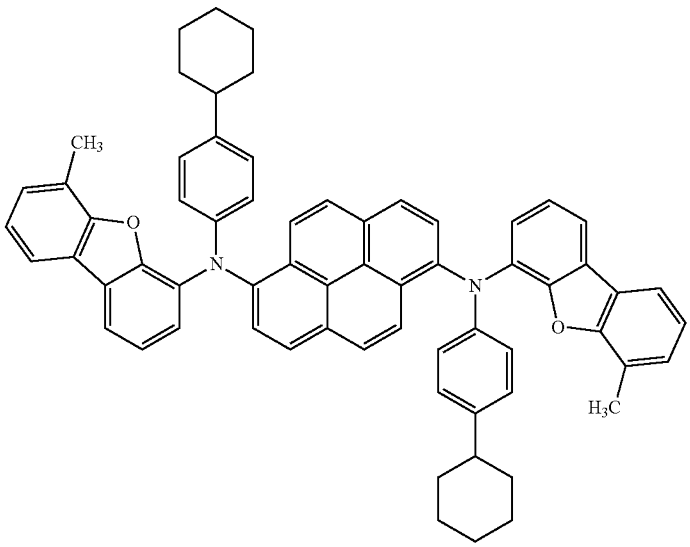
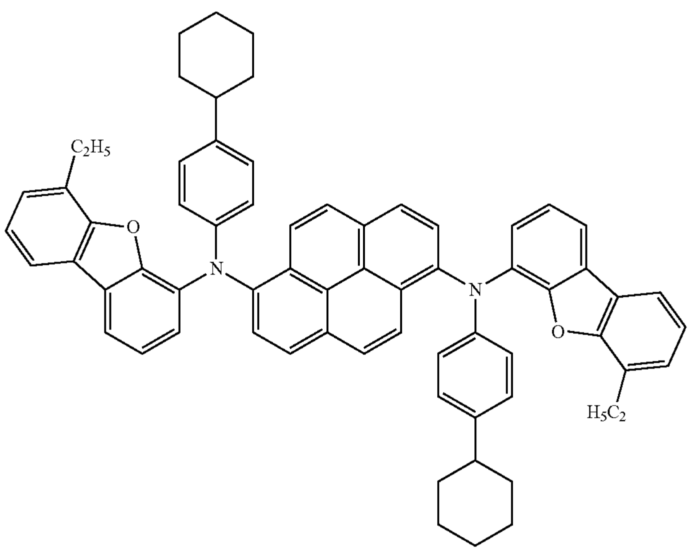
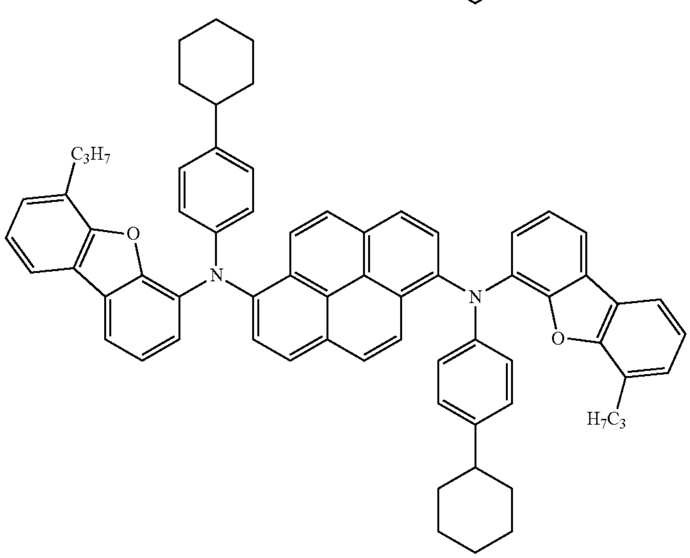

-continued
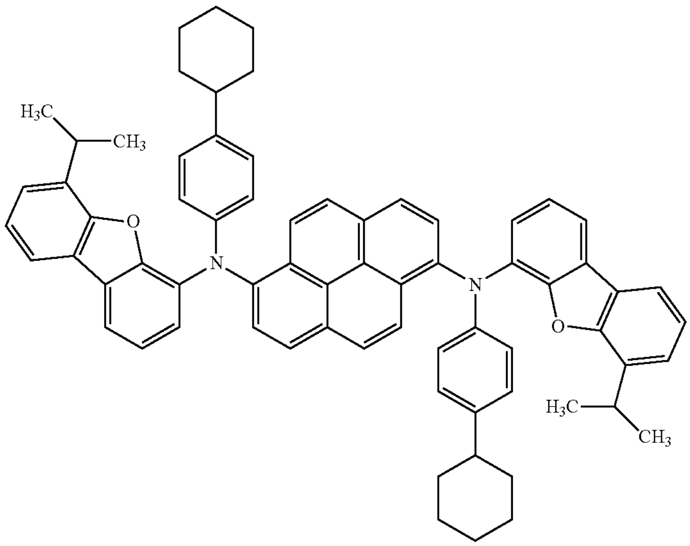
[Chem. 72]
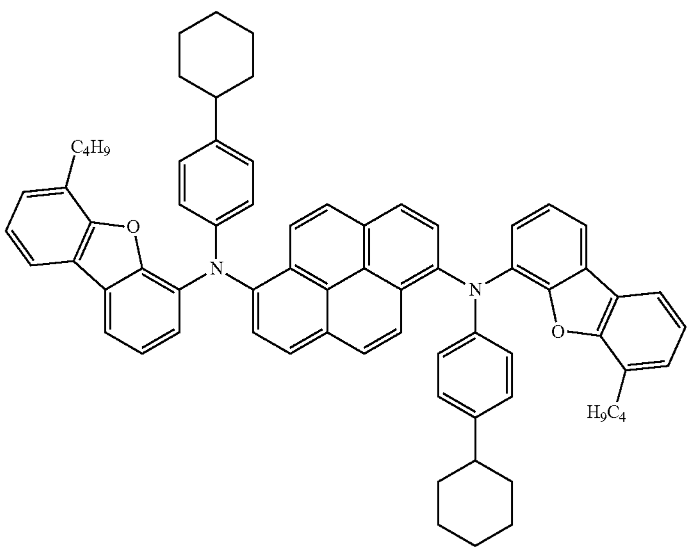
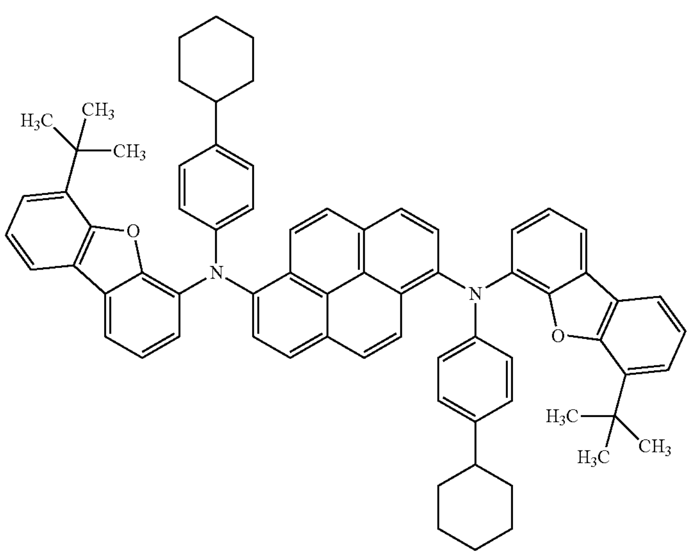

-continued
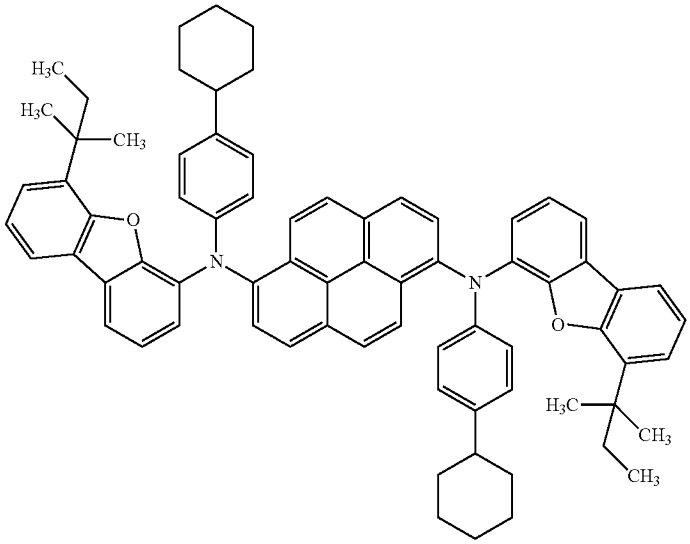
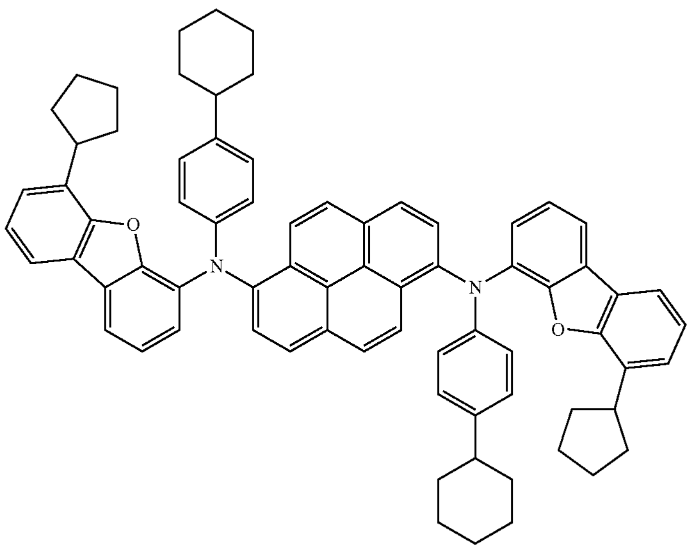
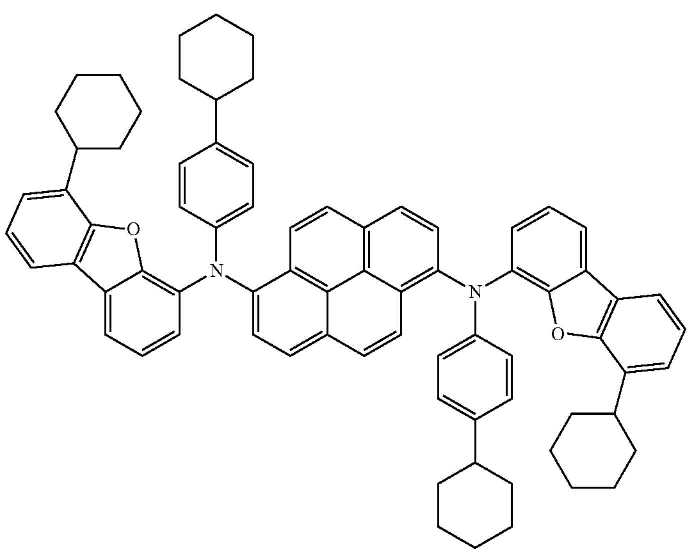

-continued
[Chem. 73]
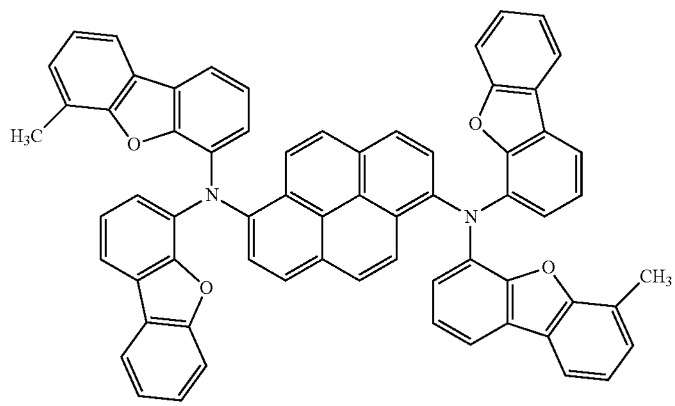
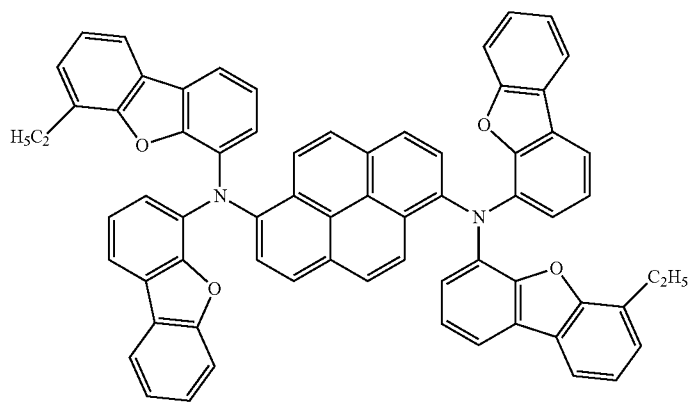
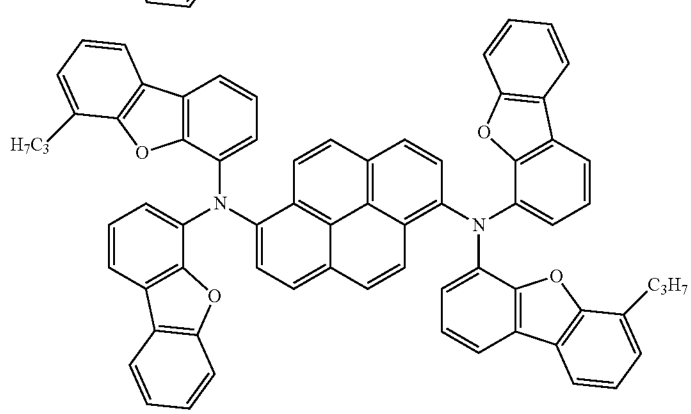
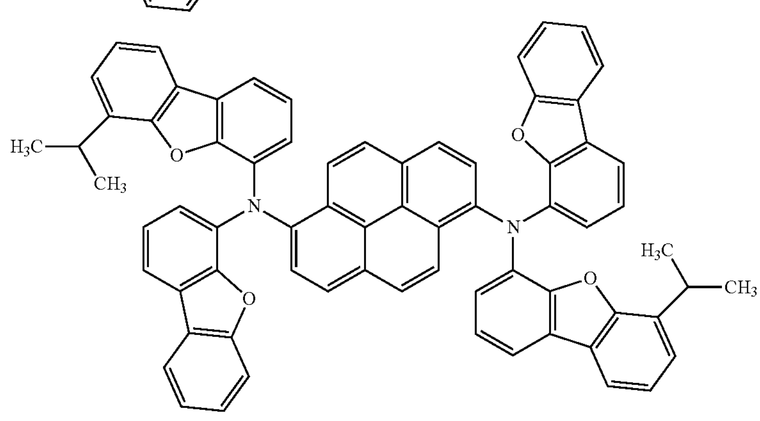

-continued
[Chem. 74]
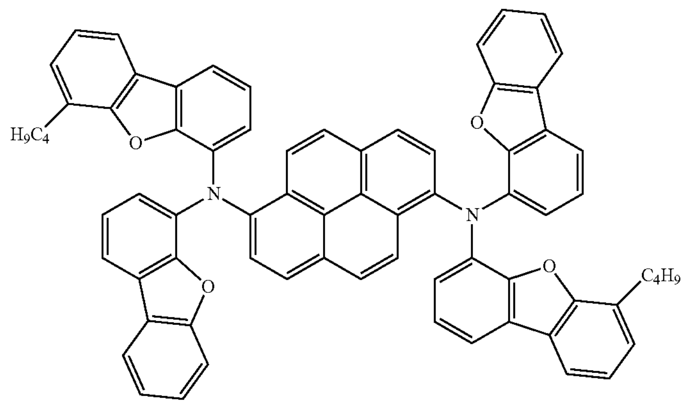
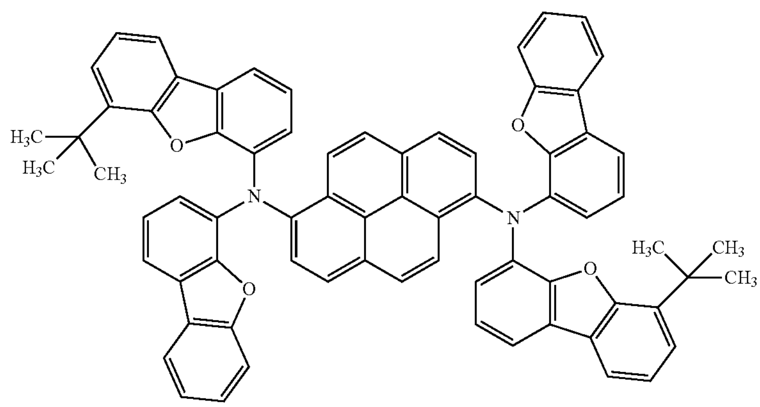
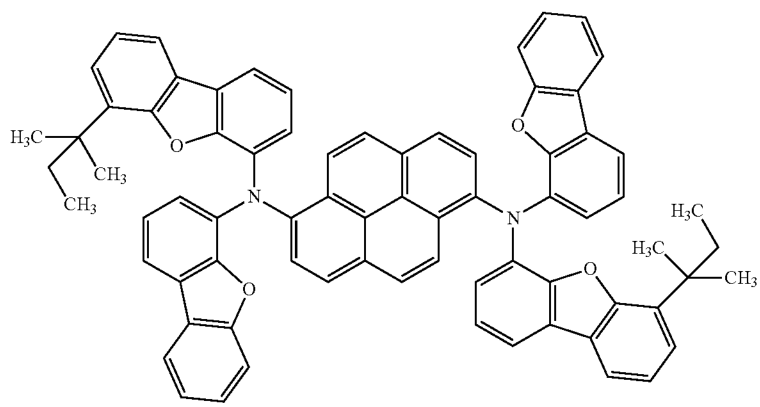
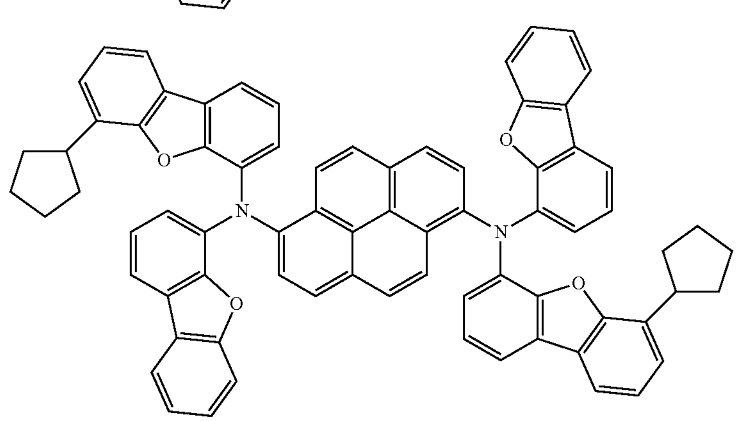

-continued
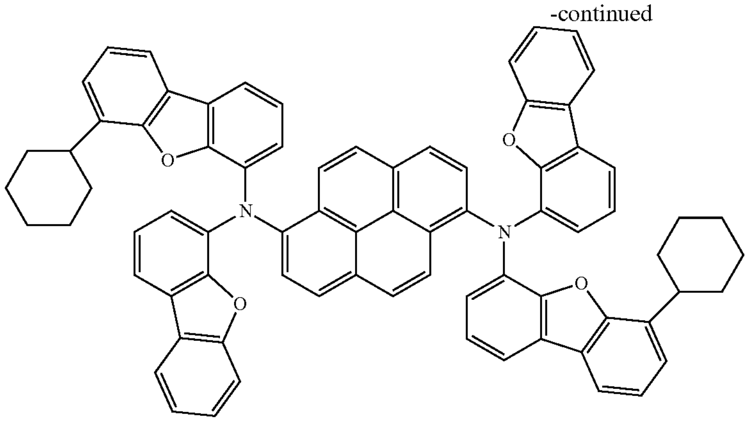
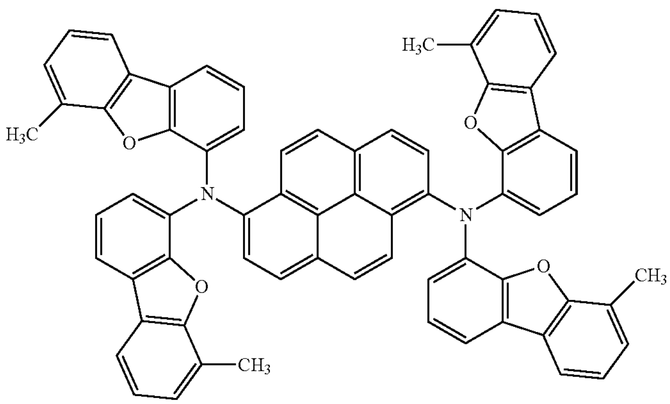
[Chem. 75]
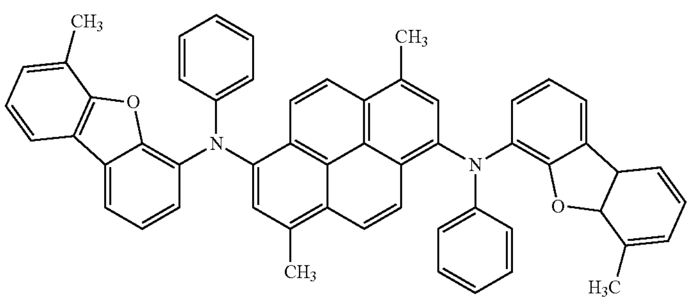
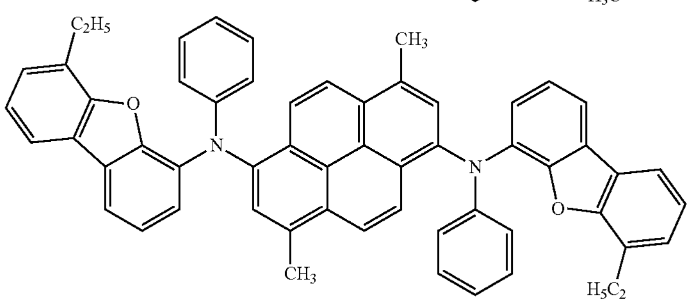
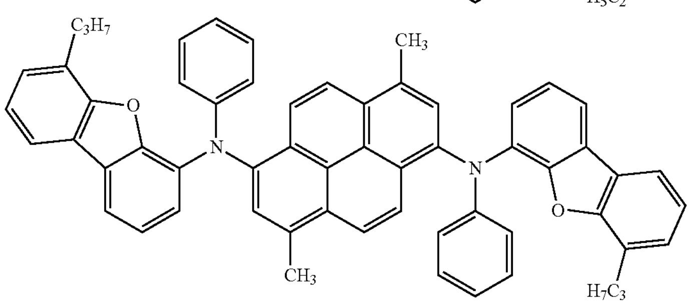

-continued
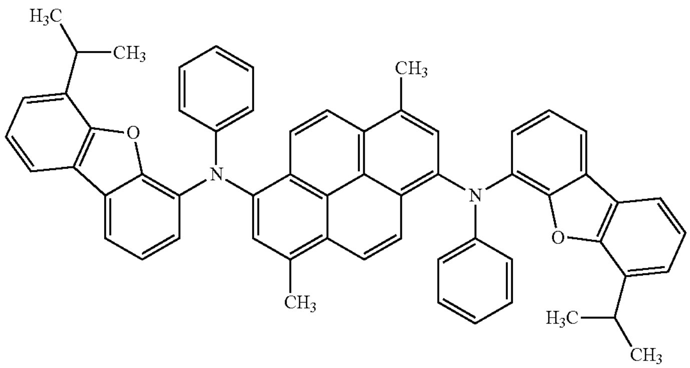
[Chem. 76]
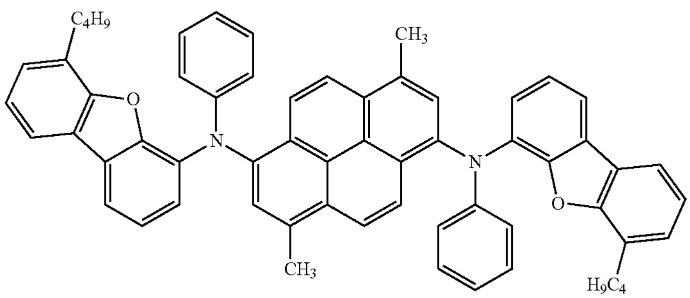
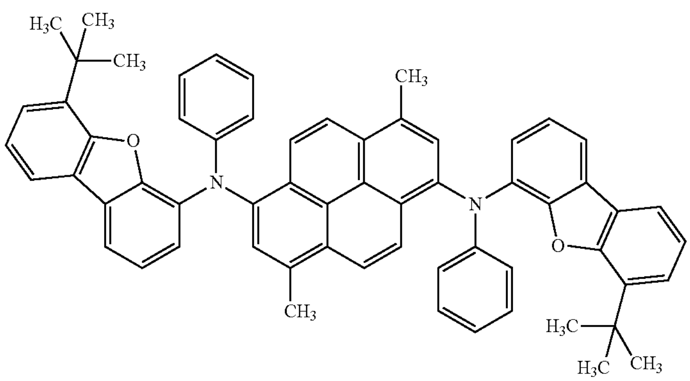
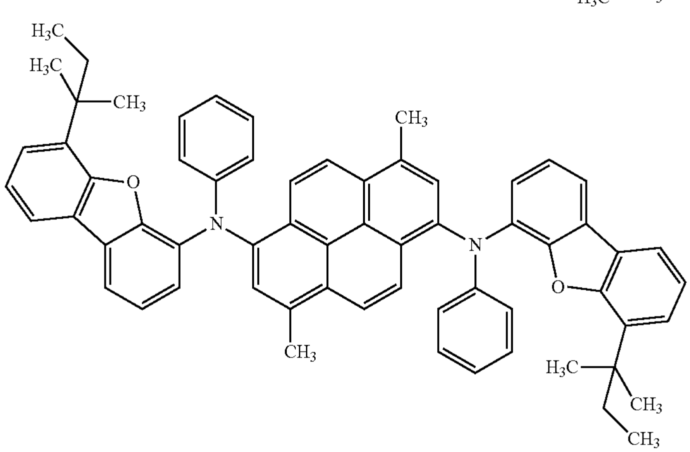

-continued
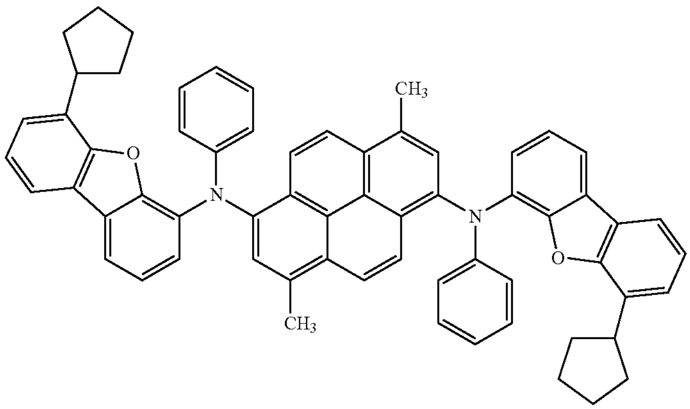
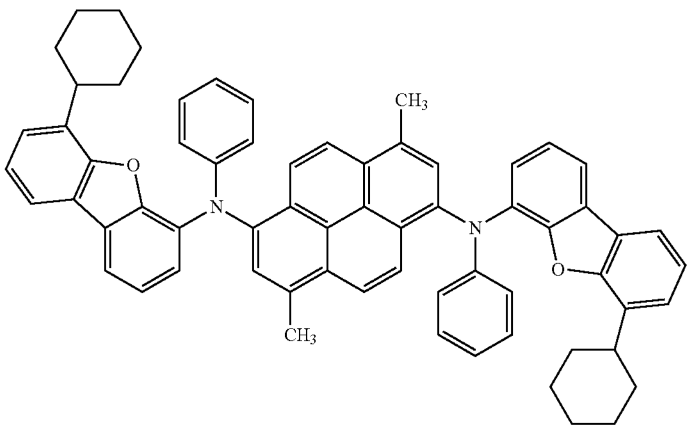
[Chem. 77]
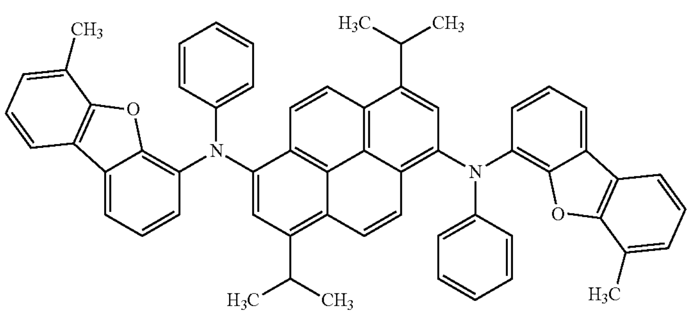
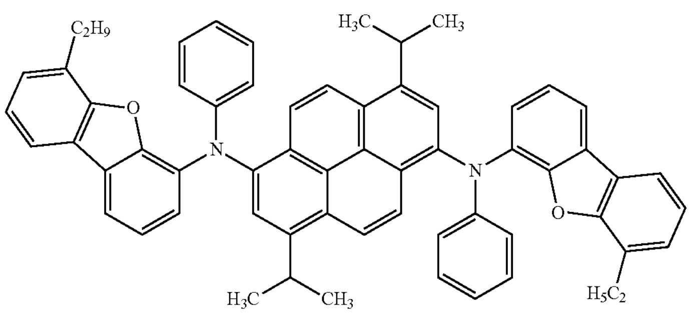

-continued
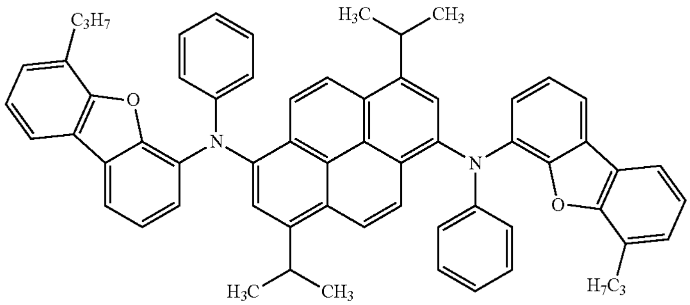
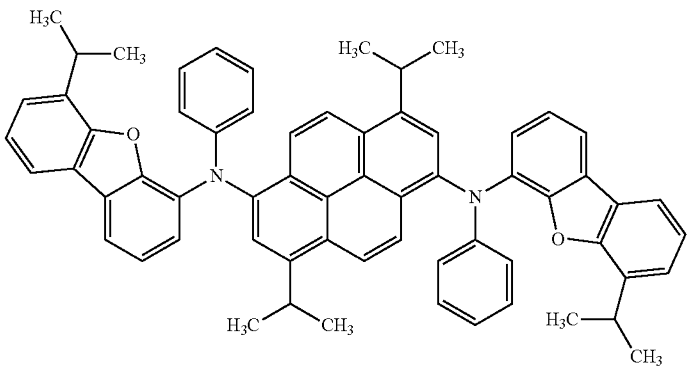
[Chem. 78]
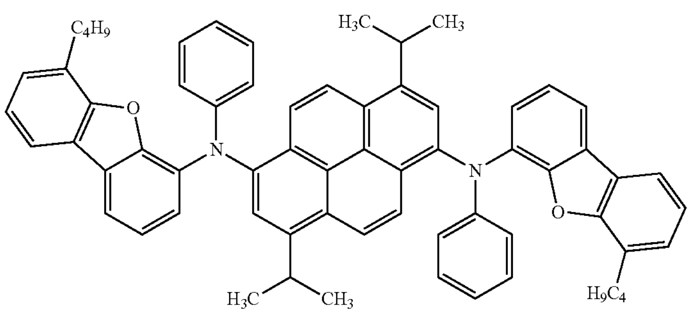
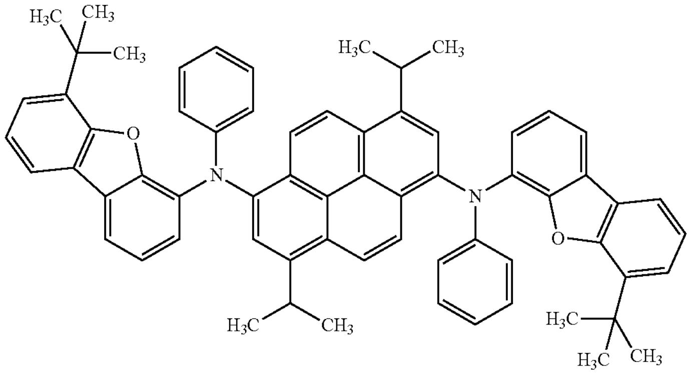

-continued
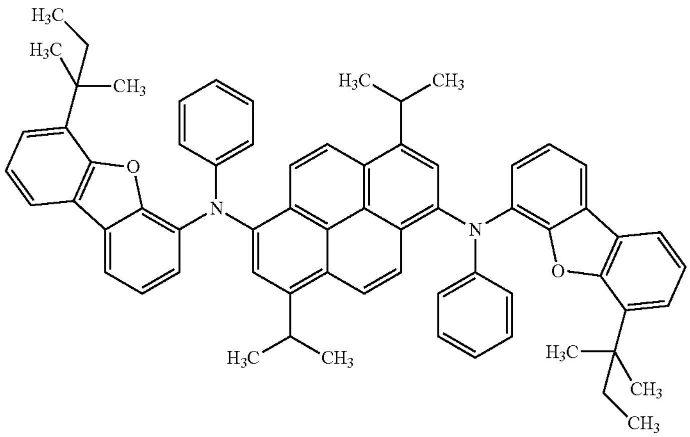
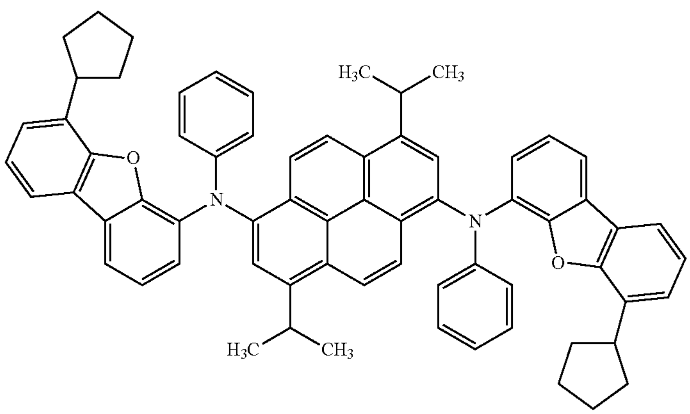
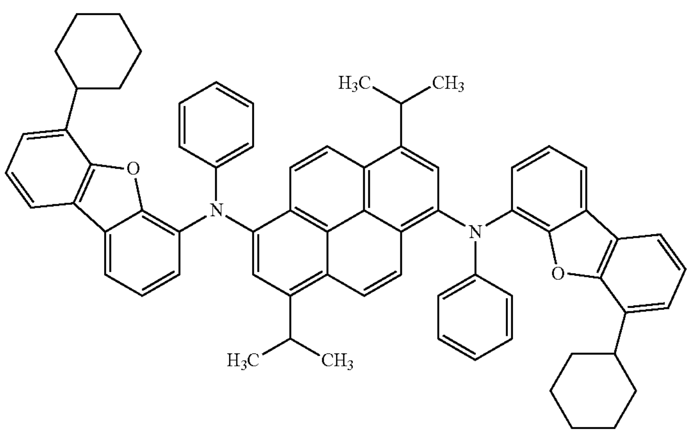
[Chem. 79]
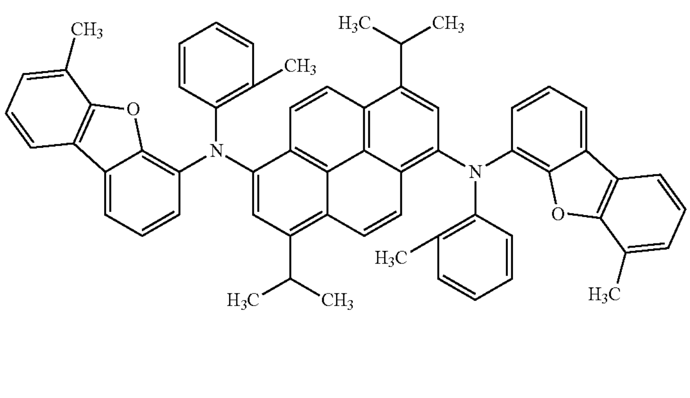

-continued
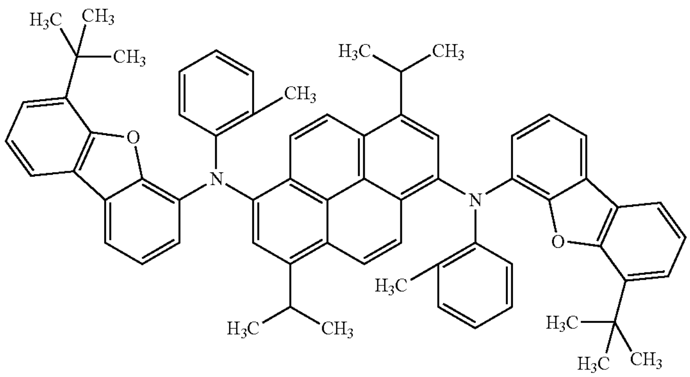
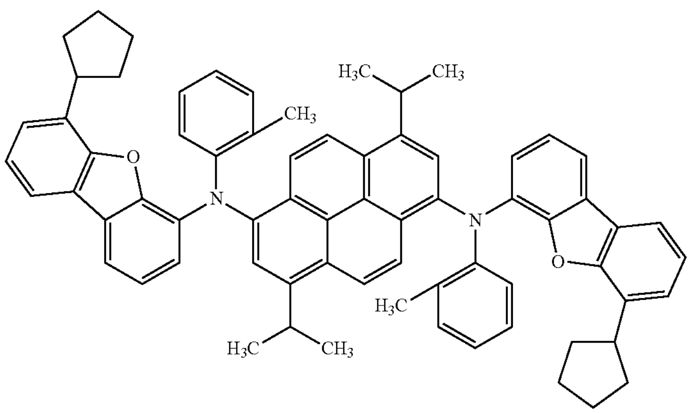
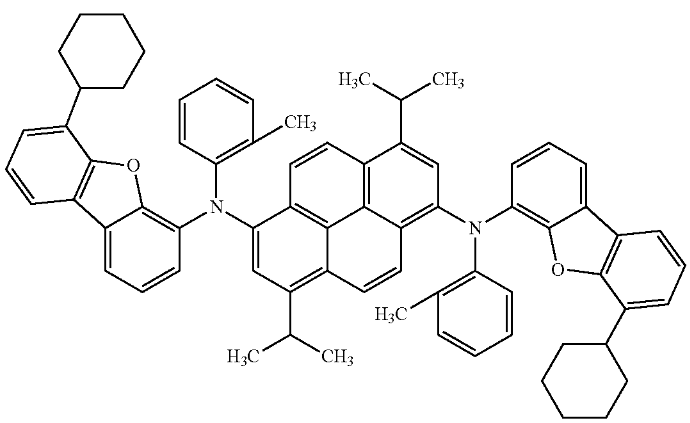
[Chem. 80]
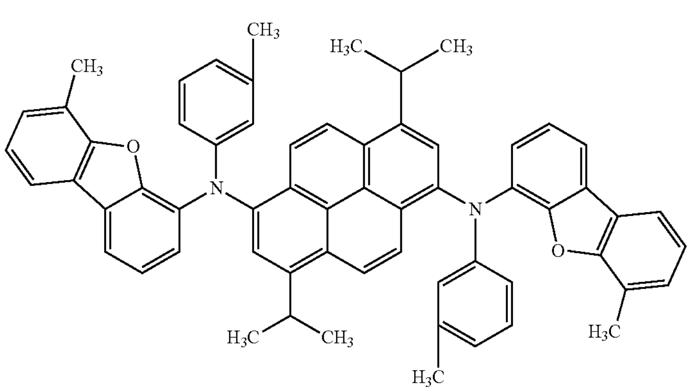

-continued
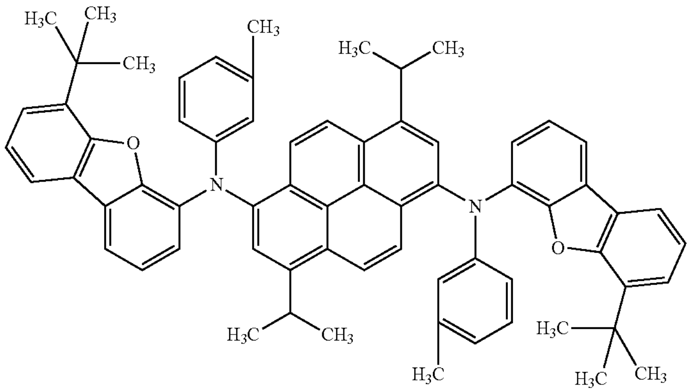
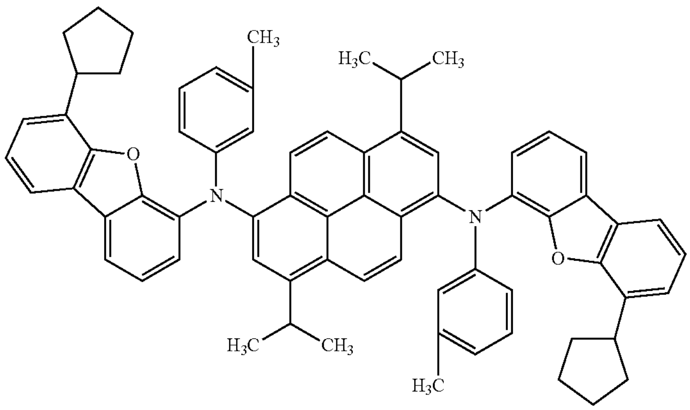
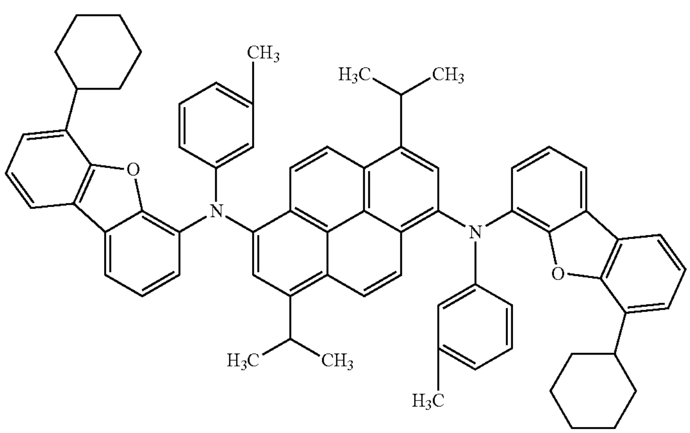
[Chem. 81]
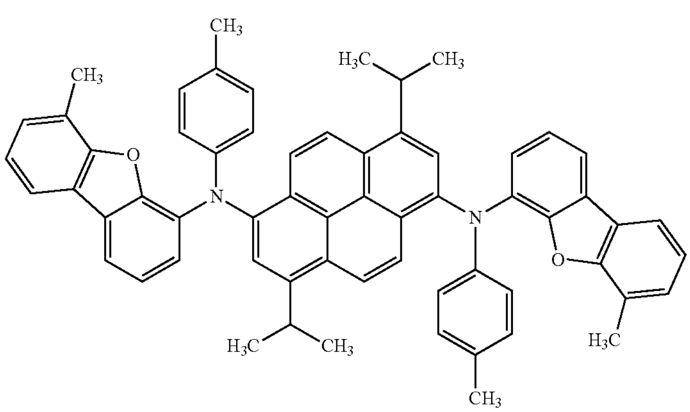

-continued
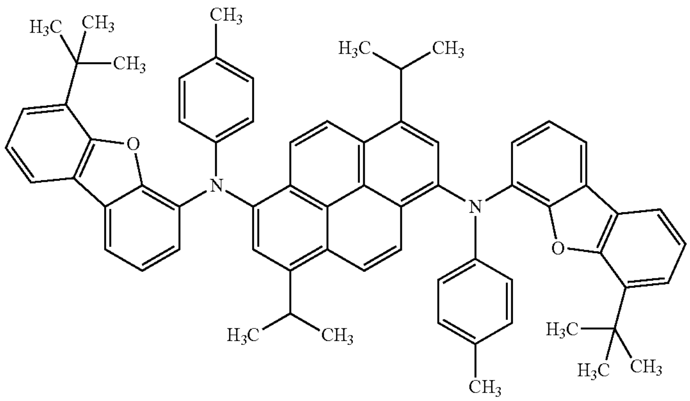
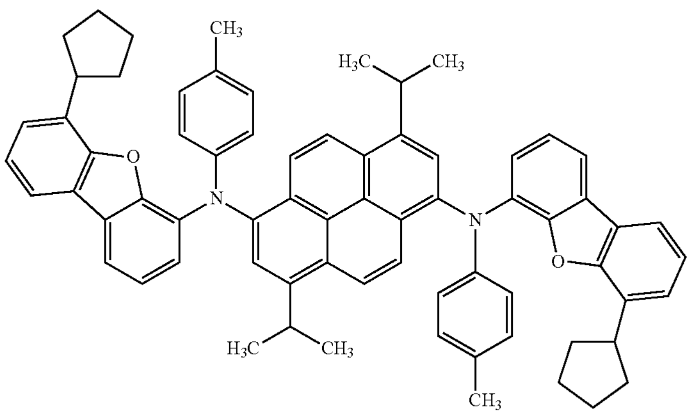
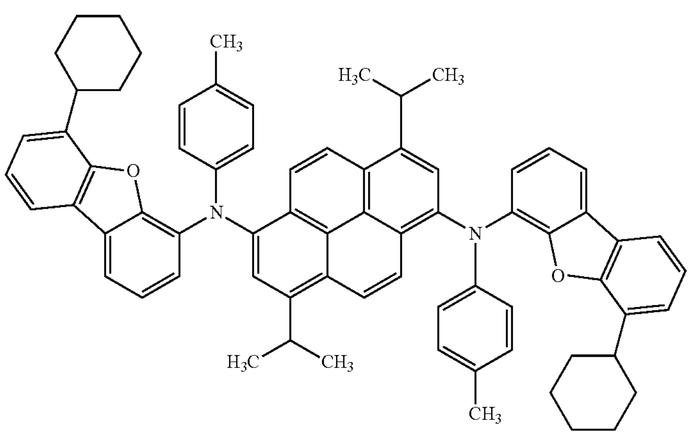
[Chem. 82]
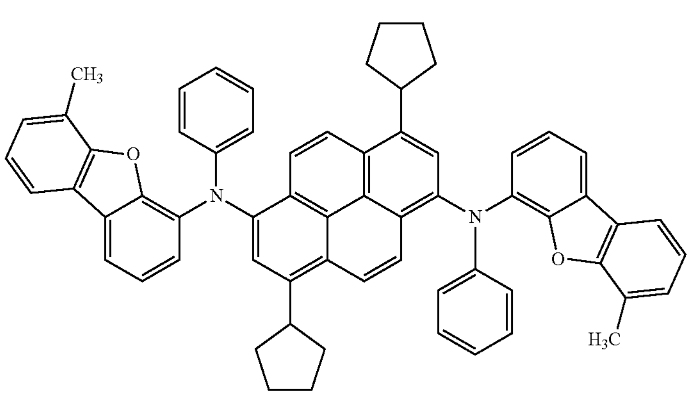

-continued
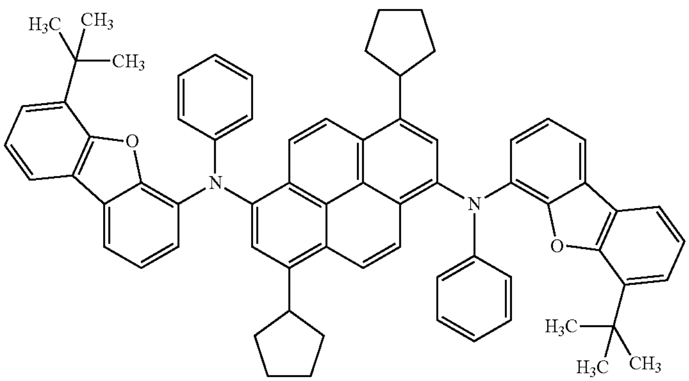
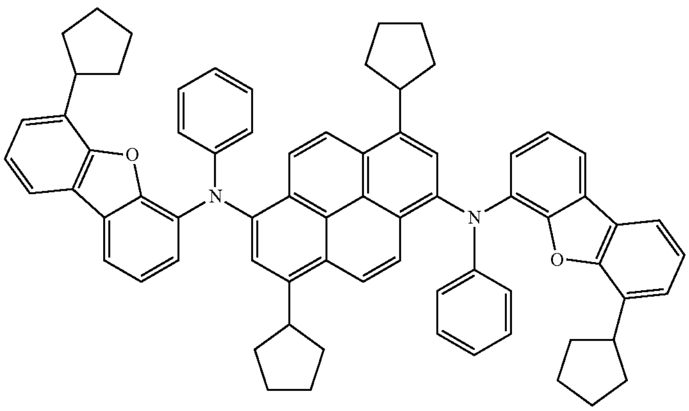
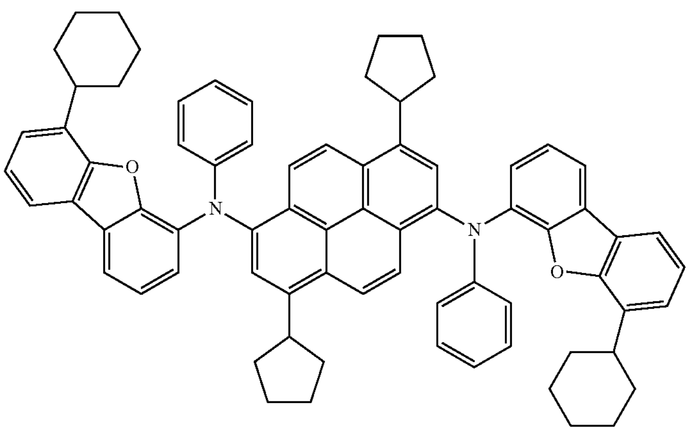
[Chem. 83]
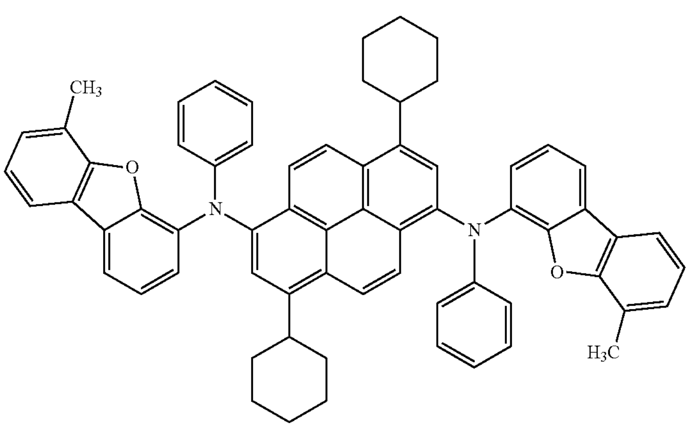

-continued
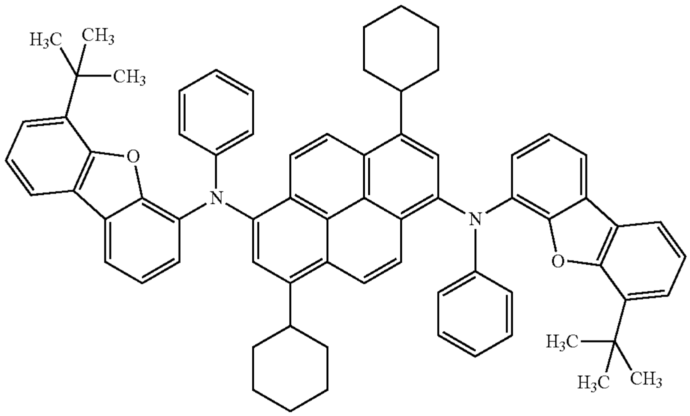
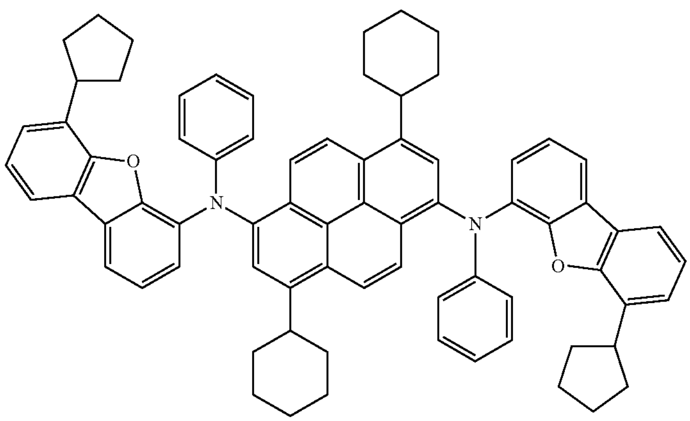
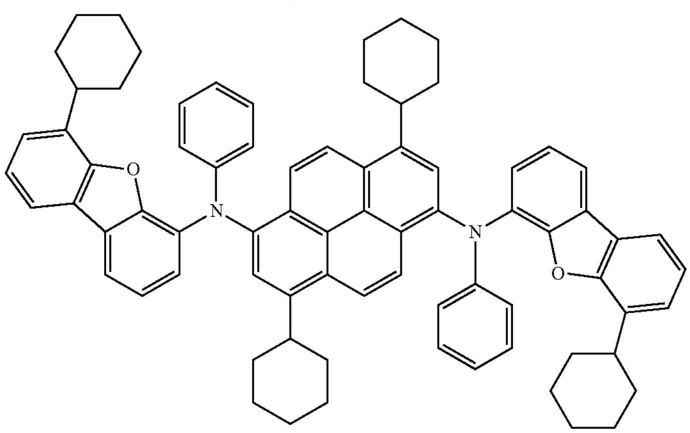
[Chem. 84]
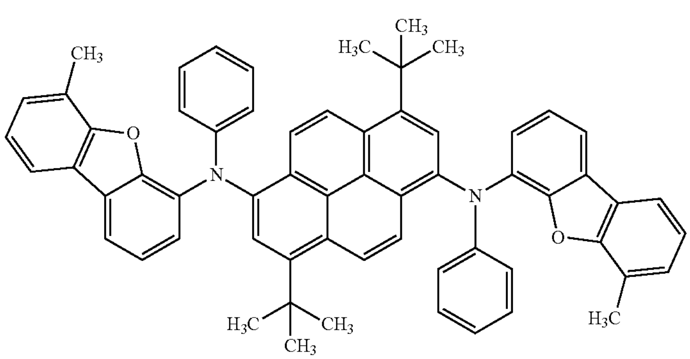

-continued
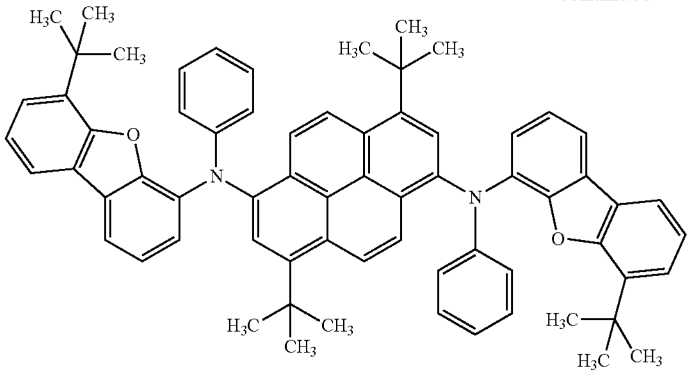
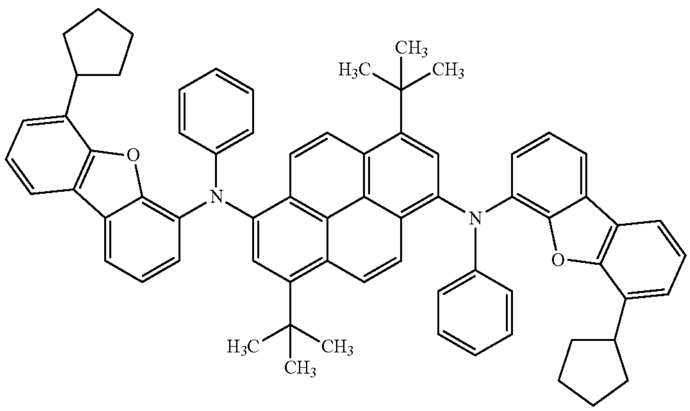
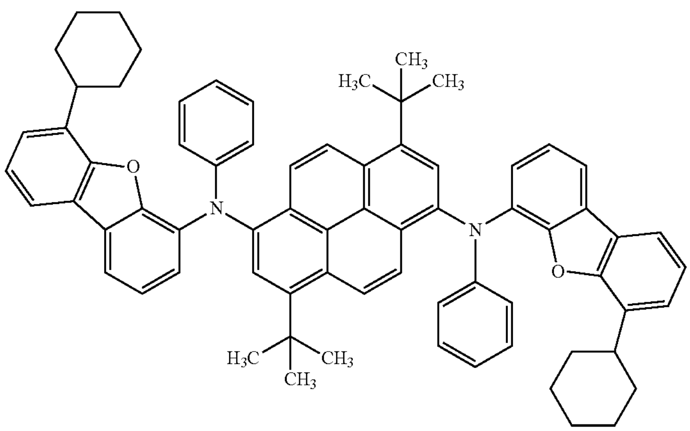
[Chem. 85]
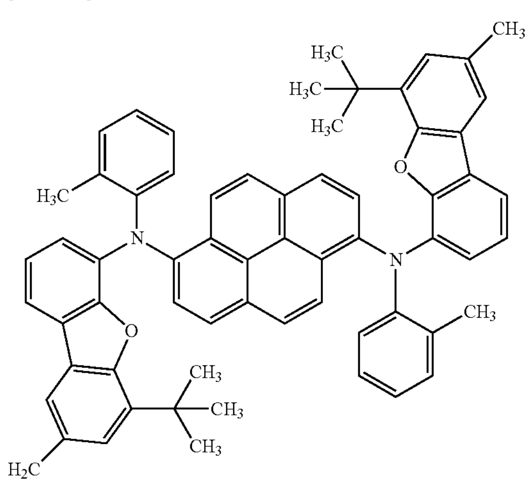
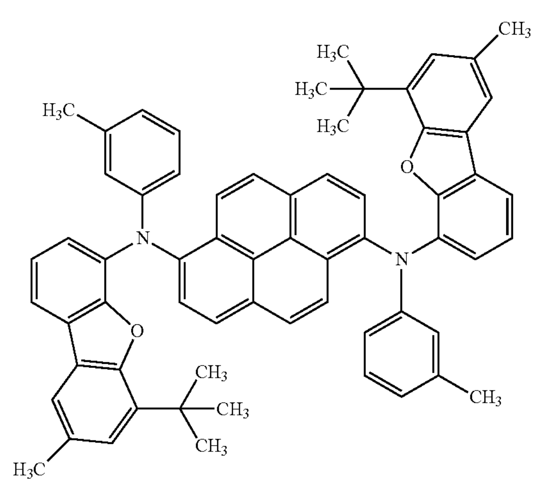

-continued
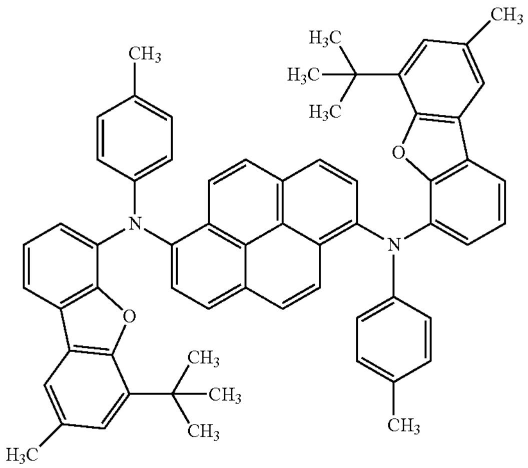
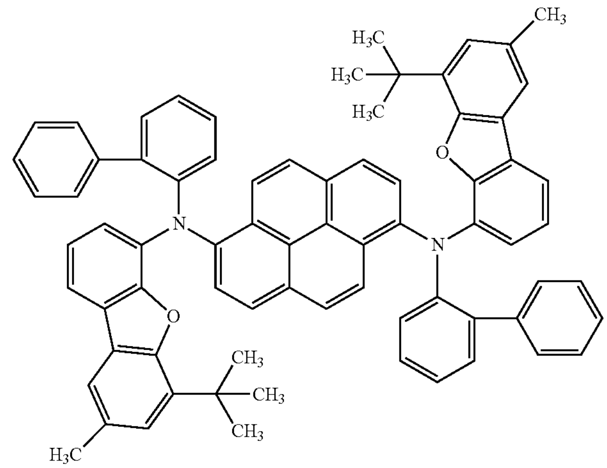
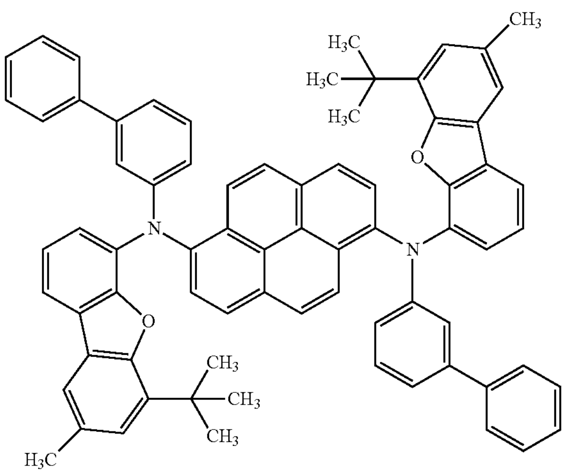
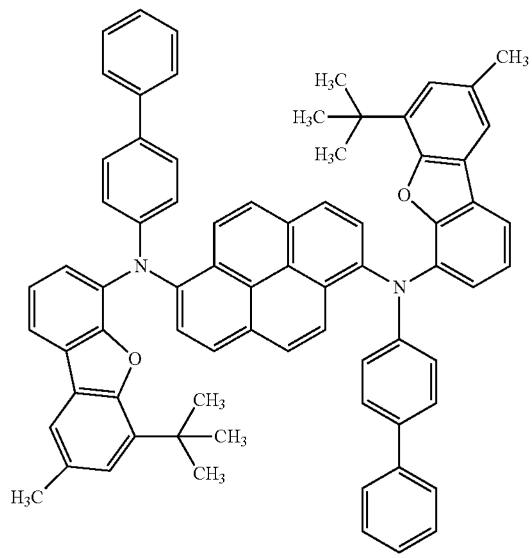
[Chem. 86]
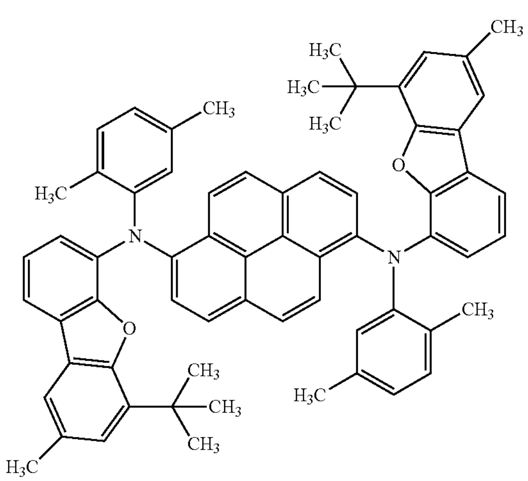
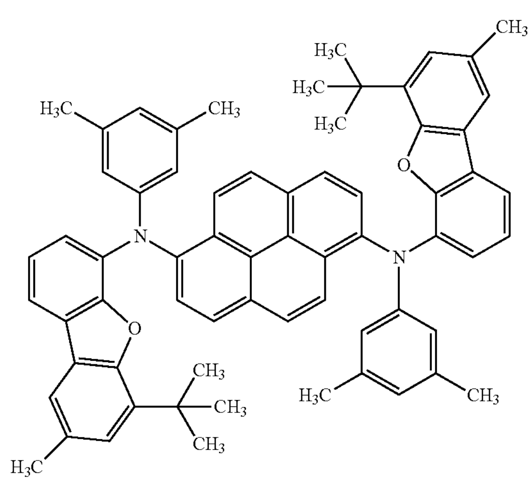

-continued
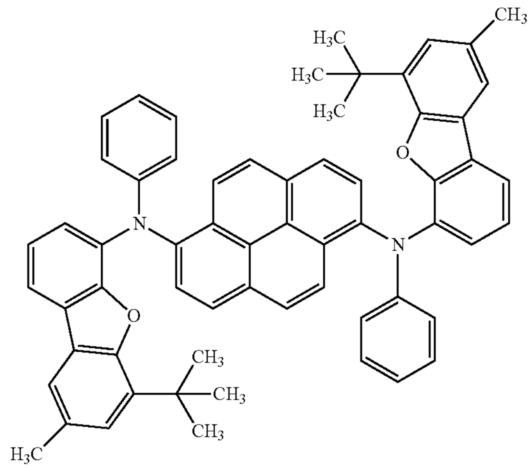
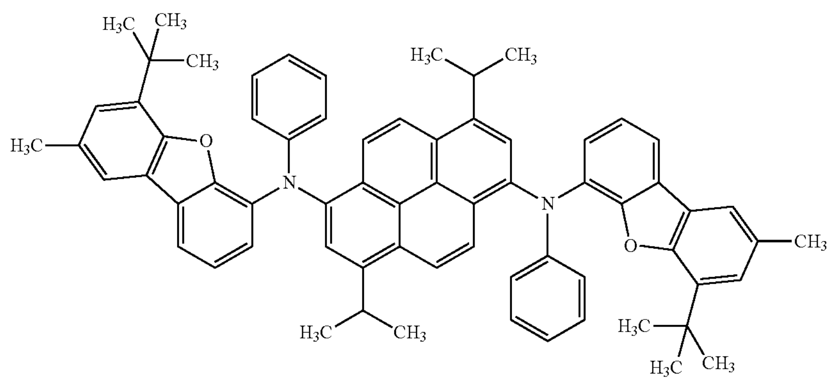
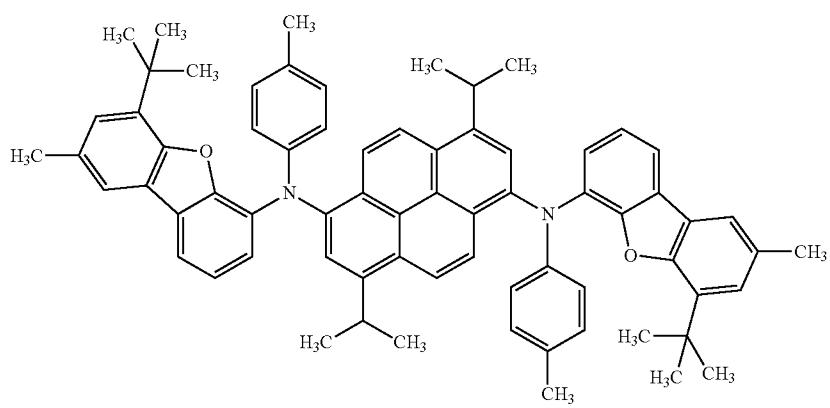

-continued
[Chem. 87]
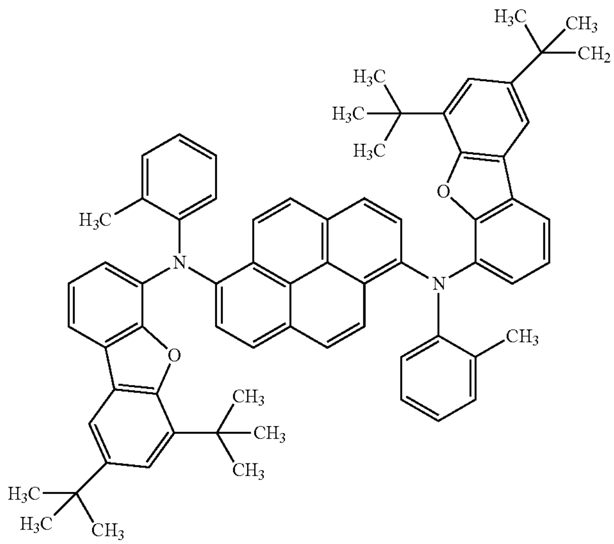
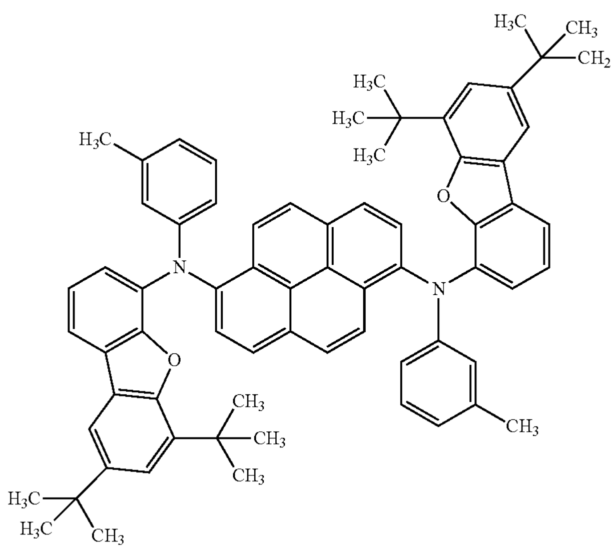
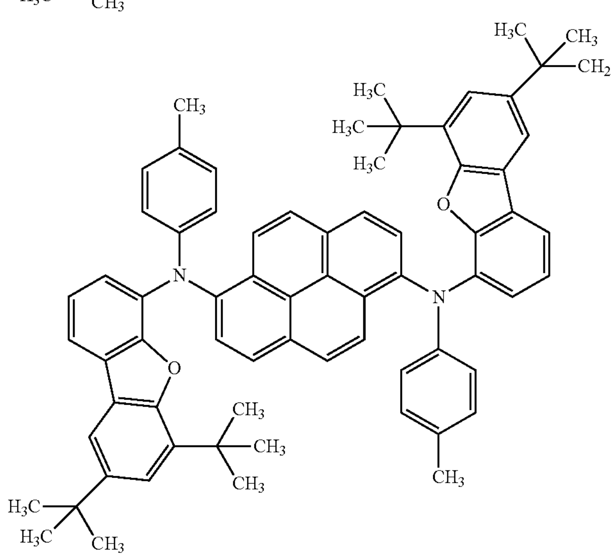

-continued
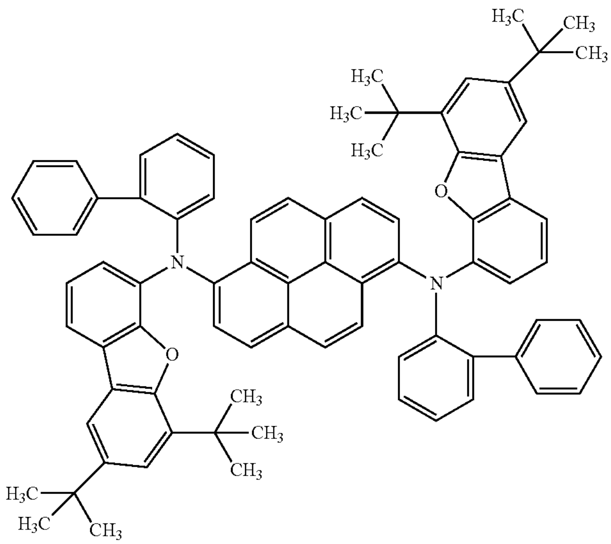
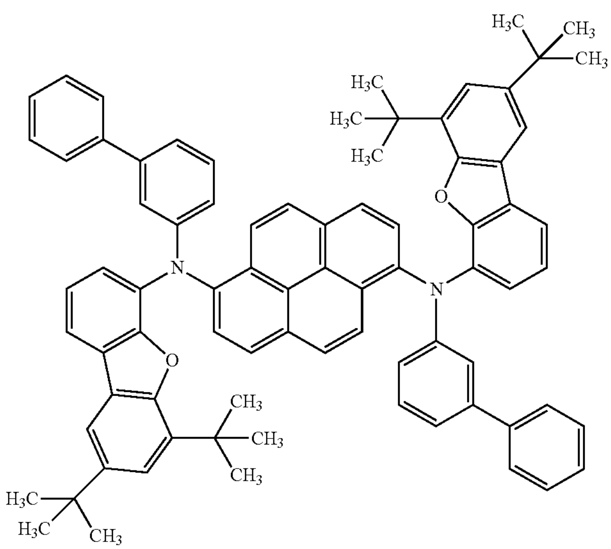
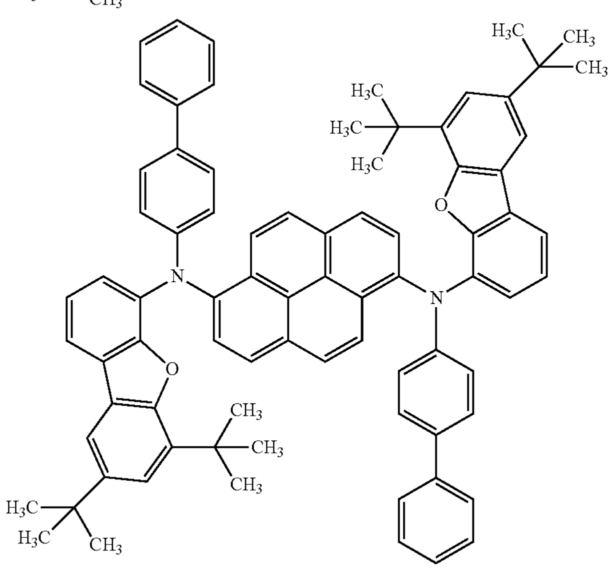

-continued
[Chem. 88]
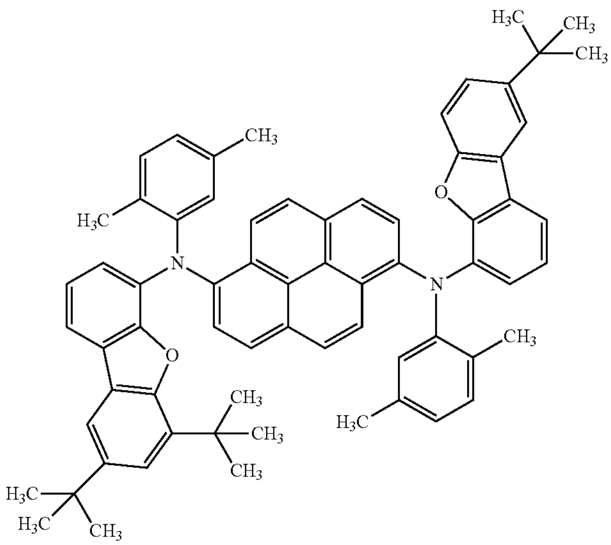
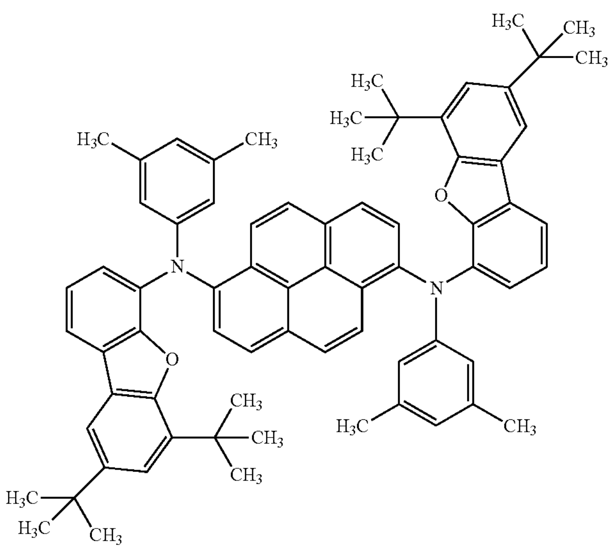
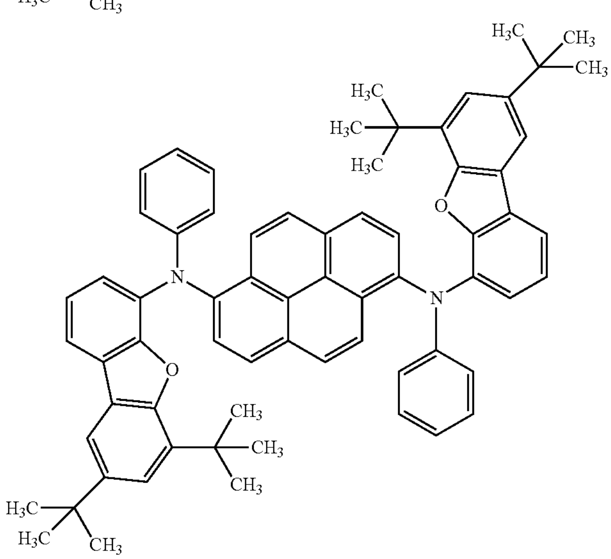

-continued
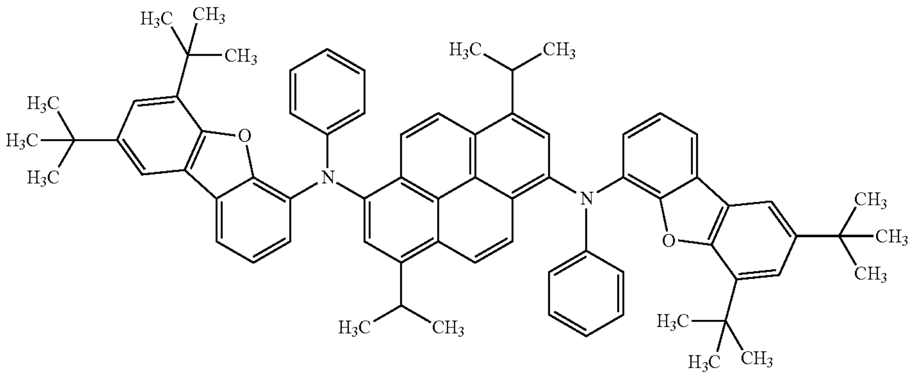
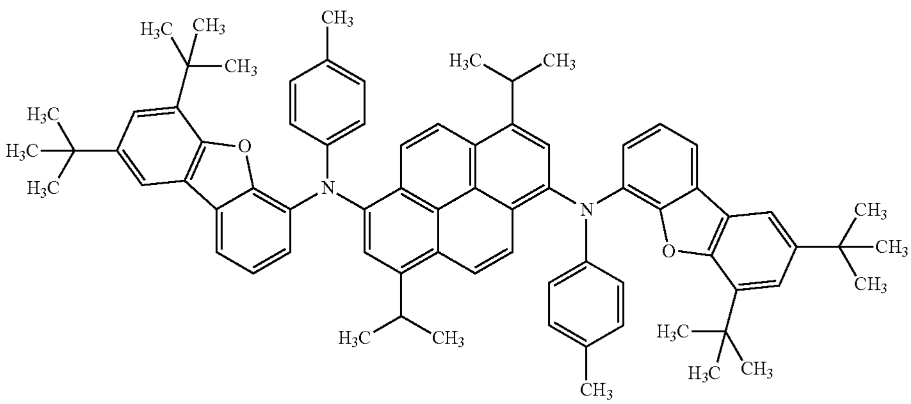
[Chem. 89]
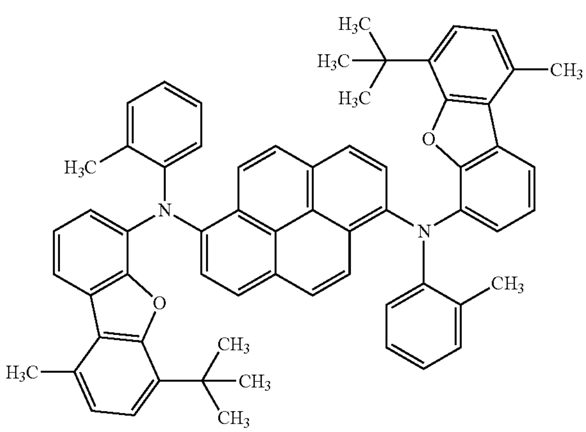
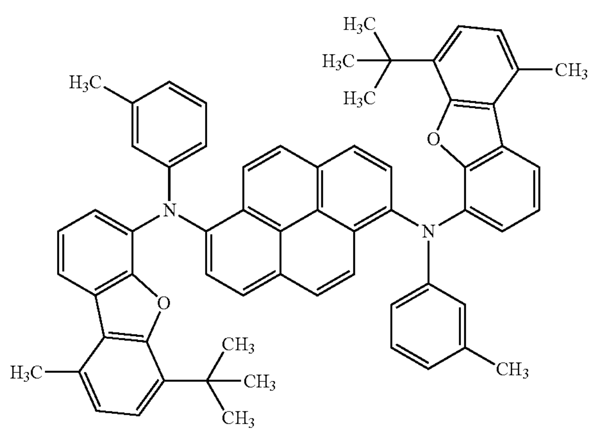
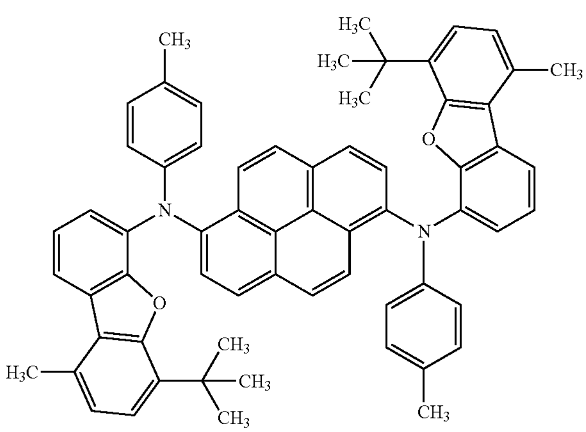
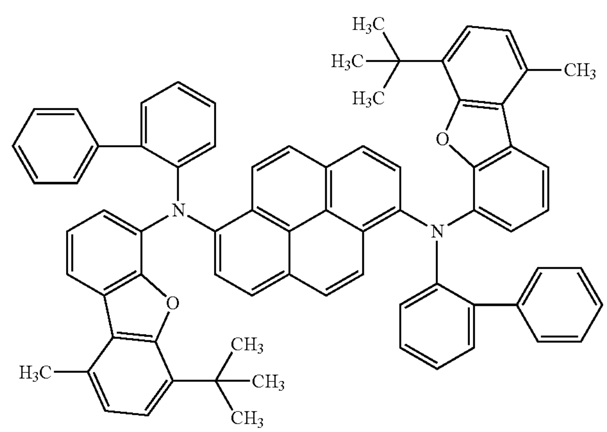

-continued
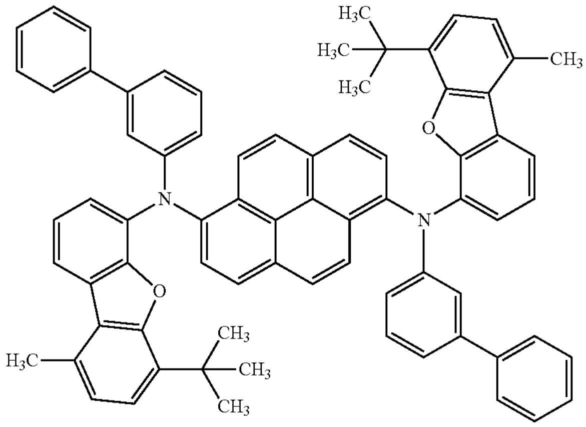
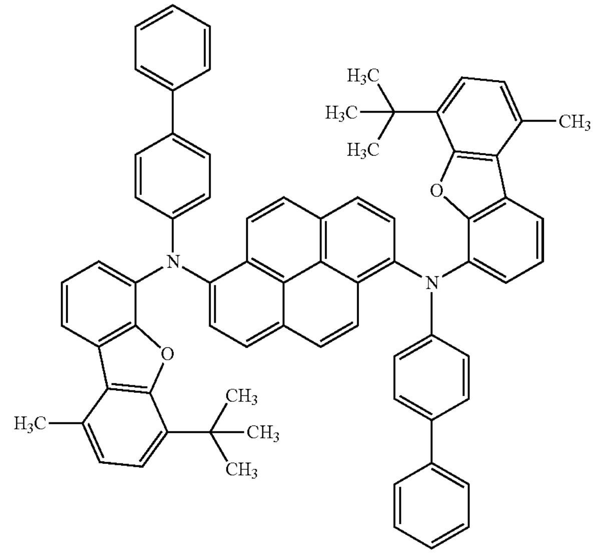
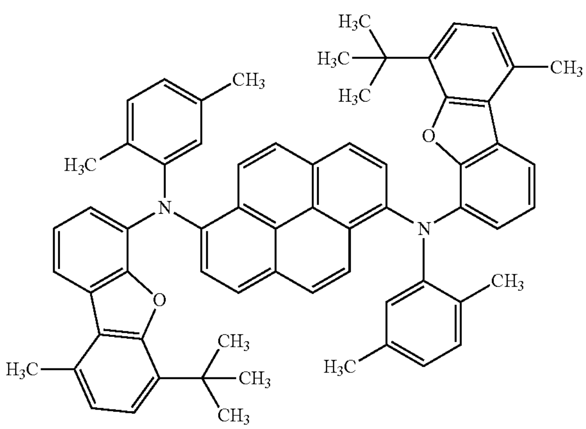
[Chem. 90]
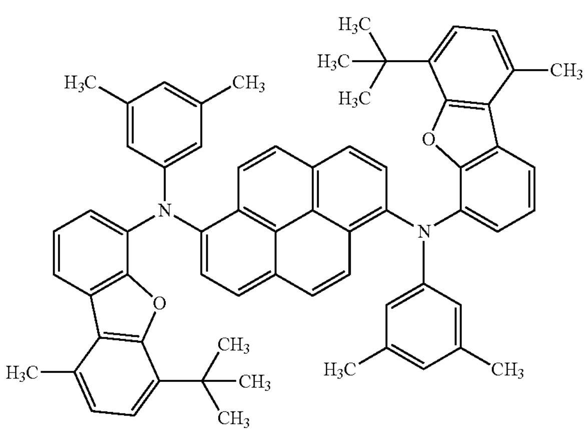
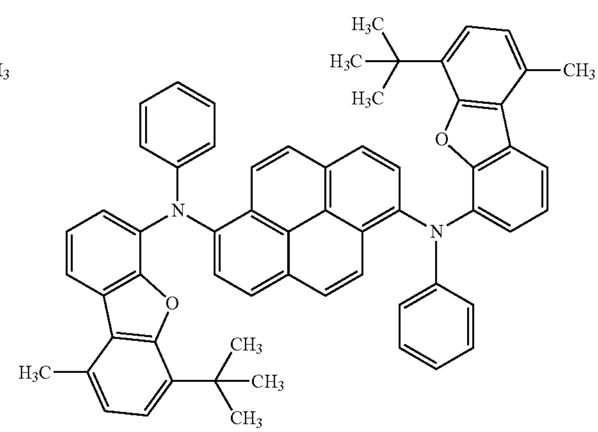

-continued
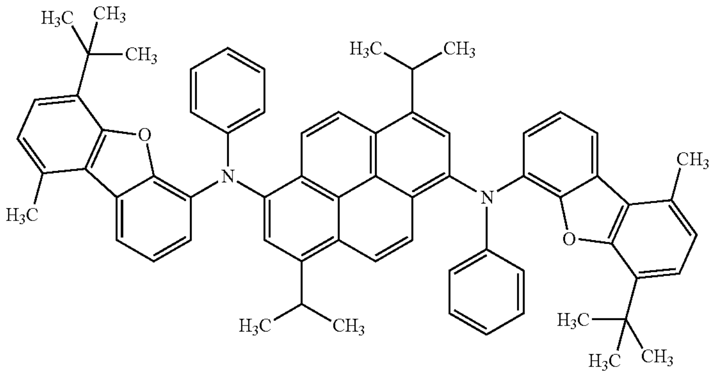
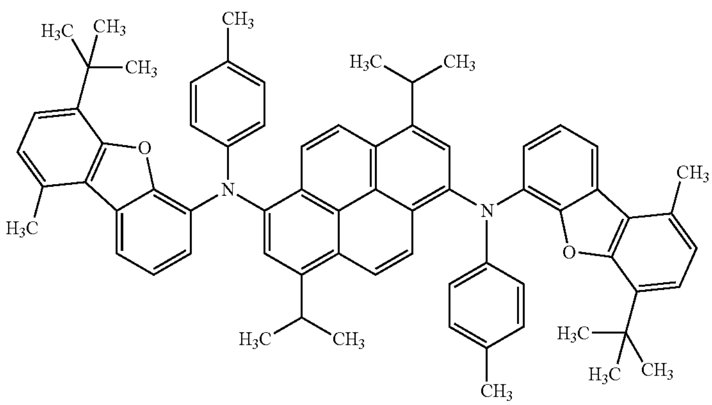
[Chem. 91]
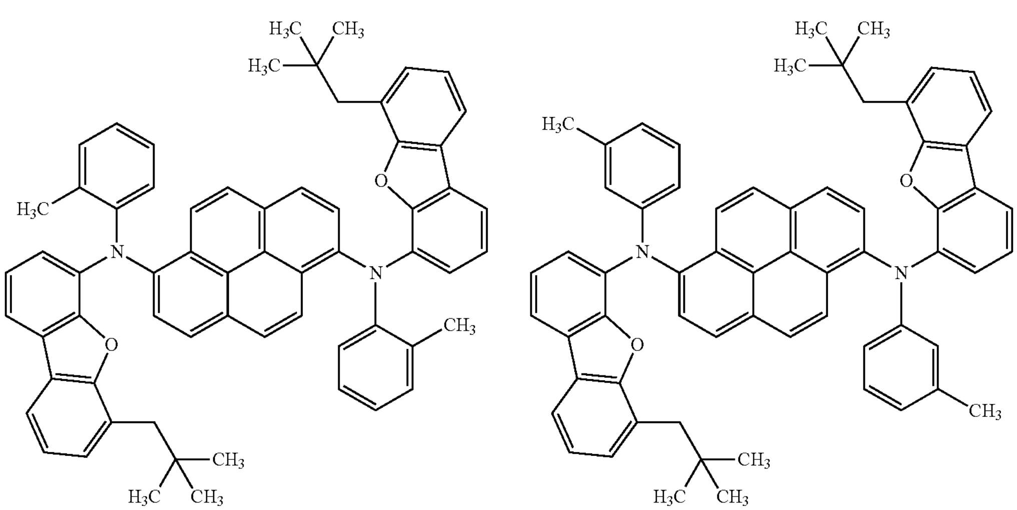

-continued
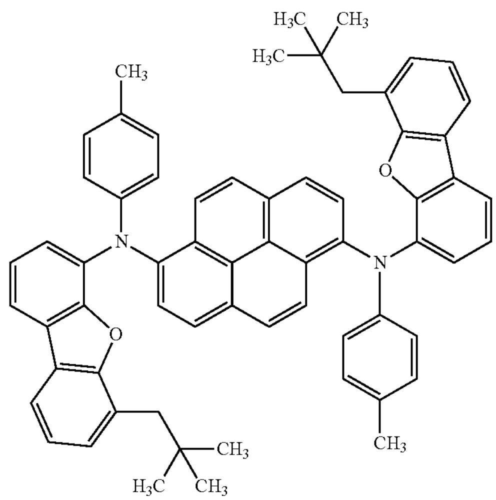
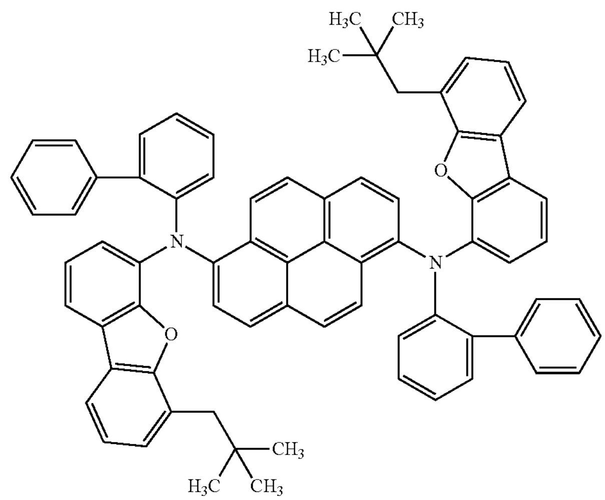
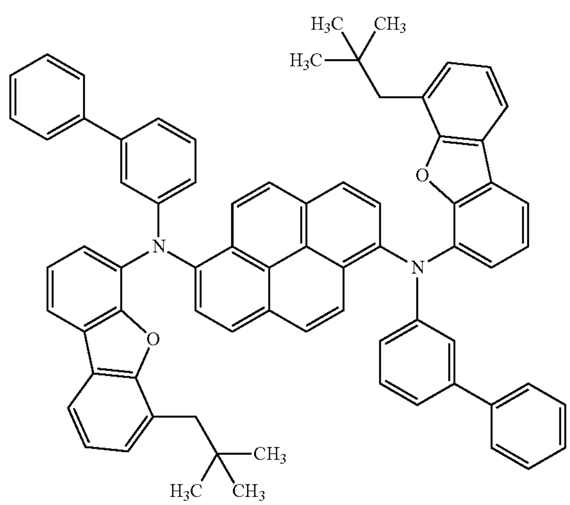
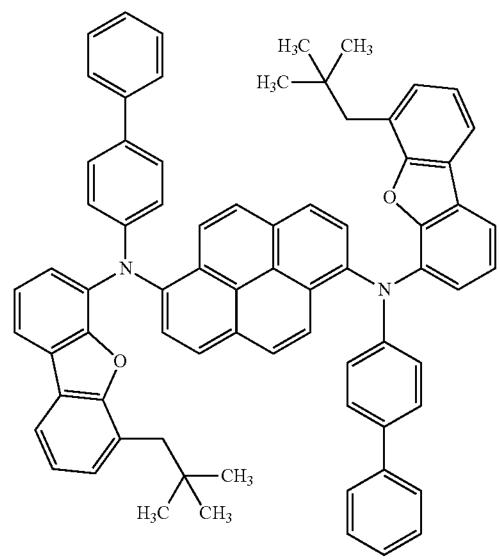
[Chem. 92]
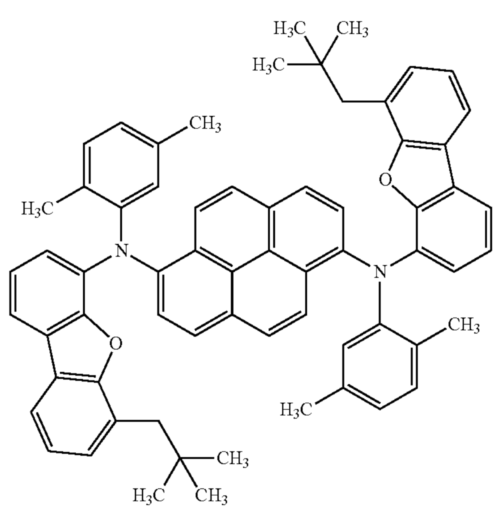
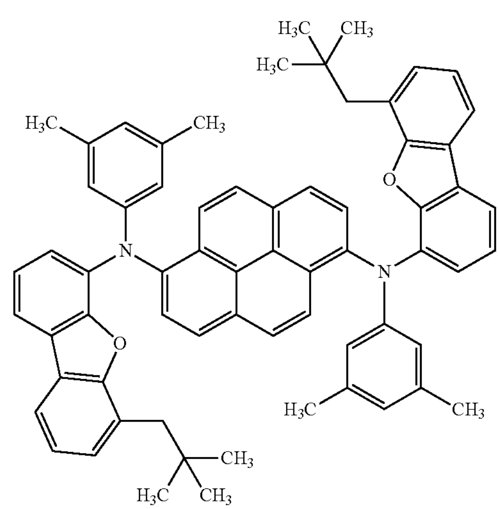

-continued
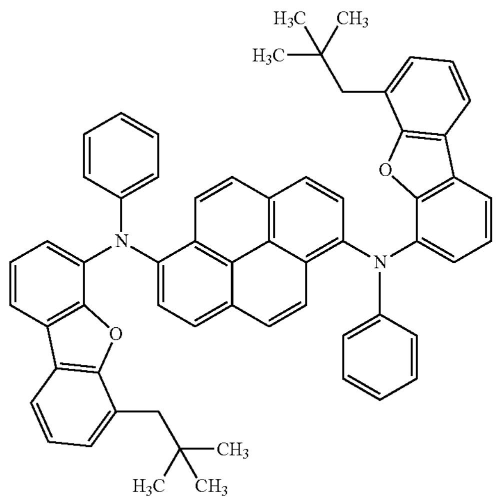
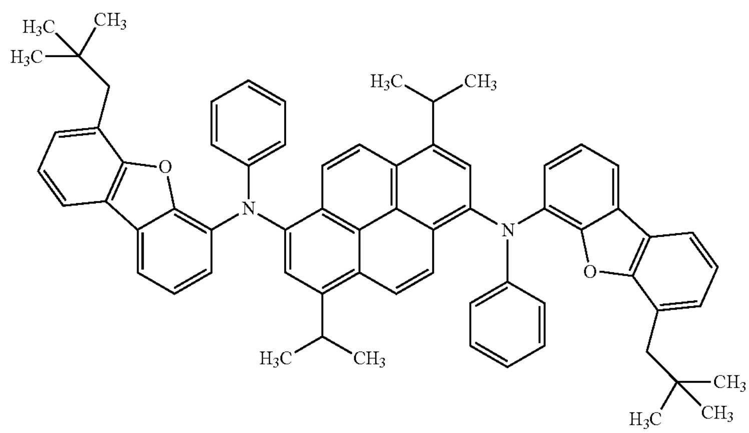
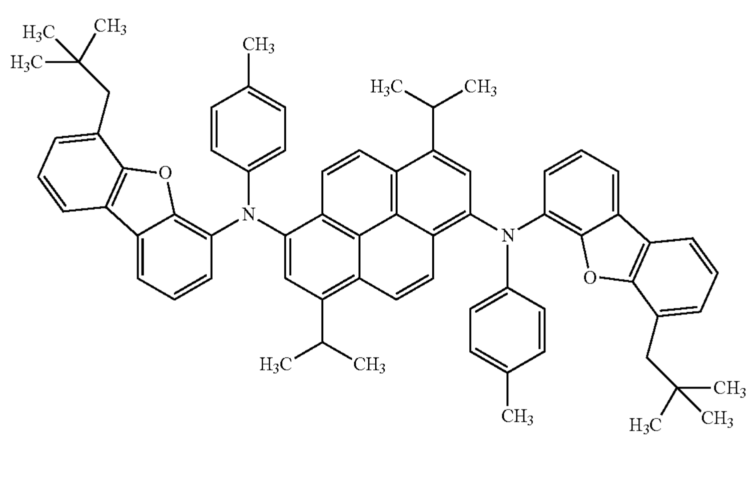

-continued
[Chem. 93]
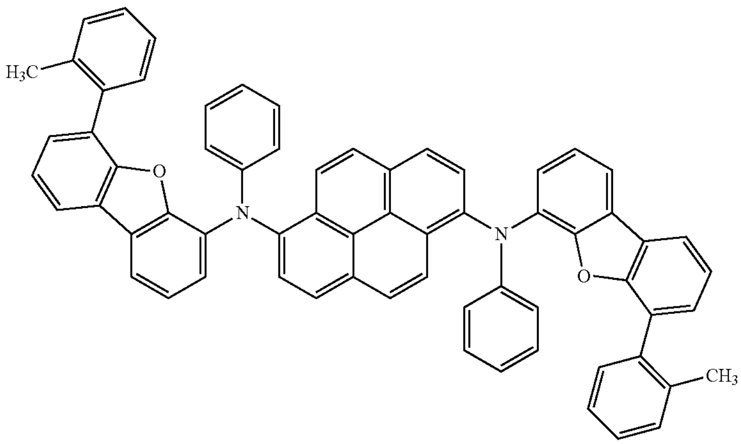
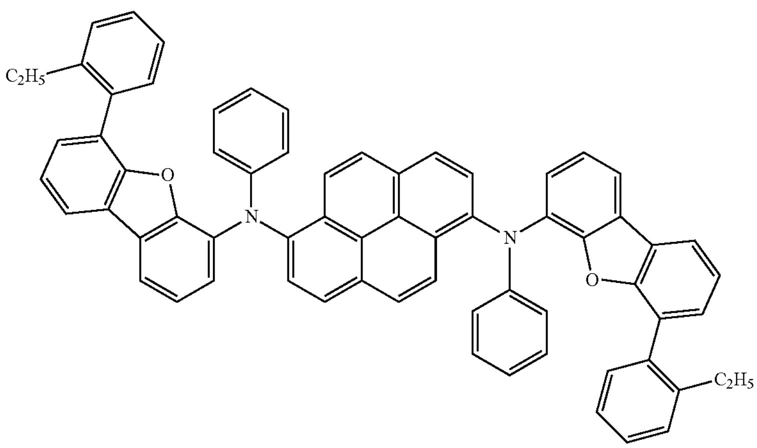
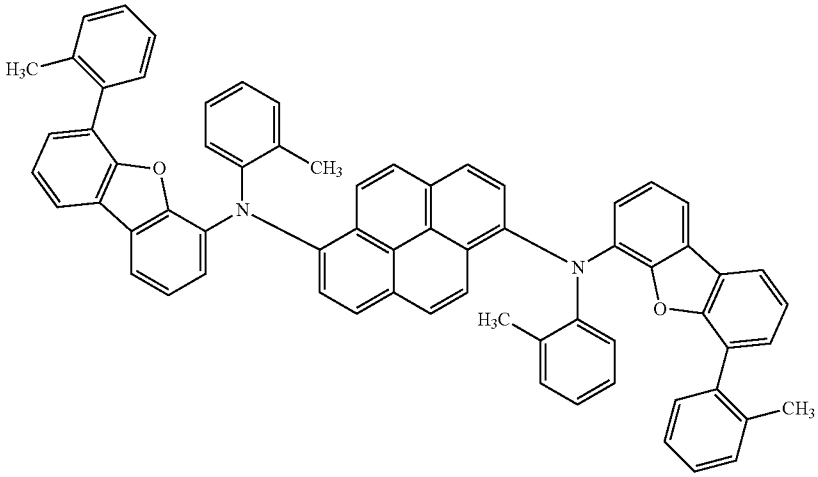

-continued
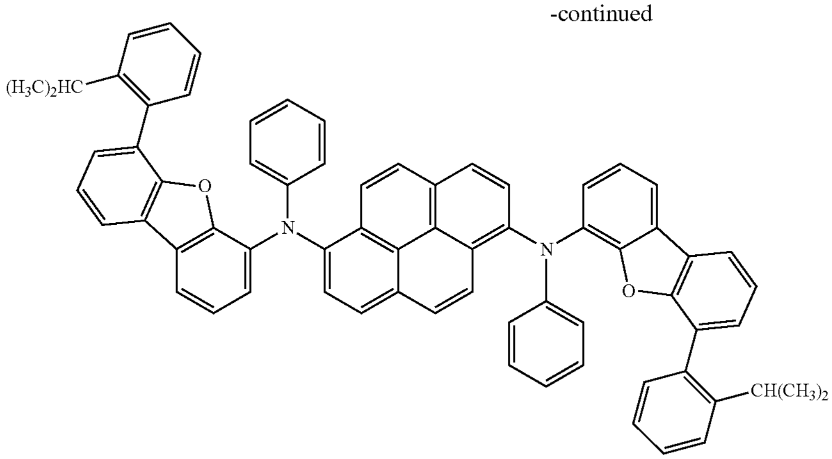
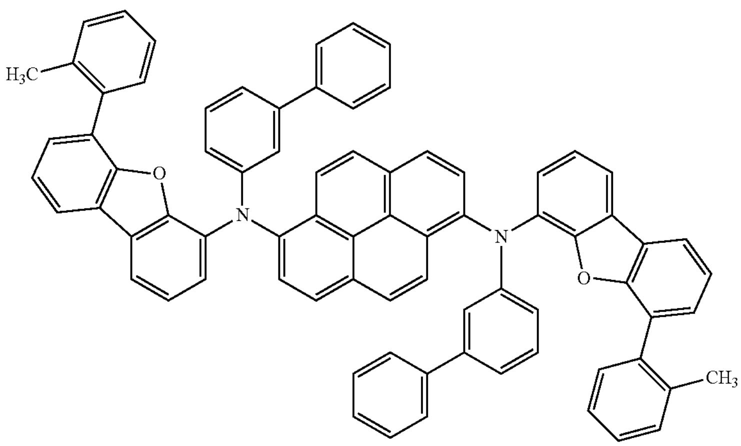
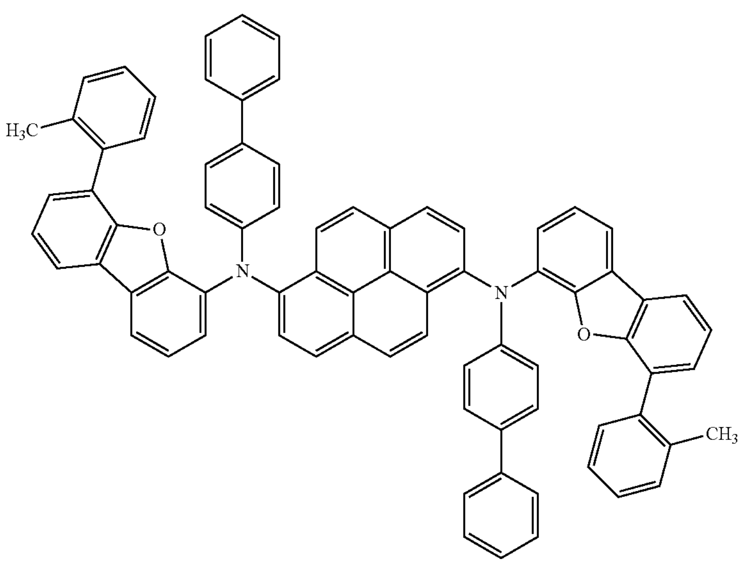

-continued
[Chem. 94]
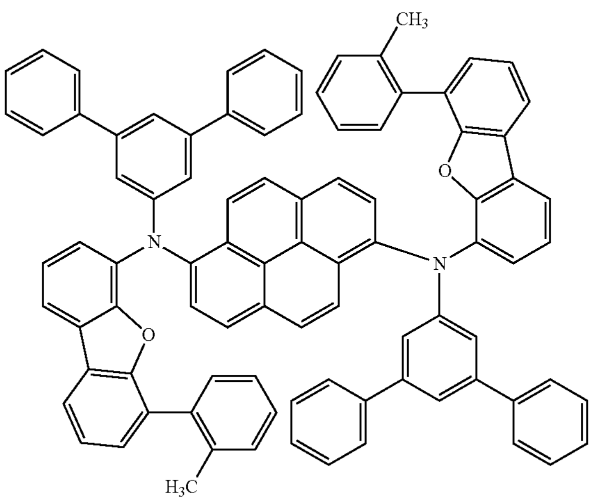
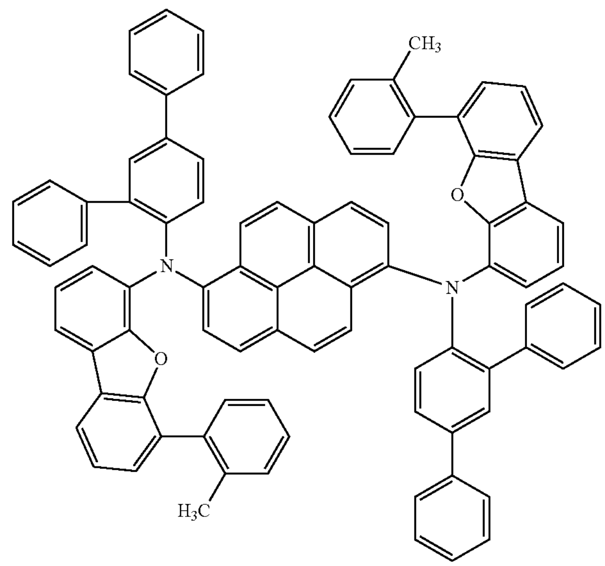
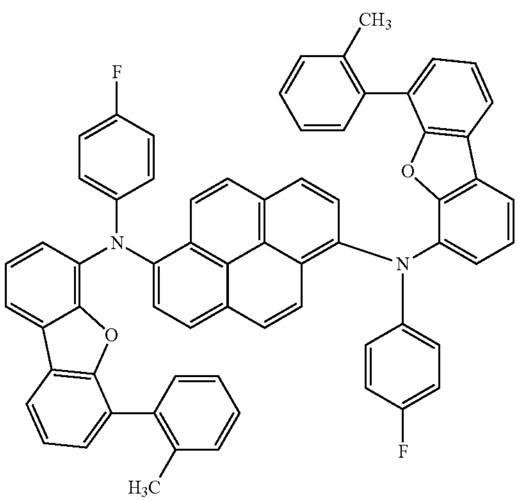
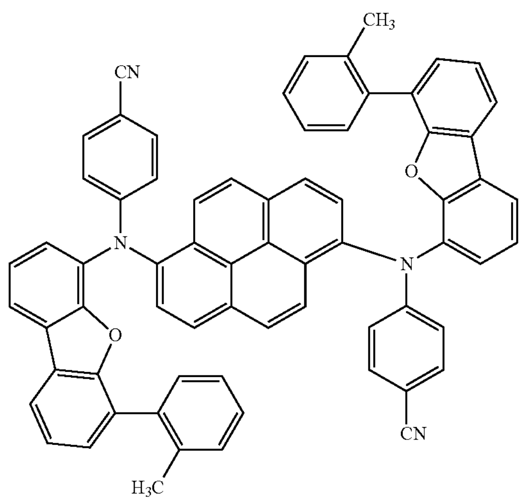
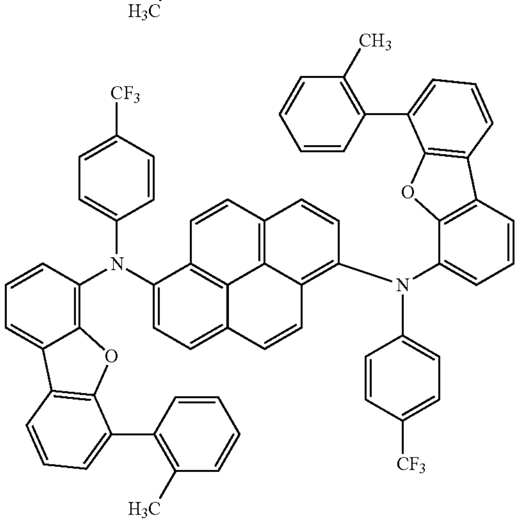
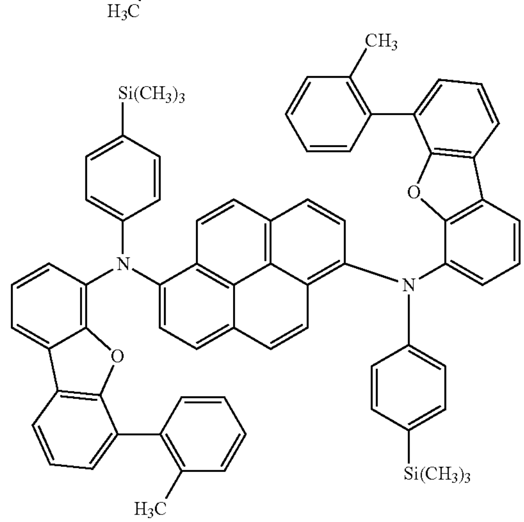

-continued
[Chem. 95]
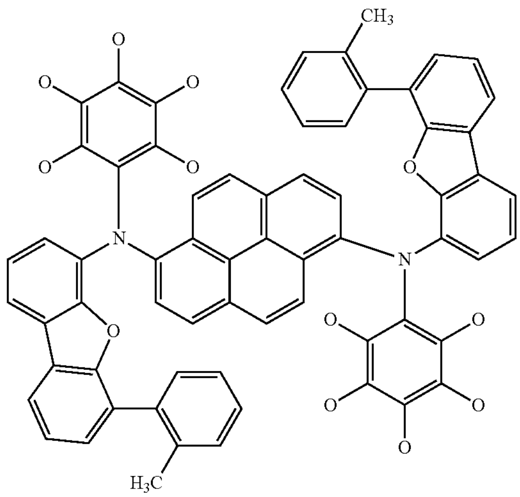
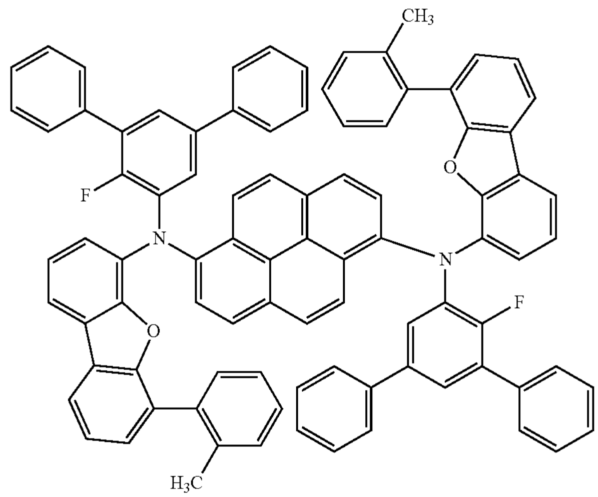
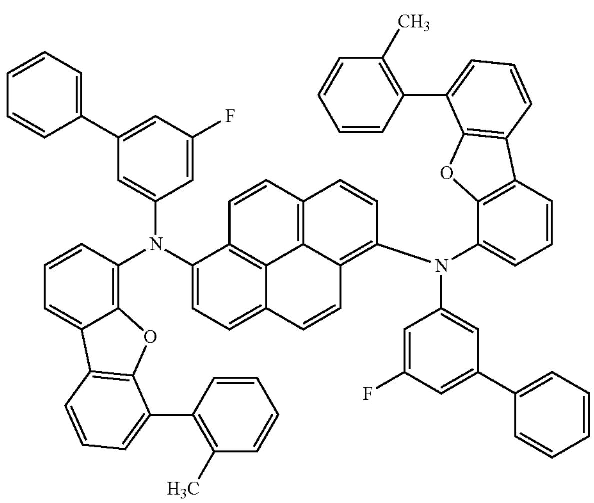
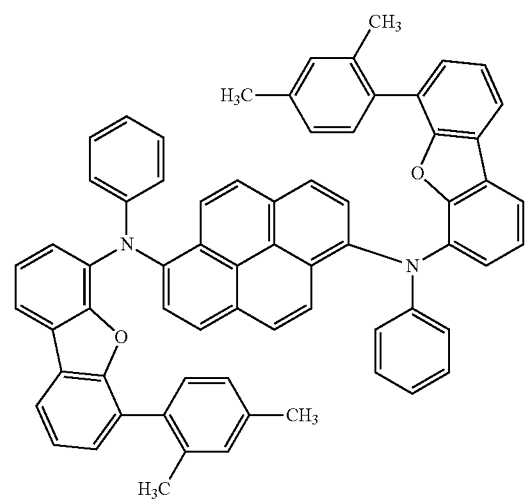
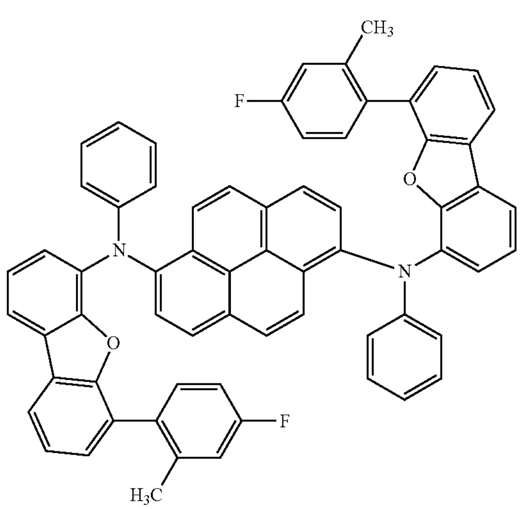
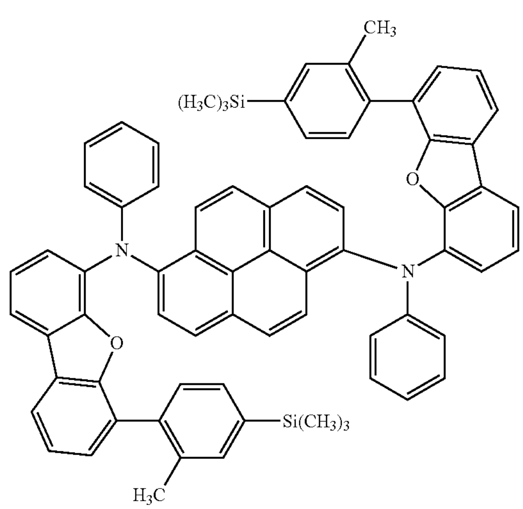

-continued
[Chem. 96]
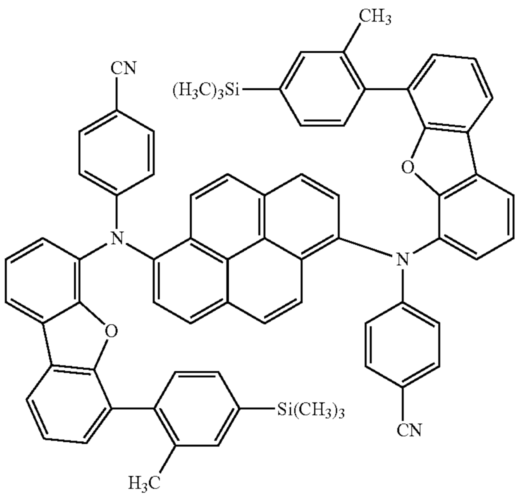
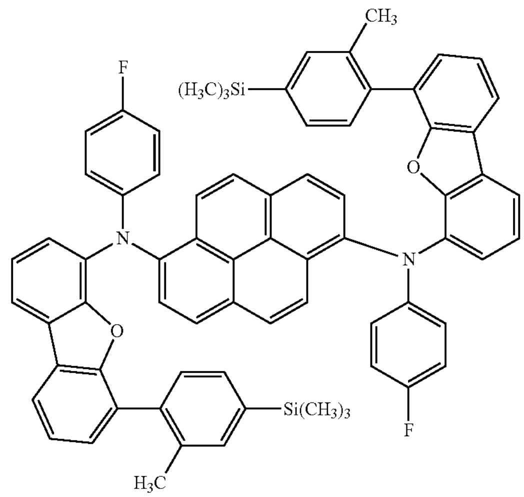
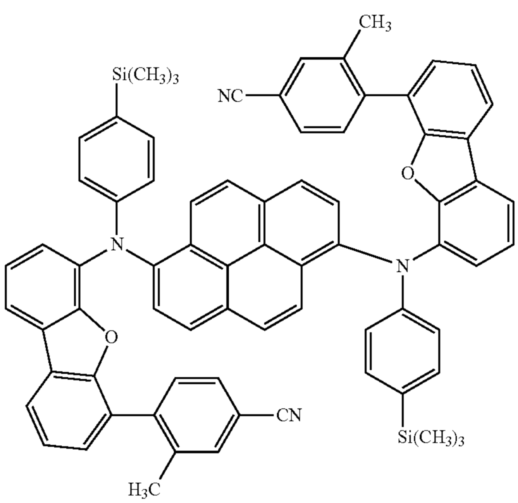
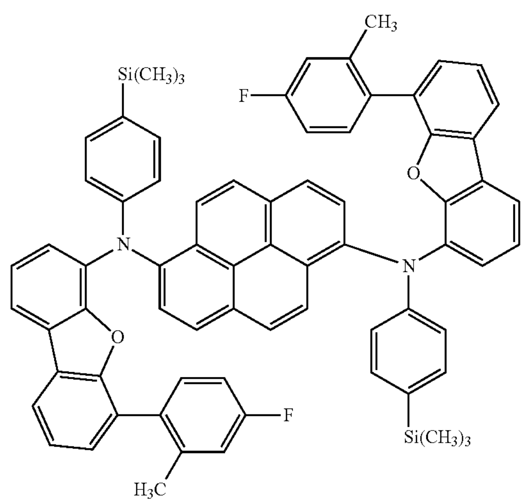
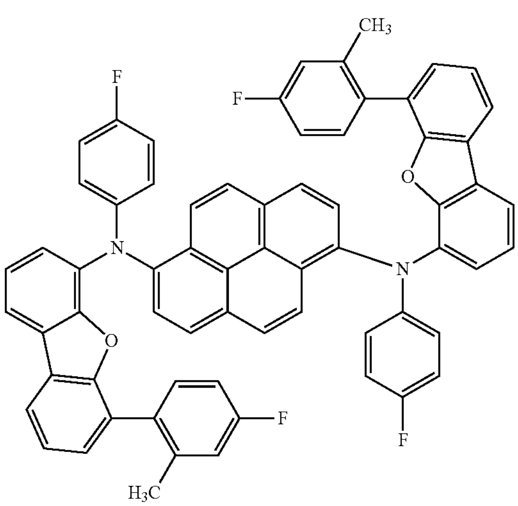
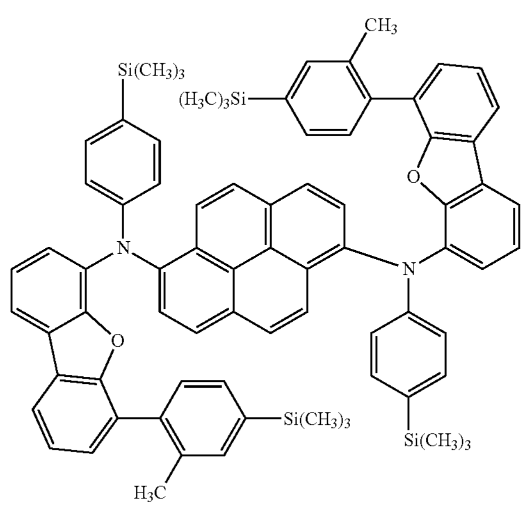

[Chem. 95]
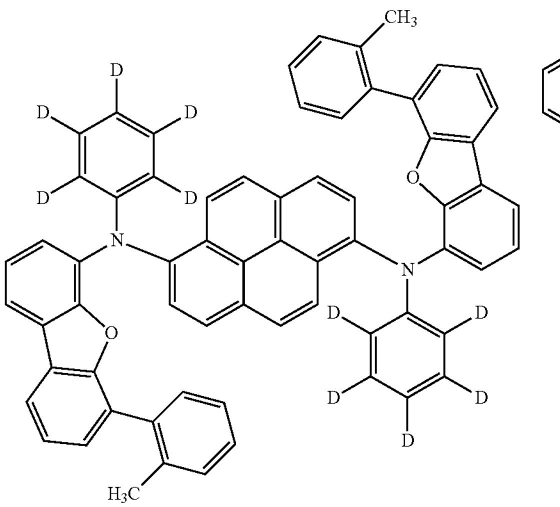
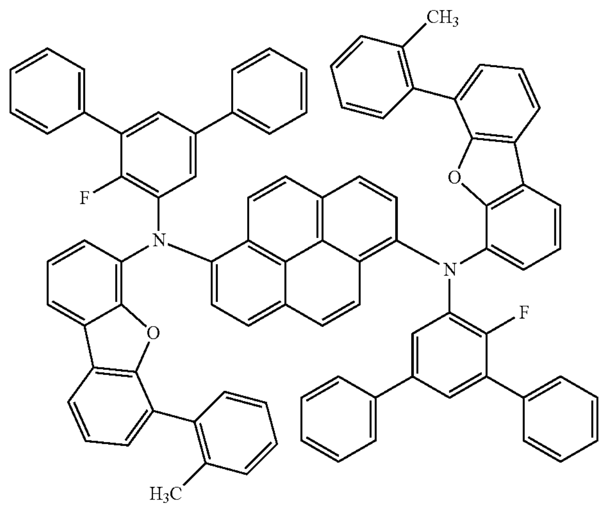
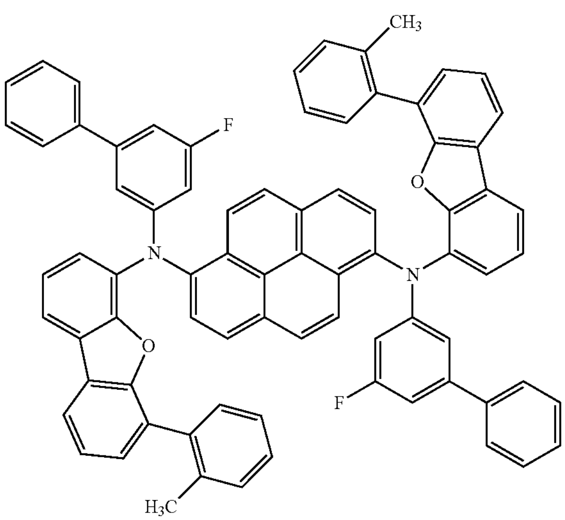
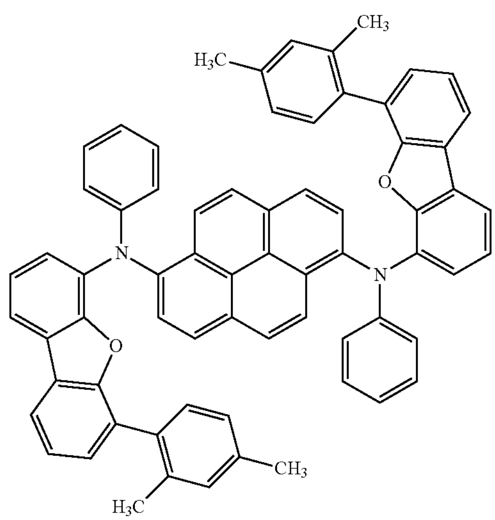
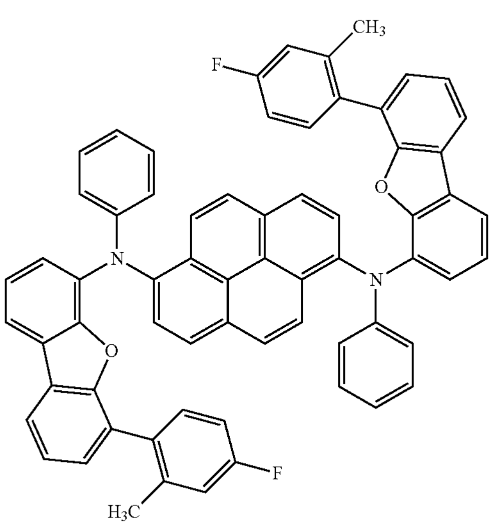
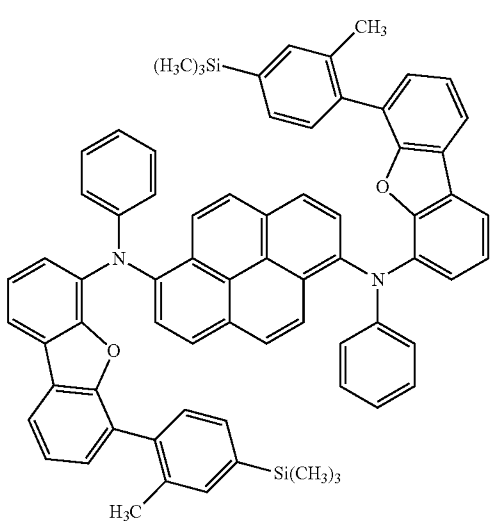

-continued
[Chem. 96]
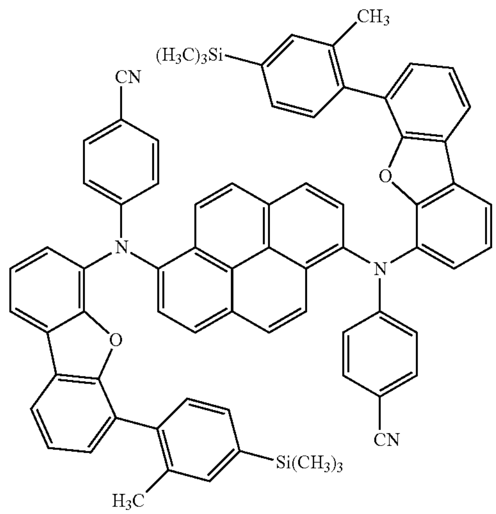
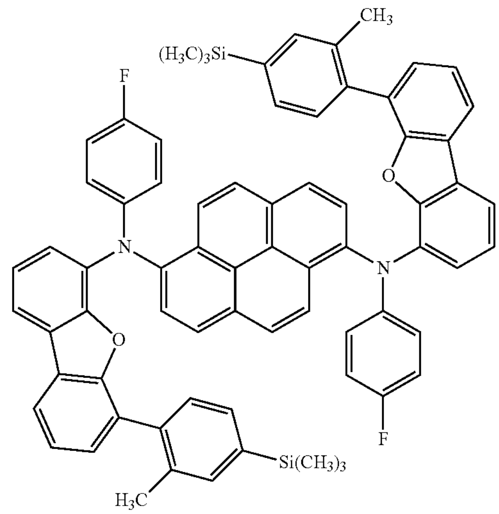
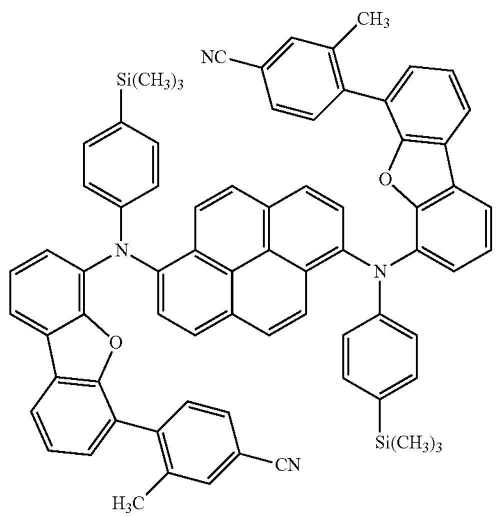
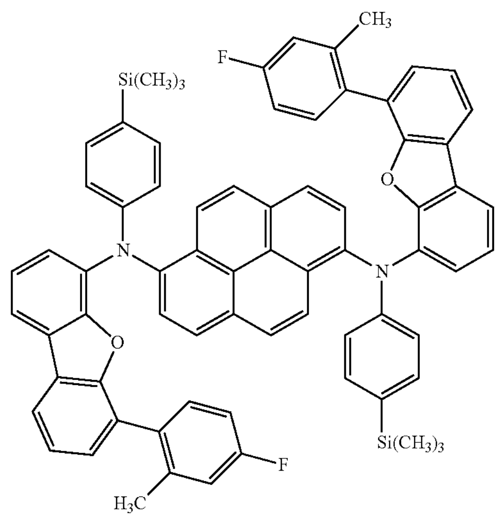
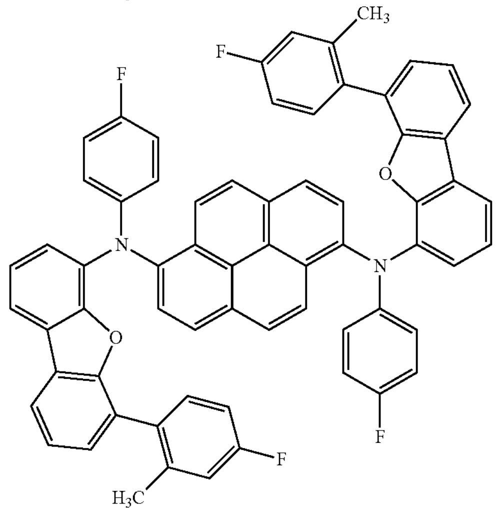
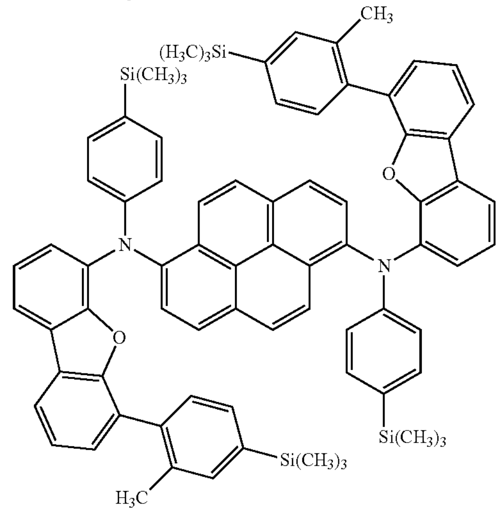

-continued
[Chem.97]
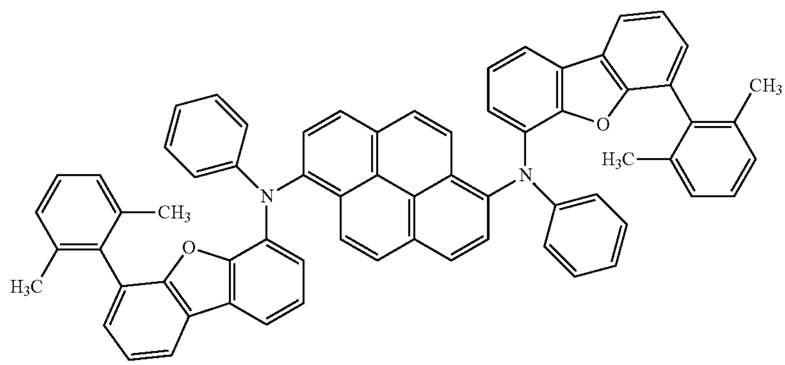
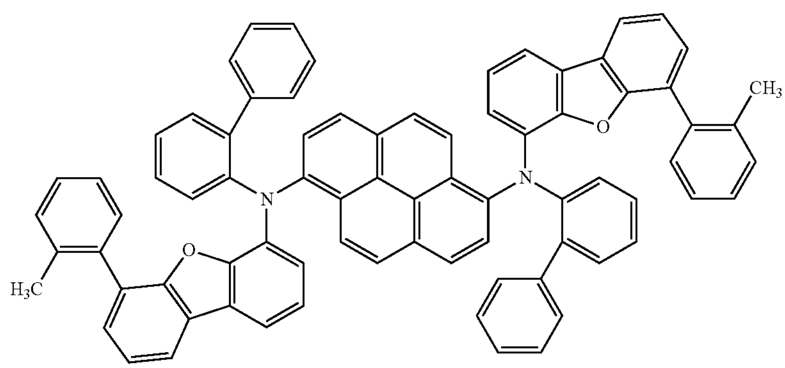
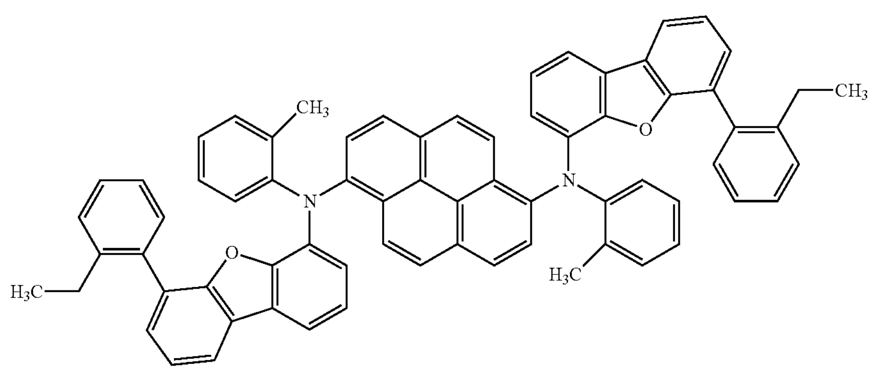
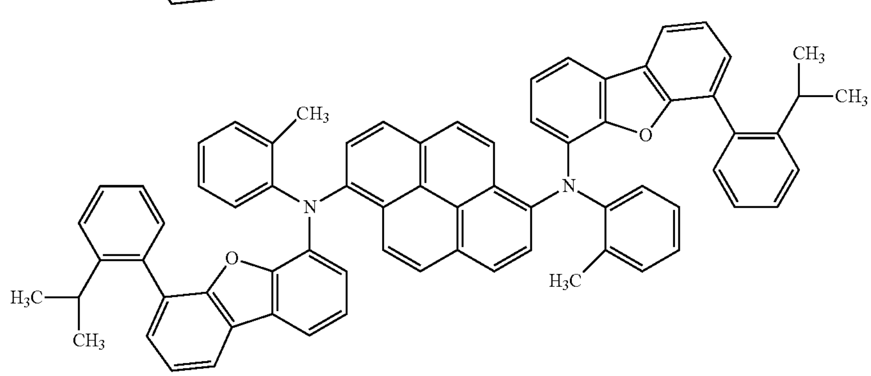

-continued
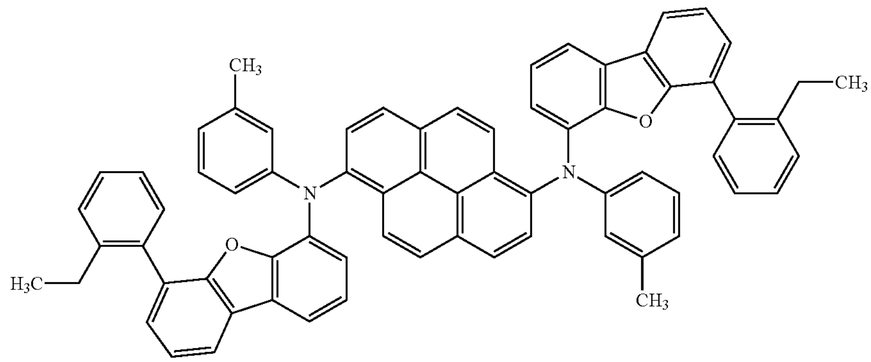
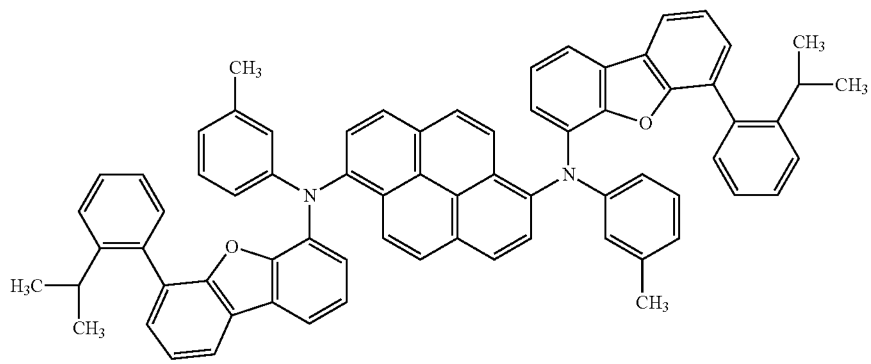
[Chem. 98]
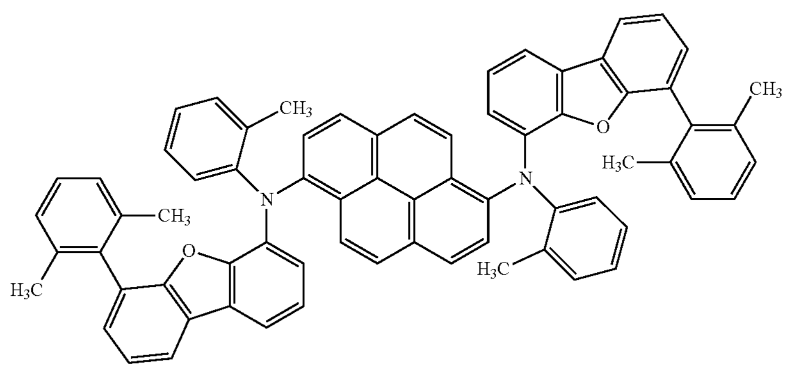
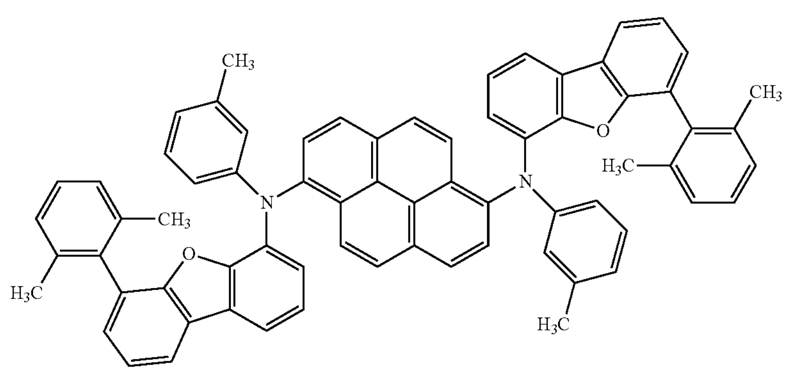

-continued
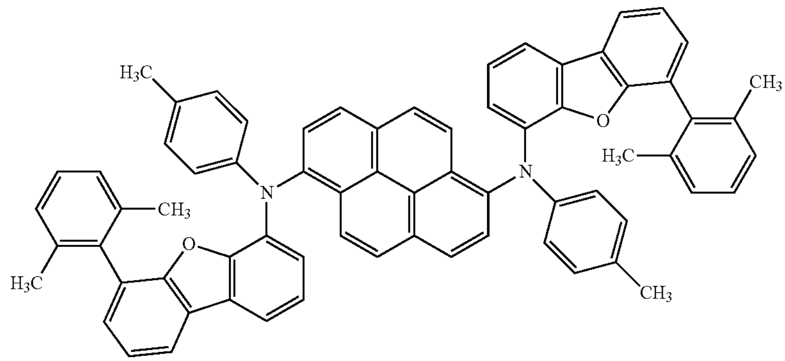
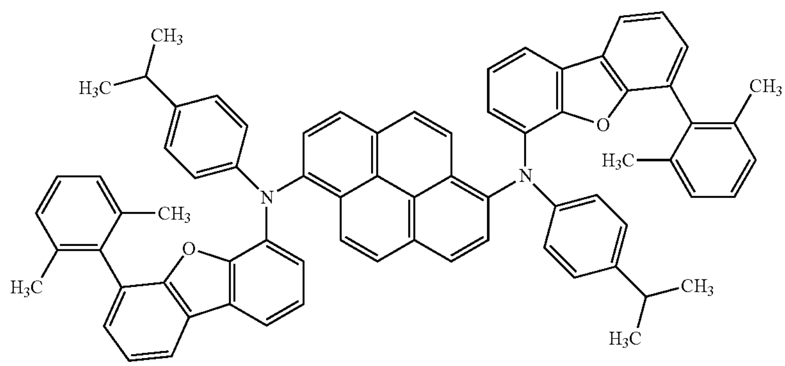
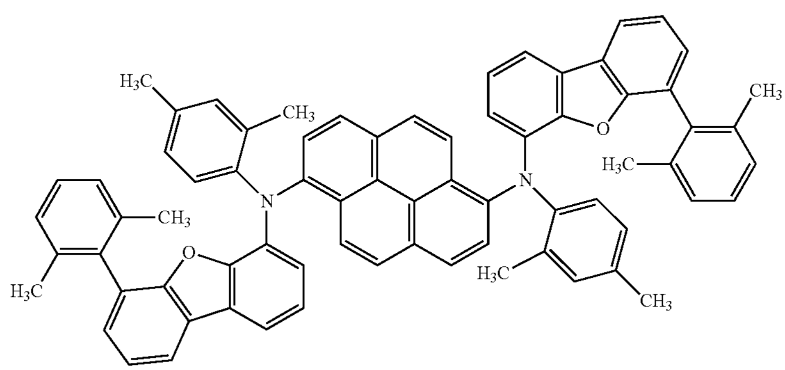
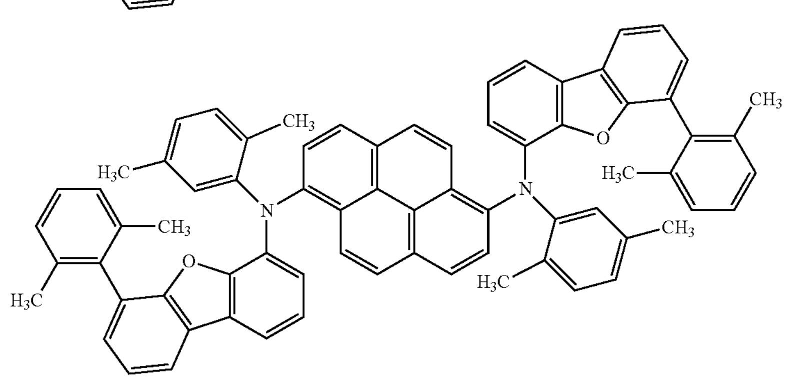

-continued
[Chem. 99]
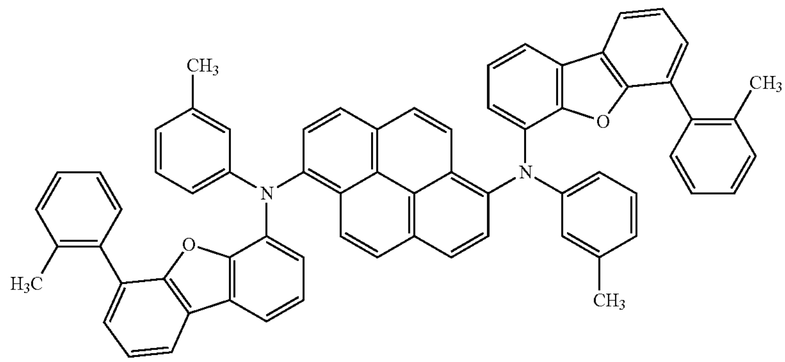
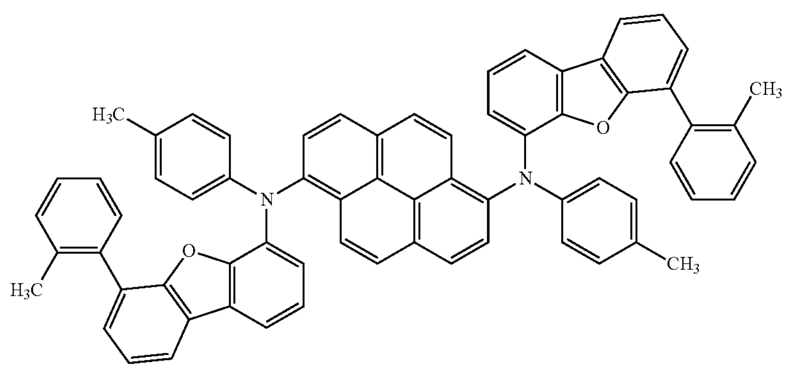
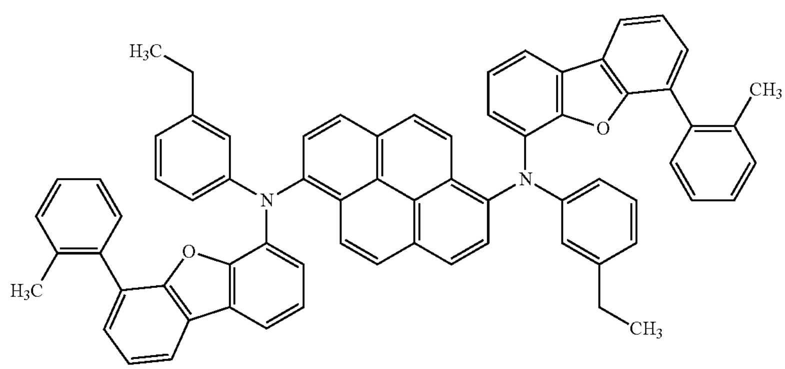
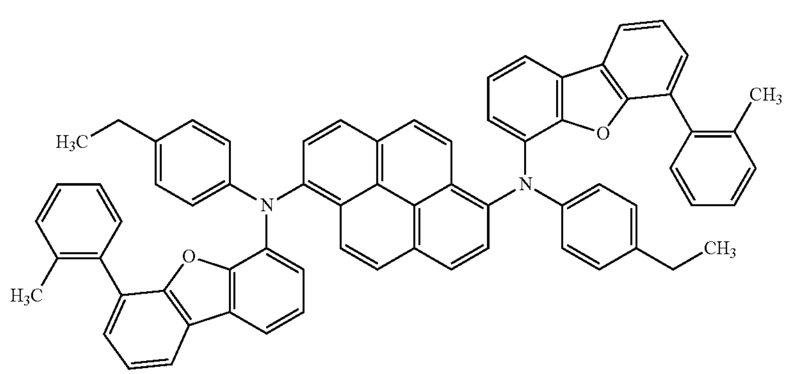

-continued
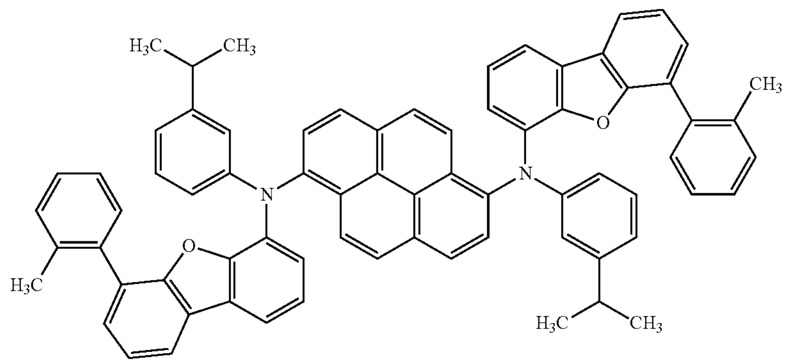
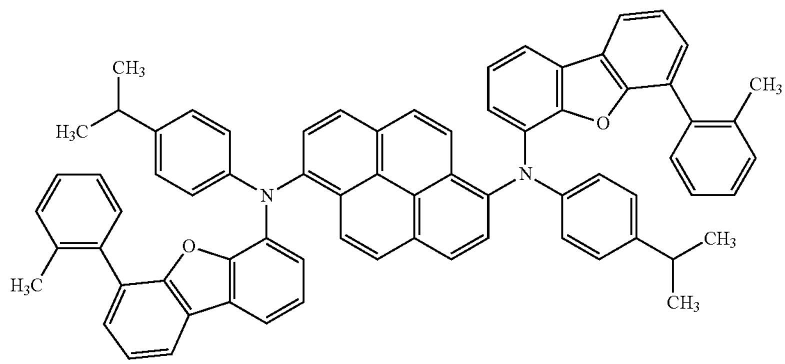
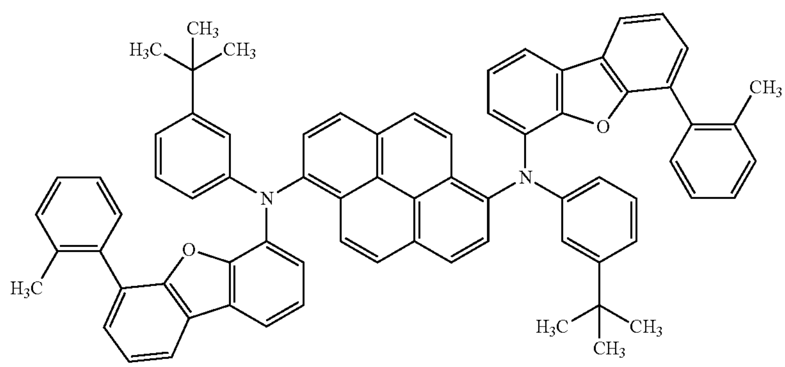
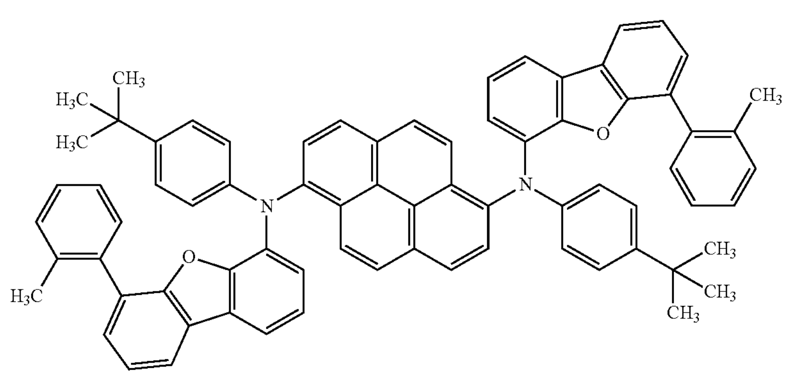

-continued
[Chem. 100]
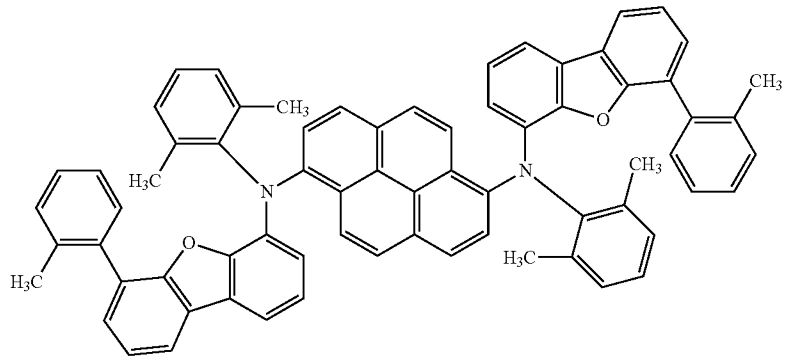
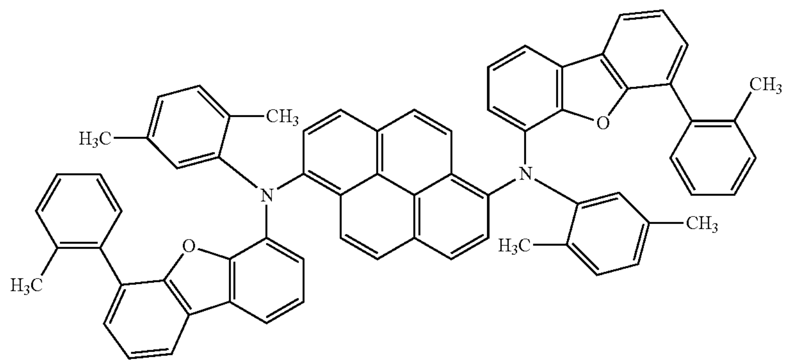
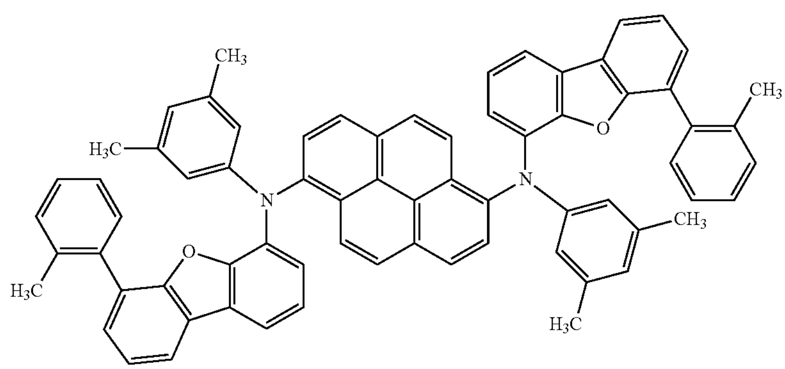
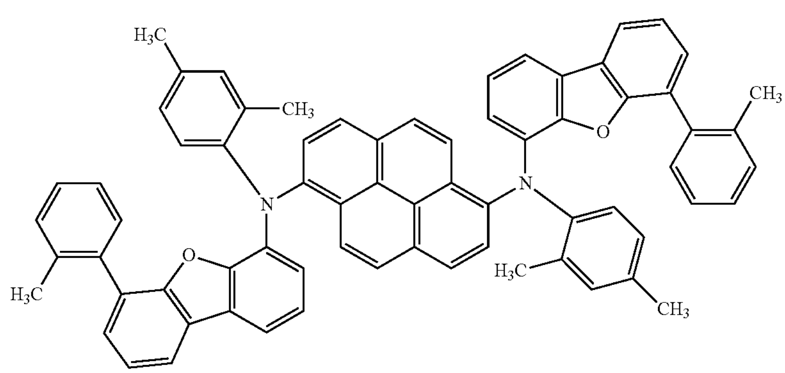

-continued
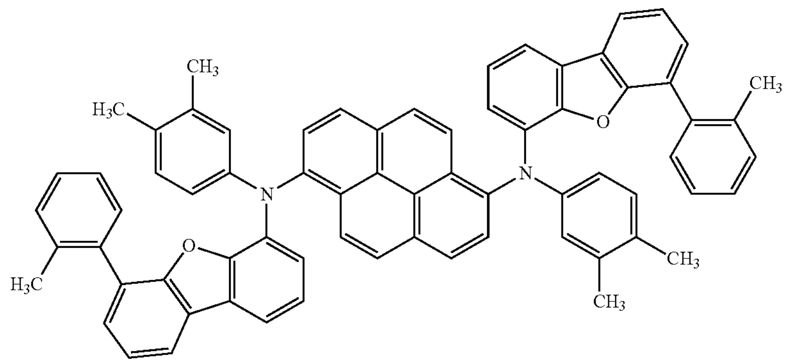
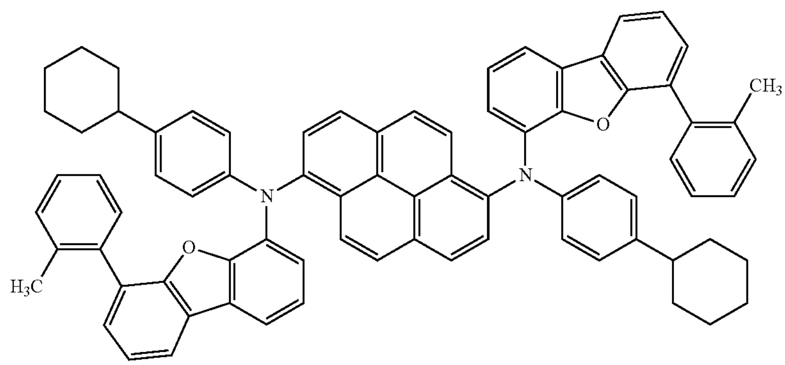
[Chem. 101]
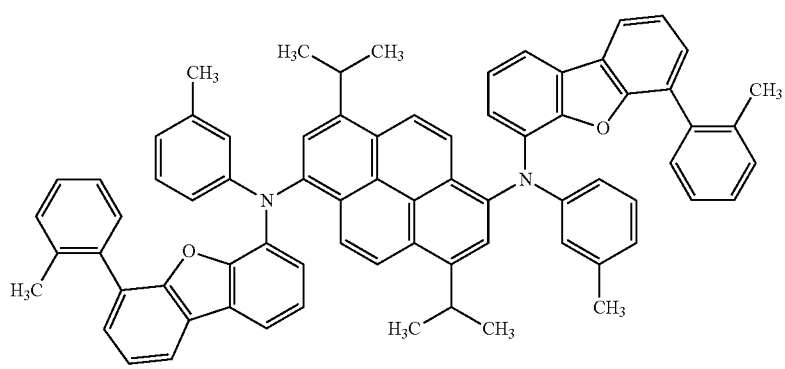
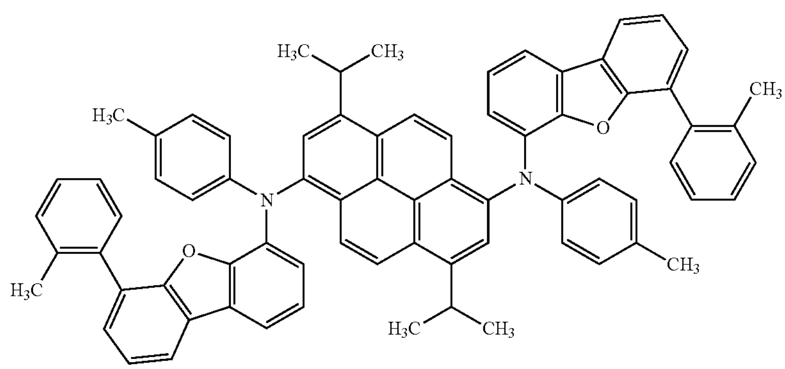

-continued
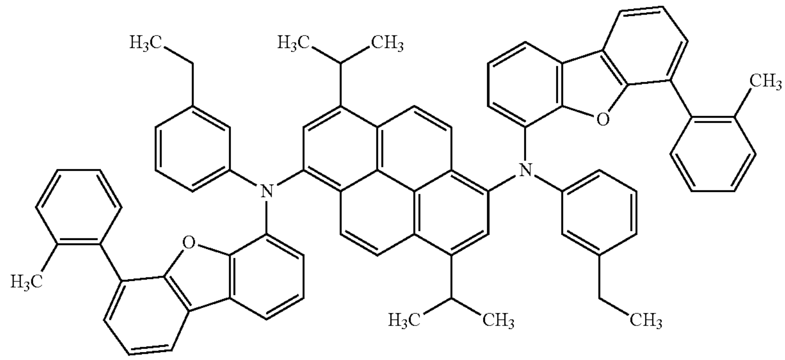
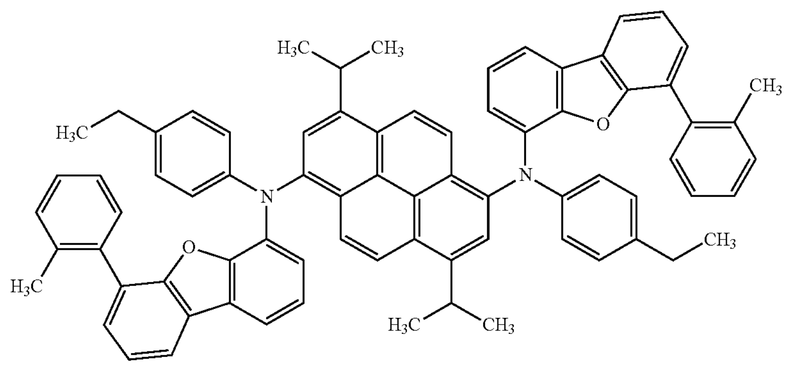
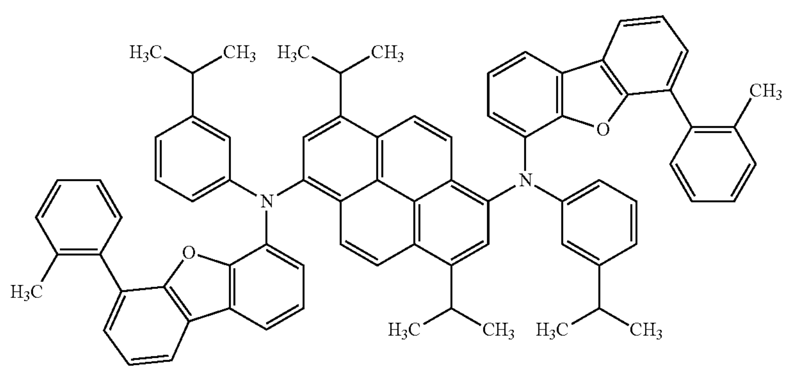
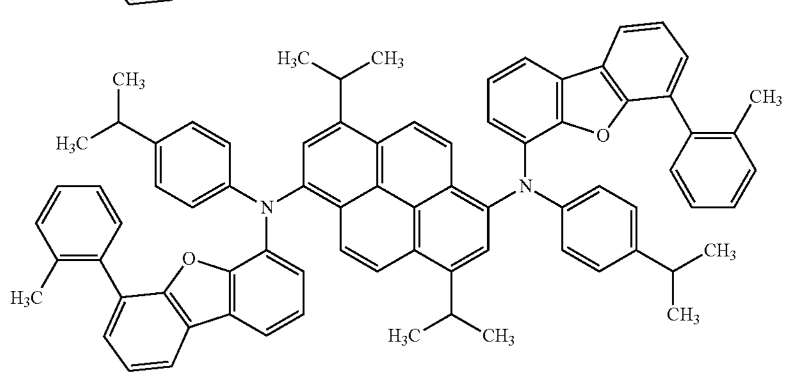

-continued
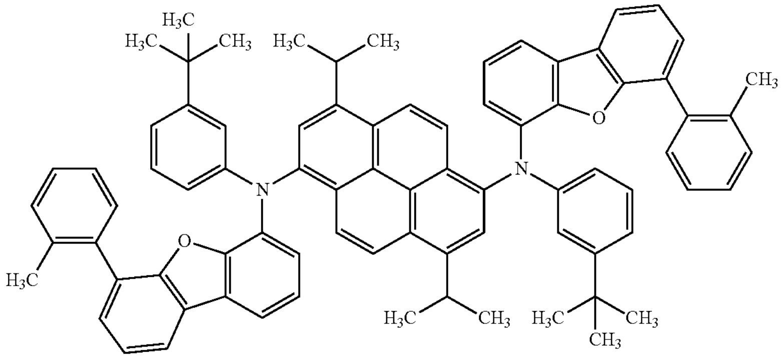
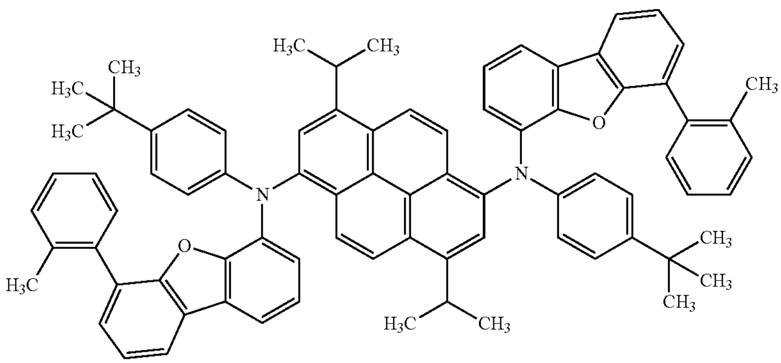
[Chem. 102]
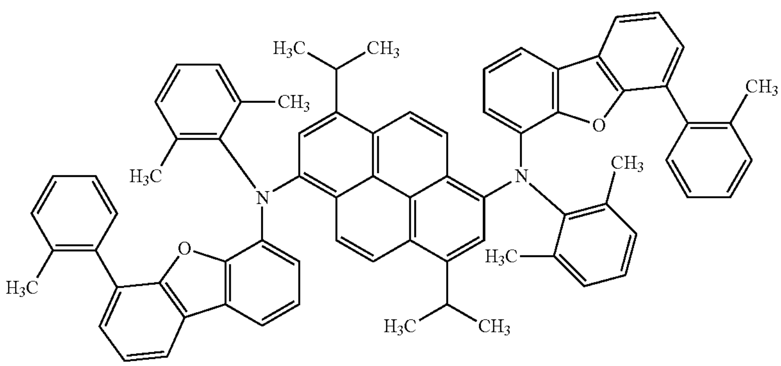
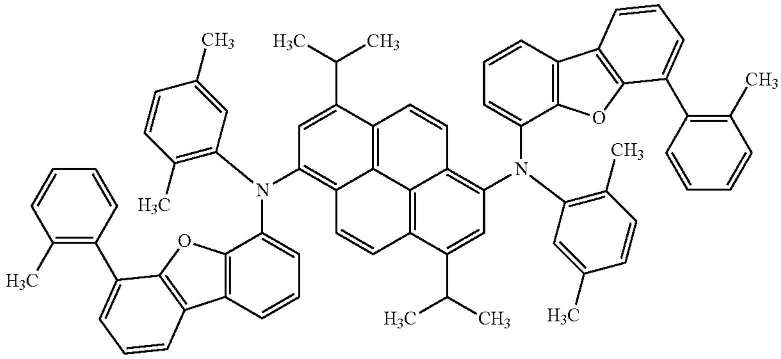

-continued
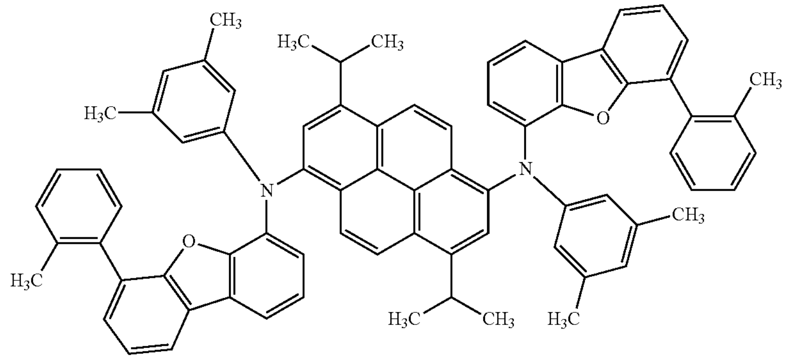
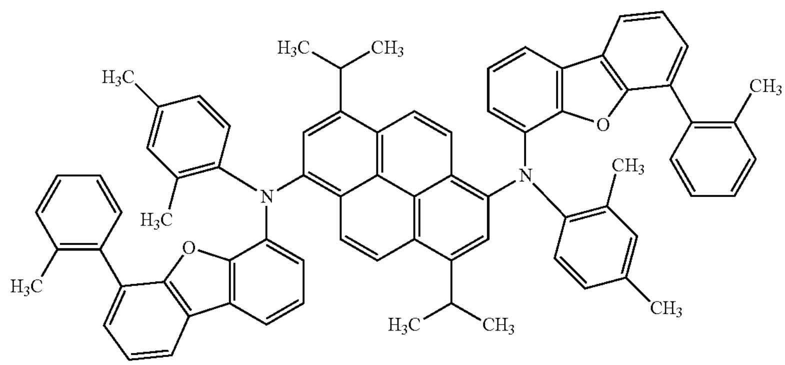
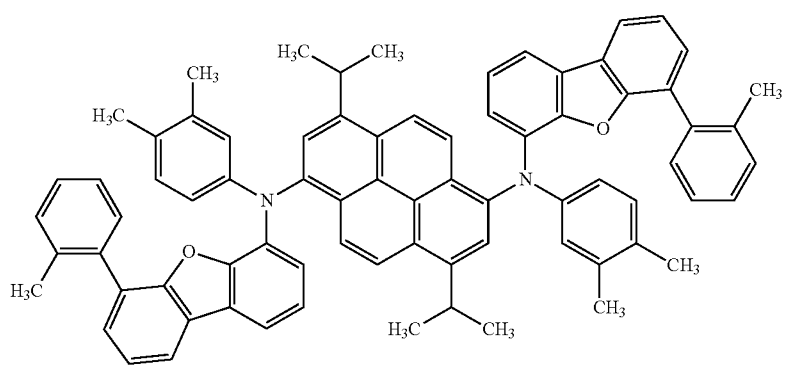
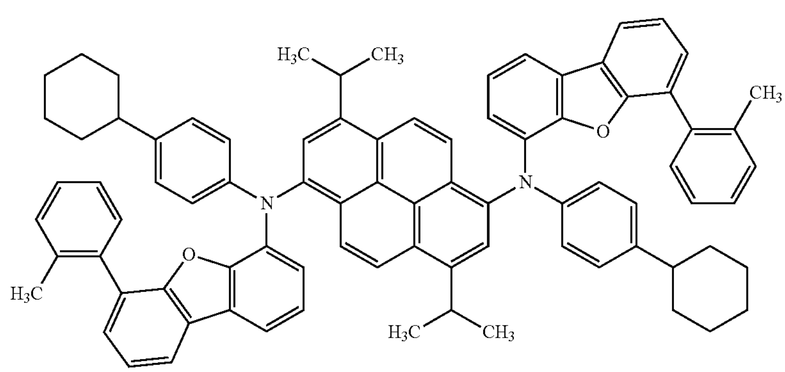

-continued
[Chem. 103]
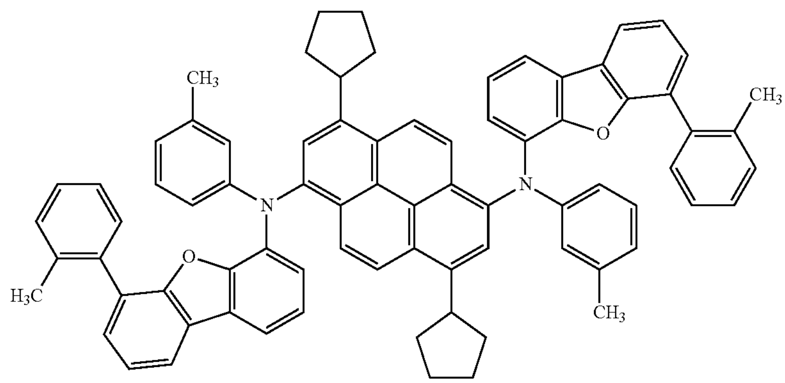
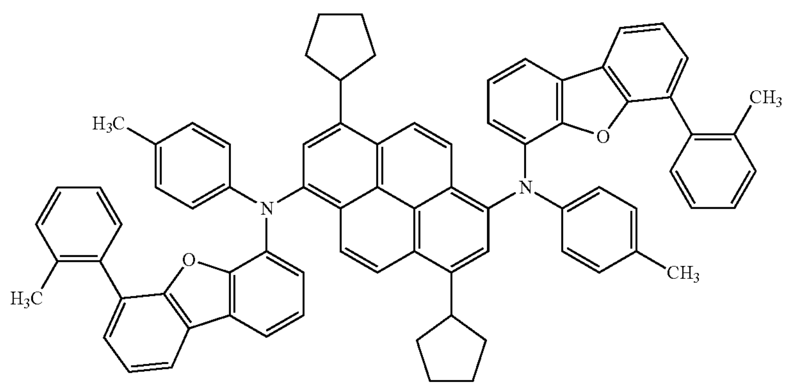
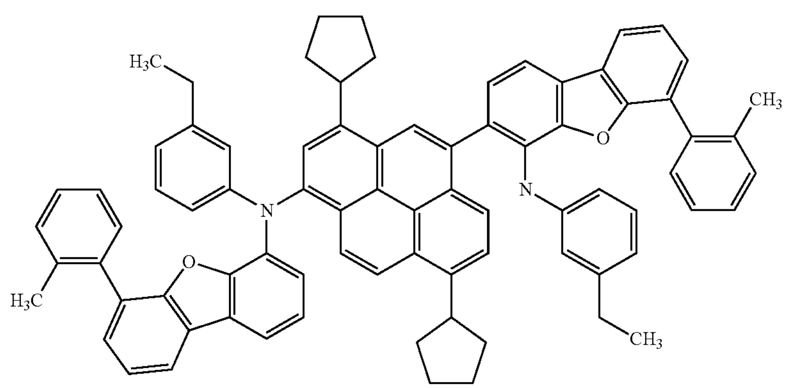
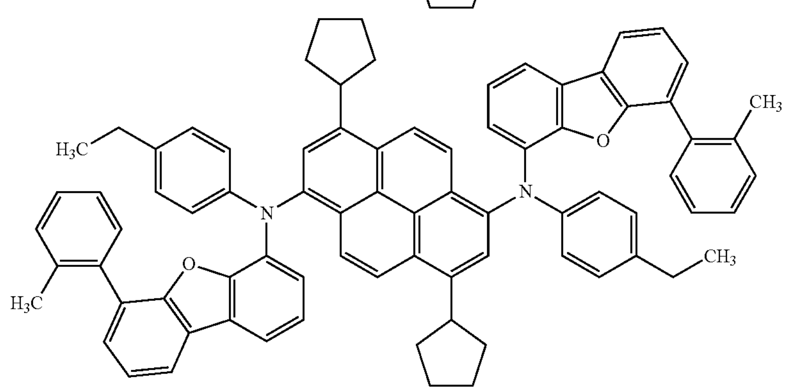

-continued
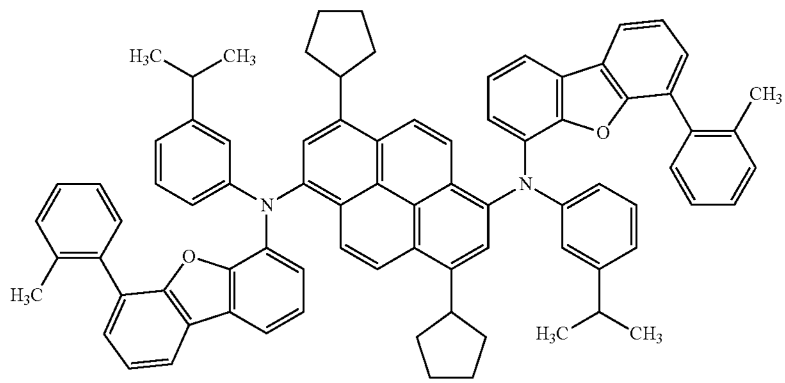
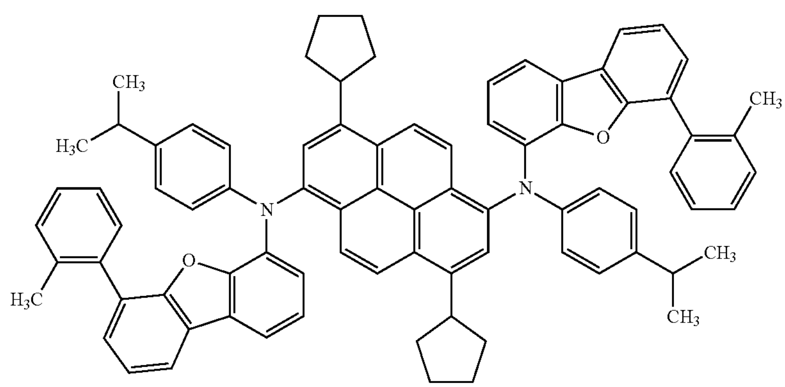
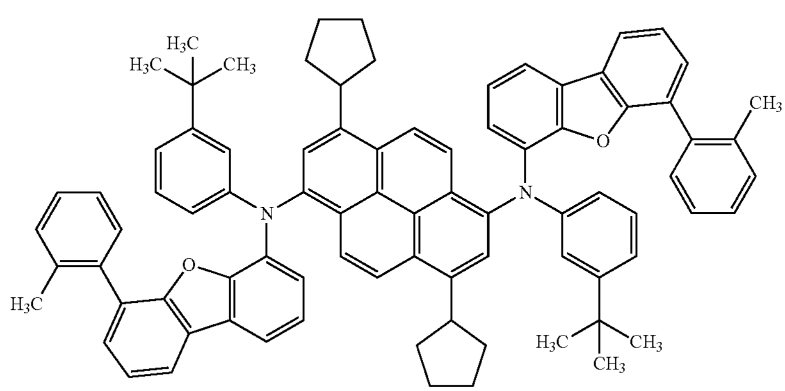
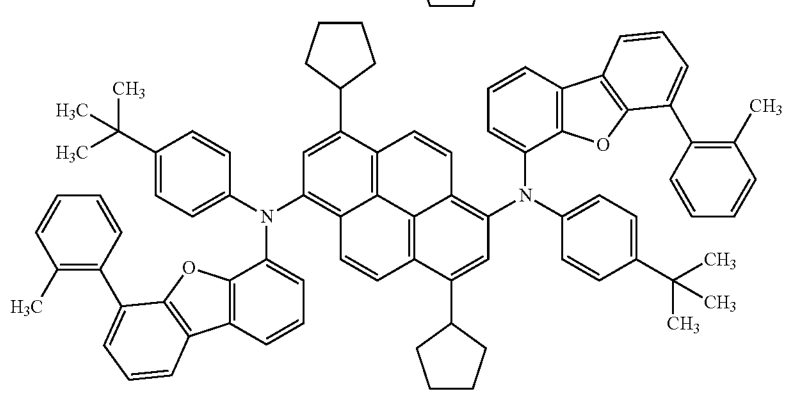

-continued
[Chem. 104]
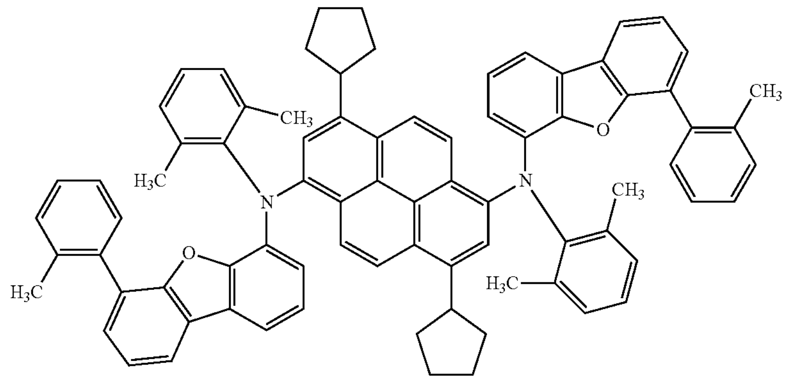
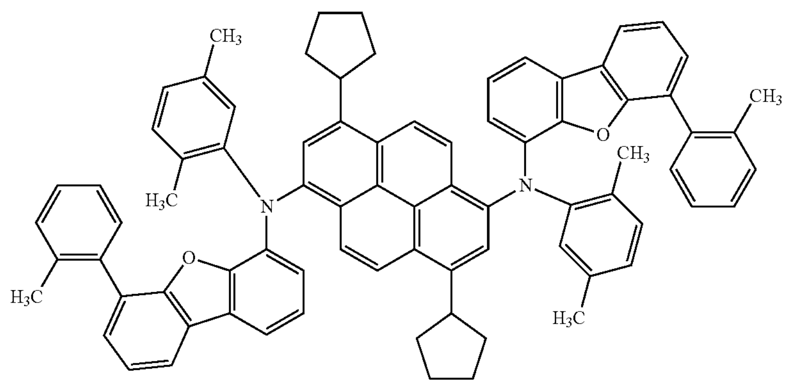
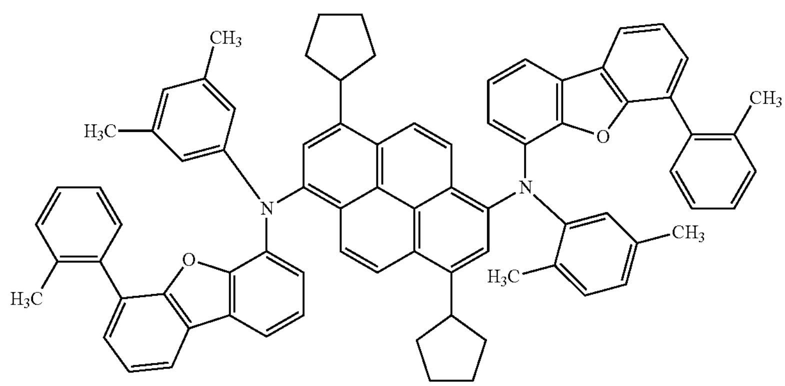
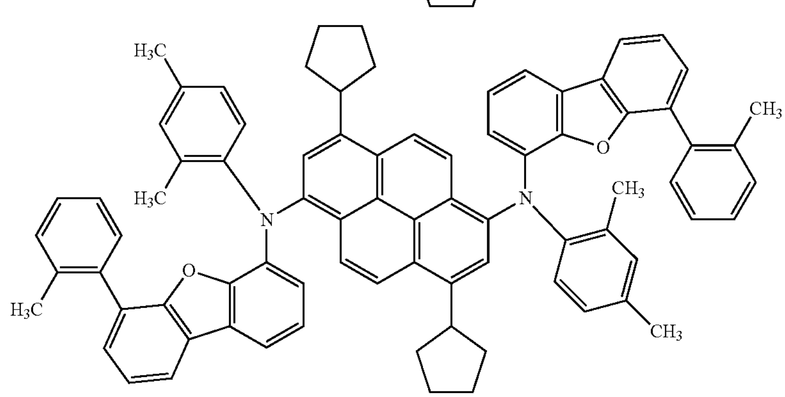

-continued
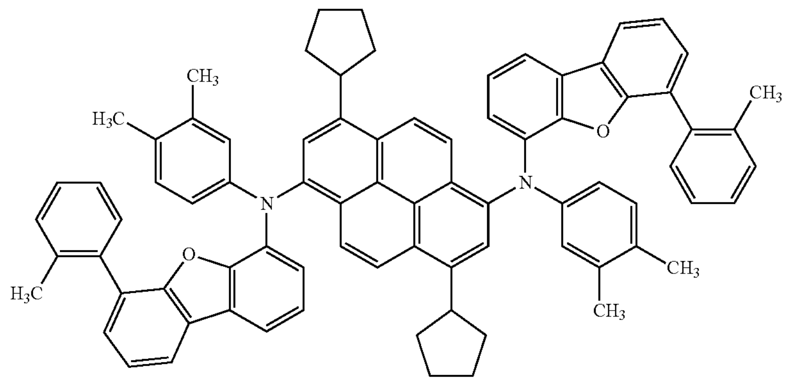
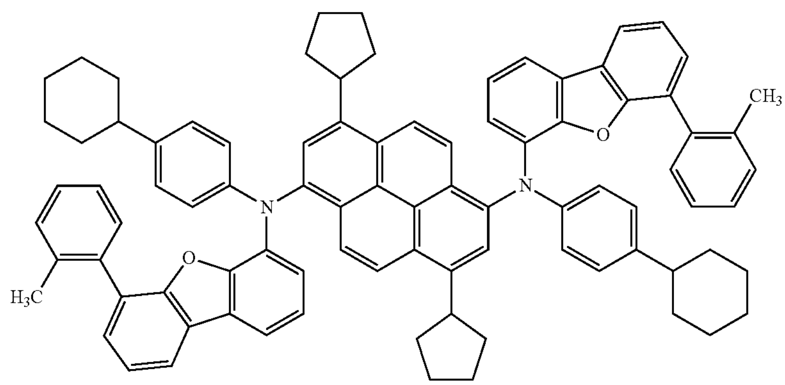
[Chem. 105]
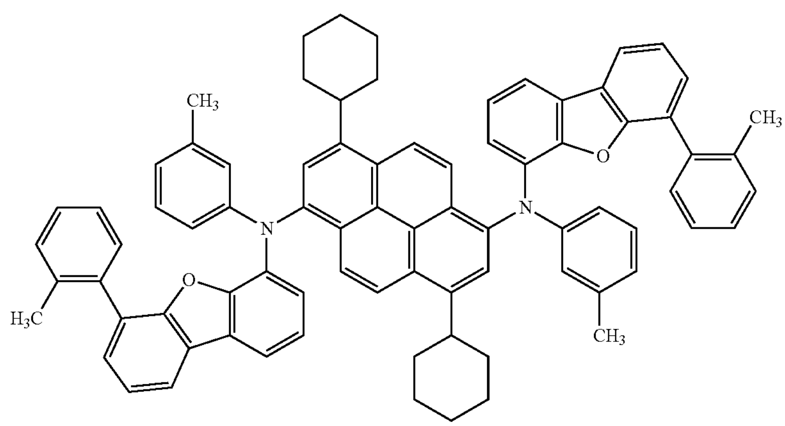
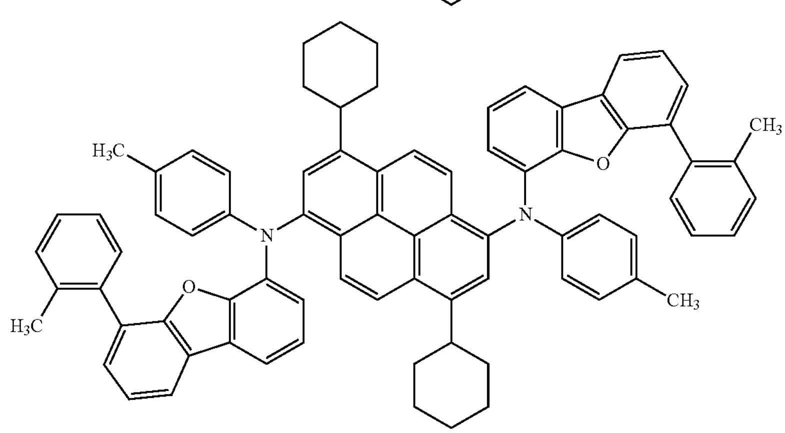

-continued
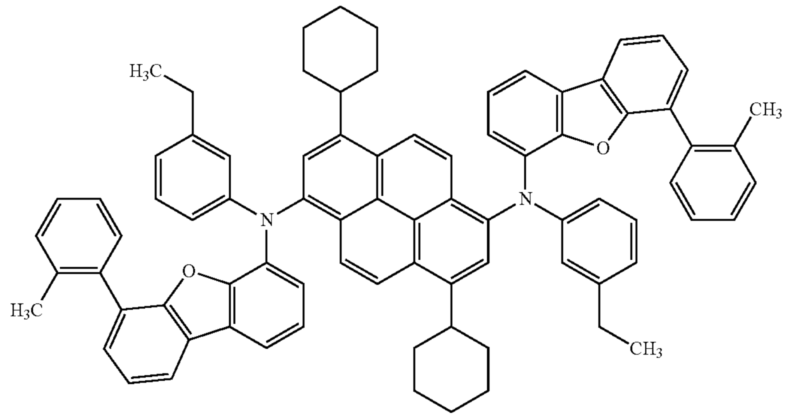
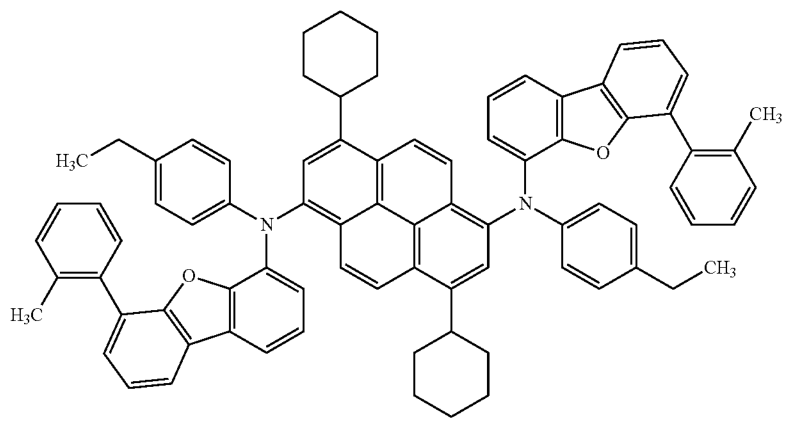
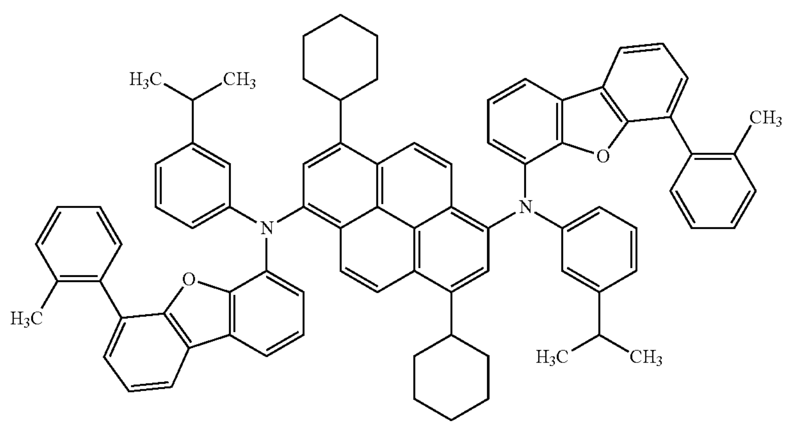
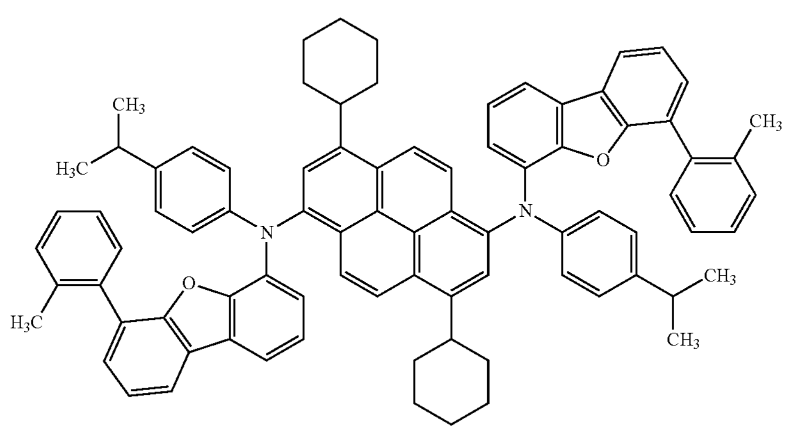

-continued
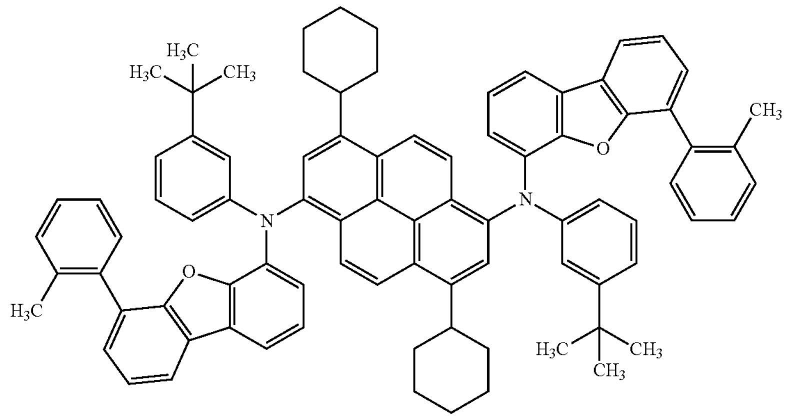
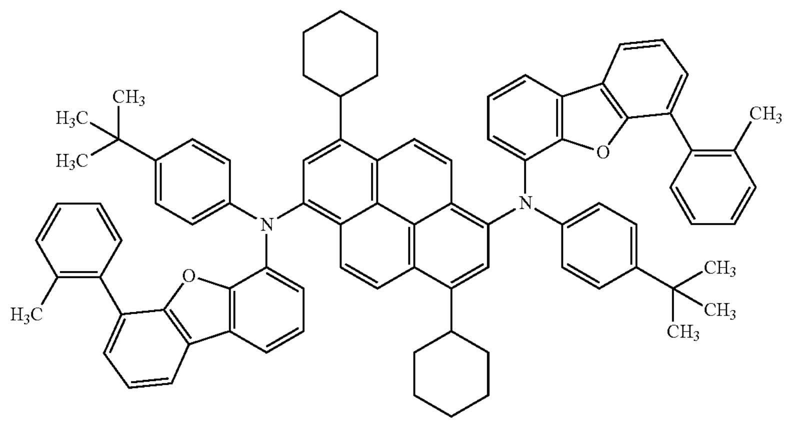
[Chem. 106]
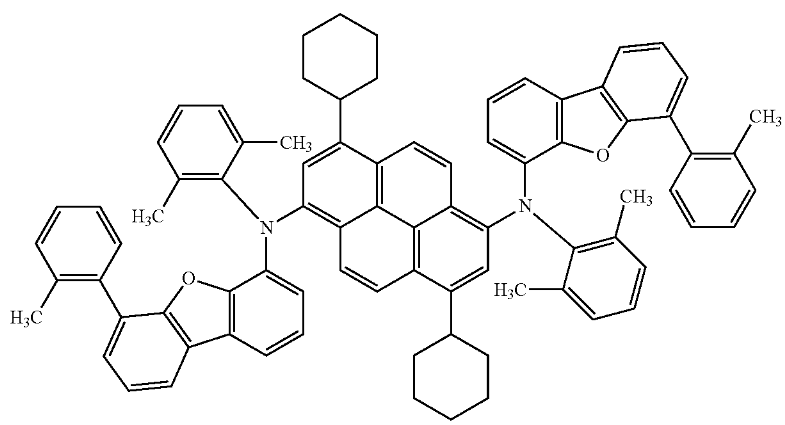
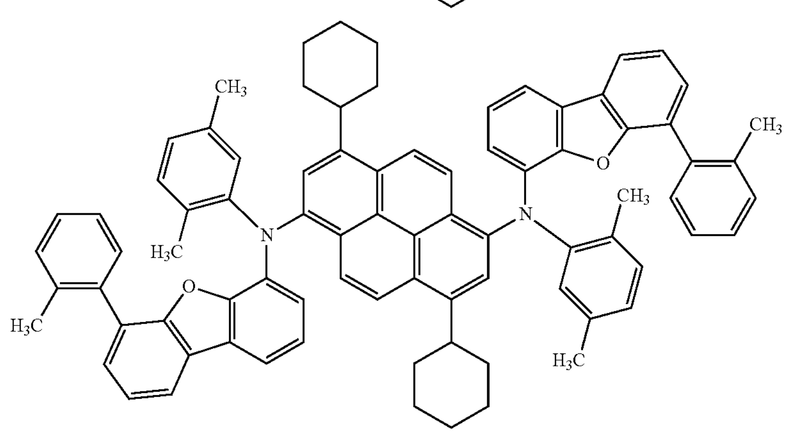

-continued
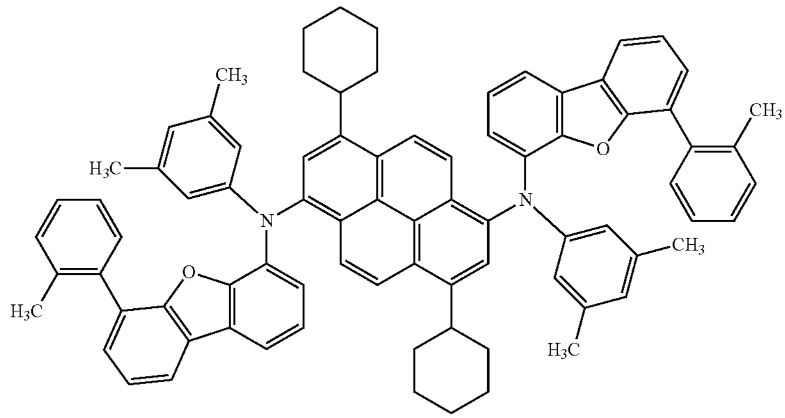
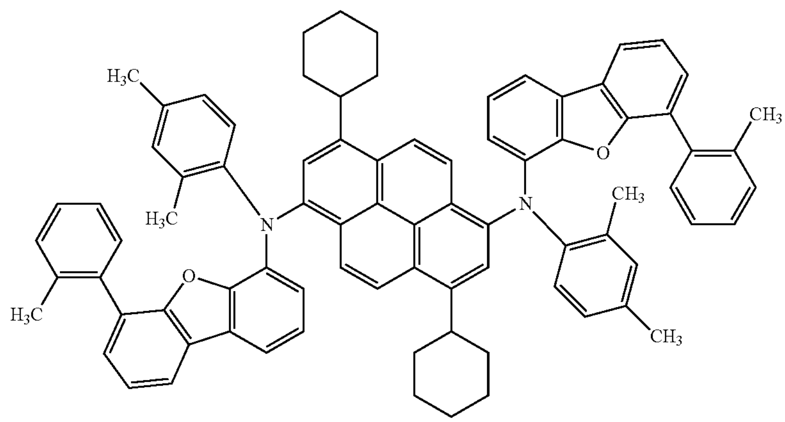
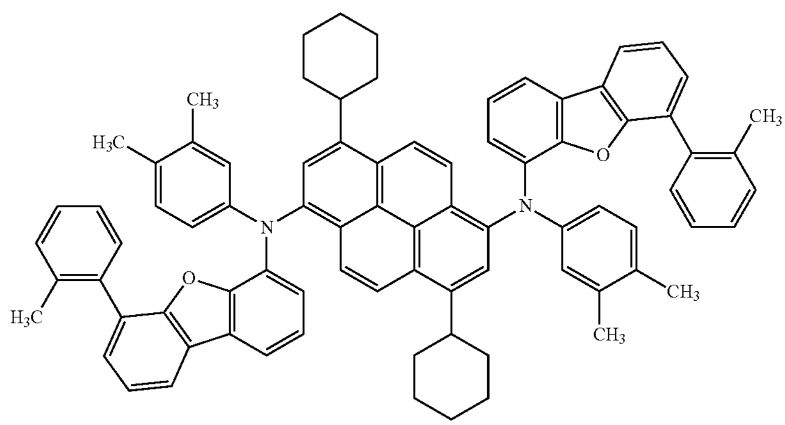
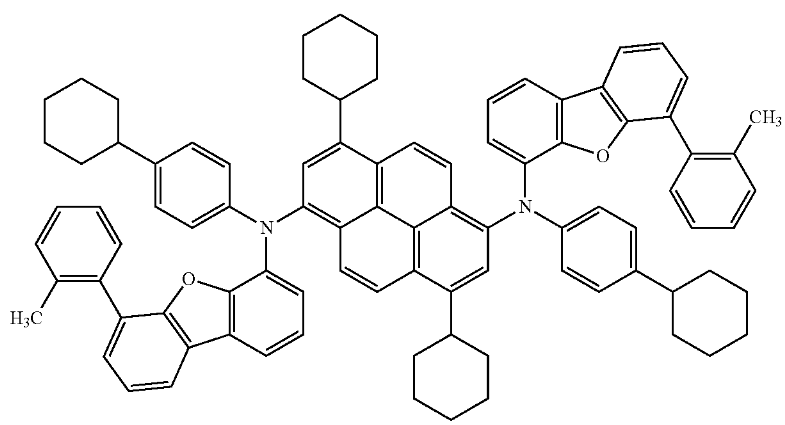

-continued
[Chem. 107]
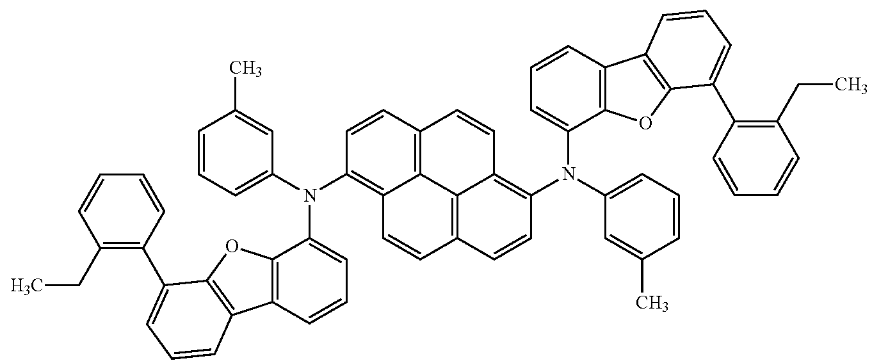
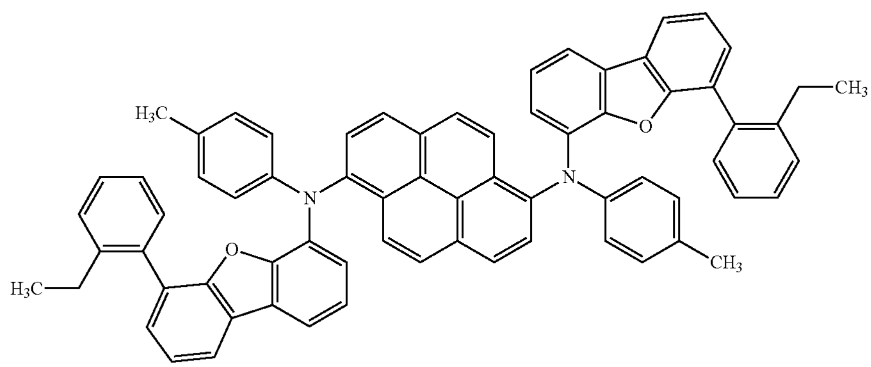
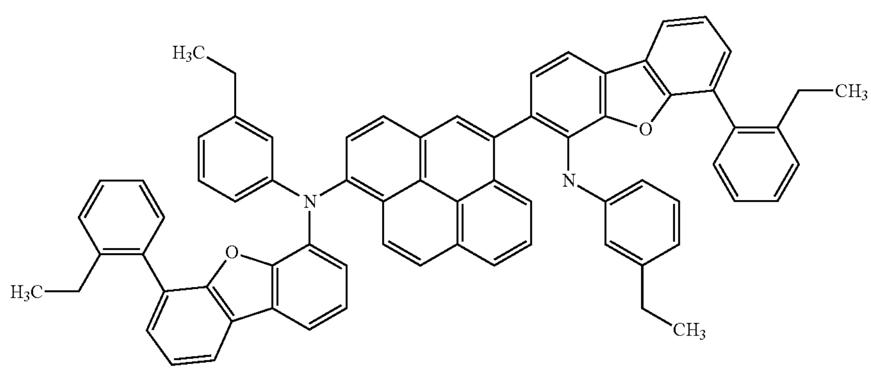
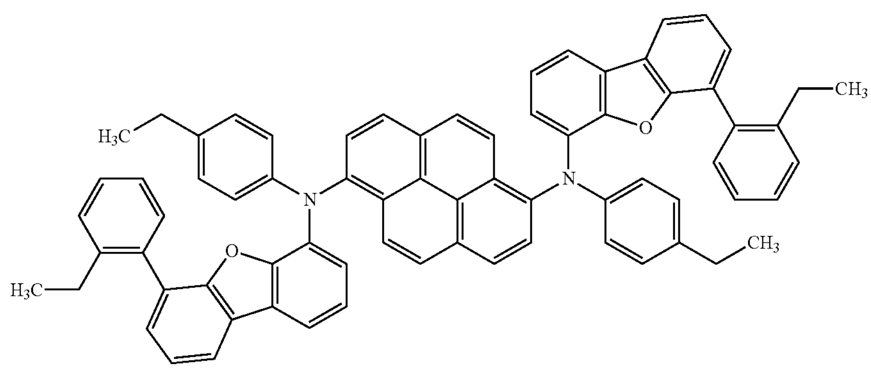

-continued
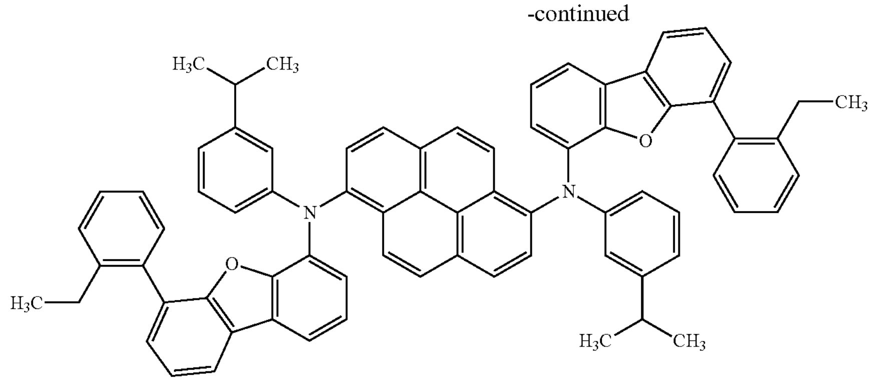
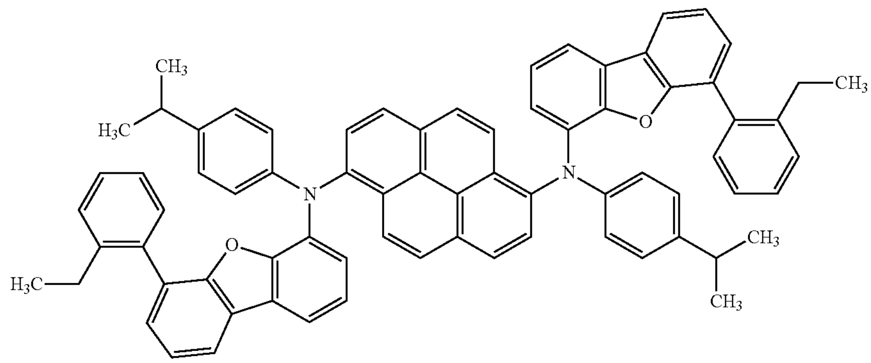
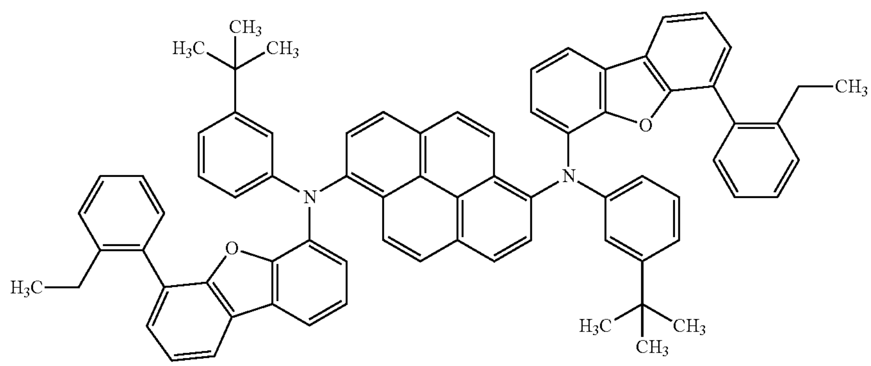
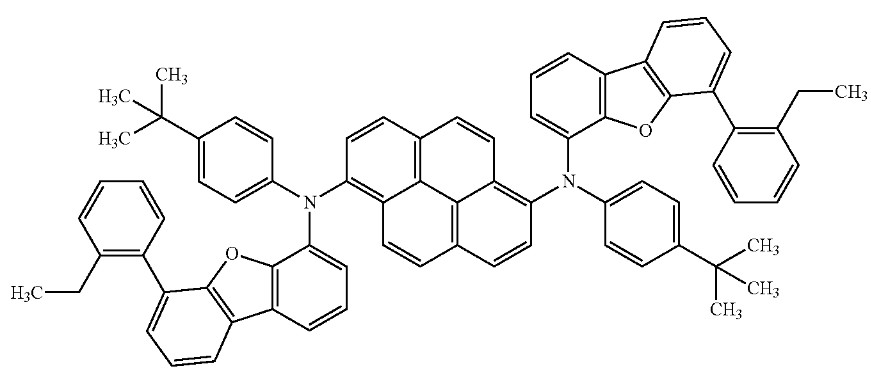

-continued
[Chem. 108]
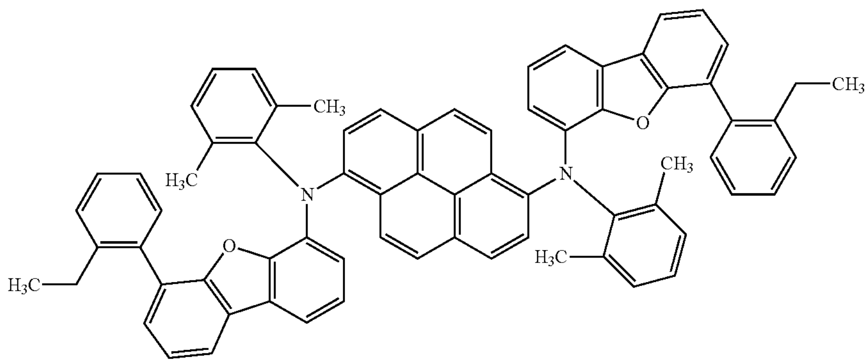
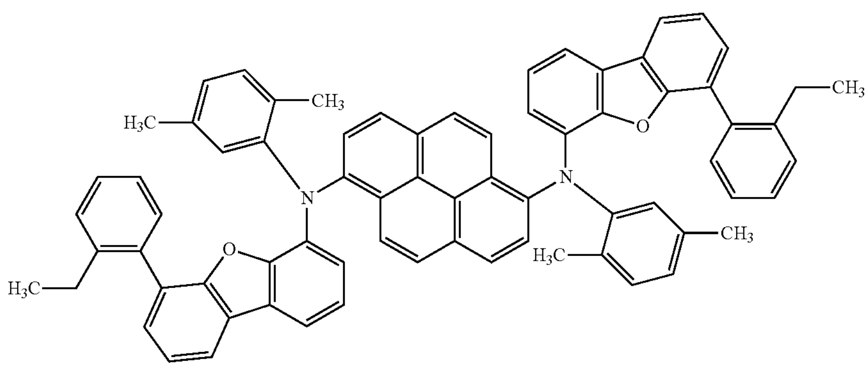
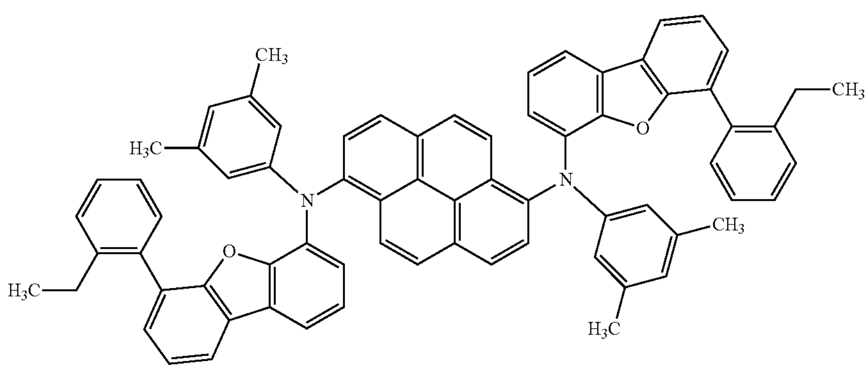
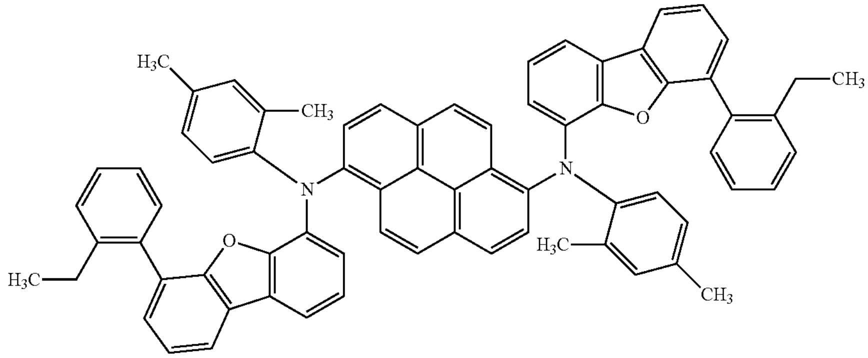

-continued
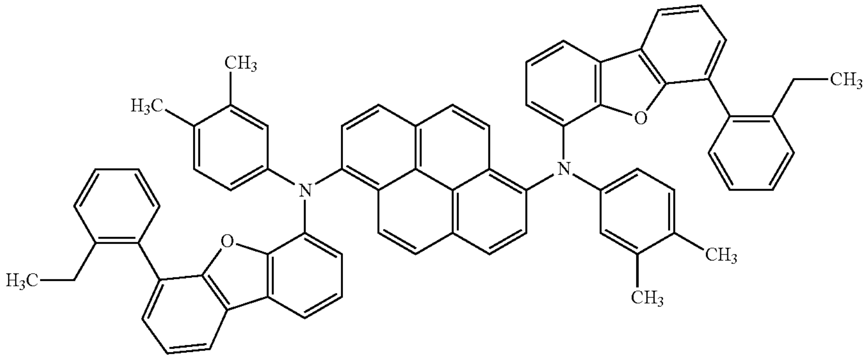
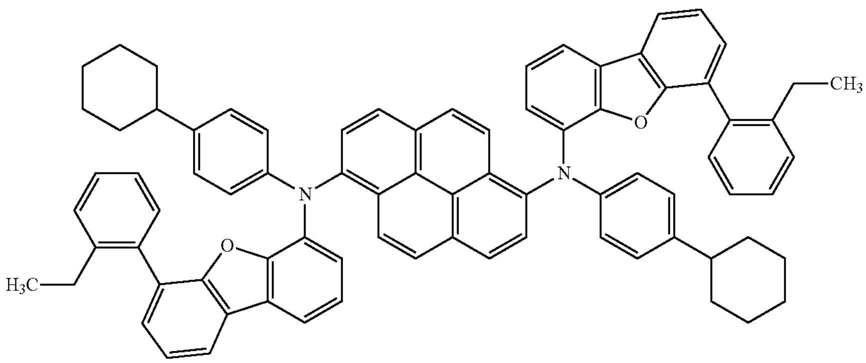
[Chem. 109]
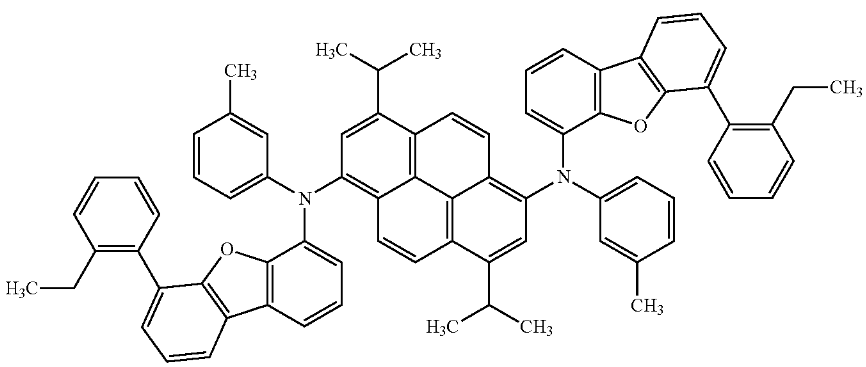
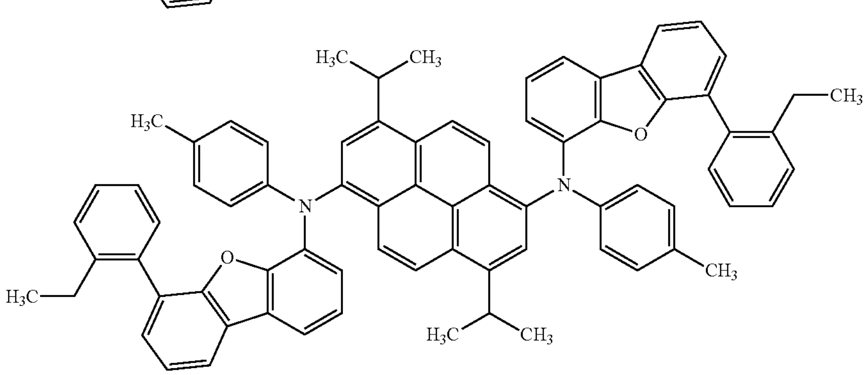

-continued
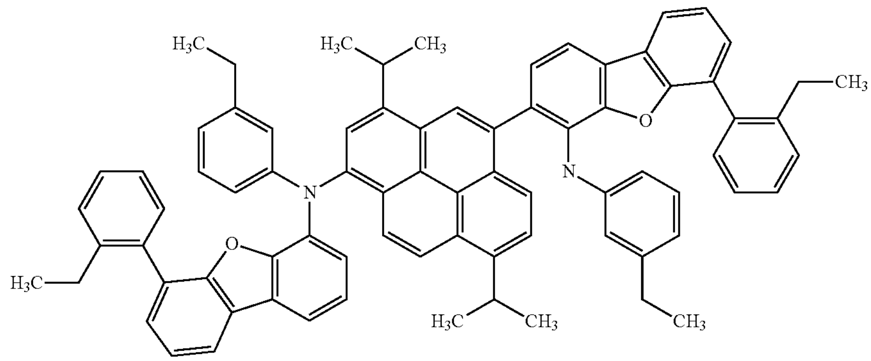
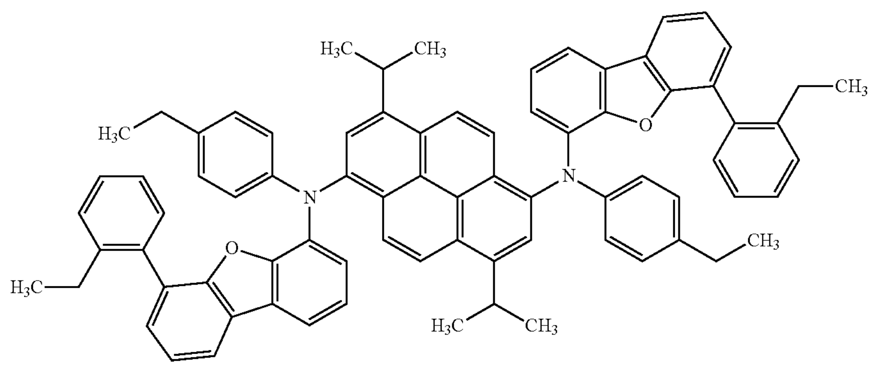
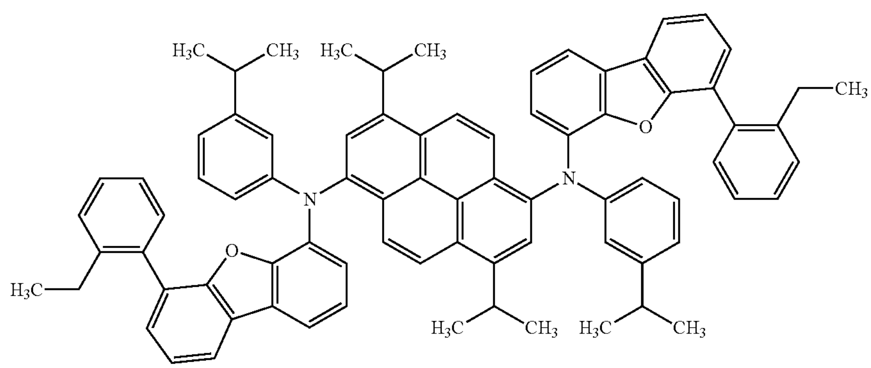
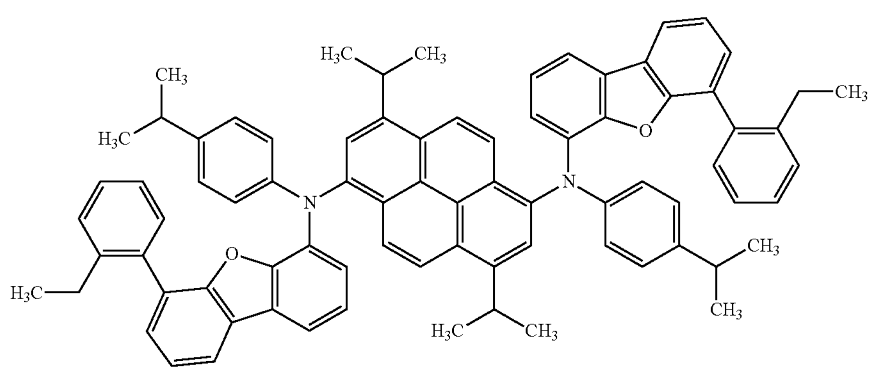

-continued
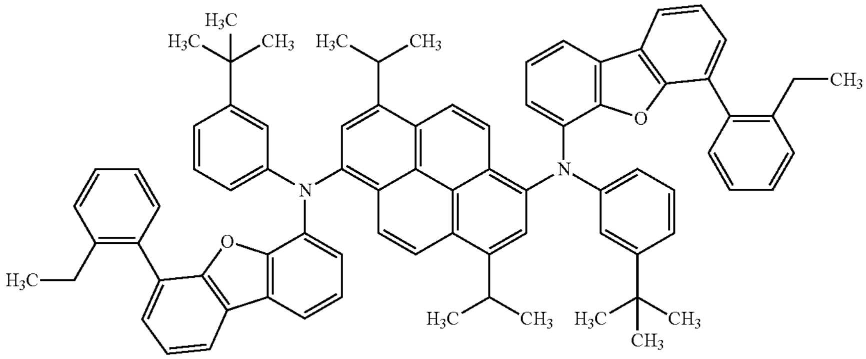
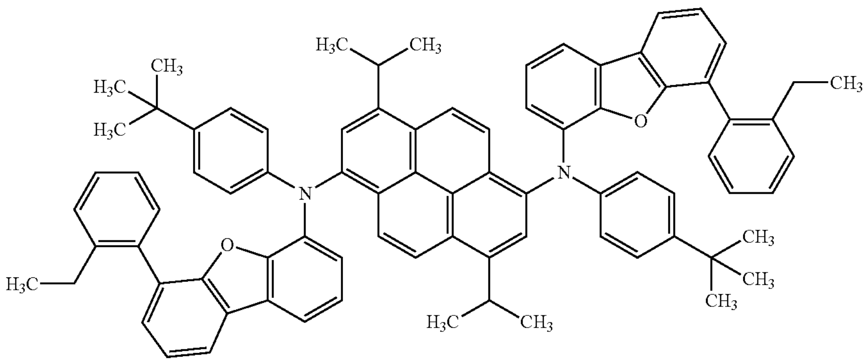
[Chem. 110]
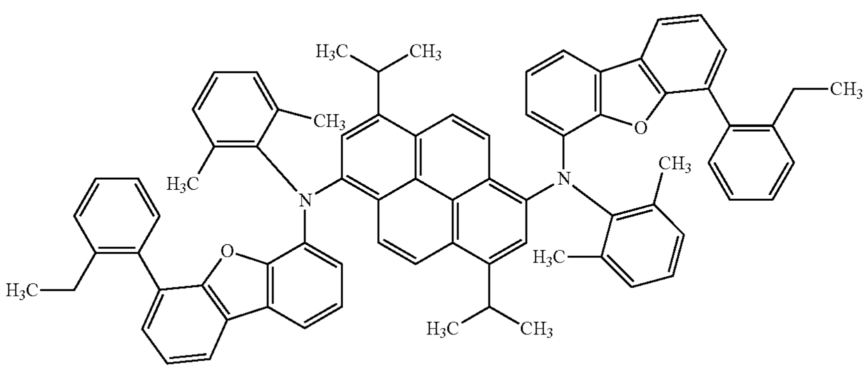
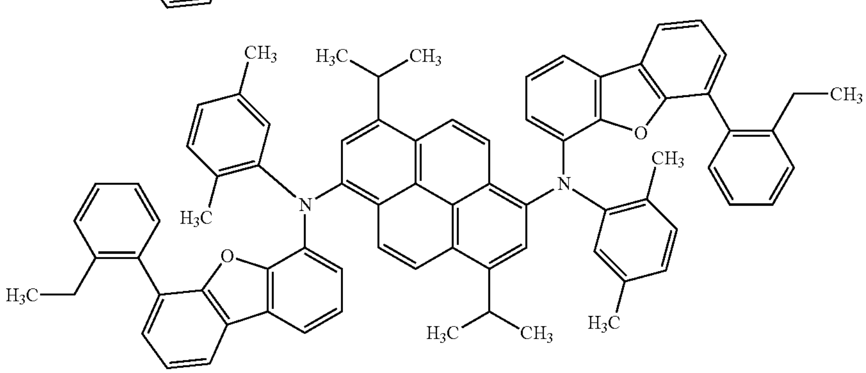

-continued
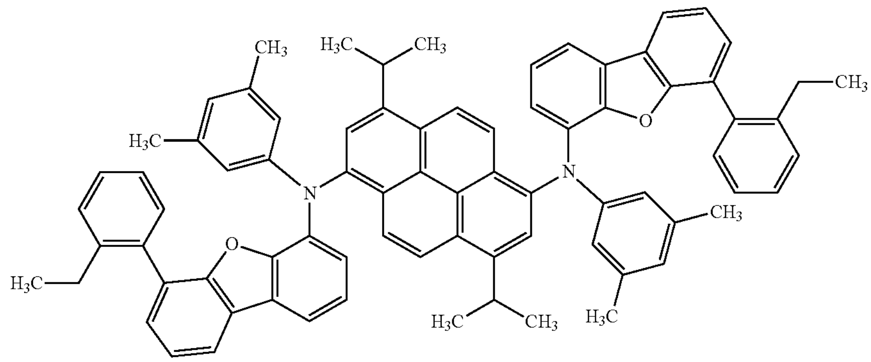
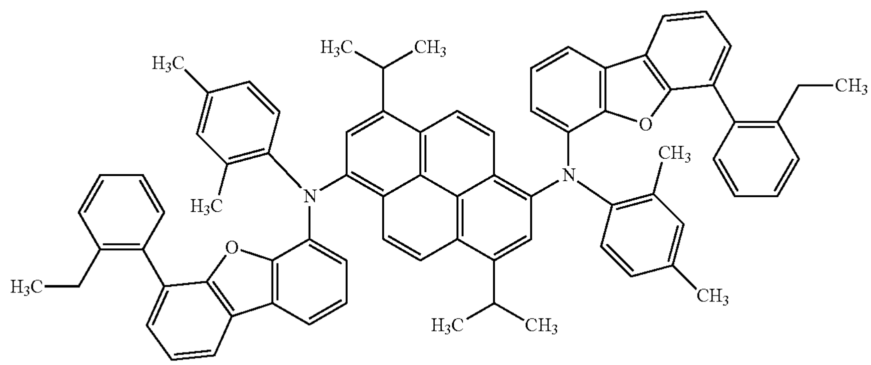
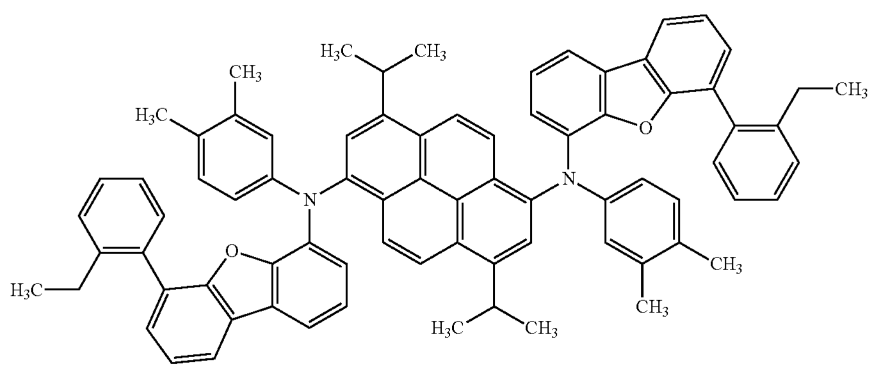
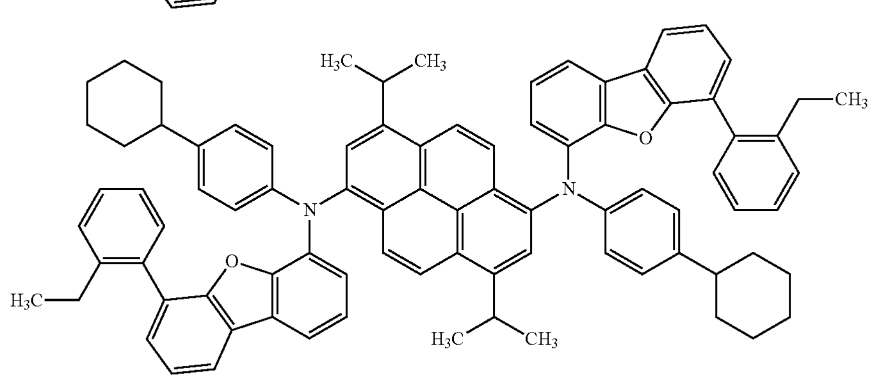

-continued
[Chem. 111]
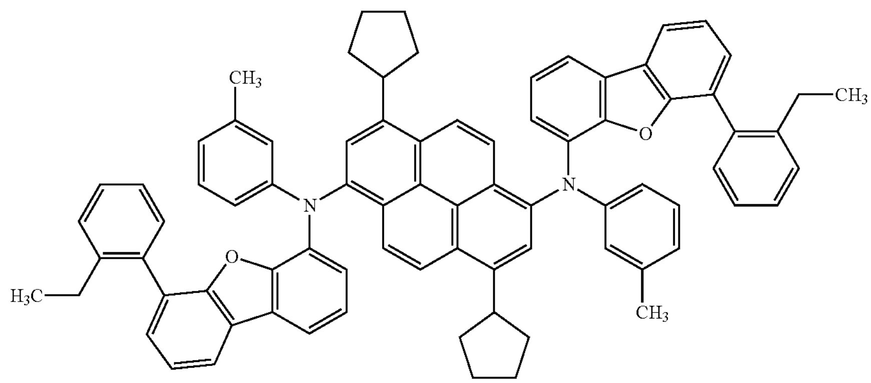
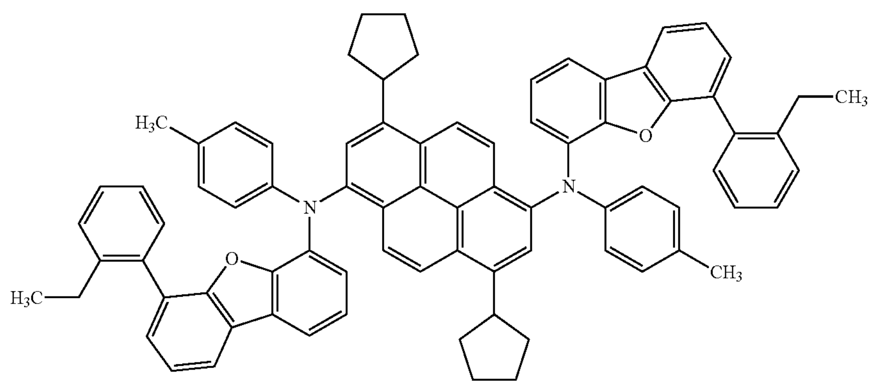
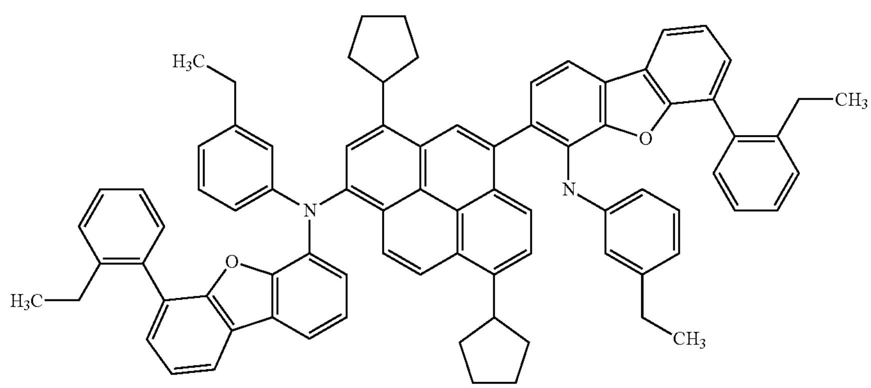
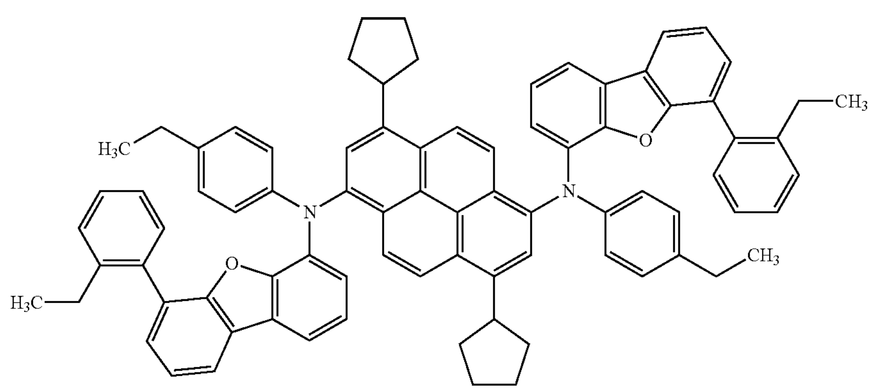

-continued
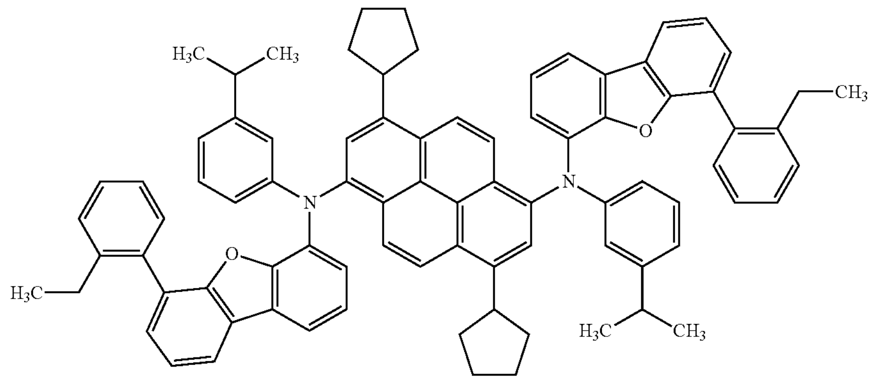
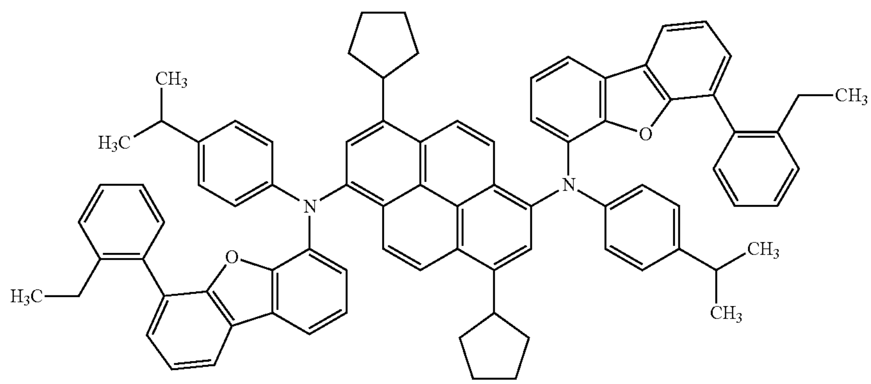
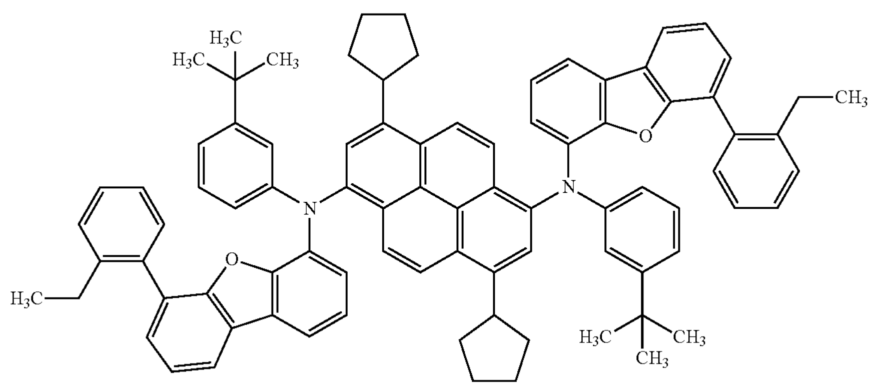
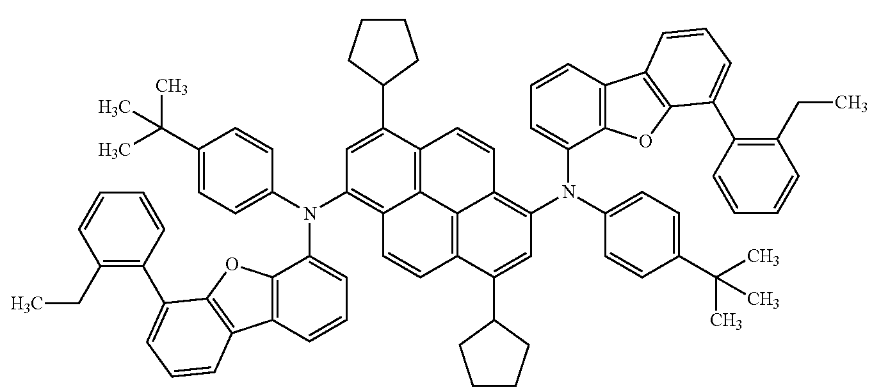

-continued
[Chem. 112]
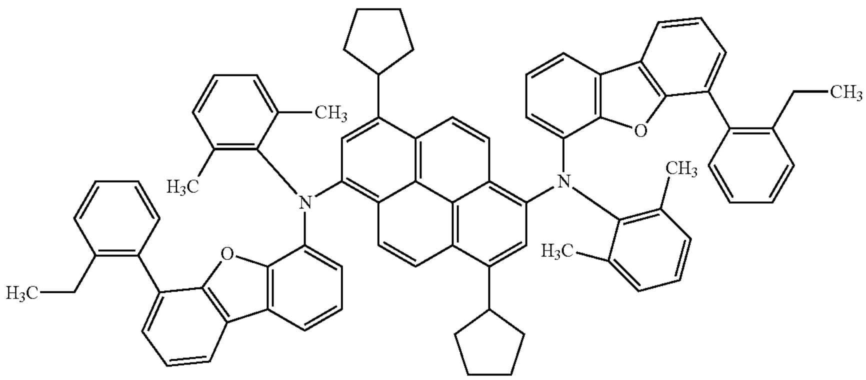
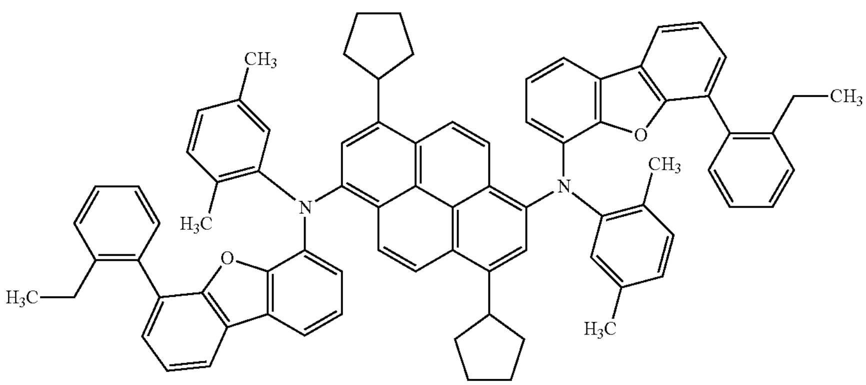
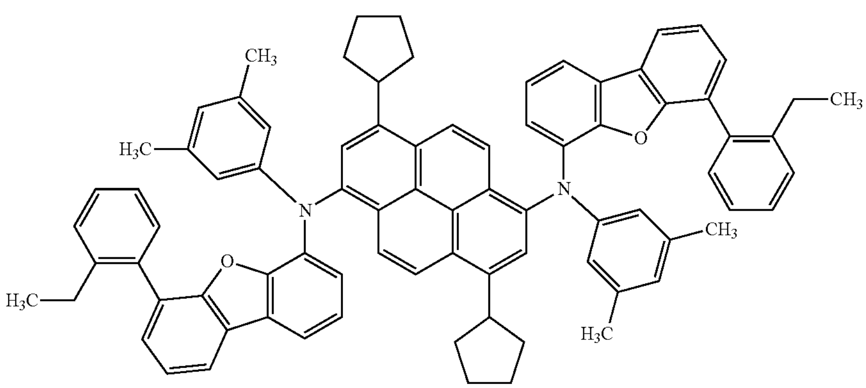
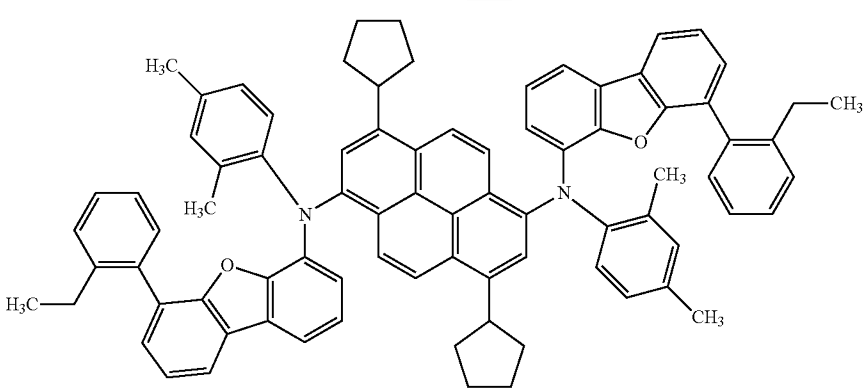

-continued
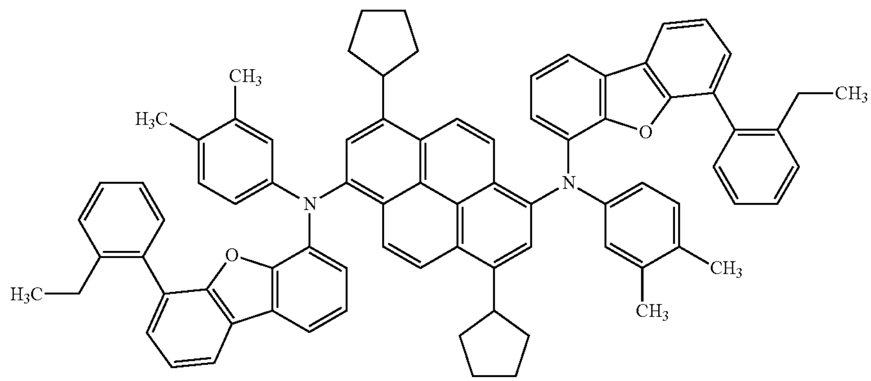
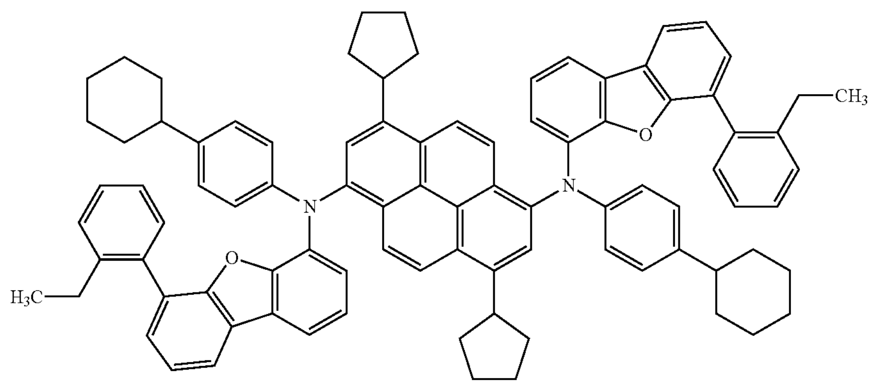
[Chem. 113]
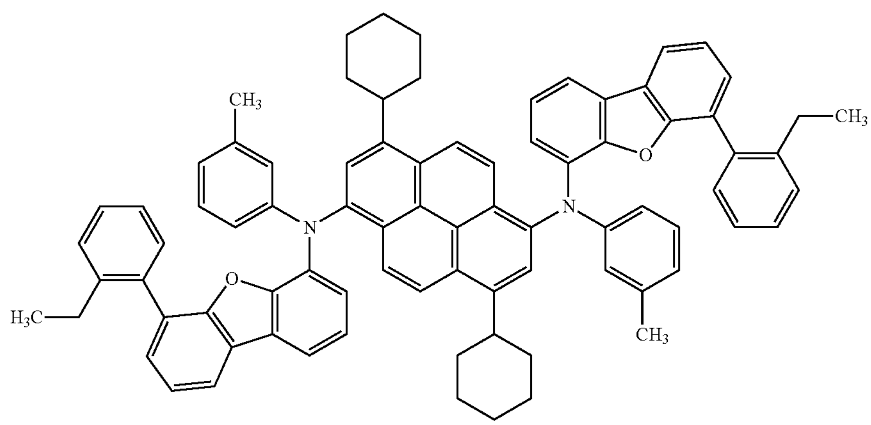
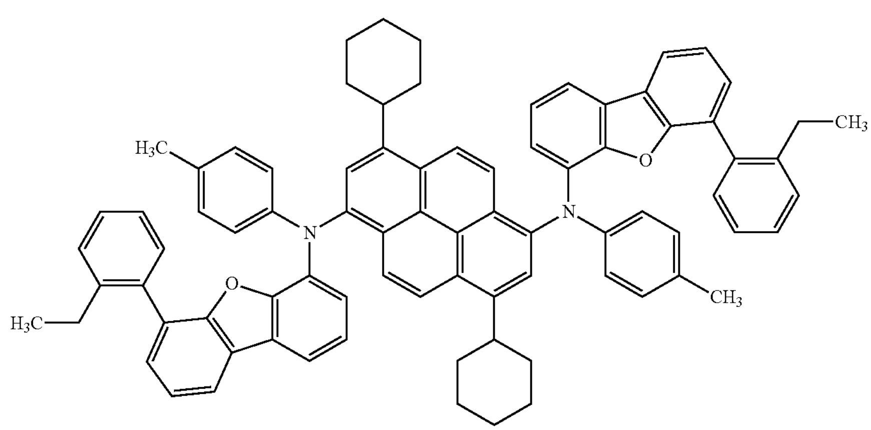

-continued
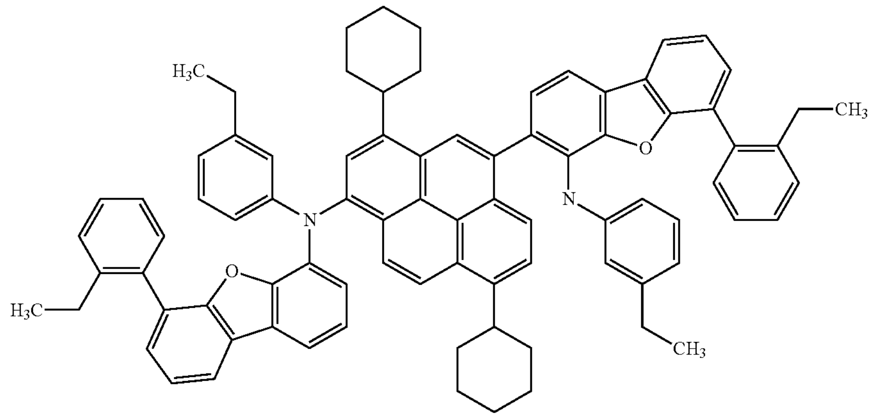
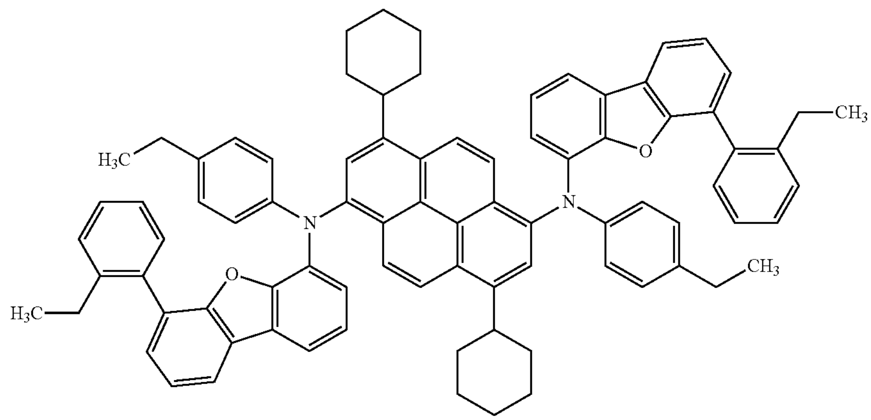
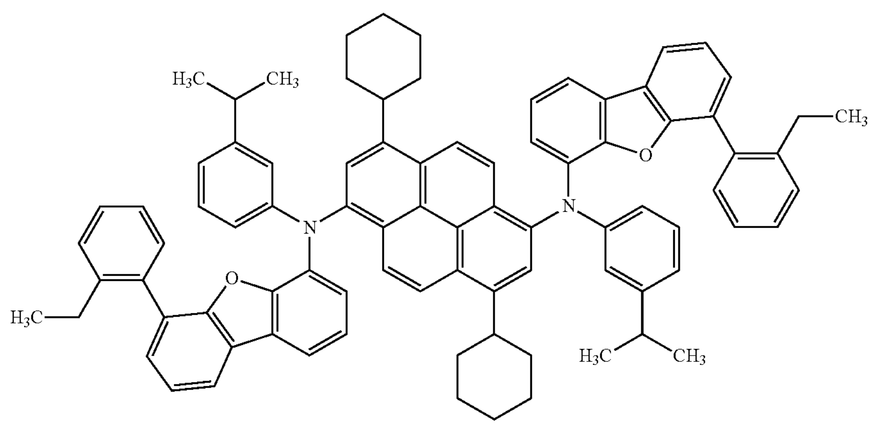
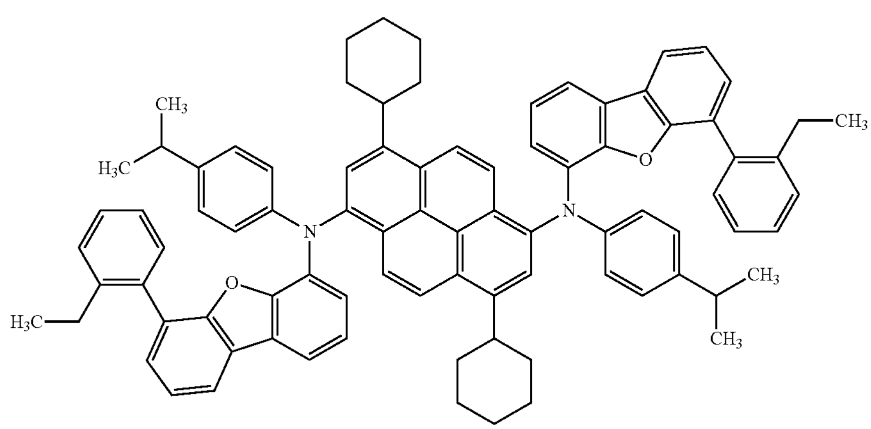

-continued
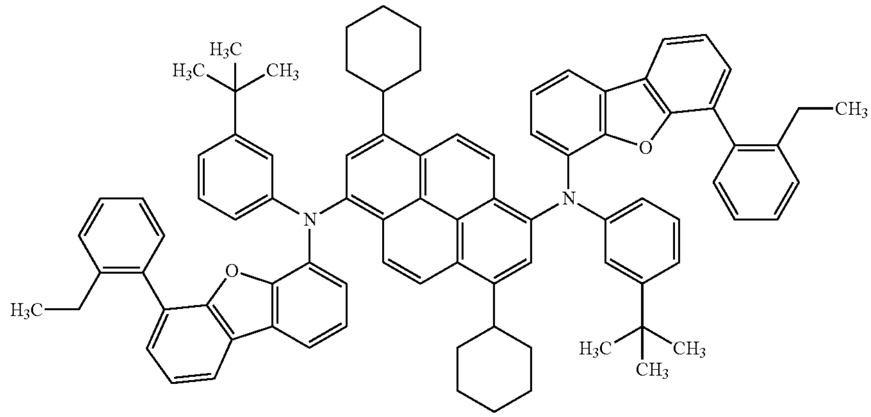
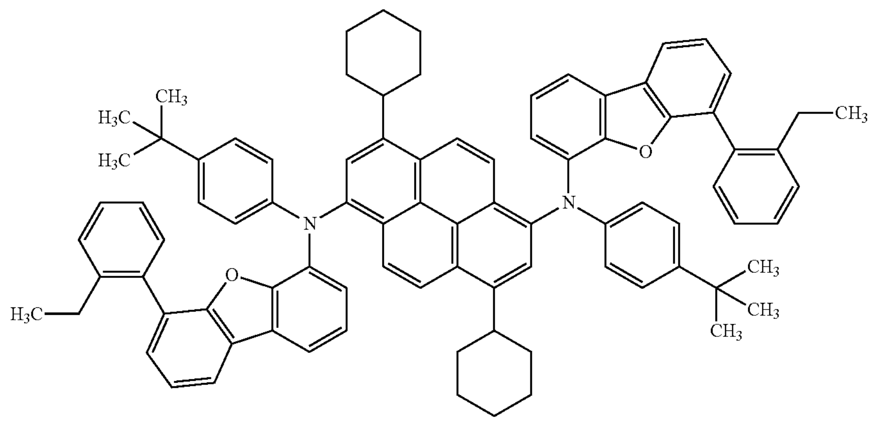
[Chem. 114]
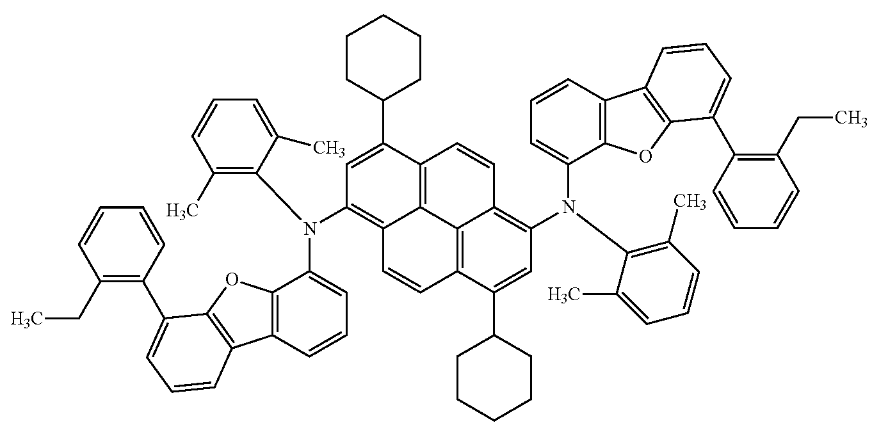
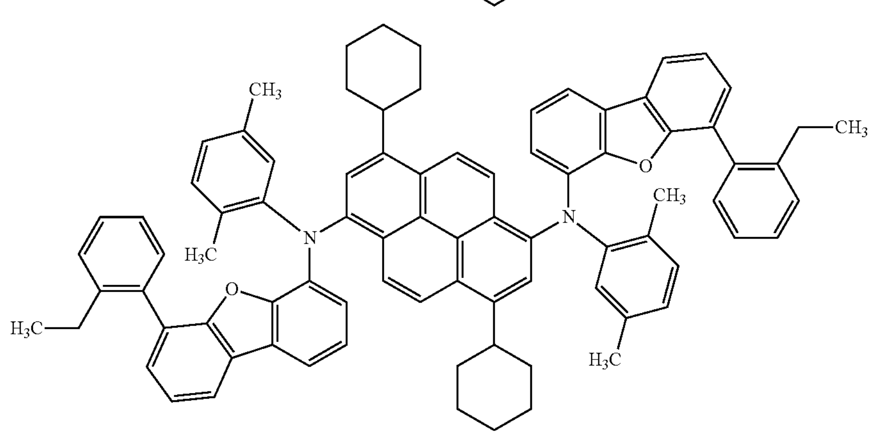

-continued
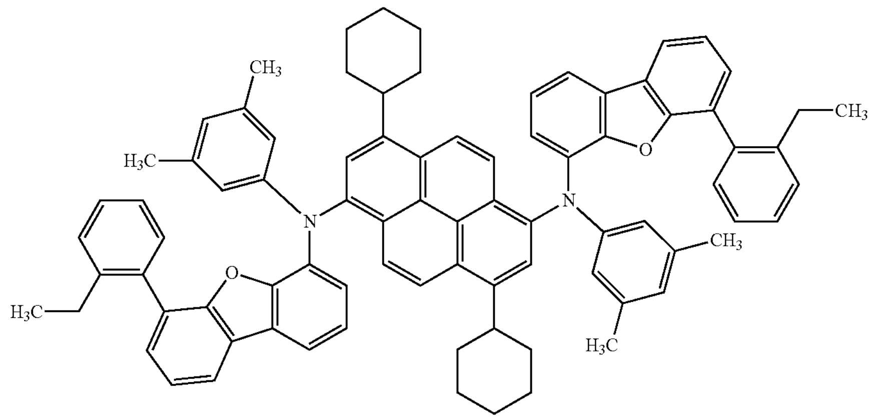
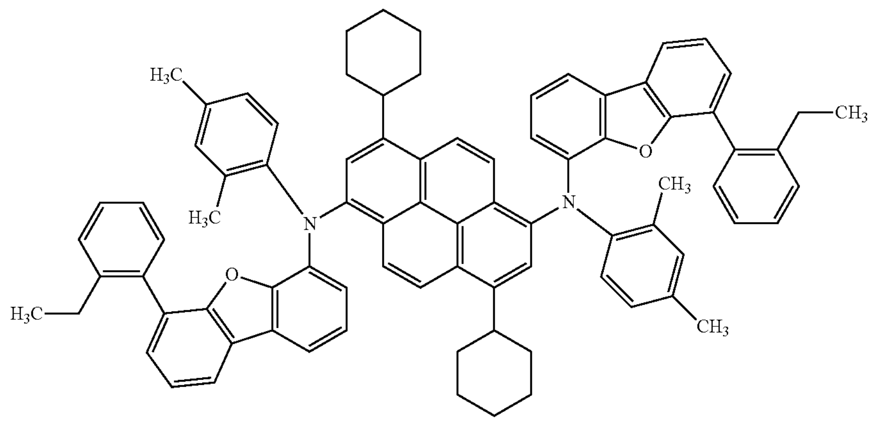
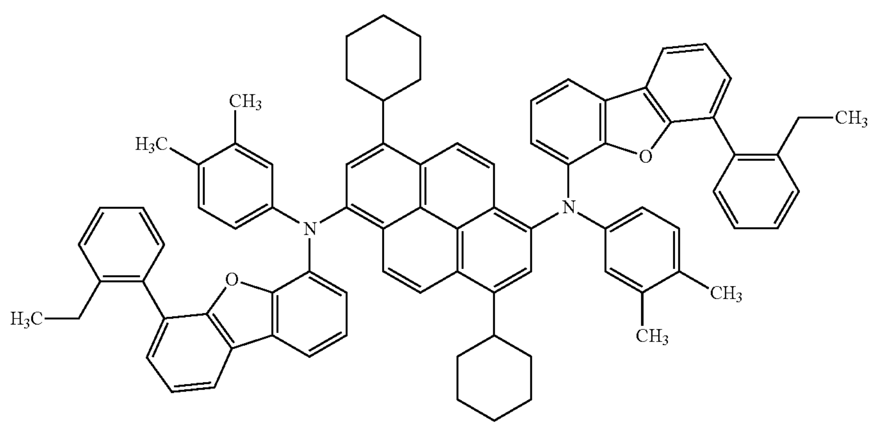
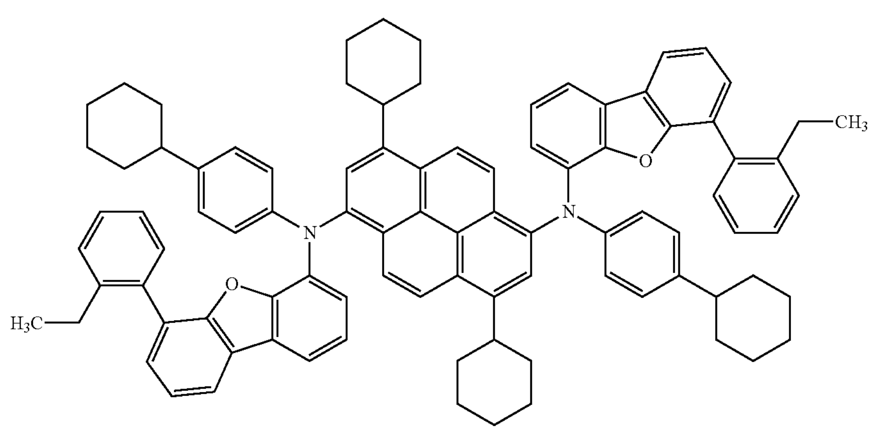

-continued
[Chem. 115]
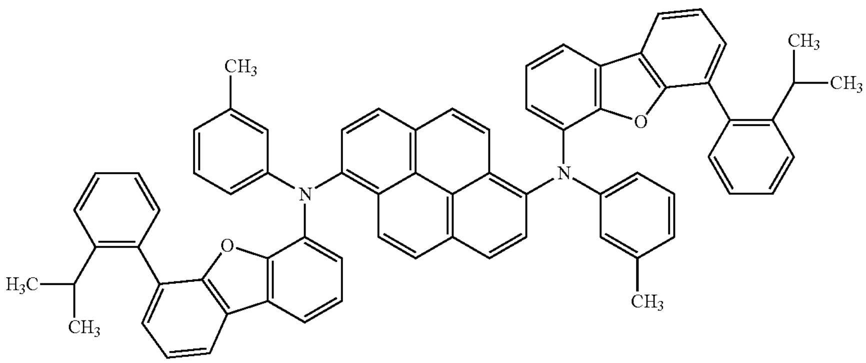
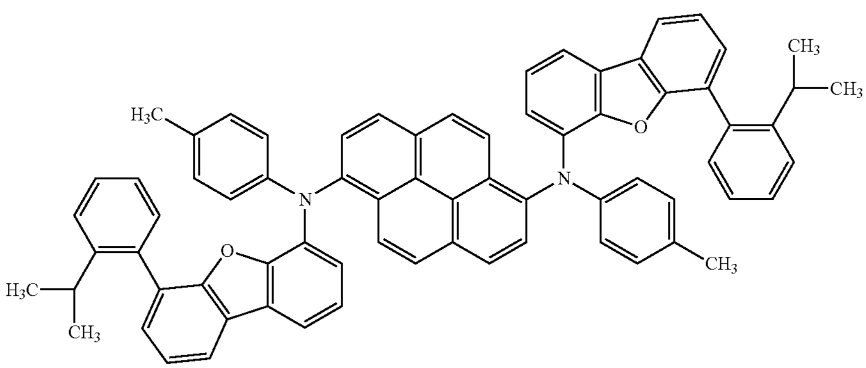
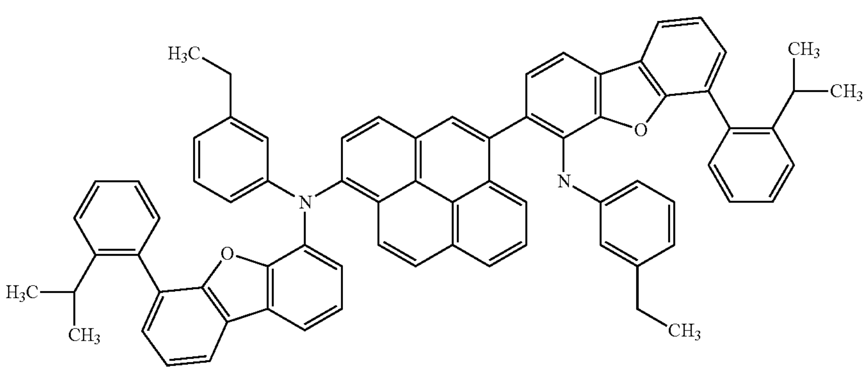
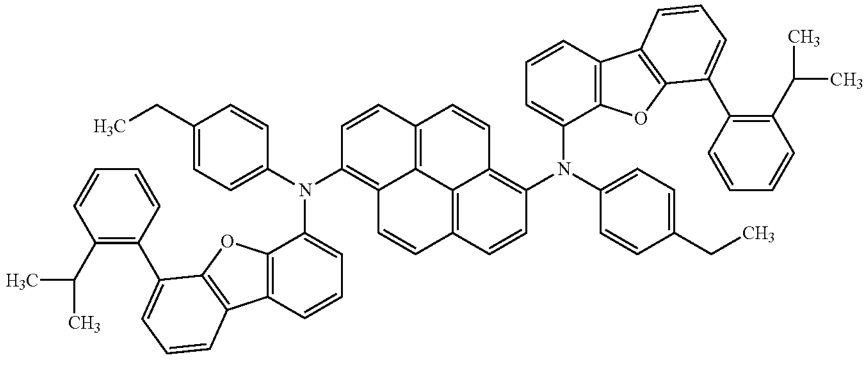

-continued
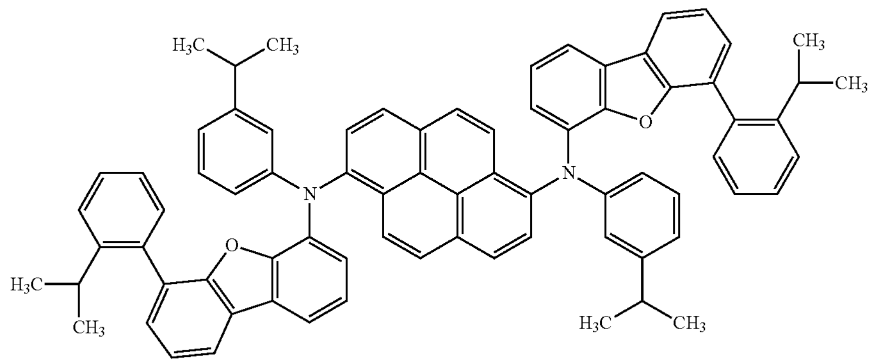
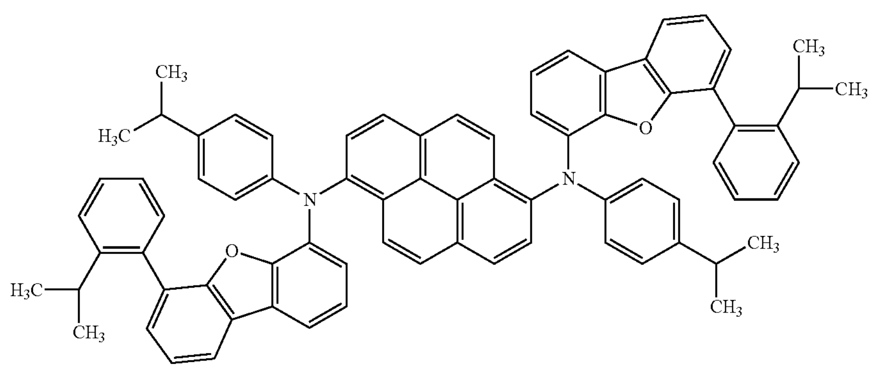
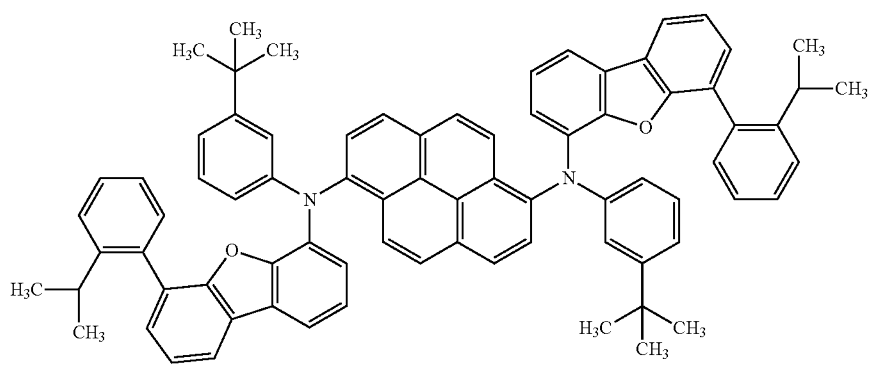
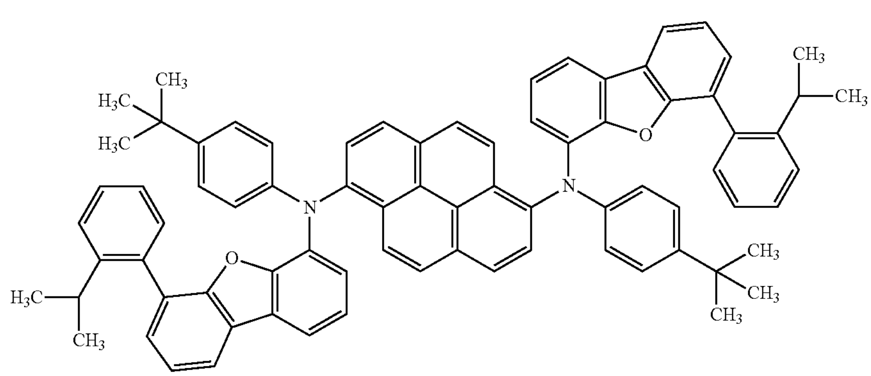

-continued
[Chem. 116]
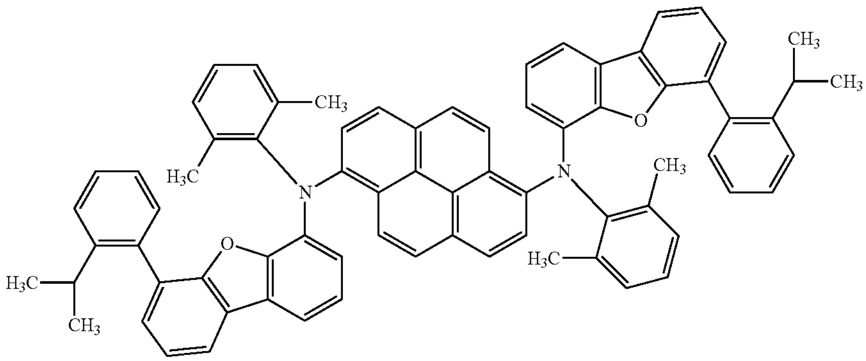
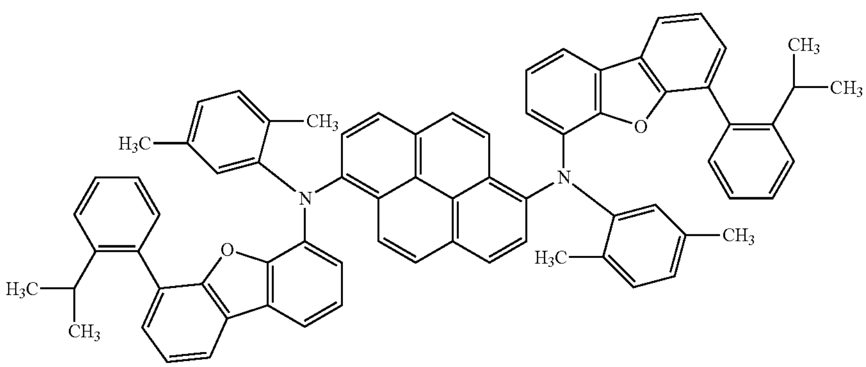
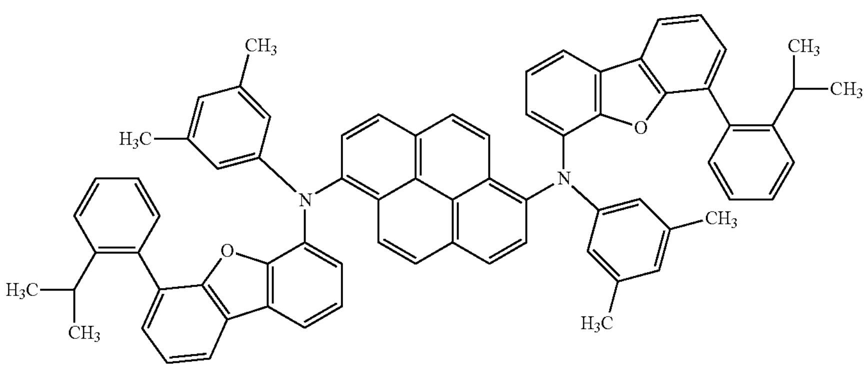
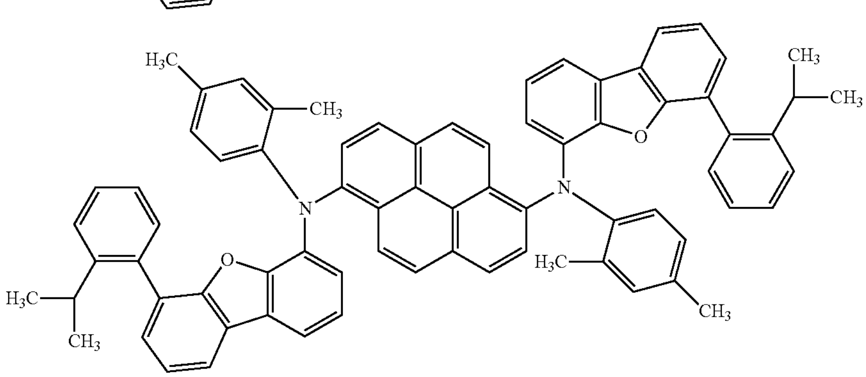

-continued
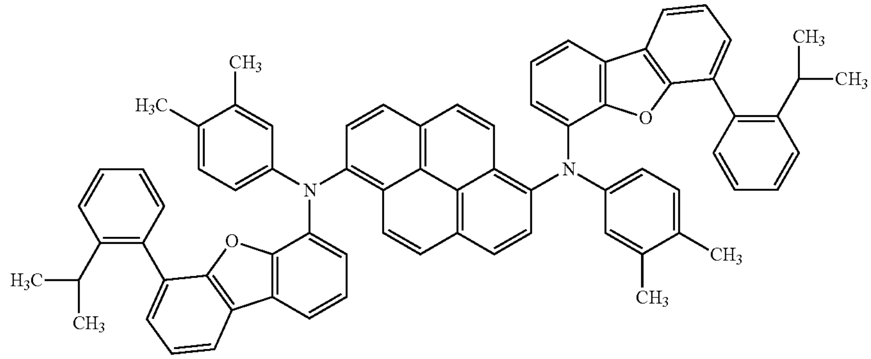
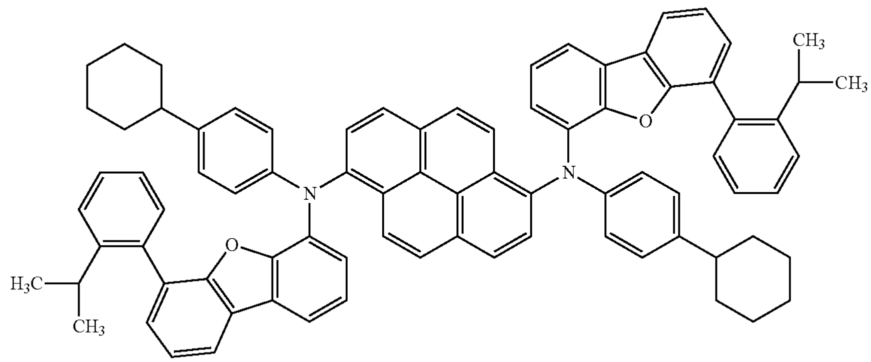
[Chem. 117]
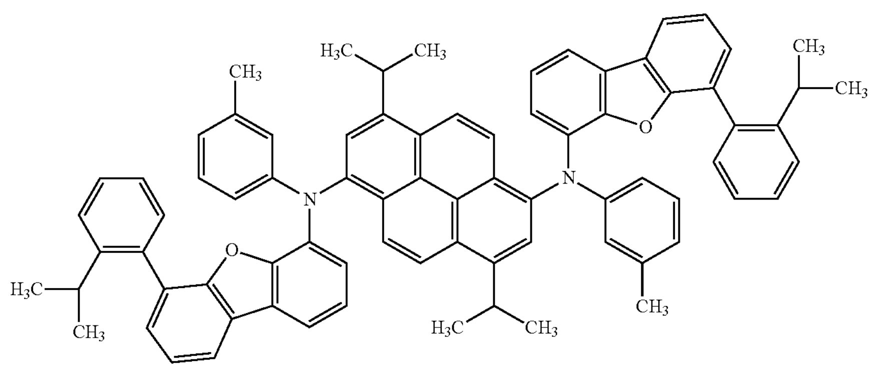
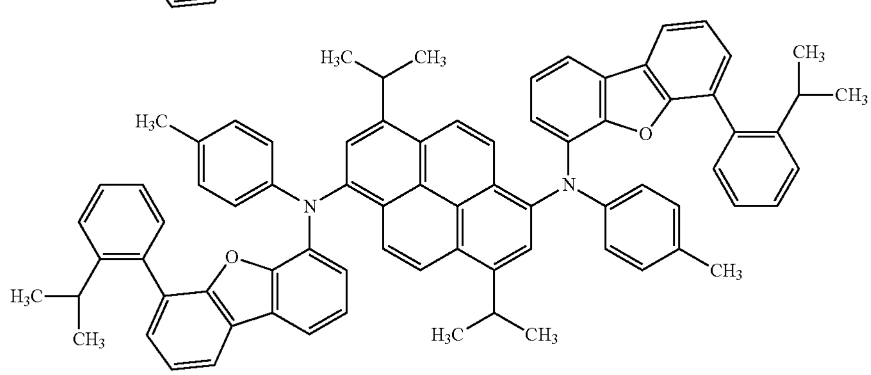

-continued
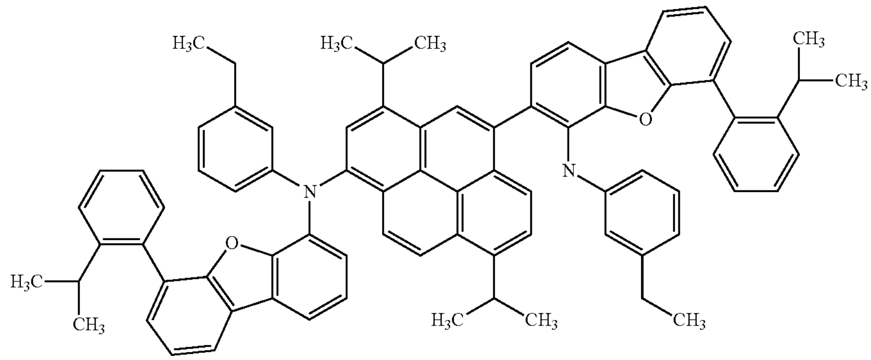
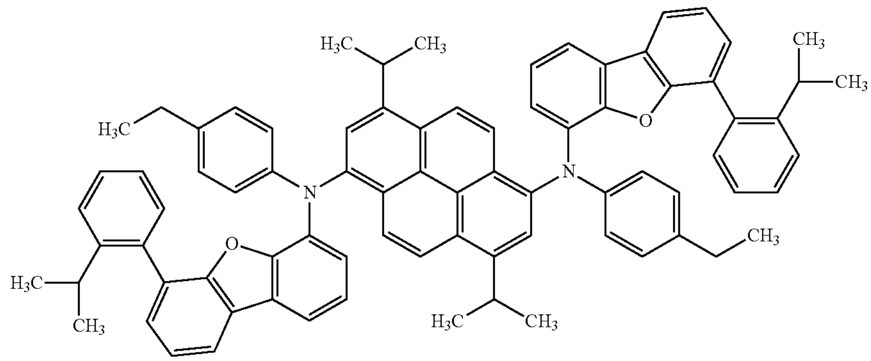
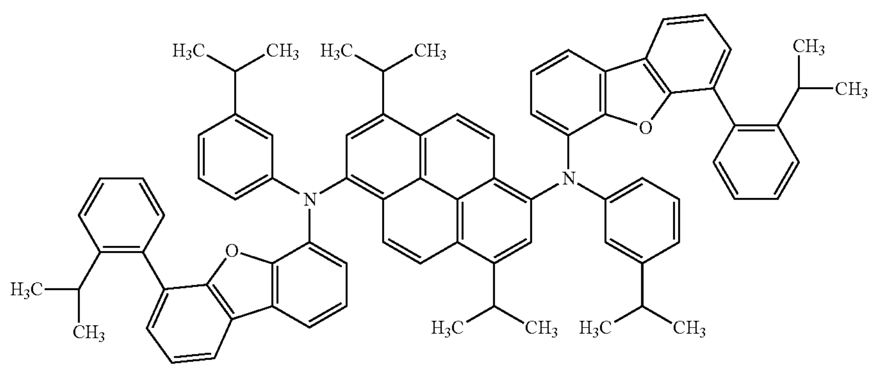
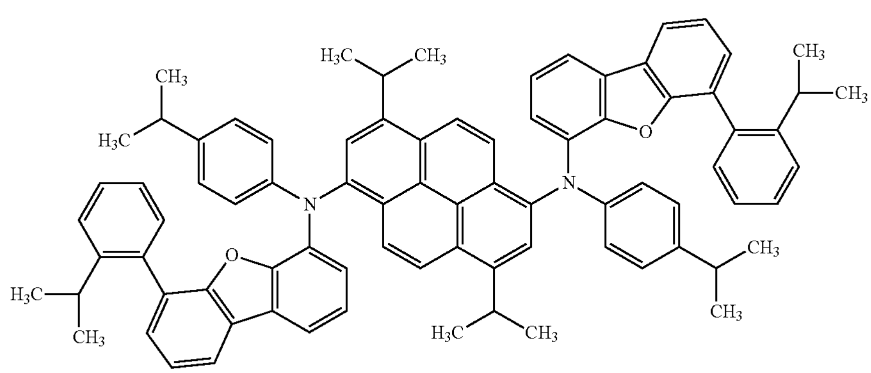

-continued
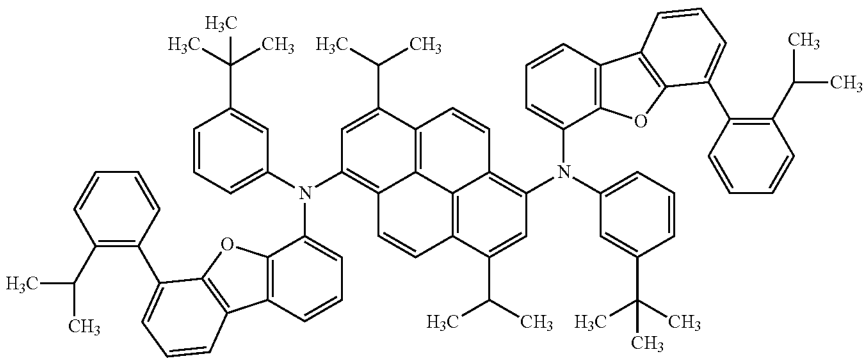
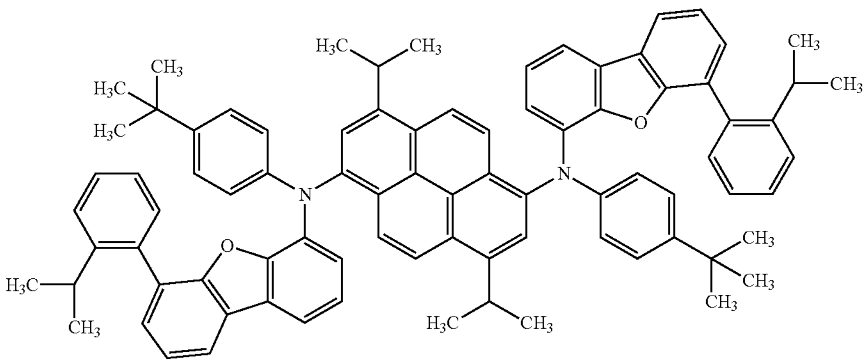
[Chem. 118]
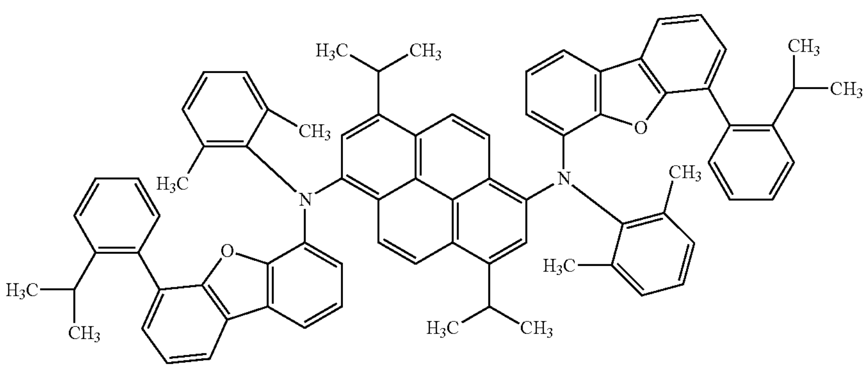
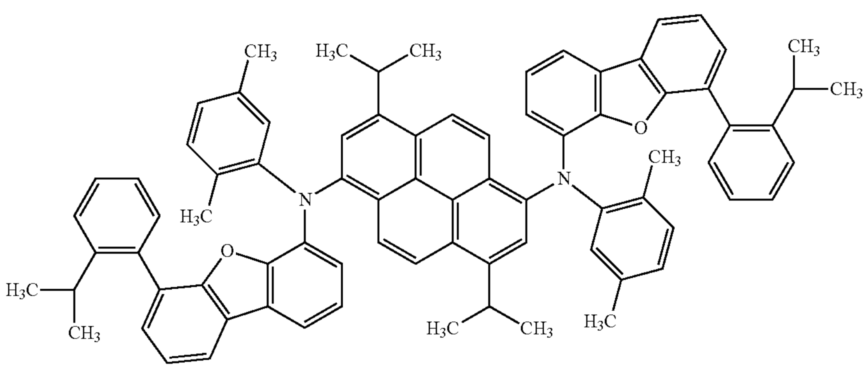

-continued
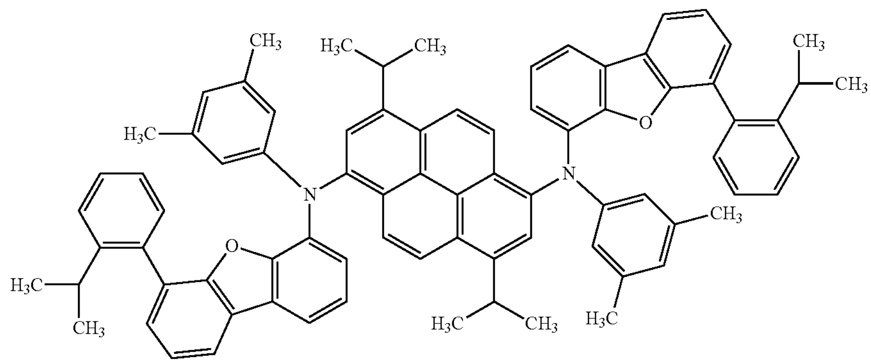
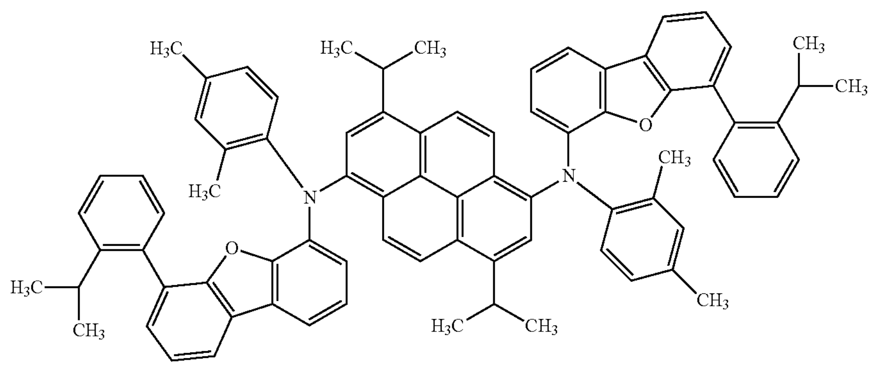
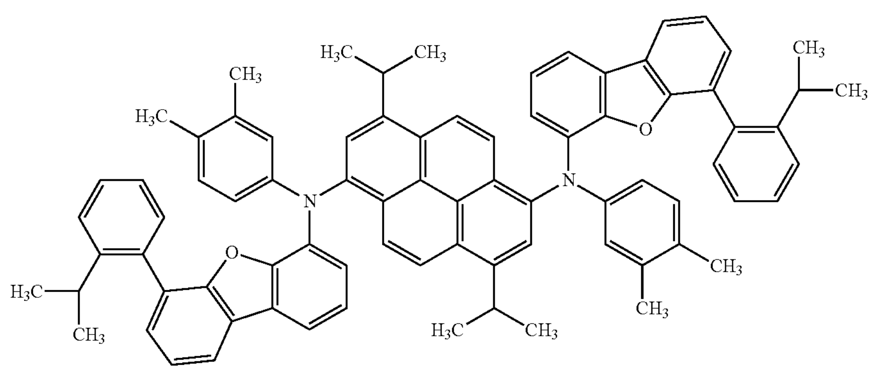
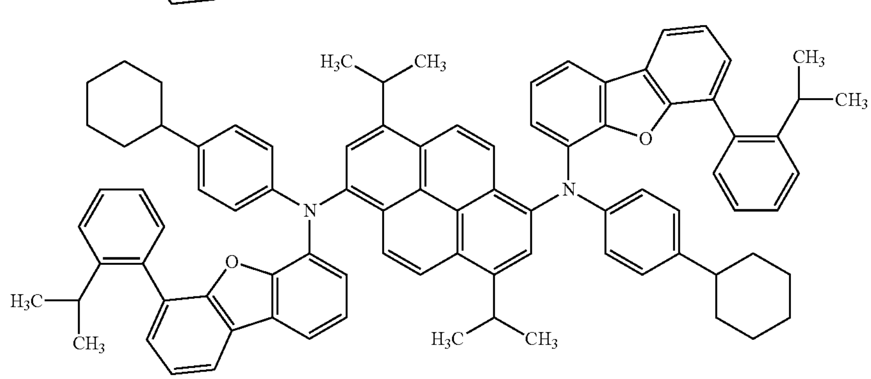

-continued
[Chem. 119]
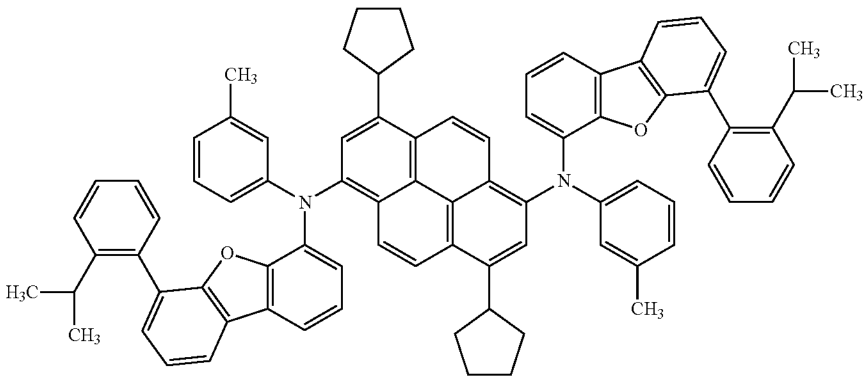
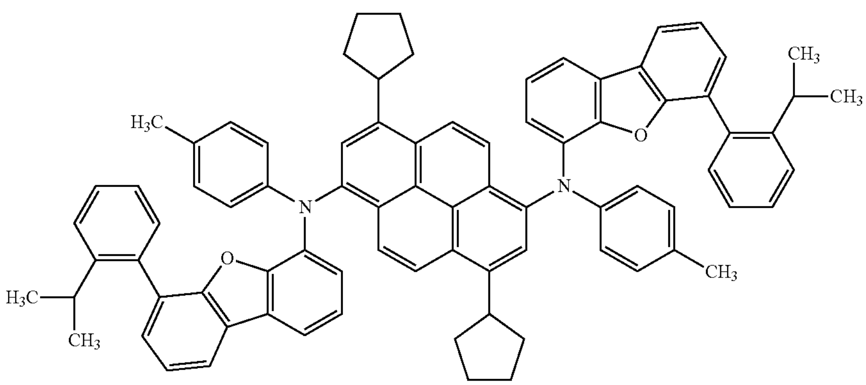
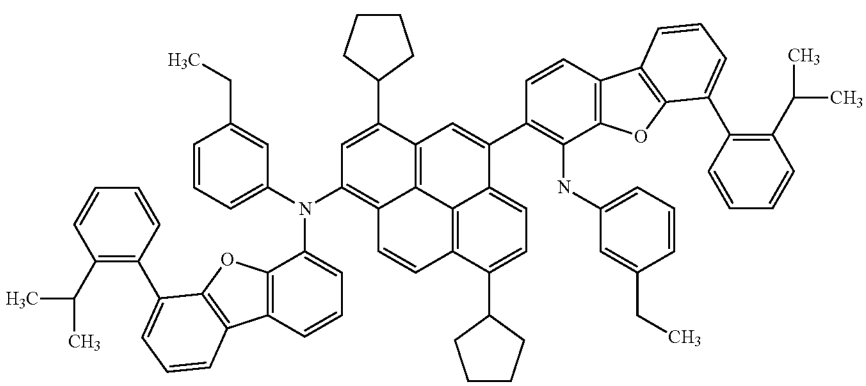
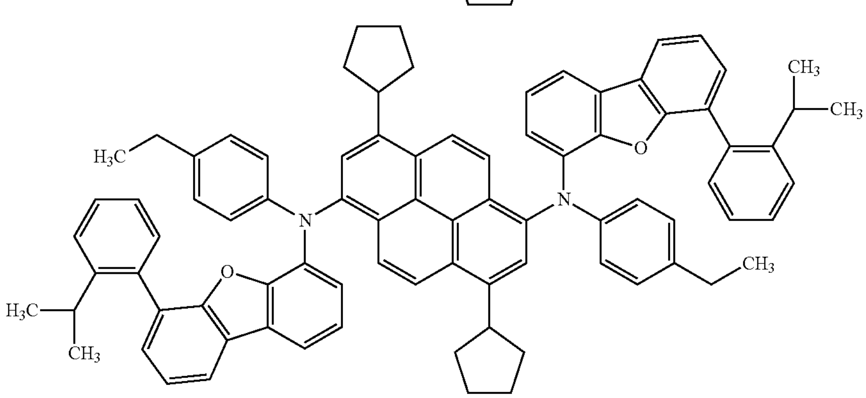

-continued
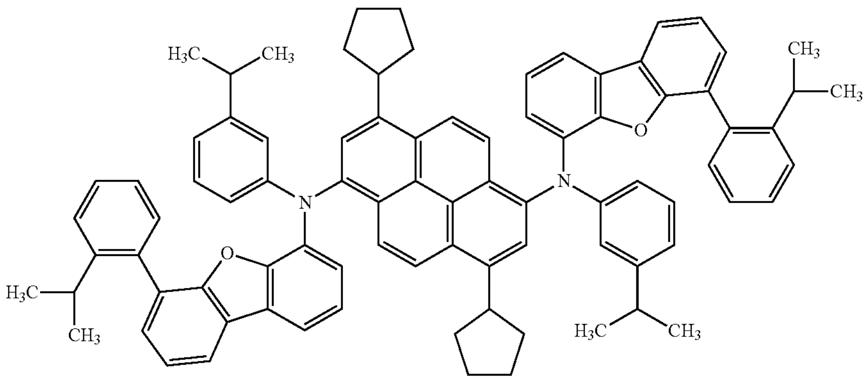
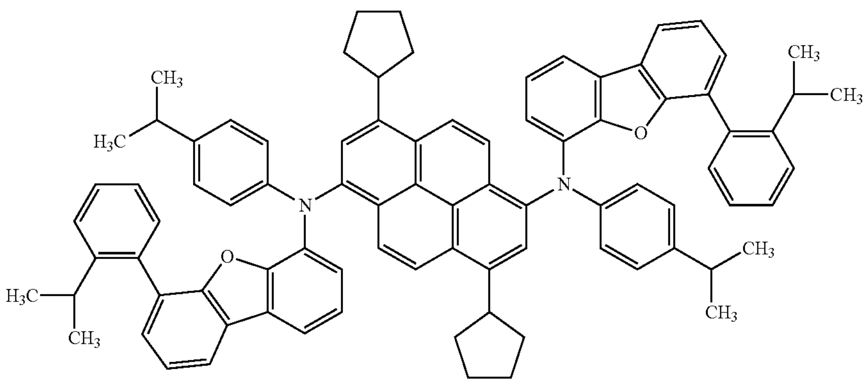
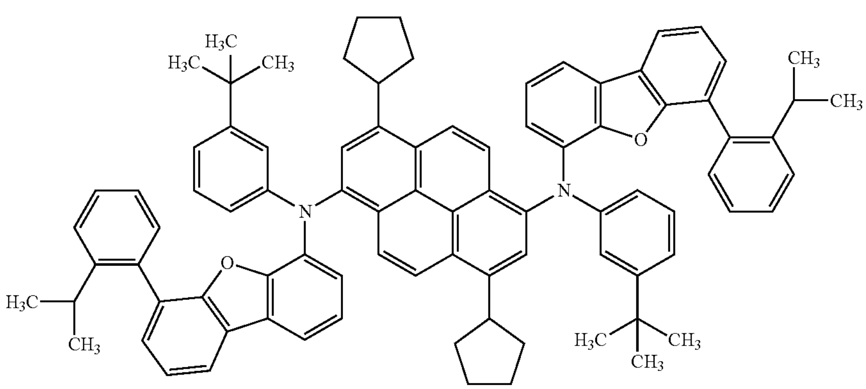
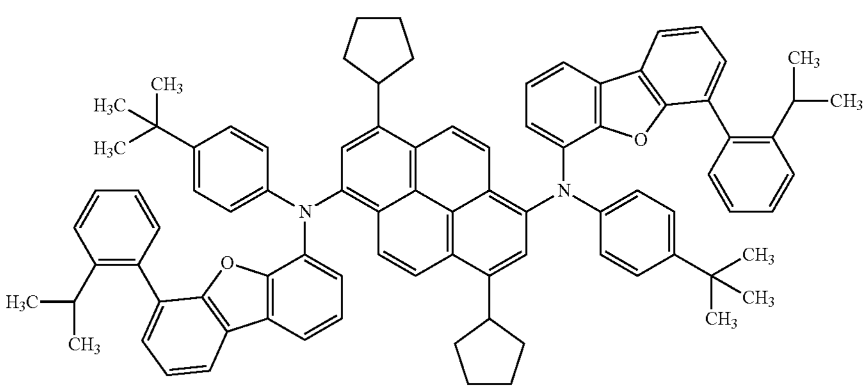

-continued
[Chem. 120]
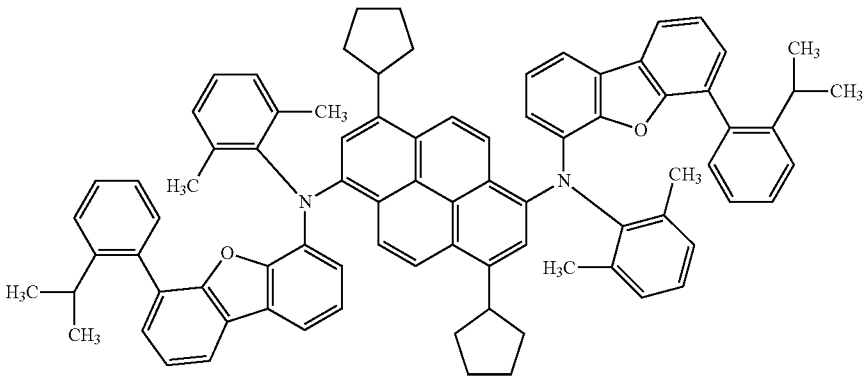
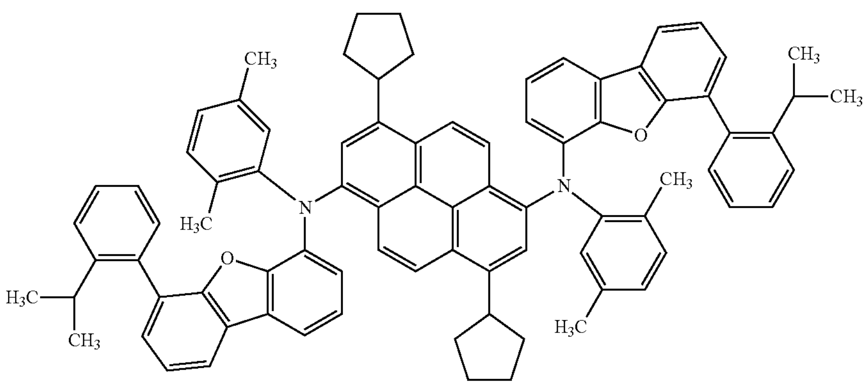
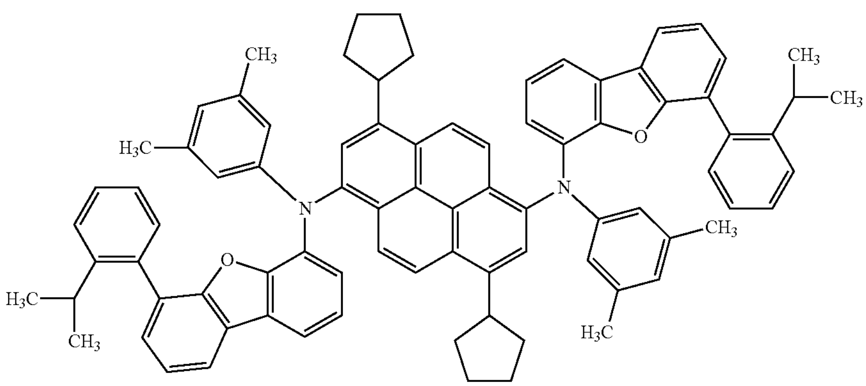
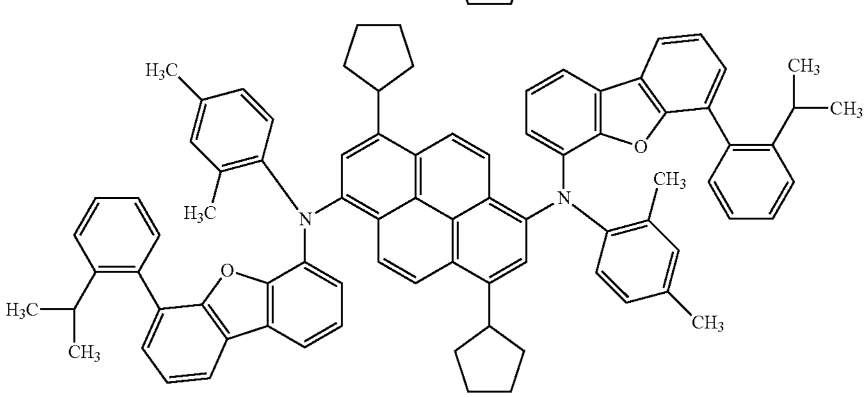

-continued
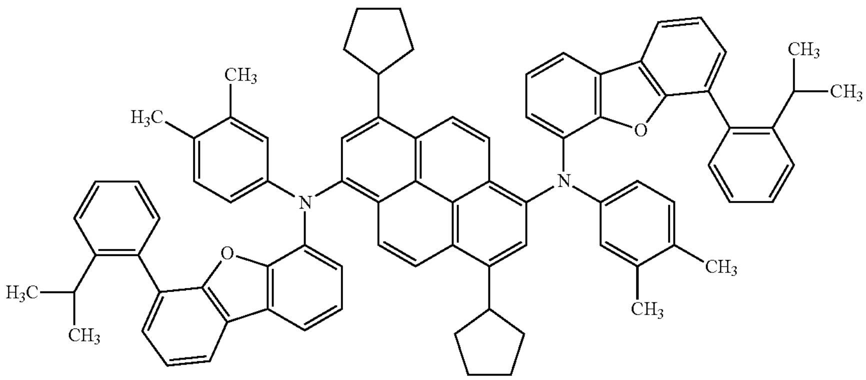
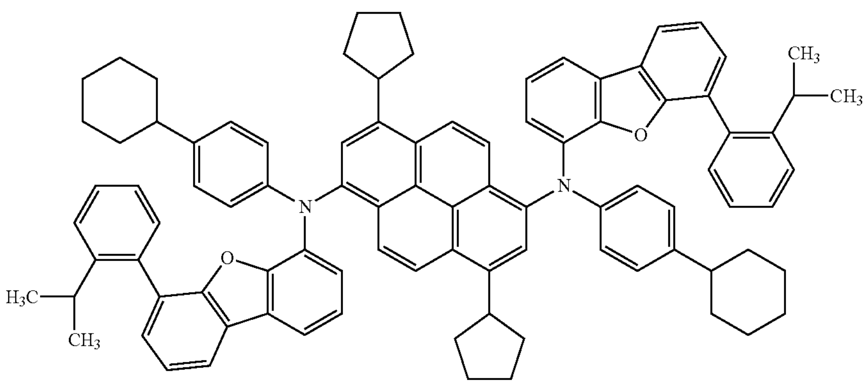
[Chem. 121]
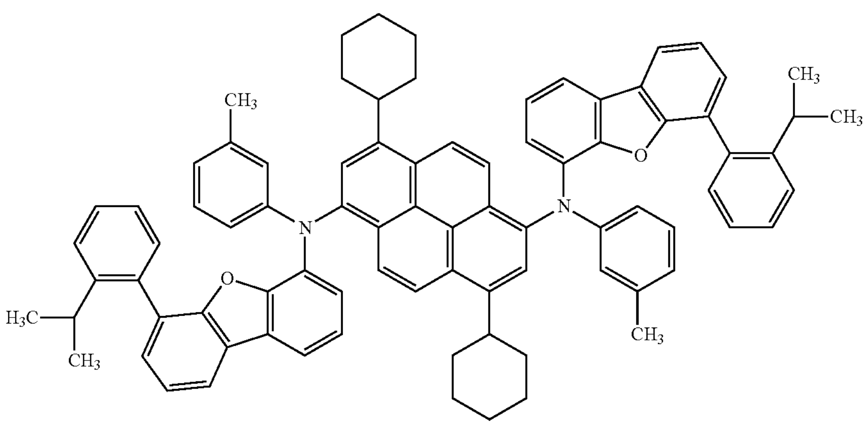
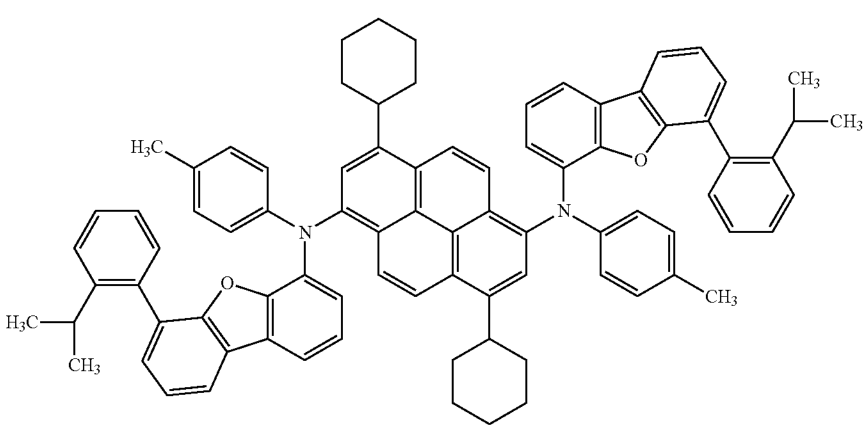

-continued
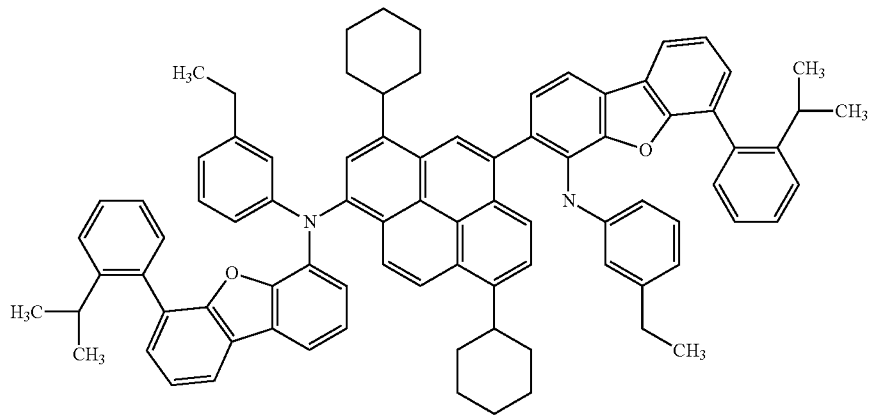
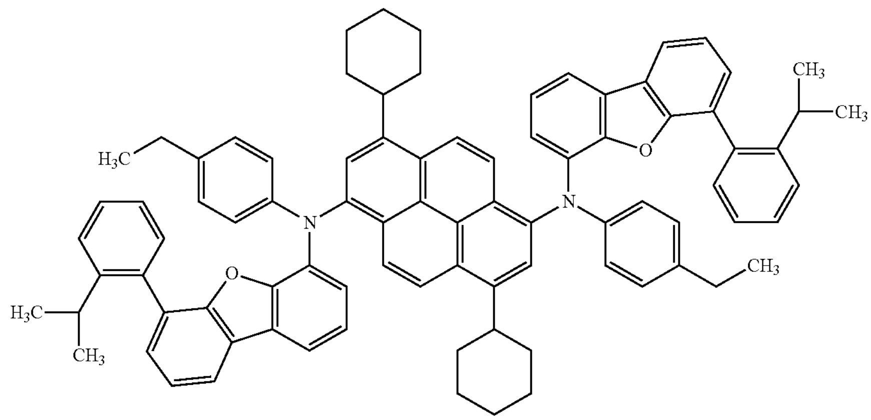
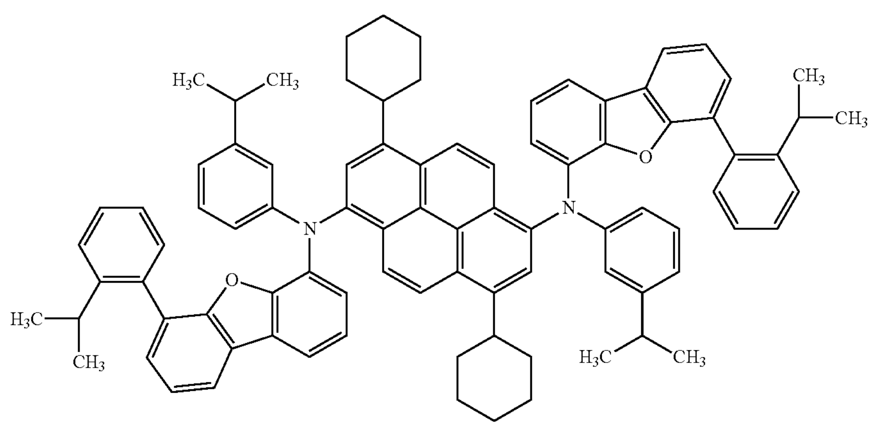
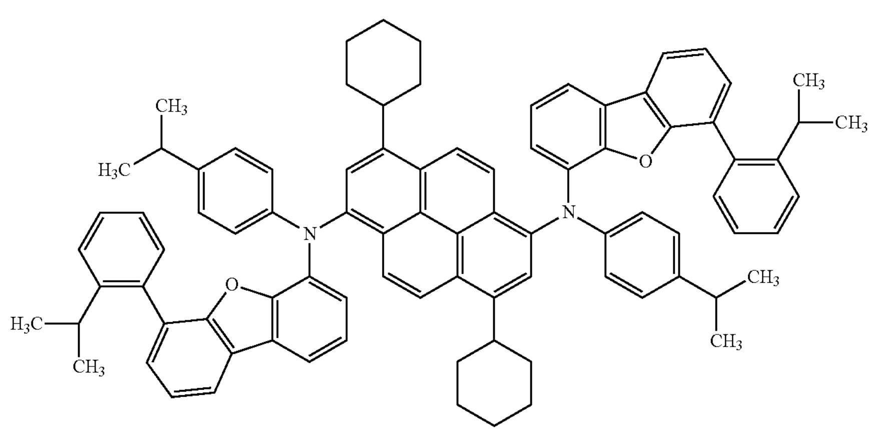

-continued
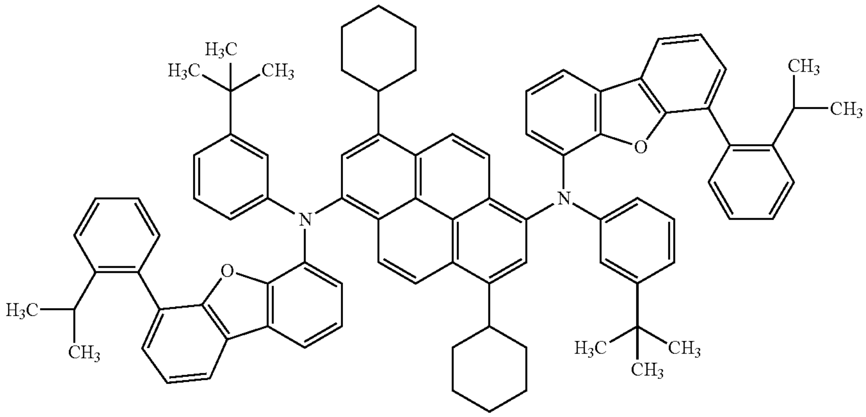
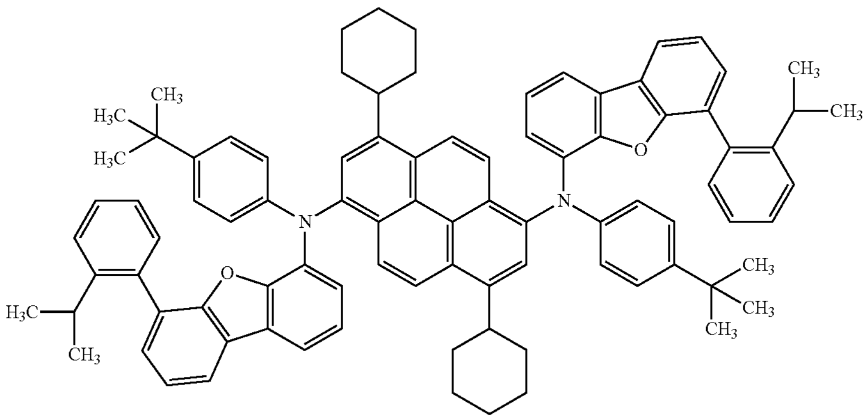
[Chem. 122]
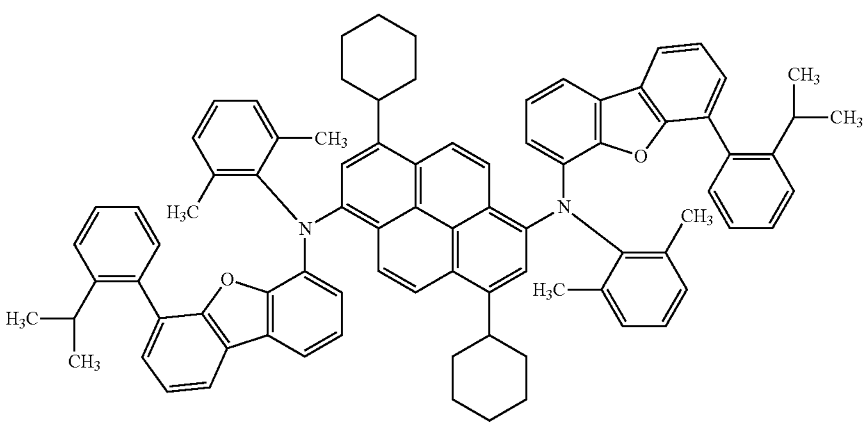
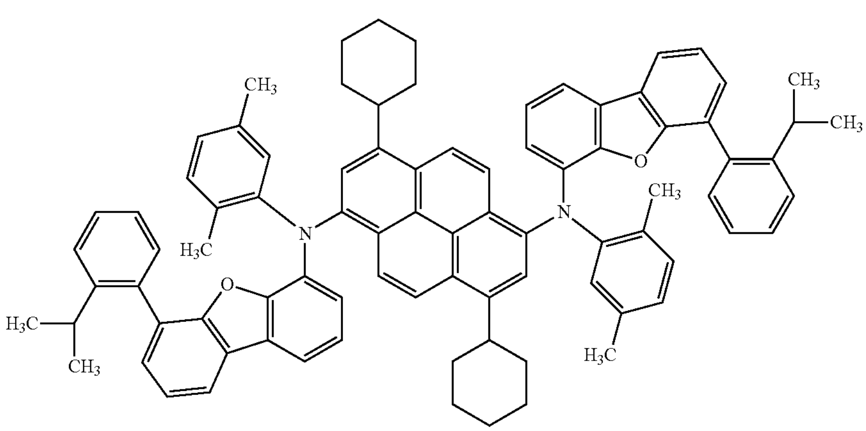

-continued
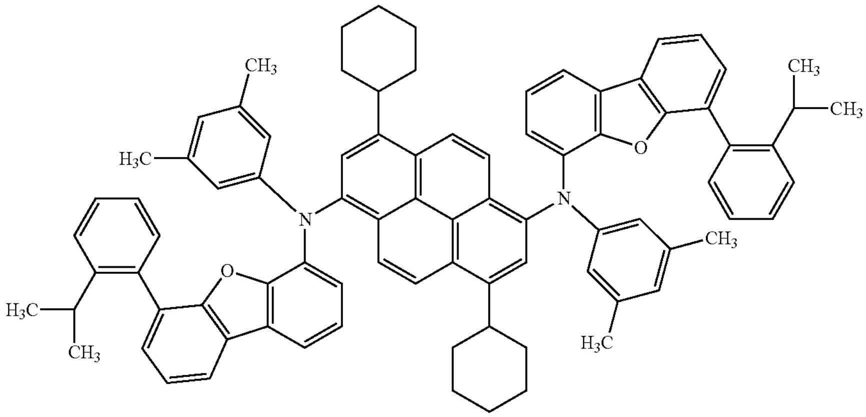
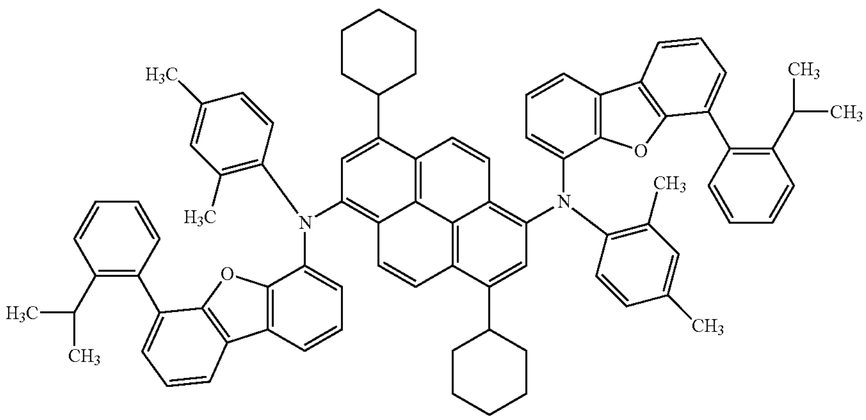
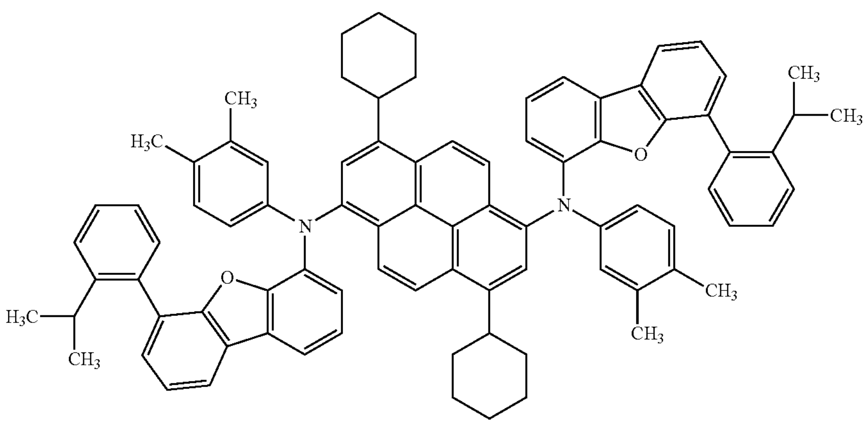
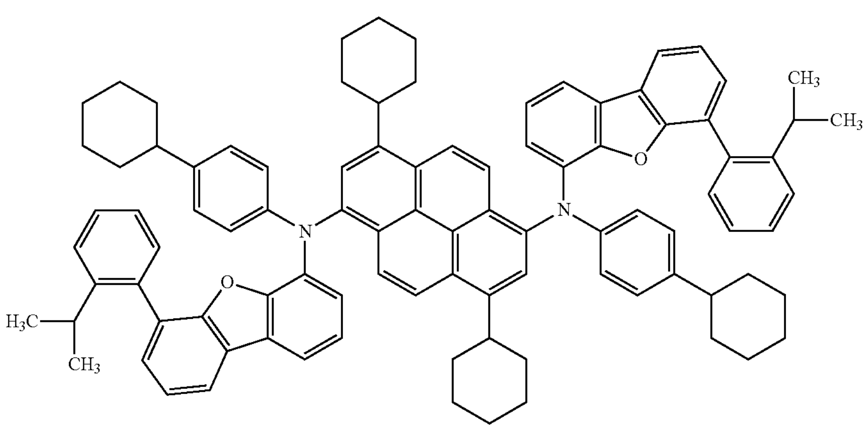

-continued
[Chem. 123]
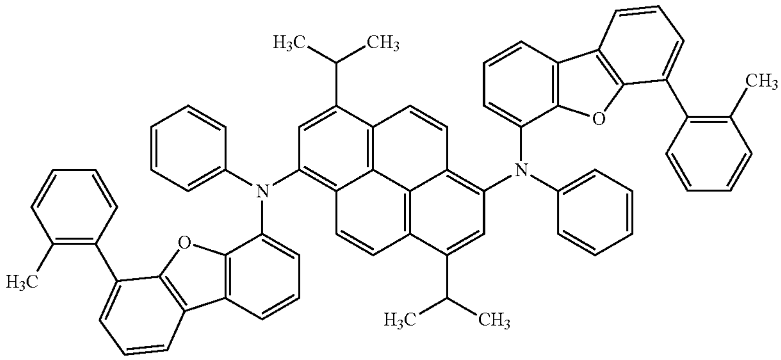
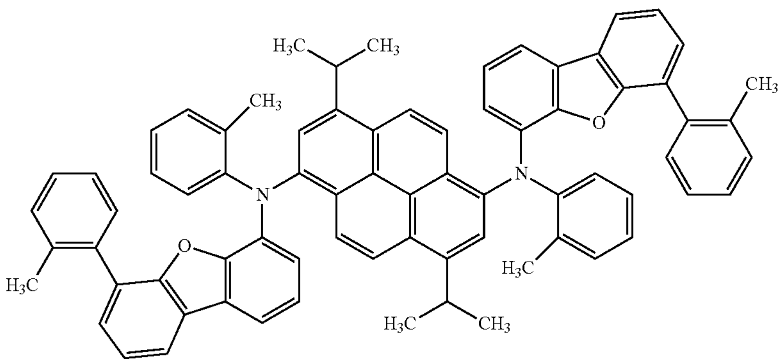
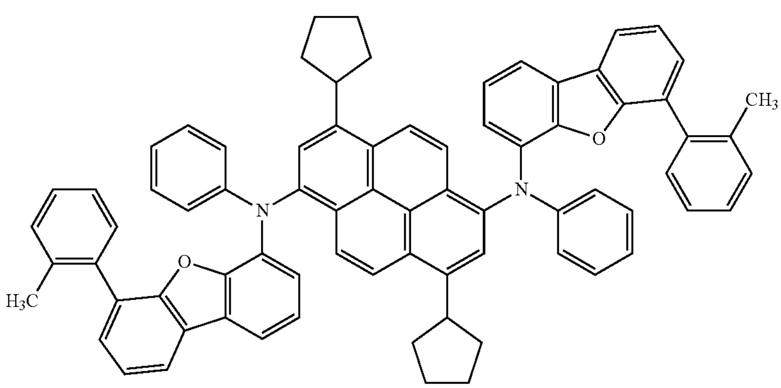
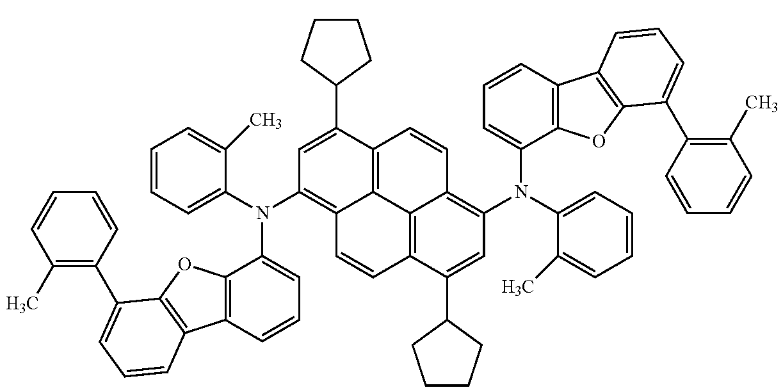

-continued
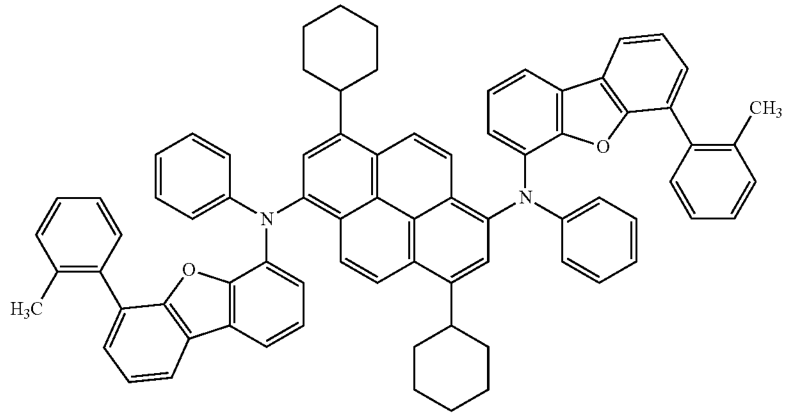
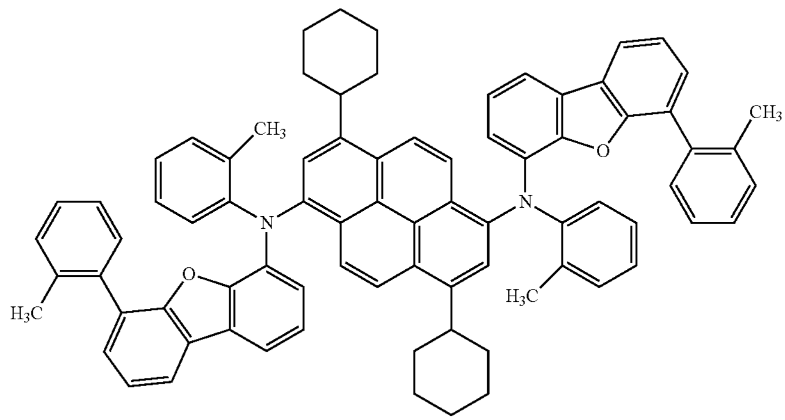
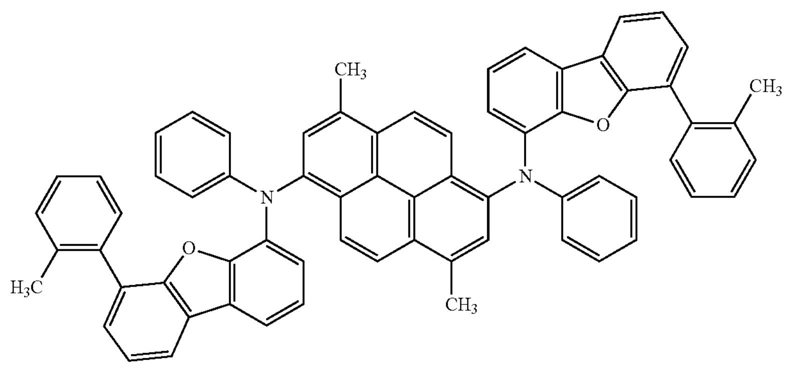
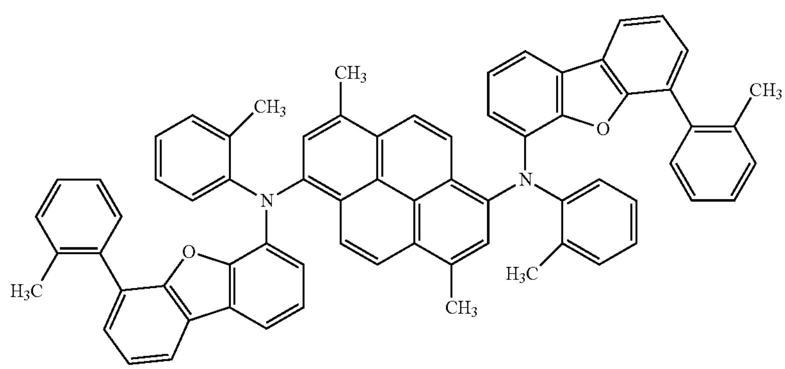 [SMILES: Cc1ccccc1-c1cccc2c1oc1c(N(c3ccccc3C)c3cc(C)c4ccc5c(N(c6ccccc6C)c6cccc7c6oc6c(-c8ccccc8C)cccc67)cc(C)c6ccc3c4c65)cccc12]

[Component (C): Solvent]

The solvent as the component (C) is represented by the following formula (C1), and has a boiling point of 110° C. or higher, and a solubility of 1 wt % or less in water.

[Chem. 124]

(C1)

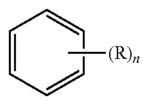

In the formula (C1), R is a substituent group, and n is an integer of 1 to 6 both inclusive. When n is 2 or more, a plurality of R's are the same as or different from one another.

In the formula (C1), non-limiting examples of R (substituent group) may include an alkyl group including 1 to 20 carbon atoms, a cycloalkyl group including 3 to 10 ring-forming carbon atoms, an ether bond-containing group, a carbonyl bond-containing group, and an ester bond-containing group.

Preferably, n may be an integer of 1 to 3 both inclusive.

These substituent groups may be further substituted with an alkyl group, a cycloalkyl group, an aryl group, or any other group. Moreover, two or more of these substituent groups are optionally bonded to form a ring.

Specific examples of respective groups in the foregoing formula (C1) are as follows.

Non-limiting examples of the alkyl group including 1 to 20 carbon atoms may include a methyl group, an ethyl group, a propyl group, an isopropyl group, an n-butyl group, an s-butyl group, an isobutyl group, a t-butyl group, an n-pentyl group, an n-hexyl group, an n-heptyl group, and an n-octyl group.

Non-limiting examples of the cycloalkyl group including 3 to 10 ring-forming carbon atoms may include a cyclopropyl group, a cyclobutyl group, a cyclopentyl group, a cyclohexyl group, a 4-methylcyclohexyl group, an adamantyl group, and a norbornyl group.

Non-limiting examples of the ether bond-containing group may include a methoxy group, an ethoxy group, a propoxyl group, and a phenoxy group.

Non-limiting examples of the carbonyl bond-containing group may include a benzoyl group.

Non-limiting examples of the ester bond-containing group may include a methylester group, an ethylester group, and a propylester group.

The boiling point of the solvent is 110° C. or higher, and may be preferably 120° C. or higher.

The solvent may preferably have a boiling point of 110° C. or higher, which makes it possible to remove moisture.

Moreover, the solubility of the solvent in water is 1 wt % or less, and may be preferably 0.5 wt % or less.

Since moisture may cause considerable performance degradation in the organic EL element, a solvent having low solubility in water may be desirable.

The boiling point and solubility in water are described in a home page of Japan Advanced Information Center of Safety and Health or a home page of United States Department of Health and Human Services (HSDS (Hazard Substances Data Base)).

Specific examples of the solvent as the component (C) may include toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, phenyl acetate, phenyl propionate, methyl benzoate, and ethyl benzoate.

One kind or two or more kinds of solvents of the component (C) may be used. Moreover, the ink composition may include a solvent other than the component (C).

In the ink composition according to the embodiment of the present technology, the content of the anthracene derivative as the component (A) may be preferably 0.5 wt % or more, and more preferably 1 wt % or more.

In general, a film thickness of a light-emitting layer of the organic EL element is from 10 nm to 100 nm, but is typically 50 nm in many cases. The light-emitting layer having a film thickness of 50 nm or more makes it possible to stabilize light emission performance and color tones.

In a case in which the foregoing ink composition is used for the organic EL element, in order to easily form a film having a film thickness of 50 nm or more, a solution concentration of 0.5 wt % or more may be preferable. In a case with a solution concentration of 0.5 wt % or more, it is possible to form a film without difficulty.

Moreover, the content of the aromatic amine derivative as the component (B) may be preferably 0.001 wt % or more, and particularly preferably 0.01 wt %.

Further, the ink composition according to the embodiment of the present technology may further include a known additive as necessary, in addition to the foregoing components (A) to (C). For an improvement in film productivity, prevention of a pinhole in a film, and any other purpose, if desired, a resin, various kinds of additives, and any other materials may be appropriately blended as additive materials without undermining the purposes of the present technology. Non-limiting examples of usable resins may include insulating resins such as polystyrene, polycarbonate, polyarylate, polyester, polyamide, polyurethane, polysulfone, polymethylmethacrylate, polymethylacrylate, and cellulose, and copolymers thereof, photoconductive resins such as poly-N-vinylcarbazole and polysilane, and conductive resins such as polythiophene and polypyrrole. Moreover, non-limiting examples of various kinds of additives may include an antioxidant, an ultraviolet absorber, and a plasticizer.

For example, 90 wt % or more, 95 wt % or more, 98 wt % or more, or 100 wt % of the ink composition according to the embodiment of the present technology may be made of the components (A) to (C).

A film of the ink composition according to the embodiment of the present technology may be formed by a known wet method such as a coating method, an ink-jet method, a spraying method, a spinner method, an immersion coating method, a screen printing method, a roll coater method, and an LB method, for example.

The ink composition according to the embodiment of the present technology is suitable for formation of an organic thin film of the organic EL element.

Next, description is given of an organic EL element according to an embodiment of the present technology.

The organic EL element according to the embodiment of the present technology includes one or more organic thin film layers that include at least a light-emitting layer and are interposed between a cathode and an anode, and the light-emitting layer is formed with use of the foregoing ink composition.

FIG. 1 is a cross-sectional view of the organic EL element according to the embodiment of the present technology.

The foregoing organic EL element includes a hole injection layer 22, a light-emitting layer 24, and an electron injection layer 26 that are interposed between a cathode 30 and an anode 10. The light-emitting layer 24 is formed with use of the foregoing ink composition.

It is to be noted that typical element configurations of the organic EL element may include, but not limited to, the following configurations.

(1) Anode/light-emitting layer/cathode (2) Anode/hole injection layer/light-emitting layer/cathode (3) Anode/light-emitting layer/electron injection layer/cathode (4) Anode/hole injection layer/light-emitting layer/electron injection layer/cathode (FIG. 1)

(5) Anode/hole injection layer/hole transport layer/light-emitting layer/electron injection layer/cathode (6) Anode/hole injection layer/light-emitting layer/hole barrier layer/electron injection layer/cathode (7) Anode/hole injection layer/hole transport layer/light-emitting layer/hole barrier layer/electron injection layer/cathode In general, the configuration (5) out of these configurations may be preferably used.

It is to be noted that in the foregoing element, one or more layers interposed between the anode and the cathode correspond to an organic thin film. All of these layers may not necessarily be made of an organic compound, and a layer made of an inorganic compound or a layer including an inorganic compound may be included.

The organic thin film formed with use of the foregoing ink composition may be used as any of the foregoing organic layers; however, the organic thin film may be preferably contained in a light emission region or a hole transporting region in these components.

The light-emitting layer has the following functions in combination:

(i) an injection function: a function of allowing for injection of holes from the anode or the hole injection layer and injection of electrons from the cathode or the electron injection layer upon application of an electric field, (ii) a transport function: a function of moving injected electric charges (electrons and holes) by force of the electric field, and (iii) a light emission function: a function of providing a site for recombination of electrons and holes to lead to light emission.

Note that electrons and holes may be different in ease of injection, and may be different in transport capability indicated by mobility of holes and electrons. The light-emitting layer may preferably move either holes or electrons.

For example, known methods such as an evaporation method, a spin coating method, and an LB method are applicable as a method of forming the light-emitting layer.

Moreover, it is possible to from the light-emitting layer by dissolving a binder such as a resin and a material compound in a solvent to prepare a solution, and forming a thin film with use of the solution by a spin coating method or any other method.

In the embodiment of the present technology, if desired, any other known luminescent material may be contained in the foregoing ink composition in the light-emitting layer without undermining the purposes of the present technology. Moreover, a light-emitting layer containing any other known luminescent material may be stacked on the light-emitting layer made of the foregoing composition. In this case, the light-emitting layer may be formed by a dry method such as a vacuum evaporation method.

[Substrate]

For example, a glass plate or a polymer plate may be used as a substrate.

Non-limiting specific examples of the glass plate may include soda-lime glass, barium-strontium-containing glass, lead glass, aluminosilicate glass, borosilicate glass, barium borosilicate glass, and quartz. Moreover, non-limiting examples of the polymer plate may include polycarbonate, acrylic, polyethylene terephthalate, polyethersulfone, and polysulfone.

[Anode]

The anode may be made of, for example, a conductive material, and a conductive material having a work function larger than 4 eV is suitable for the anode.

Non-limiting examples of the foregoing conductive material may include carbon, aluminum, vanadium, iron, cobalt, nickel, tungsten, silver, gold, platinum, palladium, and alloys thereof, metal oxides such as tin oxide and indium oxide used for an ITO substrate and a NESA substrate, and organic conductive resins such as polythiophene and polypyrrole.

The anode may be formed with a layered configuration of two or more layers, as necessary.

[Cathode]

The cathode may be made of, for example, a conductive material, and a conductive material having a work function smaller than 4 eV is suitable for the cathode.

Non-limiting examples of the foregoing conductive material may include magnesium, calcium, tin, lead, titanium, yttrium, lithium, ruthenium, manganese, aluminum, lithium fluoride, and alloys thereof.

Moreover, non-limiting typical examples of the foregoing alloys may include magnesium-silver, magnesium-indium, and lithium-aluminum. The ratio of any of the alloys is controlled by a temperature of an evaporation source, atmosphere, a degree of vacuum, and any other factor, thereby selecting an appropriate ratio.

The cathode may be formed with a layered configuration of two or more layers, as necessary. It is possible to form the cathode by forming a thin film of the foregoing conductive material by a method such as evaporation or sputtering.

In a case in which light emitted from the light-emitting layer is outputted from the cathode, light transmittance of the cathode may be preferably higher than 10%.

Moreover, sheet resistance of the cathode may be preferably several hundreds of Ω/square or less. A film thickness of the cathode is generally from 10 nm to 1 μm, and may be preferably from 50 nm to 200 nm.

[Hole Injection Layer and Hole Transport Layer]

The hole injection layer and the hole transport layer are adapted to support injection of holes into the light-emitting layer and transport the holes to a light emission region. The hole injection layer and the hole transport layer have large hole mobility and small ionization energy that is normally 5.6 eV or less.

The hole injection layer and the hole transport layer may be preferably made of a material allowing for transport of holes to the light-emitting layer at lower electric field intensity. The material may preferably have hole mobility of at least $10^{-4}$ $cm^2/Vs$ under application of an electric field of $10^4$ V/cm to $10^6$ V/cm, for example.

Specific examples of the material of the hole injection layer and the hole transport layer may include a triazole derivative, an oxadiazole derivative, an imidazole derivative, a polyarylalkane derivative, a pyrazoline derivative and a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, polysilanes, an aniline copolymer, and conductive high molecular oligomers (in particular, thiophene oligomers).

Moreover, an inorganic compound such as p-type Si or a p-type Sic may be also used as a hole injection material.

A cross-linked material may be used as the material of the hole injection layer and the hole transport layer, and a cross-linked hole injection layer and a cross-linked hole transport layer may be layers in which a known cross-linked material is insolubilized by, for example, heat or light.

In a case in which the hole injection layer and the hole transport layer in contact with the light-emitting layer are formed by a wet process, an interlayer layer may be provided between the hole injection layer or the hole transport layer and the light-emitting layer.

The interlayer layer is also referred to as an electron blocking layer. Providing the interlayer layer makes it possible to enhance electron blocking capability and to reduce damage to the light-emitting layer over time caused by the material used for the hole injection layer. Moreover, the interlayer may preferably have a function as a hole transport layer. The interlayer makes it possible to improve light emission efficiency and durability of the organic electroluminescence element. The interlayer is generally formed adjacent to the light-emitting layer between the hole injection layer and the light-emitting layer. Moreover, the interlayer may be preferably disposed adjacent to the hole injection layer as well.

As a material forming the interlayer, any of materials having a low to high molecular materials and small LUMO may be used. Non-limiting examples of the material may include polyvinyl carbazole (PVCz), and a polymer including an aromatic amine such as a polyarylene derivative including an aromatic amine in a side chain or a main chain such as polypyridine or polyaniline. It is possible for the interlayer to have a thickness of about 10 nm to about 30 nm, but the thickness of the interlayer is not limited thereto. Note that the thickness of the interlayer is a thickness of a layer made of the material of the interlayer only, and is a thickness of a region not including the material of the light-emitting layer.

[Electron Injection Layer and Electron Transport Layer]

The electron injection layer and the electron transport layer are adapted to support injection of electrons into the light-emitting layer and transport the electrons to the light emission region. The electron injection layer and the electron transport layer have large electron mobility.

It is known that, in the organic EL element, emitted light is reflected by an electrode (for example, the cathode), thereby causing interference between light directly outputted from the anode and light outputted through reflection by the electrode. In order to efficiently use this interference effect, film thicknesses of the electron injection layer and the electron transport layer are appropriately selected from a range from several nm to several μm. In particular, when the film thicknesses of the electron injection layer and the electron transport layer are large, in order to prevent an increase in voltage, electron mobility of the electron injection layer and the electron transport layer may be preferably at least $10^{-5}$ $cm^2/Vs$ or more upon application of an electric field of $10^4$ V/cm to $10^6$ V/cm.

As an electron transporting material used for the electron injection layer and the electron transport layer, an aromatic heterocyclic compound containing one or more hetero atoms in a molecule may be preferably used, and a nitrogen-containing cyclic derivative may be particularly preferable. Moreover, as the nitrogen-containing cyclic derivative, an aromatic ring having a nitrogen-containing six-membered or five-membered skeleton or a condensed aromatic cyclic compound having a nitrogen-containing six-membered or five-membered skeleton may be preferable.

[Interlayer Insulating Film]

The interlayer insulating film in an organic EL multi-color light-emitting device of the present technology is mainly used to separate each light-emitting element (light-emitting layer). In addition, the interlayer insulating film is used to flatten an edge of a highly-precise electrode and to electrically insulate a lower electrode and an upper electrode of the organic EL element from each other (prevent a short circuit).

Typical examples of a material used for the interlayer insulating film may include organic materials such as an acrylic resin, a polycarbonate resin, and a polyimide resin, and inorganic oxides such as silicon oxide ($SiO_2$ or $SiO_x$), aluminum oxide ($Al_2O_3$ or $AlO_x$), titanium oxide ($TiO_2$), silicon nitride ($Si_3N_4$), and silicon oxynitride ($SiO_xN_y$).

The interlayer insulating film may be preferably formed by introducing a photosensitive group into the foregoing material, and processing the material in a desired pattern by a photolithography method or forming the material in a desired pattern by a printing method.

[Method of Manufacturing Organic EL Multi-Color Light-Emitting Device]

Any of known dry film formation methods and known wet film formation methods is applicable to formation of each layer of the organic EL multi-color light-emitting device of the present technology. Non-limiting examples of the known dry film formation methods may include vacuum evaporation, sputtering, plasma coating, and ion plating. Non-limiting examples of the known wet film formation methods may include a spin coating method, a casting method, a microgravure coating method, a gravure coating method, a bar coating method, a roll coating method, a slit coating method, a wire bar coating method, a dip coating method, a spray coating method, a screen printing method, a flexographic printing method, an offset printing method, an ink-jet method, and a nozzle printing method. In a case with pattern formation, any of methods such as the screen printing method, the flexographic printing method, the offset printing method, the ink-jet method is applicable.

Although the film thickness of each layer is not particularly limited, it is necessary to set an appropriate film thickness. When the film thickness is too large, a high applied voltage is necessary in order to obtain a certain light output, which causes low efficiency. When the film thickness it too small, defects such as a pinhole are generated; therefore, sufficient light emission luminance is not obtained even if an electric field is applied. In general, the film thickness may be suitably within a range of 5 nm to 10 μm, and may be more preferably within a range of 10 nm to 0.2 μm.

Examples of a method of forming the hole injection layer and the hole transport layer may include film formation with use of a solution containing an aromatic amine derivative. Preferable film formation methods may include, but not limited to, a spin coating method, a casting method, a microgravure coating method, a gravure coating method, a bar coating method, a roll coating method, a slit coating method, a wire bar coating method, a dip coating method, a spray coating method, a screen printing method, a flexographic printing method, an offset printing method, an ink-jet method, and a nozzle printing method. In a case in which a pattern is formed, the screen printing method, the flexographic printing method, the offset printing method, and the ink-jet method may be preferable. It is possible to perform film formation by these methods under conditions that are well known by those skilled in the art.

After film formation, it is only necessary to remove the solvent by heating and drying under vacuum, and polymerization reaction by light or heating at high temperature (200° C. or more) is not necessary. Accordingly, it is possible to suppress performance degradation caused by light or heating at high temperature.

It is only necessary for a solution for formation of the hole injection layer and the hole transport layer to contain one or more kinds of aromatic amine derivatives, and the solution may contain a hole-transporting material, an electron-transporting material, a luminescent material, an acceptor material, a solvent, and an additive such as a stabilizer, in addition to the aromatic amine derivative.

The content of the aromatic amine derivative in the solution for film formation may be preferably from 20 wt % to 100 wt % of the total weight of the composition excluding the solvent, and more preferably from 51 wt % to 100 wt %. The aromatic amine derivative may be preferably a main component of the composition excluding the solvent. The ratio of the solvent may be preferably from 1 wt % to 99.9 wt % of the solution for film formation, and more preferably from 80 wt % to 99 wt %.

Note that the "main component" means that the content of the aromatic amine derivative is 50 wt % or more.

The foregoing solution for film formation may contain an additive for adjustment of viscosity and/or surface tension such as, for example, a thickener (such as a high-molecular compound, a poor solvent for the aromatic amine derivative), a viscosity depressant (such as a low-molecular compound), and a surfactant. Moreover, in order to improve storage stability, the solution may contain an antioxidant that does not affect the performance of the organic EL element, such as a phenol-based antioxidant and a phosphorus-based antioxidant.

Examples of the solvent of the solution for film formation may include chlorine-based solvents such as chloroform, methylene chloride, 1,2-dichloroethane, 1,1,2-trichloroethane, chlorobenzene, and o-dichlorobenzene; ether-based solvents such as tetrahydrofuran, dioxane, dioxolane, and anisole; aromatic hydrocarbon-based solvents such as toluene and xylene; aliphatic hydrocarbon-based solvents such as cyclohexane, methylcyclohexane, n-pentane, n-hexane, n-heptane, n-octane, n-nonane, and n-decane; ketone-based solvents such as acetone, methylethylketone, cyclohexanone, benzophenone, and acetophenone; ester-based solvents such as ethyl acetate, butyl acetate, ethyl cellosolve acetate, methyl benzoate, and phenyl acetate; polyhydric alcohol such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, and 1,2-hexanediol, and derivatives thereof; alcohol-based solvent such as methanol, ethanol, propanol, isopropanol, and cyclohexanol; sulfoxide-based solvents such as dimethyl sulfoxide; and amide-based solvents such as N-methyl-2-pyrrolidone and N,N-dimethylformamide. Moreover, these organic solvents may be used alone or in combination.

In terms of solubility, consistency of film formation, viscosity properties, and other properties, the aromatic hydrocarbon-based solvents, the ether-based solvents, the aliphatic hydrocarbon-based solvents, the ester-based solvents, and the ketone-based solvents may be particularly preferable. Preferable solvents may include toluene, xylene, ethylbenzene, diethylbenzene, trimethylbenzene, n-propylbenzene, isopropylbenzene, n-butylbenzene, isobutylbenzene, 5-butylbenzene, n-hexylbenzene, cyclohexylbenzene, 1-methylnaphthalene, tetralin, 1,3-dioxane, 1,4-dioxane, 1,3-dioxolane, anisole, ethoxybenzene, cyclohexane, bicyclohexyl, cyclohexenyl cyclohexanone, n-heptylcyclohexane, n-hexylcyclohexane, decalin, methyl benzoate, cyclohexanone, 2-propylcyclohexanone, 2-heptanone, 3-heptanone, 4-heptanone, 2-octanone, 2-nonanone, 2-decanone, dicyclohexylketone, acetophenone, and benzophenone.

As a separate coating process when the light-emitting layer, the hole injection layer and the hole transport layer, and other layers are formed by patterning, it may be desirable to from these layers with use of, for example, but not limited to, any of the foregoing coating methods. Separate coating may be performed by any of known methods. In addition to the coating methods, a pattern may be formed with use of a metal mask. A pattern may be formed by a known laser transfer method.

The foregoing organic EL element is applicable to, for example, but not limited to, a flat light emitter such as a flat panel display of a wall-hung television, a copying machine, a printer, a backlight of a liquid crystal display, a light source of a measuring instrument, a display board, and a beacon light.

EXAMPLES

In the following, description is given of the present technology with examples. It is to be noted that structures of compounds used in respective examples are as follows.

[Chem. 125]

H-3

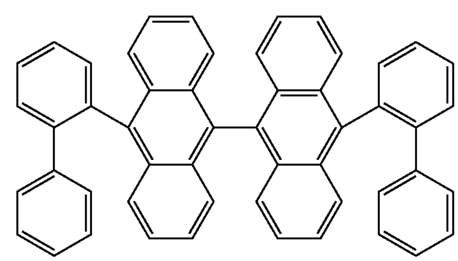

H-4

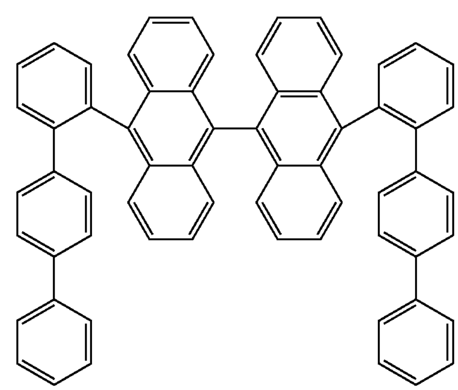

-continued

H-26

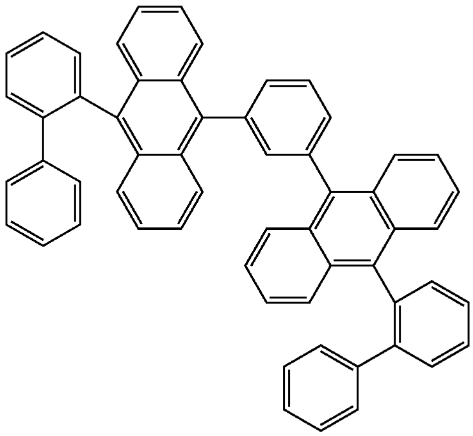

H-27

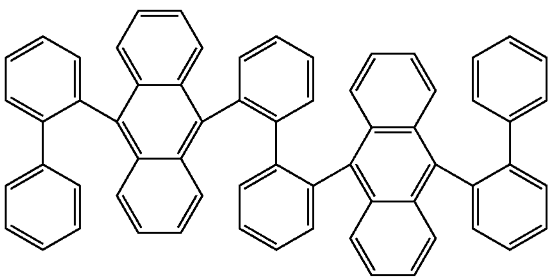

D-2

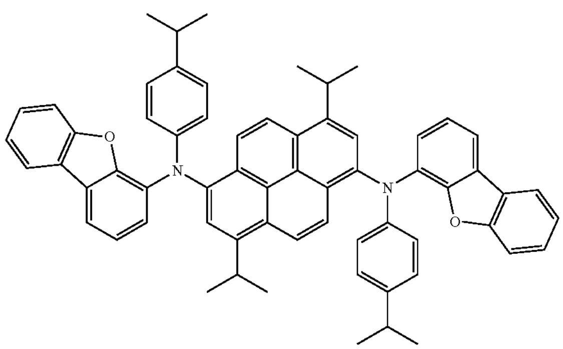

D-3

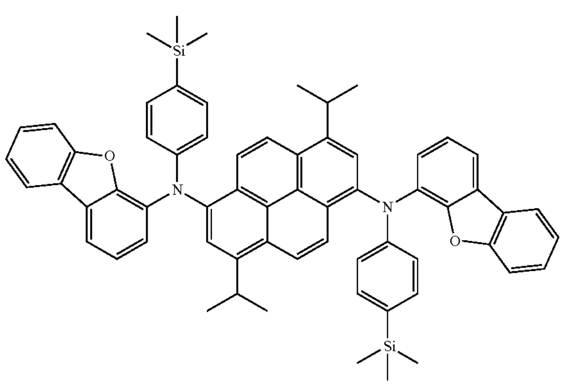

-continued

D-53

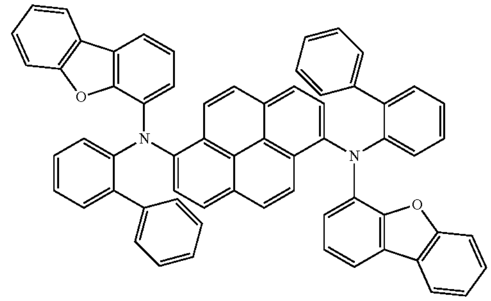

D-83

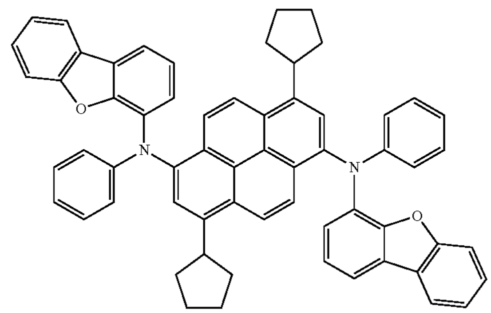

[Luminescent Ink Composition for Organic EL Element]

Example 1

0.01 g of H-3 as the component (A), 0.001 g of D-2 as the component (B), and 1 g of toluene as the component (C) were put in a glass bottle, and were stirred to prepare a composition. Absence of insoluble matters in a resultant solution was visually confirmed.

Examples 2 to 17

Compositions were prepared as with Example 1, except that components shown in Table 1 were used as the components (A) to (C). Absence of insoluble matters in each resultant solution was visually confirmed.

TABLE 1

| | Component (A) | Component (B) | Component (C) | Result of Visual Confirmation |
|---|---|---|---|---|
| Example 1 | H-3 | D-2 | Toluene | No Insoluble Matters |
| Example 2 | H-3 | D-3 | Toluene | No Insoluble Matters |
| Example 3 | H-3 | D-53 | Toluene | No Insoluble Matters |
| Example 4 | H-3 | D-83 | Toluene | No Insoluble Matters |
| Example 5 | H-4 | D-2 | Toluene | No Insoluble Matters |
| Example 6 | H-4 | D-3 | Toluene | No Insoluble Matters |
| Example 7 | H-4 | D-53 | Toluene | No Insoluble Matters |
| Example 8 | H-4 | D-83 | Toluene | No Insoluble Matters |
| Example 9 | H-26 | D-2 | Toluene | No Insoluble Matters |
| Example 10 | H-26 | D-3 | Toluene | No Insoluble Matters |
| Example 11 | H-26 | D-53 | Toluene | No Insoluble Matters |
| Example 12 | H-26 | D-83 | Toluene | No Insoluble Matters |
| Example 13 | H-27 | D-2 | Toluene | No Insoluble Matters |
| Example 14 | H-27 | D-3 | Toluene | No Insoluble Matters |
| Example 15 | H-27 | D-53 | Toluene | No Insoluble Matters |
| Example 16 | H-27 | D-83 | Toluene | No Insoluble Matters |
| Example 17 | H-3 | D-2 | Xylene | No Insoluble Matters |

[Organic EL Element]

Compounds used in the following examples and comparative examples are as follows.

[Chem. 126]

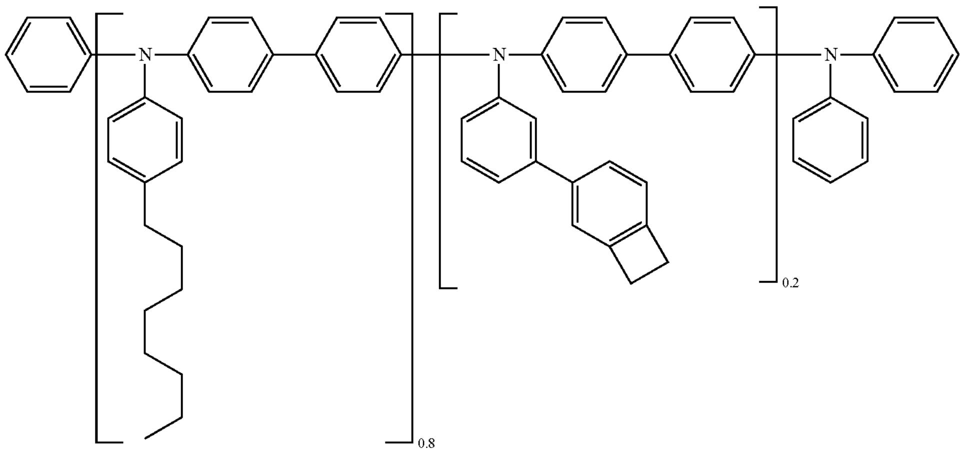

HT2 (Mw 20, 000)

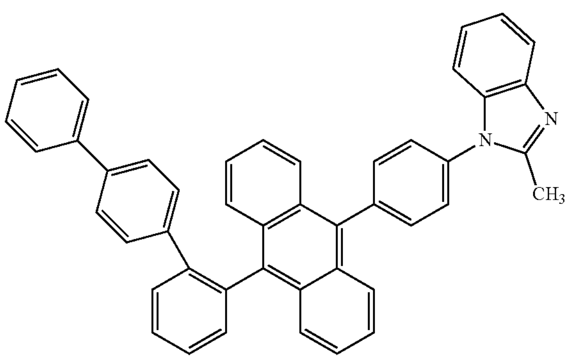

ET1

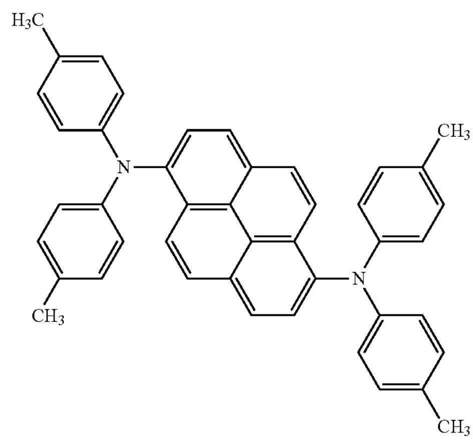

BDa

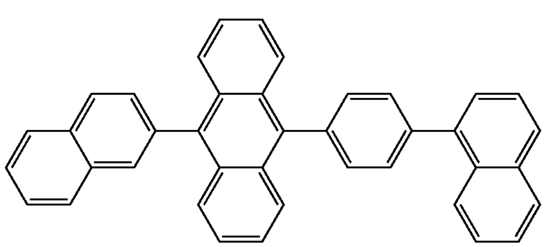

BHa

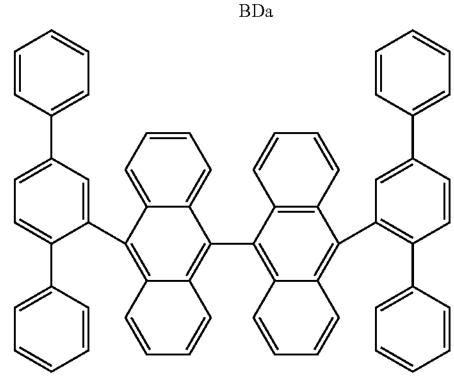

H-6

Example 18

A grass substrate of 25 mm×75 mm×1.1 mm thick provided with an ITO transparent electrode (manufactured from Geomatec Co., Ltd.) was subjected to ultrasonic cleaning in isopropyl alcohol for 5 minutes, and thereafter was subjected to UV-ozone cleaning for 30 minutes.

A 40 nm-thick film of polyethylene dioxythiophene/polystyrenesulfonic acid (PEDOT/PSS) was formed as a hole-injecting layer on the substrate by spin coating.

Next, a 20 nm-thick film of a xylene solution (1 wt %) of HT2 was formed by a spin coating method, and was subjected to heating and drying at 230° C. to form a hole transport layer. Subsequently, a toluene solution (1.0 wt %) containing a host compound H-3 and a dopant compound D-2 at a weight ratio of 90:10 was prepared, and a 50-nm thick film of the toluene solution was formed, and was subjected to drying at 120° C. to form a light-emitting layer.

Next, a 20-nm thick film of ET1 was formed on the light-emitting layer by evaporation. This layer functions as an electron injection layer.

Thereafter, Li (a Li source: manufactured from Saes Getters S.p.A.) as an electron-donating dopant and Alq were co-evaporated to form an Alq:Li film as an electron injection layer (a cathode).

Metal A1 was evaporated on the Alq:Li film to form a metal cathode. Thus, the organic EL element was fabricated.

When a current (10 mA/cm$^2$) was passed through this light-emitting element to evaluate performance of the light-emitting element, a voltage was 4.0 V, luminescent chromaticity was (0.128, 0.143), and external quantum yield was 6.7%. Results are shown in Table 2.

The luminescent chromaticity (CIEx, y) was measured by a spectroradiometer (CS-1000 manufactured from Minolta Co., Ltd.).

A method of measuring the external quantum yield is as described below.

When a current with a current density of 10 mA/cm$^2$ was passed through the obtained organic EL element to measure an emission spectrum by the spectroradiometer (CS1000 manufactured from Minolta Co., Ltd.), and the external quantum yield was calculated by the following mathematical expression (1).

[Math. 1]

Mathematical expression (1)

$$E.Q.E = \frac{N_P}{N_E} \times 100 = \frac{\dfrac{(\pi/10^9)\int \phi(\lambda)\cdot d\lambda}{hc}}{\dfrac{J/10}{e}} \times 100 = \frac{\dfrac{(\pi/10^9)\sum(\phi(\lambda)\cdot(\lambda))}{hc}}{\dfrac{J/10}{e}} \times 100(\%)$$

Examples 19 to 21 and Comparative Example 1 and 2

Organic EL elements were fabricated and evaluated as with Example 18. Results are shown in Table 2.

TABLE 2

| | (A) | (B) | V | (CIEx, y) | EQE (%) |
|---|---|---|---|---|---|
| Example 18 | H-3 | D-2 | 4.0 | (0.128, 0.143) | 6.7 |
| Example 19 | H-4 | D-2 | 4.0 | (0.128, 0.154) | 7.0 |
| Example 20 | H-6 | D-2 | 4.1 | (0.128, 0.150) | 6.8 |
| Example 21 | H-26 | D-2 | 3.9 | (0.128, 0.139) | 6.9 |
| Comparative Example 1 | H-3 | BDa | 4.2 | (0.128, 0.250) | 5.9 |
| Comparative Example 2 | BHa | D-2 | 4.1 | (0.128, 0.140) | 4.2 |

In Comparative Example 1, CIEy became large, and chromaticity was degraded. In contrast, in Examples 18 to 21, high external quantum yield was obtained without degrading chromaticity. This indicates that it was because of, in addition to a short-wavelength light emission effect of a dibenzofuranyl group contained in an aromatic amine derivative represented by the formula (B1) as described in WO2010-122810, an effect of a dibenzofuran derivative having superior compatibility with an organic solvent, which caused an improvement in dispersion of the dopant and suppression of self-absorption.

Moreover, even if D-2 was used as a dopant, in Comparative Example 2 in which BHa not having a structure represented by the formula (A1) was used as the host material (the component (A)), light emission efficiency was decreased. This indicates that it was because the glass transition temperature (Tg: 130° C.) of BHa as the host material was low, and film formability was degraded. In contrast, the host of the present technology had high Tg (Tg of H-10: 157° C., Tg of H-16: 162° C.).

This application claims the benefit of Japanese Priority Patent Application No. JP 2014-051342 filed with the Japan patent office on Mar. 14, 2014, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. An ink composition comprising:

the following component (A);

the following component (B); and the following component (C), the component (A) being an anthracene derivative represented by the following formula (A1):

[Chem. 127]

(A1)

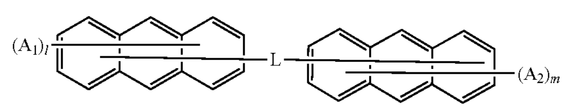

in the formula (A1), L is one of a substituted or unsubstituted terphenylylene group, a substituted or unsubstituted naphthylene group, a substituted or unsubstituted fluoranthenylene group, a substituted or unsubstituted phenanthrylene group, a substituted or unsubstituted pyrenylene group, a substituted or unsubstituted chrysenylene group, a substituted or unsubstituted fluorenylene group, a substituted or unsubstituted triphenylenylene group, substituted or unsubstituted pyridinylene group, a substituted or unsubstituted pyrazinylene group, a substituted or unsubstituted furylene group, a substituted or unsubstituted benzofuranylene group, a substituted or unsubstituted dibenzofuranylene group, a substituted or unsubstituted dibenzothiophenylene group, and a substituted or unsubstituted carbazolylene group, each of A1 and A2 is one of a substituted or unsubstituted aryl group including 6 to 50 ring-forming carbon atoms, and a heteroaryl group including 5 to 50 ring-forming atoms, each of l and m is an integer of 0 to 9, where when l is an integer of 2 or more, a plurality of A1's are the same as or different from one another, and when m is an integer of 2 or more, a plurality of A2's are the same as or different from one another, the component (B) being an aromatic amine derivative represented by the following formula (B1):

[Chem. 128}

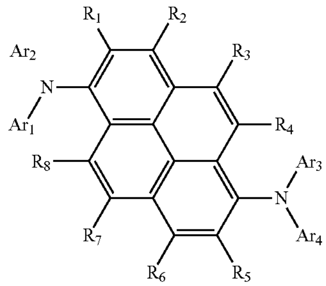

(B1)

in the formula (B1), each of R1 to R8 is one of a hydrogen atom and a substituent group, and each of Ar1 to Ar4 is one of a substituted or unsubstituted aryl group including 6 to 30 ring-forming carbon atoms, and a substituted or unsubstituted heterocyclic group including 5 to 30 ring-forming atoms, where one or more of Ar1 to Ar4 are a heterocyclic group represented by the following formula (B1'),

[Chem. 129]

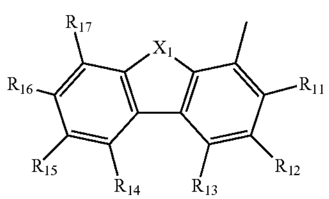

(B1')

in the formula (B1'), each of R11 to R17 is one of a hydrogen atom and a substituent group, adjacent substituent groups in R11 to R17 optionally form a saturated or unsaturated ring, and X1 is one of an oxygen atom and a sulfur atom, and the component (C) being a solvent represented by the following formula (C1) and having a boiling point of 110° C. or higher and a solubility of 1 wt % or less in water:

[Chem. 130]

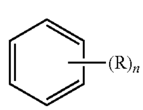

(C1)

in the formula (C1), R is a substituent group, and n is an integer of 1 to 6 both inclusive, where when n is 2 or more, a plurality of R's are the same as or different from one another.

2. The ink composition according to claim 1, wherein in the formula (A1), each of l and m is 1.

3. The ink composition according to claim 1, wherein the anthracene derivative is represented by the following formula (A2):

[Chem. 131]

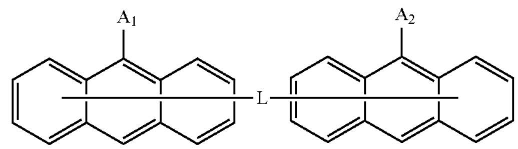

(A2)

in the formula (A2), L, A1, and A2 are respectively the same as L, A1, and A2 in the formula (A1).

4. The ink composition according to claim 1, wherein the anthracene derivative is represented by the following formula (A3):

[Chem. 132]

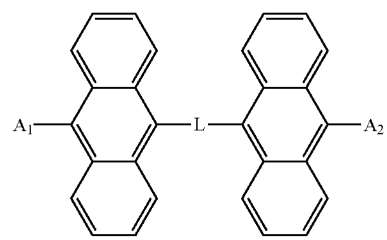

(A3)

in the formula (A3), L, A1, and A2 are respectively the same as L, A1, and A2 in the formula (A1).

5. The ink composition according to claim 1, wherein each of A1 and A2 is one of a substituted or unsubstituted phenyl group, a substituted or unsubstituted biphenyl group, a substituted or unsubstituted terphenyl group, a substituted or unsubstituted naphthyl group, a substituted or unsubstituted fluoranthenyl group, a substituted or unsubstituted anthryl group, a substituted or unsubstituted phenanthryl group, a substituted or unsubstituted pyrenyl group, a substituted or unsubstituted chrysenyl group, a substituted or unsubstituted fluorenyl group, a substituted or unsubstituted triphenylenyl group, a substituted or unsubstituted pyridinyl group, a substituted or unsubstituted pyrazinyl group, a substituted or unsubstituted indolyl group, a substituted or unsubstituted furyl group, a substituted or unsubstituted benzofuranyl group, a substituted or unsubstituted dibenzofuranyl group, a substituted or unsubstituted dibenzothiophenyl group, and a substituted or unsubstituted carbazolyl group.

6. The ink composition according to claim 1, wherein the anthracene derivative is represented by the following formula (A4):

[Chem. 133]

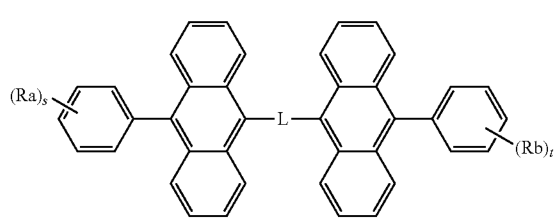

(A4)

in the formula (A4), L is the same as L in the formula (A1), each of Ra and Rb is a substituent group, and each of s and t is an integer of 0 to 5, where when s is an integer of 2 or more, a plurality of Ra's are the same as or different from one another, and when t is an integer of 2 or more, a plurality of Rb's are the same as or different from one another.

7. The ink composition according to claim 6, wherein each of Ra and Rb is one of a substituted or unsubstituted aryl group including 6 to 50 ring-forming carbon atoms, a substituted or unsubstituted alkyl group including 1 to 50 carbon atoms, a substituted or unsubstituted alkoxy group including 1 to 50 carbon atoms, a substituted or unsubstituted aralkyl group including 7 to 50 carbon atoms, a substituted or unsubstituted aryloxy group including 5 to 50 ring-forming atoms, a halogen group, and a cyano group.

8. The ink composition according to claim 1, wherein the aromatic amine derivative is represented by the following expression (B2):

[Chem. 134]

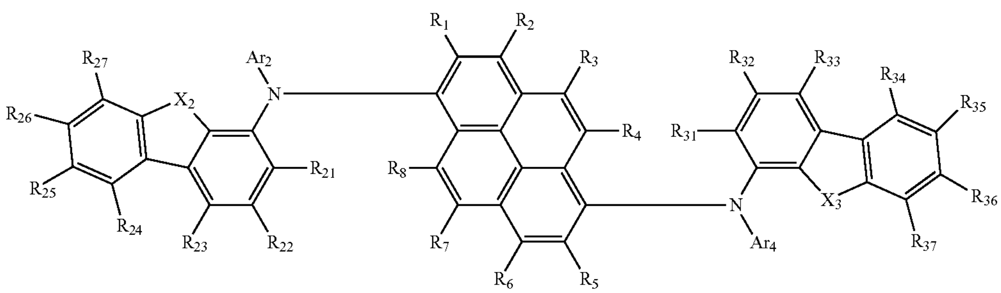

(B2)

in the formula (B2), R1 to R8, Ar2, and Ar4 are respectively the same as R1 to R8, Ar2, and Ar4 in the formula (B1), each of R21 to R27 and R31 to R37 is one of a hydrogen atom and a substituent group, where adjacent substituent groups in R21 to R27, and R31 to R37 optionally form a saturated or unsaturated ring, and each of X2 and X3 is one of an oxygen atom and a sulfur atom.

9. The ink composition according to claim 8, wherein in the formula (B2), each of Ar2 and Ar4 is a substituted or unsubstituted aryl group including 6 to 30 ring-forming carbon atoms.

10. The ink composition according to claim 8, wherein in the formula (B2), each of Ar2 and Ar4 is a substituted or unsubstituted phenyl group.

11. The ink composition according to claim 8, wherein in the formula (B2), each of R27 and R37 is one of a substituted or unsubstituted alkyl group including 1 to 20 carbon atoms, a substituted or unsubstituted silyl group, and a substituted or unsubstituted aryl group including 6 to 20 ring-forming carbon atoms, and each of R21 to R26 and R31 to R36 is a hydrogen atom.

12. The ink composition according to claim 8, wherein in the formula (B2), each of R1 to R8 is a hydrogen atom.

13. The ink composition according to claim 8, wherein in the formula (B2), R2 is one of a halogen atom, a substituted or unsubstituted alkyl group including 1 to 20 carbon atoms, a substituted or unsubstituted cycloalkyl group including 3 to 10 ring-forming carbon atoms, a substituted or unsubstituted silyl group, and a substituted or unsubstituted aryl group including 6 to 30 ring-forming carbon atoms, and each of R1 and R3 to R8 is a hydrogen atom.

14. The ink composition according to claim 8, wherein in the formula (B2), each of R2 and R6 is one of a halogen atom, a substituted or unsubstituted alkyl group including 1 to 20 carbon atoms, a substituted or unsubstituted cycloalkyl group including 3 to 10 ring-forming carbon atoms, a substituted or unsubstituted silyl group, and a substituted or unsubstituted aryl group including 6 to 30 ring-forming carbon atoms, and each of R1, R3, R4, R5, R7, and R8 is a hydrogen atom.

15. The ink composition according to claim 1, wherein each of substituent groups of R1 to R8, R11 to R17, R21 to R27, and R31 to R37 in the component (B) is one of a halogen atom, a substituted or unsubstituted alkyl group including 1 to 20 carbon atoms, a substituted or unsubstituted cycloalkyl group including 3 to 10 ring-forming carbon atoms, a substituted or unsubstituted silyl group, a cyano group, and a substituted or unsubstituted aryl group including 6 to 30 carbon atoms.

16. The ink composition according to claim 1, wherein X1 in the formula (B1), or each of X2 and X3 in the formula (B2) is an oxygen atom.

17. The ink composition according to claim 1, wherein in the formula (C1), R is one of an alkyl group including 1 to 20 carbon atoms, a cycloalkyl group including 3 to 10 ring-forming carbon atoms, an ether bond-containing group, a carbonyl bond-containing group, and an ester bond-containing group.

18. The ink composition according to claim 1, wherein the component (C) is toluene or xylene.

19. The ink composition according to claim 1, wherein the content of the component (A) is 0.5 wt % or more, and the content of the component (B) is 0.001 wt % or more.

20. An organic electroluminescence element provided with one or more organic thin film layers that are interposed between a cathode and an anode and include at least a light-emitting layer, the one or more organic thin film layers including an organic thin film as the light-emitting layer, and the organic thin film being formed with use of an ink composition, the ink composition comprising:

the following component (A);

the following component (B); and the following component (C), the component (A) being an anthracene derivative represented by the following formula (A1):

[Chem. 135]

(A1)

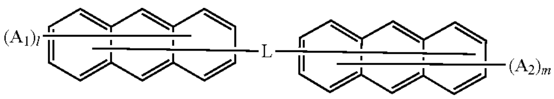

in the formula (A1), L is one of a substituted or unsubstituted terphenylylene group, a substituted or unsubstituted naphthylene group, a substituted or unsubstituted fluoranthenylene group, a substituted or unsubstituted phenanthrylene group, a substituted or unsubstituted pyrenylene group, a substituted or unsubstituted chrysenylene group, a substituted or unsubstituted fluorenylene group, a substituted or unsubstituted triphenylenylene group, substituted or unsubstituted pyridinylene group, a substituted or unsubstituted pyrazinylene group, a substituted or unsubstituted furylene group, a substituted or unsubstituted benzofuranylene group, a substituted or unsubstituted dibenzofuranylene group, a substituted or unsubstituted dibenzothiophenylene group, and a substituted or unsubstituted carbazolylene group, each of A1 and A2 is one of a substituted or unsubstituted aryl group including 6 to 50 ring-forming carbon atoms, and a heteroaryl group including 5 to 50 ring-forming atoms, each of l and m is an integer of 0 to 9, where when 1 is an integer of 2 or more, a plurality of A1's are the same as or different from one another, and when m is an integer of 2 or more, a plurality of A2's are the same as or different from one another, the component (B) being an aromatic amine derivative represented by the following formula (B1):

[Chem. 136]

(B1)

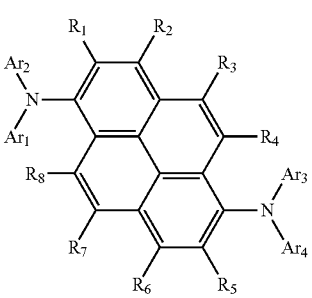

in the formula (B1), each of R1 to R8 is one of a hydrogen atom and a substituent group, and each of Ar1 to Ar4 is one of a substituted or unsubstituted aryl group including 6 to 30 ring-forming carbon atoms, and a substituted or unsubstituted heterocyclic group including 5 to 30 ring-forming atoms, where one or more of Ar1 to Ar4 are a heterocyclic group represented by the following formula (B1'),

[Chem. 137]

(B1')

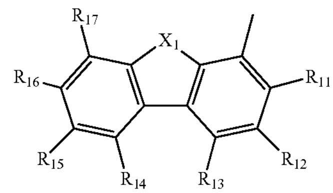

in the formula (B1'), each of R11 to R17 is one of a hydrogen atom and a substituent group, adjacent substituent groups in R11 to R17 optionally form a saturated or unsaturated ring, and X1 is one of an oxygen atom and a sulfur atom, and the component (C) being a solvent represented by the following formula (C1) and having a boiling point of 110° C. or higher and a solubility of 1 wt % or less in water:

[Chem. 138]

(C1)

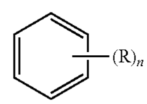

in the formula (C1), R is a substituent group, and n is an integer of 1 to 6 both inclusive, where when n is 2 or more, a plurality of R's are the same as or different from one another.

21. An electronic apparatus provided with an organic electroluminescence element, the organic electroluminescence element including one or more organic thin film layers that are interposed between a cathode and an anode and include at least a light-emitting layer, the one or more organic thin film layers including an organic thin film as the light-emitting layer, and the organic thin film being formed with use of an ink composition, the ink composition comprising:

the following component (A);

the following component (B); and the following component (C), the component (A) being an anthracene derivative represented by the following formula (A1):

[Chem. 139]

(A1)

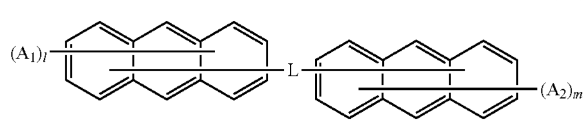

in the formula (A1), L is one of a substituted or unsubstituted terphenylylene group, a substituted or unsubstituted naphthylene group, a substituted or unsubstituted fluoranthenylene group, a substituted or unsubstituted phenanthrylene group, a substituted or unsubstituted pyrenylene group, a substituted or unsubstituted chrysenylene group, a substituted or unsubstituted fluorenylene group, a substituted or unsubstituted triphenylenylene group, substituted or unsubstituted pyridinylene group, a substituted or unsubstituted pyrazinylene group, a substituted or unsubstituted furylene group, a substituted or unsubstituted benzofuranylene group, a substituted or unsubstituted dibenzofuranylene group, a substituted or unsubstituted dibenzothiophenylene group, and a substituted or unsubstituted carbazolylene group, each of A1 and A2 is one of a substituted or unsubstituted aryl group including 6 to 50 ring-forming carbon atoms, and a heteroaryl group including 5 to 50 ring-forming atoms, each of l and m is an integer of 0 to 9, where when 1 is an integer of 2 or more, a plurality of A1's are the same as or different from one another, and when m is an integer of 2 or more, a plurality of A2's are the same as or different from one another, the component (B) being an aromatic amine derivative represented by the following formula (B1):

[Chem. 140]

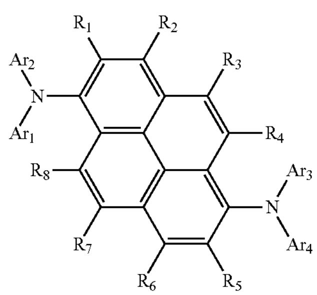

(B1)

in the formula (B1), each of R1 to R8 is one of a hydrogen atom and a substituent group, and each of Ar1 to Ar4 is one of a substituted or unsubstituted aryl group including 6 to 30 ring-forming carbon atoms, and a substituted or unsubstituted heterocyclic group including 5 to 30 ring-forming atoms, where one or more of Ar1 to Ar4 are a heterocyclic group represented by the following formula (B1'),

[Chem. 141]

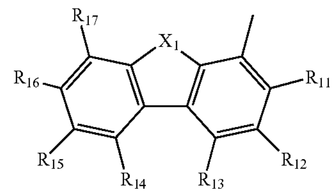

(B1')

in the formula (B1'), each of R11 to R17 is one of a hydrogen atom and a substituent group, adjacent substituent groups in R11 to R17 optionally form a saturated or unsaturated ring, and X1 is one of an oxygen atom and a sulfur atom, and the component (C) being a solvent represented by the following formula (C1) and having a boiling point of 110° C. or higher and a solubility of 1 wt % or less in water:

[Chem. 142]

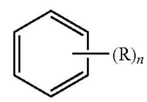

(C1)

in the formula (C1), R is a substituent group, and n is an integer of 1 to 6 both inclusive, where when n is 2 or more, a plurality of R's are the same as or different from one another.

* * * * *